United States Patent
Izu et al.

(10) Patent No.: US 7,512,167 B2
(45) Date of Patent: Mar. 31, 2009

(54) INTEGRATED SEMICONDUCTOR LASER DEVICE AND METHOD OF FABRICATING THE SAME

(75) Inventors: Hiroaki Izu, Hirakata (JP); Tsutomu Yamaguchi, Nara (JP); Hiroki Ohbo, Moriguchi (JP); Ryoji Hiroyama, Kyo-tanabe (JP); Masayuki Hata, Kadoma (JP); Kiyoshi Oota, Neyagawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 298 days.

(21) Appl. No.: 11/219,875

(22) Filed: Sep. 7, 2005

(65) Prior Publication Data

US 2006/0078020 A1    Apr. 13, 2006

(30) Foreign Application Priority Data

Sep. 24, 2004  (JP)  ............................. 2004-276457
Mar. 28, 2005  (JP)  ............................. 2005-093234

(51) Int. Cl.
*H01S 3/04*     (2006.01)
*H01S 5/00*     (2006.01)

(52) U.S. Cl. .................. 372/43.01; 372/36; 372/44.01; 372/44.011; 372/50.1

(58) Field of Classification Search ................ 372/36, 372/43.01, 44.01, 44.011, 50.1
See application file for complete search history.

(56) References Cited

U.S. PATENT DOCUMENTS

| | | | |
|---|---|---|---|
| 5,638,391 A * | 6/1997 | Shima et al. | 372/44.011 |
| 5,644,586 A * | 7/1997 | Kawano et al. | 372/44.01 |
| 6,647,042 B2 | 11/2003 | Miyachi et al. | |
| 6,680,958 B1 * | 1/2004 | Nemoto | 372/43.01 |
| 6,748,001 B1 | 6/2004 | Nishitsuka et al. | |
| 6,901,086 B2 * | 5/2005 | Li | 372/7 |
| 2002/0043660 A1 * | 4/2002 | Yamazaki et al. | 257/59 |
| 2003/0013217 A1 * | 1/2003 | Dudoff et al. | 438/27 |
| 2004/0121499 A1 * | 6/2004 | Miyachi et al. | 438/22 |
| 2004/0184502 A1 * | 9/2004 | Miyachi et al. | 372/50 |
| 2005/0175053 A1 * | 8/2005 | Kimura et al. | 372/50.12 |

(Continued)

FOREIGN PATENT DOCUMENTS

JP        05068021     *    3/1993

(Continued)

OTHER PUBLICATIONS

Chinese Office Action, w/ English translation thereof, issued in Chinese Patent Application No. CN 200510105528.6 dated Nov. 7, 2008.

*Primary Examiner*—Minsun Harvey
*Assistant Examiner*—Joshua King
(74) *Attorney, Agent, or Firm*—McDermott Will & Emery LLP

(57) ABSTRACT

An integrated semiconductor laser device capable of improving the properties of a laser beam and reducing the cost for optical axis adjustment is provided. This integrated semiconductor laser device comprises a first semiconductor laser element including a first emission region and having either a projecting portion or a recess portion and a second semiconductor laser element including a second emission region and having either a recess portion or a projecting portion. Either the projecting portion or the recess portion of the first semiconductor laser element is fitted to either the recess portion or the projecting portion of the second semiconductor laser element.

13 Claims, 68 Drawing Sheets

U.S. PATENT DOCUMENTS

2008/0054272 A1 * 3/2008 Sato et al. .................. 257/79

FOREIGN PATENT DOCUMENTS

| JP | 11056101 | * | 3/1999 |
| JP | 2000-294878 | A | 10/2000 |
| JP | 2000372827 | * | 12/2000 |
| JP | 2002-299739 | A | 10/2002 |

* cited by examiner

INTEGRATED SEMICONDUCTOR LASER DEVICE AND METHOD OF FABRICATING THE SAME

BACKGROUND OF THE INVENTION

1. Field of the Invention

The present invention relates to an integrated semiconductor laser device and a method of fabricating the same, and more particularly, it relates to an integrated semiconductor laser device comprising a plurality of semiconductor laser elements and a method of fabricating the same.

2. Description of the Background Art

An integrated semiconductor laser device prepared by integrating a plurality of semiconductor laser elements in the direction of stacking of semiconductor layers is known in general, as disclosed in Japanese Patent Laying-Open No. 2002-299739, for example.

FIG. 133 is a perspective view showing the structure of a conventional integrated semiconductor laser device. Referring to FIG. 133, a first semiconductor laser element 410 and a second semiconductor laser element 420 are integrated with each other in the direction (vertical direction Z) of stacking of semiconductor layers in the conventional integrated semiconductor laser device.

A ridge portion 412 and a recess portion 413 are formed on a semiconductor element layer 411 constituting the first semiconductor laser element 410. The ridge portion 412 and the recess portion 413 are arranged at a prescribed interval in the horizontal direction (direction X). A peripheral region of the ridge portion 412 of the semiconductor element layer 411 forms an emission region 414 of the first semiconductor laser element 410. Another ridge portion 422 and another recess portion 423 are formed on another semiconductor element layer 421 constituting the second semiconductor laser element 420. The ridge portion 422 and the recess portion 423 are also arranged at a prescribed interval in the direction X. A peripheral region of the ridge portion 422 of the semiconductor element layer 421 forms an emission region 424 of the second semiconductor laser element 420.

The first and second semiconductor laser elements 410 and 420 are bonded to each other through bonding layers 415 and 425. More specifically, the first and second semiconductor laser elements 410 and 420 are so bonded to each other that the ridge portion 412 of the first semiconductor laser element 410 and the recess portion 423 of the second semiconductor laser element 420 positionally coincide with each other while the ridge portion 422 of the second semiconductor laser element 420 and the recess portion 413 of the first semiconductor laser element 410 also positionally coincide with each other.

In the conventional integrated semiconductor laser device shown in FIG. 133, however, the ridge portion 412 (ridge portion 422) of the first semiconductor laser element 410 (second semiconductor laser element 420) is not fitted in the recess portion 423 (recess portion 413) of the second semiconductor laser element 420 (first semiconductor laser element 410). When the first and second semiconductor laser elements 410 and 420 are bonded to each other, therefore, it is disadvantageously difficult to inhibit the first and second semiconductor laser elements 410 and 420 from horizontally moving in the directions X and Y. Thus, the first and second semiconductor laser elements 410 and 420 are disadvantageously bonded to each other while cleavage directions thereof do not coincide with each other. Consequently, cleavability for simultaneously cleaving the first and second semiconductor laser elements 410 and 420 is reduced to disadvantageously deteriorate the properties of a laser beam emitted from a cleavage plane (light emission plane).

In the conventional integrated semiconductor laser device shown in FIG. 133, further, the emission regions 414 and 424 of the first and second semiconductor laser elements 410 and 420 are arranged at prescribed intervals in the horizontal direction X as well as in the direction Z of stacking of the semiconductor layers. In other words, the emission regions 414 and 424 of the first and second semiconductor laser elements 410 and 420 misregister from each other in two directions, i.e., the horizontal direction X and the direction Z of stacking of the semiconductor layers. Therefore, the intervals between the emission regions 414 and 424 are disadvantageously increased as compared with a case where the emission regions 414 and 424 misregister from each other only in the direction X or Z. If the intervals between the emission regions 414 and 424 are increased, a beam emitted from either the emission region 424 or the emission region 414 may be incident upon a region displaced from a prescribed region of an optical system formed by a lens and a mirror in a case of introducing a beam emitted from the integrated semiconductor laser device into the optical system also when optical axes are so adjusted as to introduce a beam emitted from either the emission region 414 or the emission region 424 into the prescribed region of the optical system. Consequently, it is so difficult to adjust the optical axis of the beam emitted from the integrated semiconductor laser device with respect to the optical system that the cost for the optical axis adjustment is disadvantageously increased.

SUMMARY OF THE INVENTION

The present invention has been proposed in order to solve the aforementioned problem, and an object of the present invention is to provide an integrated semiconductor laser device capable of improving the properties of a laser beam and reducing the cost for optical axis adjustment.

Another object of the present invention is to provide a method of fabricating an integrated semiconductor laser device capable of improving the properties of a laser beam and reducing the cost for optical axis adjustment.

In order to attain the aforementioned objects, an integrated semiconductor laser device according to a first aspect of the present invention comprises a first semiconductor laser element including a first emission region and having either a projecting portion or a recess portion and a second semiconductor laser element including a second emission region and having either a recess portion or a projecting portion. Either the projecting portion or the recess portion of the first semiconductor laser element is fitted to either the recess portion or the projecting portion of the second semiconductor laser element.

In the integrated semiconductor laser device according to the first aspect, as hereinabove described, either the projecting portion or the recess portion of the first semiconductor laser element is fitted to either the recess portion or the projecting portion of the second semiconductor laser element, whereby the first and second semiconductor laser elements bonded to each other can be inhibited from horizontal misregistration due to the fitting between the projecting and recess portions. Thus, the optical axes of beams emitted from the first and second semiconductor laser elements respectively can be inhibited from horizontal deviation, whereby the optical axis of a beam emitted from the integrated semiconductor laser device can be easily adjusted when the beam is introduced into an optical system formed by a lens and a mirror. Thus, the cost for optical axis adjustment can be reduced. Further, the first and second semiconductor laser elements bonded to each other can be so inhibited from horizontal misregistration that cleavage directions of the first and second semiconductor laser elements can be inhibited from deviating from each other. Thus, cleavability for simultaneously cleaving the first and second semiconductor laser elements bonded to each other can be improved. Consequently, the properties of laser beams emitted from a cleavage plane (light emission plane) can be improved.

In the aforementioned integrated semiconductor laser device according to the first aspect, the first emission region and the second emission region are preferably aligned substantially along the same line extending the direction of stacking of semiconductor layers. According to this structure, the interval between the first and second emission regions can be reduced as compared with a case where the first and second emission regions positionally deviate from each other in two directions, i.e., the direction (vertical direction) of stacking of the semiconductor layers and a direction (horizontal direction) perpendicular thereto. Thus, a beam emitted from either the second emission region or the first emission region can be inhibited from being incident on a region remarkably deviating from a prescribed region of the optical system when the beam emitted from the integrated semiconductor laser device is introduced into the optical system, if the optical axis is so adjusted as to introduce the beam emitted from either the first emission region or the second emission region into the prescribed region of the optical system. Consequently, the optical axis of the beam emitted from the integrated semiconductor laser device can be more easily adjusted with respect to the optical system, whereby the cost for optical axis adjustment can be further reduced.

In this case, the projecting portion and the recess portion are preferably so provided as to align the first emission region and the second emission region substantially along the same line extending the direction of stacking of the semiconductor layers. According to this structure, the first and second emission regions can be easily aligned substantially along the same line extending the direction of stacking of the semiconductor layers by fitting the projecting portion and the recess portion to each other.

In the aforementioned integrated semiconductor laser device according to the first aspect, the projecting portion and the recess portion are preferably formed to extend in a direction intersecting with a light emission plane. According to this structure, the length of a region where the projecting portion and the recess portion are fitted to each other is increased in the direction intersecting with the light emission plane, whereby the first and second semiconductor laser elements bonded to each other can be further inhibited from horizontal misregistration.

In the aforementioned integrated semiconductor laser device according to the first aspect, either the first semiconductor laser element or the second semiconductor laser element preferably further includes a first ridge portion constituting the projecting portion, and either the second semiconductor laser element or the first semiconductor laser element preferably includes the recess portion. According to this structure, the first and second semiconductor laser elements bonded to each other can be easily inhibited from horizontal misregistration due to the fitting between the first ridge portion and the recess portion by fitting the first ridge portion of either the first semiconductor laser element or the second semiconductor laser element into the recess portion of either the second semiconductor laser element or the first semiconductor laser element when bonding the first and second semiconductor laser elements to each other.

In this case, either the second semiconductor laser element or the first semiconductor laser element preferably further includes a second ridge portion and a current blocking layer formed to cover the side surfaces of the second ridge portion with a thickness larger than the height of the second ridge portion and an opening provided on a region corresponding to the second ridge portion, the opening of the current blocking layer preferably constitutes the recess portion of either the second semiconductor laser element or the first semiconductor laser element, and the first ridge portion constituting the projecting portion is preferably fitted in the opening of the current blocking layer constituting the recess portion. According to this structure, the first and second semiconductor laser elements bonded to each other can be further easily inhibited from horizontal misregistration due to the fitting between the first ridge portion and the opening of the current blocking layer by fitting the first ridge portion of either the first semiconductor laser element or the second semiconductor laser element into the opening of the current blocking layer of either the second semiconductor laser element or the first semiconductor laser element when bonding the first and second semiconductor laser elements to each other.

In the aforementioned integrated semiconductor laser device according to the first aspect, at least either the first semiconductor laser element or the second semiconductor laser element preferably further includes a substrate formed with the projecting portion or the recess portion. According to this structure, the projecting portion or the recess portion can be easily formed on at least either the first semiconductor laser element or the second semiconductor laser element.

In the aforementioned integrated semiconductor laser device according to the first aspect, the projecting portion is preferably so tapered that the width of the tapered end is smaller than the width of the base, and the recess portion is preferably so tapered that the width of the bottom is smaller than the width of the open end. According to this structure, the projecting portion can be easily fitted into the recess portion.

In the aforementioned integrated semiconductor laser device according to the first aspect, the projecting portion and the recess portion may be bonded to each other through a bonding layer to electrically conduct with each other. According to this structure, the projecting portion and the recess portion can be easily bonded to each other to electrically conduct with each other through the bonding layer.

In the aforementioned integrated semiconductor laser device according to the first aspect, the first semiconductor laser element may further include a first electrode arranged on the side closer to the second semiconductor laser element for supplying electric power to the first emission region, the second semiconductor laser element may further include a second electrode arranged on the side closer to the first semiconductor laser element for supplying electric power to the second emission region, and the first electrode and the second electrode may be electrically connected with each other. According to this structure, the first and second electrodes can be easily connected to a common electrode.

In the aforementioned structure having the first and second semiconductor laser elements including the first and second electrodes respectively, a contact hole extending in the direction of stacking of the semiconductor layers is preferably formed in a prescribed region of the second semiconductor laser element, and the first electrode and the second electrode are preferably electrically connected with an external device from the second semiconductor laser element side of the integrated semiconductor laser device through the contact hole. According to this structure, a voltage can be externally applied to the first and second electrodes through the contact hole also when the first and second semiconductor laser elements are stacked (integrated) with each other to oppose the first and second electrodes to each other.

In the aforementioned structure having the contact hole formed in the second semiconductor laser element, an extraction electrode electrically connected to the first electrode and the second electrode is preferably formed on the inner side surface of the contact hole. According to this structure, a voltage can be easily externally applied to the first and second electrodes through the extraction electrode.

In the aforementioned integrated semiconductor laser device according to the first aspect, the first semiconductor laser element may further include a first electrode arranged on the side closer to the second semiconductor laser element for supplying electric power to the first emission region, the second semiconductor laser element may further include a second electrode arranged on the side closer to the first semiconductor laser element for supplying electric power to the second emission region, and an insulating film may be arranged at least between the first electrode and the second electrode. According to this structure, the first and second electrodes can be electrically insulated from each other through the insulating film also when the first and second semiconductor laser elements are stacked (integrated) with each other to oppose the first and second electrodes to each other. Thus, different voltages can be applied to the first and second electrodes respectively by connecting different electrodes thereto. Further, an identical voltage can also be applied to the first and second electrodes by connecting a common electrode thereto. If the first and second electrodes are p-side electrodes and n-side electrodes of the first and second semiconductor laser elements are arranged on the side opposite to the bonding side, different voltages can be applied to the n-side electrodes of the first and second semiconductor laser elements respectively by connecting different electrodes thereto, and an identical voltage can also be applied to the n-side electrodes of the first and second semiconductor laser elements by connecting a common electrode thereto. Further, an identical voltage can also be applied to the p-side electrode (first electrode) of the first semiconductor laser element and the n-side electrode of the second semiconductor laser element by connecting a common electrode thereto. In addition, an identical voltage can also be applied to the n-side electrode of the first semiconductor laser element and the p-side electrode (second electrode) of the second semiconductor laser element by connecting a common electrode thereto. Thus, the flexibility can be improved in relation to methods of supplying electric power to the first and second emission regions of the first and second semiconductor laser elements. Consequently, the integrated semiconductor laser device can be used in diverse manners.

In the aforementioned structure having the insulating film arranged between the first and second electrodes of the first and second semiconductor laser elements, an opening is preferably formed on a prescribed region of the insulating film while a first contact hole extending in the direction of stacking of the semiconductor layers is preferably formed in a region of the second semiconductor laser element facing the opening of the insulating film, and the first electrode is preferably electrically connected with an external device from the second semiconductor laser element side of the integrated semiconductor laser device through the first contact hole and the opening of the insulating film. According to this structure, a voltage can be externally applied to the first electrode through the first contact hole and the opening of the insulating film despite the insulating film arranged between the first and second electrodes.

In the aforementioned structure having the first contact hole formed in the second semiconductor laser element, a first extraction electrode electrically connected to the first electrode is preferably formed on the inner side surface of the first contact hole. According to this structure, a voltage can be easily applied to the first electrode through the first extraction electrode.

In the aforementioned structure having the first contact hole formed in the second semiconductor laser element, a second contact hole extending in the direction of stacking of the semiconductor layers is preferably formed in a region of the second semiconductor laser element separated from the first contact hole at a prescribed interval, and the second electrode is preferably electrically connected with the external device from the second semiconductor laser element side of the integrated semiconductor laser device through the second contact hole. According to this structure, a voltage can be applied to the second electrode through the second contact hole, whereby different voltages can be applied to the first and second electrodes respectively by applying a voltage to the first electrode through the first contact hole.

In the aforementioned structure having the second contact hole formed in the second semiconductor laser element, a second extraction electrode electrically connected to the second electrode is preferably formed on the inner side surface of the second contact hole. According to this structure, a voltage can be easily externally applied to the second electrode through the second extraction electrode.

In the aforementioned structure having the insulating film arranged between the first and second electrodes of the first and second semiconductor laser elements, the integrated semiconductor laser device preferably further comprises a third semiconductor laser element including a third emission region and a third electrode arranged on the side closer to the first semiconductor laser element for supplying electric power to the third emission region, and the insulating film is preferably also arranged between the first electrode and the third electrode in addition to between the first electrode and the second electrode. According to this structure, the first and second electrodes can be insulated from each other while the first and third electrodes can also be insulated from each other through the insulating film also when the first, second and third semiconductor laser elements are stacked (integrated) with each other to oppose the first electrode, the second electrode and the third electrodes to each other in the integrated semiconductor laser device further comprising the third semiconductor laser element.

In this case, the second semiconductor laser element and the third semiconductor laser element are preferably formed on a common substrate. According to this structure, the first, second and third semiconductor laser elements can be stacked (integrated) with each other while suppressing horizontal misregistration between the first semiconductor laser element and the second semiconductor laser element as well as that between the first semiconductor laser element and the third semiconductor laser element.

In the aforementioned structure further comprising the third semiconductor element, a third contact hole extending in the direction of stacking of the semiconductor layers is preferably formed in the third semiconductor element, and the third electrode is preferably connected to the external device from the third semiconductor laser element side of the integrated semiconductor laser device through the third contact hole. According to this structure, a voltage can be applied to the third electrode through the third contact hole, whereby different voltages can be easily applied to the first electrode, the second electrode and the third electrode respectively by applying a voltage to the first electrode through the first contact hole while applying another voltage to the second electrode through the second contact hole.

In the aforementioned structure having the third contact hole formed in the third semiconductor laser element, a third extraction electrode electrically connected to the third electrode is preferably formed on the inner side surface of the third contact hole. According to this structure, a voltage can be easily externally applied to the third electrode through the third extraction electrode.

A method of fabricating an integrated semiconductor laser device according to a second aspect of the present invention comprises steps of bonding a first semiconductor laser element having either a projecting portion or a recess portion and a second semiconductor laser element having either a recess portion or a projecting portion to each other while fitting the projecting portion into the recess portion and simultaneously cleaving the first semiconductor laser element and the second semiconductor laser element bonded to each other.

In the method of an integrated semiconductor laser device according to the second aspect, as hereinabove described above, the first semiconductor laser element having either a projecting portion or a recess portion and the second semiconductor laser element having either a recess portion or a projecting portion are bonded to each other while the projecting portion is fitted into the recess portion and the first and second semiconductor laser elements bonded to each other are thereafter simultaneously cleaved so that the first and second semiconductor laser elements bonded to each other can be inhibited from horizontal misregistration due to the fitting between the projecting and recess portions. Thus, the optical axes of beams emitted from the first and second semiconductor laser elements respectively can be inhibited from horizontal deviation, whereby the optical axis of a beam emitted from the integrated semiconductor laser device can be easily adjusted when the beam is introduced into an optical system formed by a lens and a mirror. Thus, the cost for optical axis adjustment can be reduced. Further, the first and second semiconductor laser elements bonded to each other can be so inhibited from horizontal misregistration that cleavage directions of the first and second semiconductor laser elements can be inhibited from deviating from each other. Thus, cleavability for simultaneously cleaving the first and second semiconductor laser elements bonded to each other can be improved. Consequently, an integrated semiconductor laser device capable of improving the properties of a laser beam emitted from a cleavage plane (light emission plane) can be easily formed.

In the aforementioned method of fabricating an integrated semiconductor laser device according to the second aspect, the first semiconductor laser element preferably includes a first emission region, the second semiconductor laser element preferably includes a second emission region, and the step of bonding the first semiconductor laser element and the second semiconductor laser element to each other preferably includes a step of bonding the first semiconductor laser element and the second semiconductor laser element to each other for aligning the first emission region and the second emission region substantially along the same line extending the direction of stacking of semiconductor layers. According to this structure, the interval between the first and second emission regions can be reduced as compared with a case where the first and second emission regions positionally deviate from each other in two directions, i.e., the direction (vertical direction) of stacking of the semiconductor layers and a direction perpendicular thereto. Thus, a beam emitted from either the second emission region or the first emission region can be inhibited from being incident on a region remarkably deviating from a prescribed region of the optical system when the beam emitted from the integrated semiconductor laser device is introduced into the optical system, if the optical axis is so adjusted as to introduce the beam emitted from either the first emission region or the second emission region into the prescribed region of the optical system. Consequently, the optical axis of the beam emitted from the integrated semiconductor laser device can be more easily adjusted with respect to the optical system, whereby the cost for optical axis adjustment can be further reduced.

In the aforementioned structure having the first and second semiconductor laser elements including the first and second emission regions respectively, the first semiconductor laser element may further include a first electrode arranged on the side closer to the second semiconductor laser element for supplying electric power to the first emission region, the second semiconductor laser element may further include a second electrode arranged on the side closer to the first semiconductor laser element for supplying electric power to the second emission region, and the step of bonding the first semiconductor laser element and the second semiconductor laser element to each other may include a step of bonding the first semiconductor laser element and the second semiconductor laser element to each other through a bonding layer so that the first electrode and the second electrode electrically conduct with each other. According to this structure, electric power can be supplied to both of the first and second emission regions of the first and second semiconductor laser elements by applying a voltage to either the first electrode or the second electrode.

In the aforementioned structure having the first and second semiconductor laser elements including the first and second emission regions respectively, the first semiconductor laser element may further include a first electrode arranged on the side closer to the second semiconductor laser element for supplying electric power to the first emission region, the second semiconductor laser element may further include a second electrode arranged on the side closer to the first semiconductor laser element for supplying electric power to the second emission region, and the step of bonding the first semiconductor laser element and the second semiconductor laser element to each other may include a step of arranging an insulating film at least between the first electrode and the second electrode and bonding the first semiconductor laser element and the second semiconductor laser element to each other through the insulating film. According to this structure, the first and second electrodes can be electrically insulated from each other through the insulating film also when the first and second semiconductor laser elements are stacked (integrated) with each other to oppose the first and second electrodes to each other. Thus, different voltages can be applied to the first and second electrodes respectively, whereby the flexibility can be improved in relation to methods of supplying electric power to the first and second emission regions of the first and second semiconductor laser elements respectively. Consequently, the integrated semiconductor laser device can be used in diverse manners.

In the aforementioned case where the step of bonding the first and second semiconductor laser elements to each other includes the step of bonding the first and second semiconductor laser elements to each other through an insulating film, the integrated semiconductor laser device preferably further comprises a third semiconductor laser element, including a third emission region and a third electrode arranged on the side closer to the first semiconductor laser element for supplying electric power to the third emission region, formed on a substrate common to the second semiconductor laser element, and the step of bonding the first semiconductor laser element and the second semiconductor laser element to each other preferably includes a step of arranging the insulating film also between the third electrode and the first electrode in addition to between the first electrode and the second electrode and bonding the first semiconductor laser element and the second semiconductor laser element to each other through the insulating film while bonding the first semiconductor laser element and the third semiconductor laser element to each other through the insulating film. According to this structure, the first and second electrodes of the first and second semiconductor laser elements can be insulated from each other while the first and third electrodes of the first and third semiconductor laser elements can also be insulated from each other through the insulating film also when the first, second and semiconductor laser elements are stacked (integrated) with each other to oppose the first electrode, the second and the third electrode to each other in the integrated semiconductor laser device further comprising the third semiconductor laser element.

The foregoing and other objects, features, aspects and advantages of the present invention will become more apparent from the following detailed description of the present invention when taken in conjunction with the accompanying drawings.

DESCRIPTION OF THE PREFERRED
EMBODIMENTS

Embodiments of the present invention are now described with reference to the drawings.

First Embodiment

First, the structure of an integrated semiconductor laser device according to a first embodiment of the present invention is described with reference to FIGS. 1 and 2.

Figure 2:
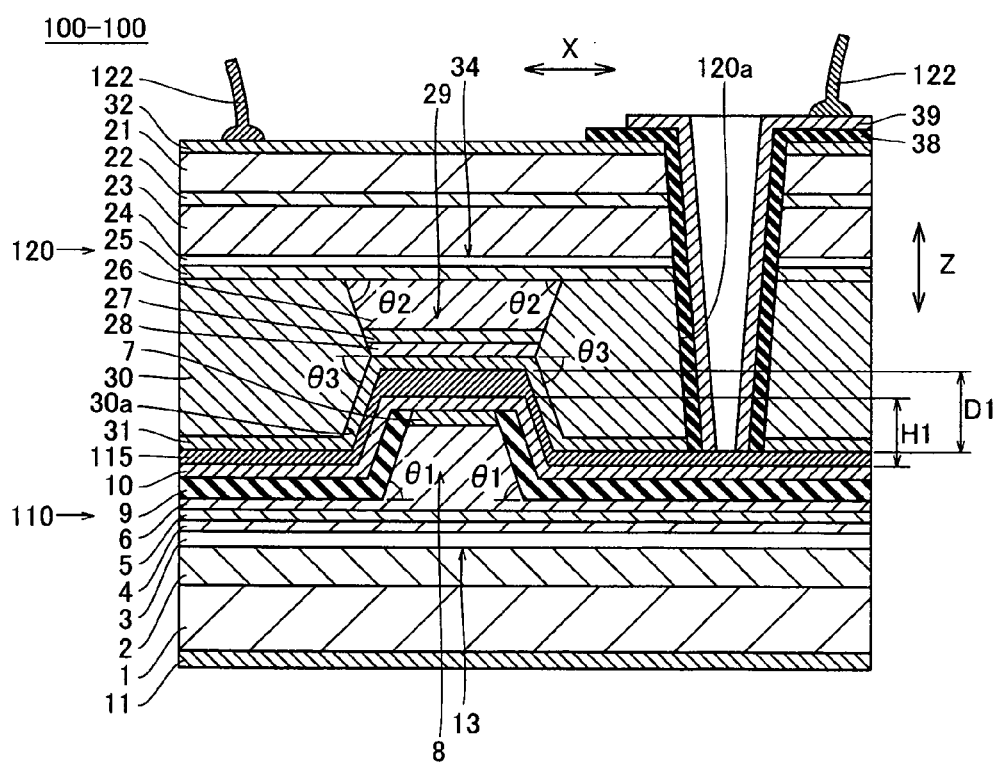
FIG. 2 is a sectional view taken along the line 100-100 in FIG. 1.

As shown in FIG. 2, the integrated semiconductor laser device according to the first embodiment is formed by stacking (integrating) a blue-violet laser element 110 having a registrational projecting portion and a red laser element 120 having a registrational recess portion with each other in a direction Z. The blue-violet laser element 110 and the red laser element 120 are examples of the "first semiconductor laser element" and the "second semiconductor laser element" in the present invention respectively.

The structure of the blue-violet laser element 110 according to the first embodiment is now described. In the blue-violet laser element 110 according to the first embodiment, an n-type cladding layer 2 of n-type AlGaN having a thickness of about 2.5 μm is formed on an n-type GaN substrate 1, as shown in FIG. 2. An active layer 3 having a thickness of about 70 nm is formed on the n-type cladding layer 2. This active layer 3 has a multiple quantum well (MQW) structure obtained by alternately stacking a plurality of well layers (not shown) of undoped InGaN and a plurality of barrier layers (not shown) of undoped InGaN with each other. A light guide layer 4 of undoped InGaN having a thickness of about 80 nm is formed on the active layer 3. A cap layer 5 of undoped AlGaN having a thickness of about 20 nm is formed on the light guide layer 4.

A p-type cladding layer 6 of p-type AlGaN having a projecting portion and remaining flat portions is formed on the cap layer 5. The flat portion of the p-type cladding layer 6 has a thickness of about 50 nm, and the projecting portion has a height of about 350 nm from the upper surfaces of the flat portions. A p-type contact layer 7 of p-type InGaN having a thickness of about 3 nm is formed on the projecting portion of the p-type cladding layer 6. The p-type contact layer 7 and the projecting portion of the p-type cladding layer 6 constitute a ridge portion 8.

According to the first embodiment, the ridge portion 8 has tapered side surfaces so that the width of the tapered end is smaller than that of the base. The side surfaces of the ridge portion 8 and the upper surface of the active layer 3 form an angle θ1 of about 70°. The tapered end of the ridge portion 8 has a width of about 1.5 μm. As shown in FIG. 1, the ridge portion 8 is in the form of a (slender) stripe extending in a direction Y perpendicular to light emission planes (cleavage planes) 12. This ridge portion 8 forms the registrational projecting portion. As shown in FIG. 2, a portion of the active layer 3 located under the ridge portion 8 and a peripheral portion of this portion of the active layer 3 form an emission region 13 of the blue-violet laser element 110. The ridge portion 8 is an example of the "projecting portion" or the "first ridge portion" in the present invention. The emission region 13 is an example of the "first emission region" in the present invention.

A current blocking layer 9 of $SiO_2$ having a thickness of about 200 nm is formed to cover the side surfaces of the ridge portion 8 and the upper surfaces of the flat portions of the p-type cladding layer 6. A p-side electrode 10 is formed on the current blocking layer 9, to be in contact with the upper surface of the ridge portion 8 (p-type contact layer 7). This p-side electrode 10 is formed by a Pd layer (not shown) having a thickness of about 100 nm and an Au layer (not shown) having a thickness of about 1 μm successively from the side closer to the n-type GaN substrate 1. The p-side electrode 10 is an example of the "first electrode" in the present invention. Thus, the registrational projecting portion constituted of the ridge portion 8 has a projection height H1 of about 153 nm between the upper surfaces of the portions of the p-side electrode 10 located on the upper surfaces of the flat portions of the p-type cladding layer 6 and the upper surface of the portion of the p-side electrode 10 located on the upper surface of the ridge portion 8.

An n-side electrode 11 is formed on the back surface of the n-type GaN substrate 1, as shown in FIG. 2. This n-side electrode 11 is formed by an Al layer (not shown) having a thickness of about 6 nm, a Pd layer (not shown) having a thickness of about 10 nm and an Au layer (not shown) having a thickness of about 300 nm successively from the side closer to the n-type GaN substrate 1.

The structure of the red laser element 120 according to the first embodiment is now described. The red laser element 120 shown in FIG. 2 has a downwardly directed ridge portion 29. In this red laser element 120, an n-type buffer layer 22 of n-type GaInP having a thickness of about 300 nm is formed on the surface of an n-type GaAs substrate 21 closer to the blue-violet laser element 110, as shown in FIG. 2. An n-type cladding layer 23 of n-type AlGaInP having a thickness of about 2 μm is formed on the surface of the n-type buffer layer 22 closer to the blue-violet laser element 110. An active layer 24 having a thickness of about 60 nm is formed on the surface of the n-type cladding layer 23 closer to the blue-violet laser element 110. This active layer 24 has an MQW structure obtained by alternately stacking a plurality of well layers (not shown) of undoped GaInP and a plurality of barrier layers (not shown) of undoped AlGaInP with each other.

A p-type first cladding layer 25 of p-type AlGaInP having a thickness of about 300 nm is formed on the surface of the active layer 24 closer to the blue-violet laser element 110. A projecting p-type second cladding layer 26 of p-type AlGaInP having a thickness of about 1.2 μm is formed on a prescribed region of the surface of the p-type first cladding layer 25 closer to the blue-violet laser element 110. A p-type intermediate layer 27 of p-type GaInP having a thickness of about 100 nm is formed on the surface of the p-type second cladding layer 26 closer to the blue-violet laser element 110. A p-type contact layer 28 of p-type GaAs having a thickness of about 300 nm is formed on the surface of the p-type intermediate layer 27 closer to the blue-violet laser element 110. The p-type contact layer 28, the p-type intermediate layer 27 and the p-type second cladding layer 26 constitute the ridge portion 29 having tapered side surfaces so that the width thereof is reduced from the base toward the tapered end. The side surfaces of the ridge portion 29 and the surface of the active layer 24 form an angle θ2 of about 60°. The tapered end of the ridge portion 29 has a width of about 2.7 μm. As shown in FIG. 1, the ridge portion 29 is in the form of a (slender) stripe extending in the direction Y perpendicular to the light emission planes (cleavage planes) 12. As shown in FIG. 2, a portion of the active layer 24 corresponding to the position formed with the ridge portion 29 and a peripheral portion of this portion of the active layer 24 form an emission region 34 of the red laser element 120. The ridge portion 29 is an example of the "second ridge portion" in the present invention. The emission region 34 is an example of the "second emission region" in the present invention.

According to the first embodiment, an n-type current blocking layer 30 having a thickness (about 2 μm) larger than the height (about 1.6 μm) of the ridge portion 29 is formed on the surface of the p-type first cladding layer 25 closer to the blue-violet laser element 110, to cover the side surfaces of the ridge portion 29. The n-type current blocking layer 30 has an opening 30a exposing the surface of the ridge portion 29 closer to the blue-violet laser element 110. The opening 30a of the n-type current blocking layer 30 has tapered inner side surfaces so that the width of the bottom (the width (about 2.7 μm) of the tapered end of the ridge portion 29) is smaller than the width (about 3 μm) of the open end. The inner side surfaces of the opening 30a of the n-type current blocking layer 30 and the surface of the active layer 24 form an angle θ3 of about 70°. As shown in FIG. 1, the opening 30a of the n-type current blocking layer 30 is in the form of a (slender) stripe extending in the direction Y along the ridge portion 29. The n-type current blocking layer 30 is formed by an n-type AlInP layer (not shown) and an n-type GaAs layer (not shown) successively from the side closer to the n-type GaAs substrate 21. The opening 30a of the n-type current blocking layer 30 forms a registrational recess portion. The n-type current blocking layer 30 is an example of the "current blocking layer" in the present invention, and the opening 30a is an example of the "recess portion" in the present invention.

As shown in FIG. 2, a p-side electrode 31 having a thickness of about 0.3 μm is formed to cover the surface of the n-type current blocking layer 30 closer to the blue-violet laser element 110 while being in contact with the surface of the ridge portion 29 (p-type contact layer 28) closer to the blue-violet laser element 110. This p-side electrode 31 is formed by an AuZn layer (not shown), a Pt layer (not shown) and an Au layer (not shown) successively from the side closer to the n-type GaAs substrate 21. The p-side electrode 31 is an example of the "second electrode" in the present invention. Thus, the registrational recess portion constituted of the opening 30a of the n-type current blocking layer 30 has a depth D1 of about 400 nm between portions of the surface of the p-side electrode 31 closer to the blue-violet laser element 110 located on regions other than that corresponding to the ridge portion 29 and a portion of the surface of the p-side electrode 31 closer to the blue-violet laser element 110 located on the region facing the ridge portion 29. In other words, the depth D1 (about 400 nm) of the registrational recess portion constituted of the opening 30a of the n-type current blocking layer 30 is larger than the projection height H1 (about 153 nm) of the registrational projecting portion constituted of the ridge portion 8. An n-side electrode 32 having a thickness of about 1 μm is formed on the surface of the n-type GaAs substrate 21 opposite to the blue-violet laser element 110. This n-side electrode 32 is formed by an AuGe layer (not shown), an Ni layer (not shown) and an Au layer (not shown) successively from the side closer to the n-type GaAs substrate 21.

A circular contact hole 120a is formed to pass through the n-side electrode 32, the n-type GaAs substrate 21, the semiconductor layers 22 to 25 and 30 and the p-side electrode 31 from the surface of the n-side electrode 32 opposite to the blue-violet laser element 110. This contact hole 120a has a tapered inner side surface so that the diameter of a portion closer to the p-side electrode 31 is smaller than the diameter of several 10 μm of a portion closer to the n-side electrode 32. An insulating film 38 of SiO₂ having a thickness of about 200 nm is formed on the inner side surface of the contact hole 120a and the surface, opposite to the blue-violet laser element 110, of a portion of the n-side electrode 32 located on a region close to the contact hole 120a. An extraction electrode 39 having a thickness of about 0.3 μm is formed on a prescribed region of the insulating film 38 to be electrically connected to a solder layer 115 described later through the contact hole 120a. This extraction electrode 39 is formed by a Ti layer (not shown), a Pt layer (not shown) and an Au layer (not shown) successively from the side closer to the n-type GaAs substrate 21. Wires (gold wires) 122 are bonded to the surfaces of the n-side electrode 32 and the extraction electrode 39 opposite to the blue-violet laser element 110 respectively.

According to the first embodiment, the blue-violet laser element 110 and the red laser element 120 are integrated (stacked) with each other in the direction Z while the registrational projecting portion constituted of the ridge portion 8 is fitted into the registrational recess portion constituted of the opening 30a of the n-type current blocking layer 30, as shown in FIG. 2. Further, the emission regions 13 and 34 of the blue-violet laser element 110 and the red laser element 120 are aligned with each other in the direction (direction Z shown in FIG. 2) of stacking of the semiconductor layers. The depth D1 (about 400 nm) of the registrational recess portion of the red laser element 120 is larger than the projection height H1 (about 153 nm) of the registrational projecting portion of the blue-violet laser element 110 as described above, whereby the interval between the upper surface of the registrational projecting portion of the blue-violet laser element 110 and the bottom surface of the registrational recess portion of the red laser element 120 is larger than the interval between the remaining regions of the blue-violet laser element 110 and the red laser element 120 other than the registrational projecting portion and the registrational recess portion. The registrational projecting portion of the blue-violet laser element 110 and the registrational recess portion of the red laser element 120 are bonded to each other through the solder layer 115 of Au—Sn. The solder layer 115 is an example of the "bonding layer" in the present invention. The p-side electrodes 10 and 31 of the blue-violet laser element 110 and the red laser element 120 are electrically connected to the extraction electrode 39 through the solder layer 115.

According to the first embodiment, as hereinabove described, the registrational projecting portion constituted of the ridge portion 8 of the blue-violet laser element 110 is fitted into the registrational recess portion constituted of the opening 30a of the n-type current blocking layer 30 of the red laser element 120, whereby the blue-violet laser element 110 and the red laser element 120 bonded to each other can be inhibited from horizontal misregistration (in the direction X shown in FIG. 2) due to the fitting between the registrational projecting portion and the registrational recess portion. Thus, the optical axes of beams emitted from the blue-violet laser element 110 and the red laser element 120 respectively can be inhibited from horizontal deviation (in the direction X shown in FIG. 2), whereby the optical axis of a beam emitted from the integrated semiconductor laser device can be easily adjusted when the beam is introduced into an optical system formed by a lens and a mirror. Thus, the cost for optical axis adjustment can be reduced. Further, the blue-violet laser element 110 and the red laser element 120 bonded to each other can be so inhibited from horizontal misregistration (in the direction X shown in FIG. 2) that cleavage directions of the blue-violet laser element 110 and the red laser element 120 can be inhibited from deviating from each other. Thus, cleavability for simultaneously cleaving the blue-violet laser element 110 and the red laser element 120 bonded to each other can be improved. Consequently, the properties of laser beams emitted from the light emission planes (cleavage planes) 12 can be improved.

According to the first embodiment, further, the emission regions 13 and 34 of the blue-violet laser element 110 and the red laser element 120 are aligned with each other in the direction (direction Z shown in FIG. 2) of stacking of the semiconductor layers, so that the interval between the emission regions 13 and 34 of the blue-violet laser element 110 and the red laser element 120 can be reduced as compared with a case where the emission regions 13 and 34 of the blue-violet laser element 110 and the red laser element 120 positionally deviate from each other in two directions, i.e., the direction (direction Z shown in FIG. 2) of stacking of the semiconductor layers and the horizontal direction (direction X shown in FIG. 2). Thus, the beam emitted from either the emission region 34 or the emission region 13 of the blue-violet laser element 110 can be inhibited from being incident on a region remarkably deviating from a prescribed region of the optical system when the beam emitted from the integrated semiconductor laser device is introduced into the optical system, if the optical axis is so adjusted as to introduce the beam emitted from either the emission region 13 of the blue-violet laser element 110 or the emission region 34 of the red laser element 120 into the prescribed region of the optical system. Consequently, the optical axis of the beam emitted from the integrated semiconductor laser device can be more easily adjusted with respect to the optical system, whereby the cost for optical axis adjustment can be further reduced.

According to the first embodiment, further, the registrational projecting portion (ridge portion 8) of the blue-violet laser element 110 is in the form of a (slender) stripe extending in the direction (direction Y shown in FIG. 1) perpendicular to the light emission planes 12 while the registrational recess portion (opening 30a of the n-type current blocking layer 30) of the red laser element 120 is also in the form of a (slender) stripe extending in the direction (direction Y shown in FIG. 1) perpendicular to the light emission planes 12, thereby increasing the length of the region where the registrational projecting portion is fitted in the registrational recess portion in the direction (direction Y shown in FIG. 1) perpendicular to the light emission planes 12. Thus, the blue-violet laser element 110 and the red laser element 120 bonded to each other can be further inhibited from horizontal misregistration in the direction X shown in FIG. 1.

According to the first embodiment, further, the registrational projecting portion (ridge portion 8) of the blue-violet laser element 110 is so tapered that the width of the tapered end is smaller than that of the base while the registrational recess portion (opening 30a of the n-type current blocking layer 30) of the red laser element 120 is so tapered that the width of the bottom is smaller than that of the open end, whereby the registrational projecting portion can be easily fitted into the registrational recess portion.

According to the first embodiment, further, the registrational projecting portion of the blue-violet laser element 110 and the registrational recess portion of the red laser element 120 are bonded to each other through the solder layer 115, whereby the registrational projecting portion of the blue-violet laser element 110 and the registrational recess portion of the red laser element 120 can be bonded to each other through the solder layer 115 to electrically conduct with each other.

According to the first embodiment, further, the interval between the upper surface of the registrational projecting portion of the blue-violet laser element 110 (portion corresponding to the ridge portion 8) and the bottom surface of the registrational recess portion of the red laser element 120 (portion corresponding to the ridge portion 29) is larger than that between the remaining regions of the blue-violet laser element 110 and the red laser element 120 other than the registrational projecting portion and the registrational recess portion, whereby the upper surface of the registrational projecting portion (portion corresponding to the ridge portion 8) and the bottom surface of the registrational recess portion (portion corresponding to the ridge portion 29) can be inhibited from being in contact with each other also when the remaining regions of the blue-violet laser element 110 and the red laser element 120 other than the registrational projecting portion and the registrational recess portion are in contact with each other. Thus, the ridge portions 8 and 29 can be inhibited from receiving stress and damage when the registrational projecting portion of the blue-violet laser element 110 and the registrational recess portion of the red laser element 120 are bonded to each other.

According to the first embodiment, further, the n-type current blocking layer 30 including the n-type GaAs layer is employed as the current blocking layer of the red laser element 120, whereby heat radiation capacity of the integrated semiconductor laser device can be improved due to excellent heat radiation capacity of the n-type GaAs layer.

According to the first embodiment, further, the p-side electrodes 10 and 31 of the blue-violet laser element 110 and the red laser element 120 are electrically connected with each other through the solder layer 115, so that the p-side electrodes 10 and 31 of the blue-violet laser element 110 and the red laser element 120 can be easily connected to a common anode.

According to the first embodiment, further, the contact hole 120a is formed on the red laser element 120 while the p-side electrodes 10 and 31 of the blue-violet laser element 110 and the red laser element 120 are connected to the external device through the contact hole 120a, whereby a voltage can be externally applied to the p-side electrodes 10 and 31 of the blue-violet laser element 110 and the red laser element 120 through the contact hole 120a also when the blue-violet laser element 110 and the red laser element 120 are stacked (integrated) with each other to oppose the p-side electrodes 10 and 31 of the blue-violet laser element 110 and the red laser element 120 to each other.

According to the first embodiment, further, the extraction electrode 39 electrically connected with the p-side electrodes 10 and 31 of the blue-violet laser element 110 and the red laser element 120 is formed on the inner side surface of the contact hole 120a, whereby a voltage can be easily externally applied to the p-side electrodes 10 and 31 of the blue-violet laser element 110 and the red laser element 120 through the extraction electrode 39.

According to the first embodiment, further, the projecting portion is constituted of the ridge portion 8 of the blue-violet laser element 110 while the recess portion is formed on the region close to the ridge portion 29 of the red laser element 120, whereby the interval between the emission regions 13 and 120 of the blue-violet laser element 110 and the red laser element 120 can be further reduced by fitting the projecting portion of the blue-violet laser element 110 and the recess portion of the red laser element 120 to each other.

A fabrication process for the integrated semiconductor laser device according to the first embodiment is now described with reference to FIGS. 1 to 28.

Figure 3:
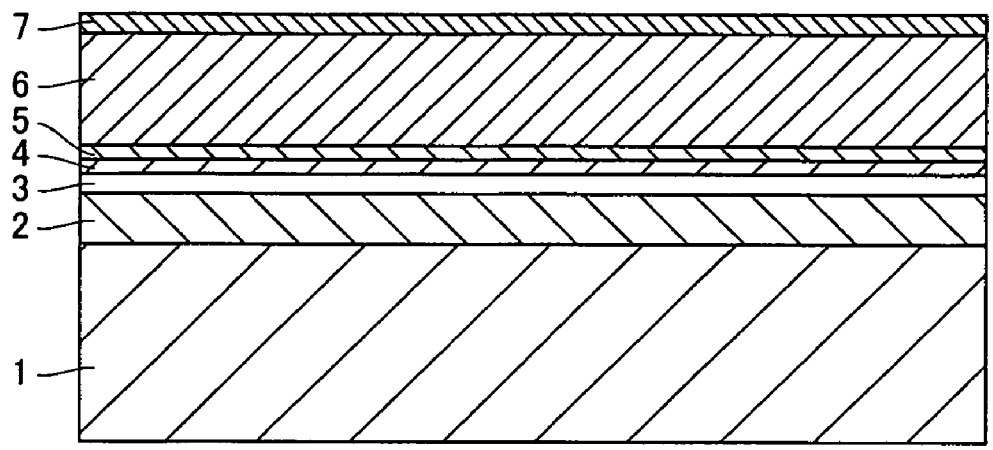
FIGS. 3 to 9 are sectional views for illustrating a fabrication process for the integrated semiconductor laser device according to the first embodiment shown in FIGS. 1 and 2.

According to the first embodiment, the blue-violet laser element 110 is formed through steps shown in FIGS. 3 to 13, while the red laser element 120 is formed through steps shown in FIG. 14 to 26. In order to form the blue-violet laser element 110, the respective semiconductor layers constituting the blue-violet laser element 110 are grown on the n-type GaN substrate 1, as shown in FIG. 3. More specifically, the n-type cladding layer 2 of n-type AlGaN having the thickness of about 2.5 µm is grown on the n-type GaN substrate 1 having the thickness of about 400 µm by metal organic chemical vapor deposition (MOCVD), and the active layer 3 having the thickness of about 70 nm is thereafter grown on the n-type cladding layer 2. This active layer 3 is grown by alternately growing the plurality of well layers (not shown) of undoped InGaN and the plurality of barrier layers (not shown) of undoped InGaN. Thus, the active layer 3 having the MQW structure obtained by alternately stacking the plurality of well layers and the plurality of barrier layers with each other is formed on the n-type cladding layer 2.

Then, the light guide layer 4 of undoped InGaN having the thickness of about 80 nm and the cap layer 5 of undoped AlGaN having the thickness of about 20 nm are successively grown on the active layer 3. Thereafter the p-type cladding layer 6 of p-type AlGaN having the thickness of about 400 nm and the p-type contact layer 7 of p-type InGaN having the thickness of about 3 nm are successively grown on the cap layer 5.

Figure 4:
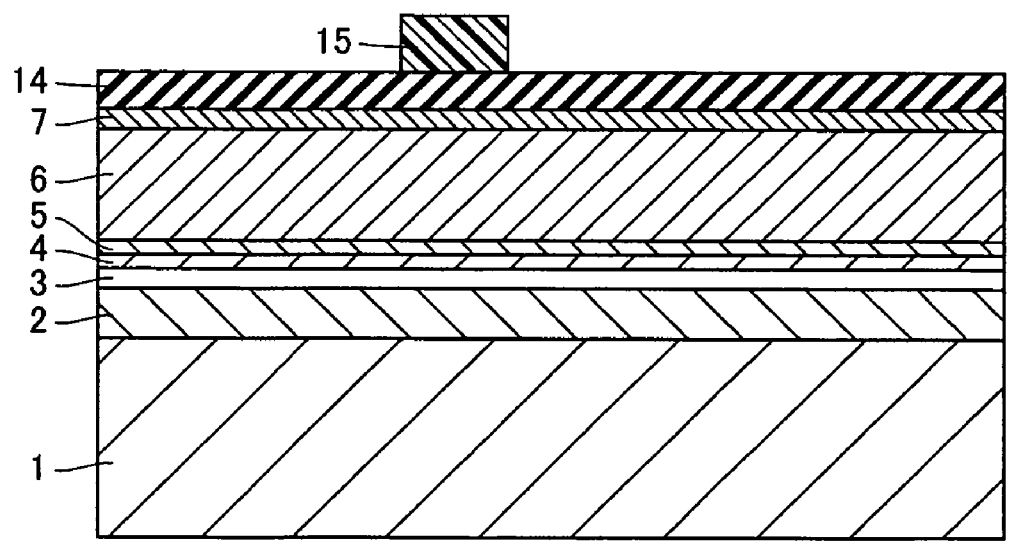

Then, an $SiO_2$ film 14 having a thickness of about 240 nm is formed on the p-type contact layer 7 by plasma CVD, as shown in FIG. 4. Thereafter a striped (slender) resist film 15 having a thickness of about 1.5 μm is formed on a region of the $SiO_2$ film 14 corresponding to the ridge portion 8 (see FIG. 2).

Figure 5:
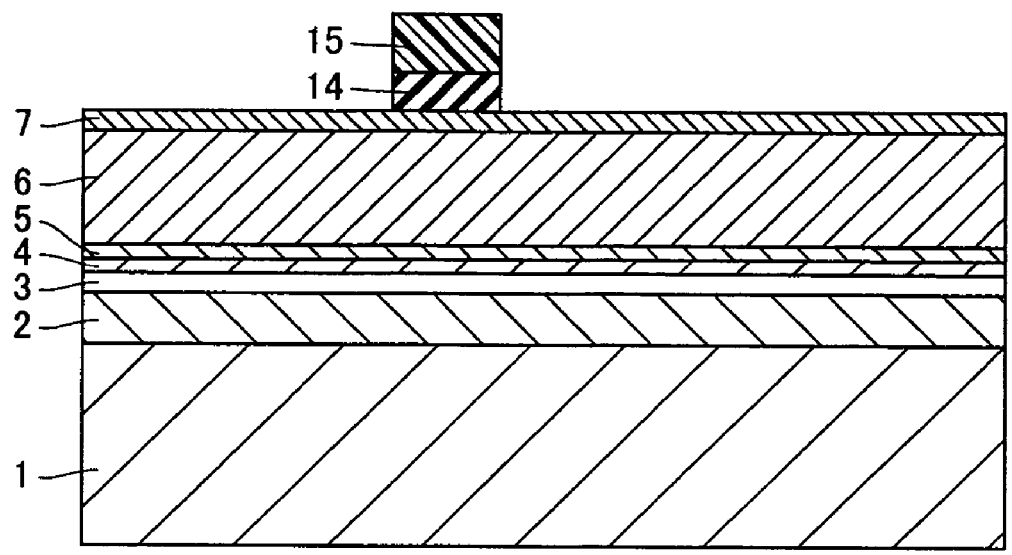

As shown in FIG. 5, the $SiO_2$ film 14 is etched through a mask of the resist film 15 by reactive ion etching (RIE) with $CF_4$ gas. Thereafter the resist film 15 is removed.

Figure 6:
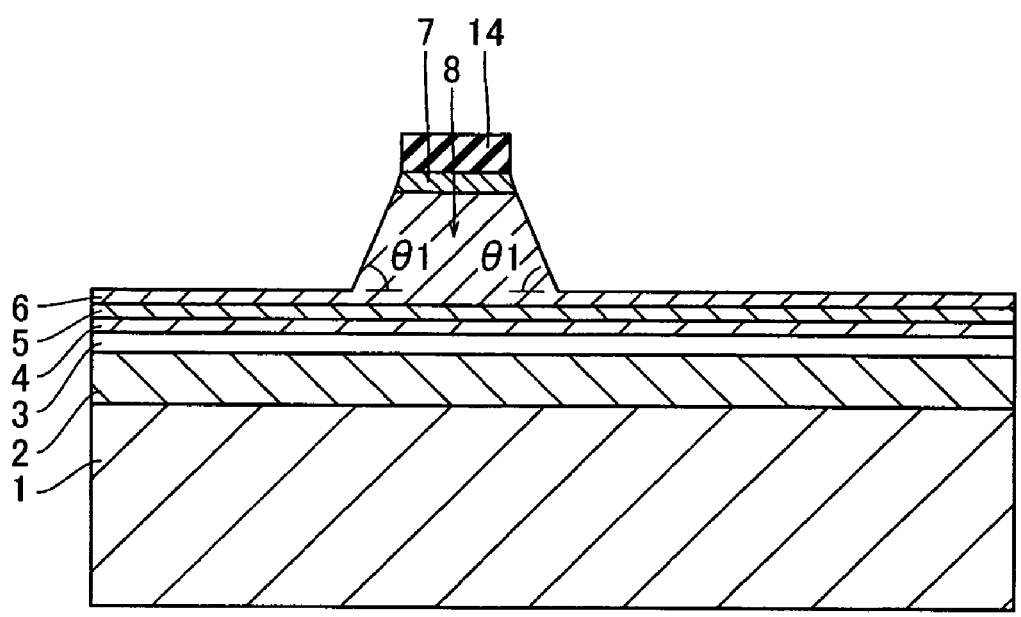

As shown in FIG. 6, a portion between the upper surface of the p-type contact layer 7 and an intermediate portion of the p-type cladding layer 6 at a depth of about 350 nm from the upper surface thereof is etched through a mask of the $SiO_2$ film 14 by RIE with chlorine gas. Thus, the ridge portion 8 is constituted of the projecting portion of the p-type cladding layer 6 and the p-type contact layer 7. At this time, the ridge portion 8 is formed to have the tapered side surfaces so that the width of the tapered end is smaller than that of the base. The side surfaces of the ridge portion 8 and the upper surface of the active layer 3 (p-type cladding 6) form the angle θ1 of about 70°, and the tapered end of the ridge portion 8 has the width of about 1.5 μm. Further, the ridge portion 8 is in the form of a (slender) stripe extending in the direction perpendicular to the light emission planes 12, as shown in FIG. 1. This ridge portion 8 forms the registrational projecting portion. Thereafter the $SiO_2$ film 14 is removed.

Figure 7:
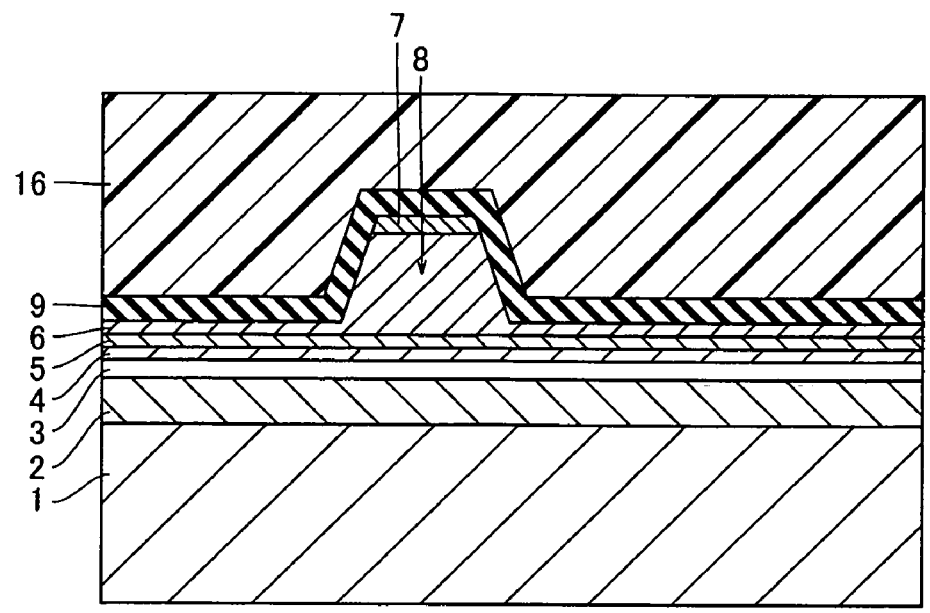

As shown in FIG. 7, the current blocking layer 9 of $SiO_2$ having the thickness of about 200 nm is formed by plasma CVD, to cover the overall surface. Thereafter another resist film 16 is formed to cover the overall surface.

Figure 8:
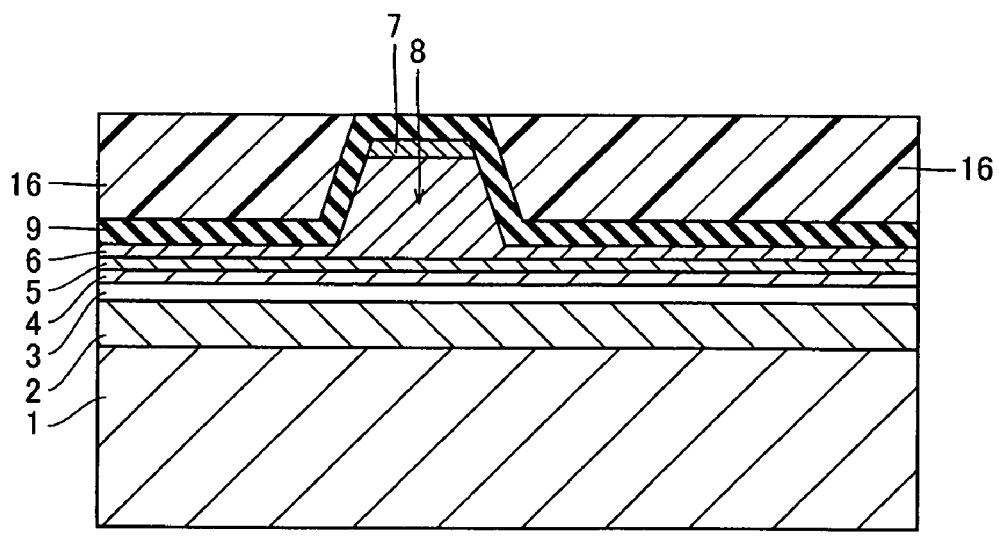
Figure 9:
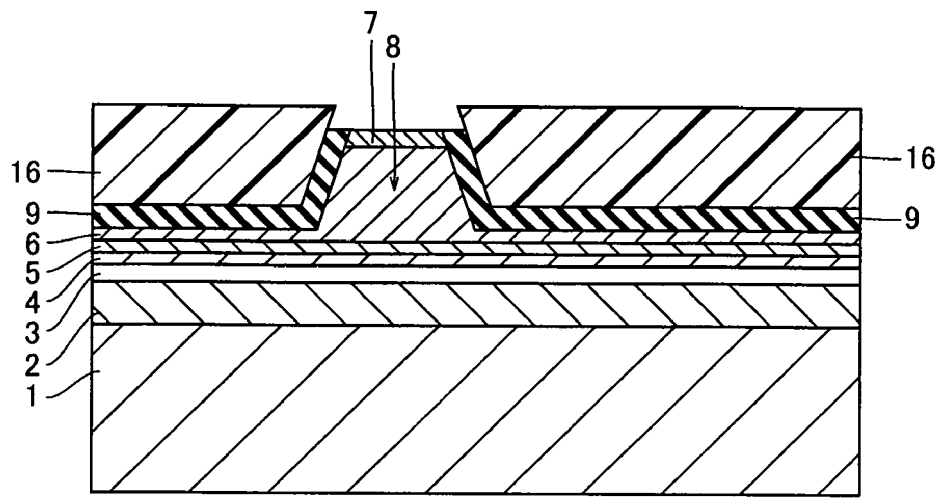

As shown in FIG. 8, the resist film 16 is etched back along the overall region by plasma etching with oxygen gas to be reduced in thickness, thereby exposing the surface of the portion of the current blocking layer 9 located on the upper surface of the ridge portion 8. Thus, the upper surface of the ridge portion 8 is exposed as shown in FIG. 9. Thereafter the resist film 16 is removed.

Figure 10:
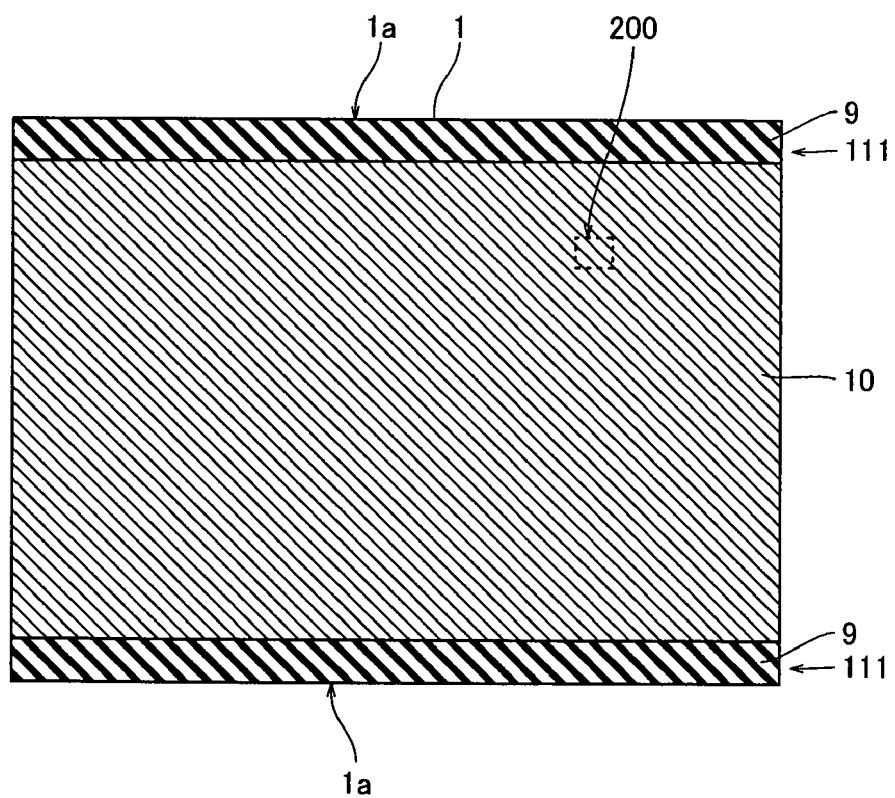
FIG. 10 is a plan view for illustrating the fabrication process for the integrated semiconductor laser device according to the first embodiment shown in FIGS. 1 and 2.
Figure 11:
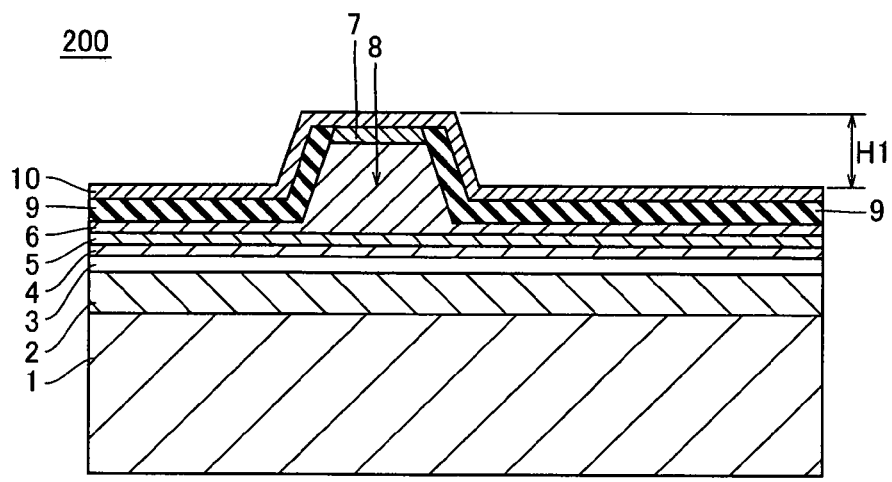
FIG. 11 is a sectional view of a region 200 enclosed with a broken line in FIG. 10.
Figure 12:
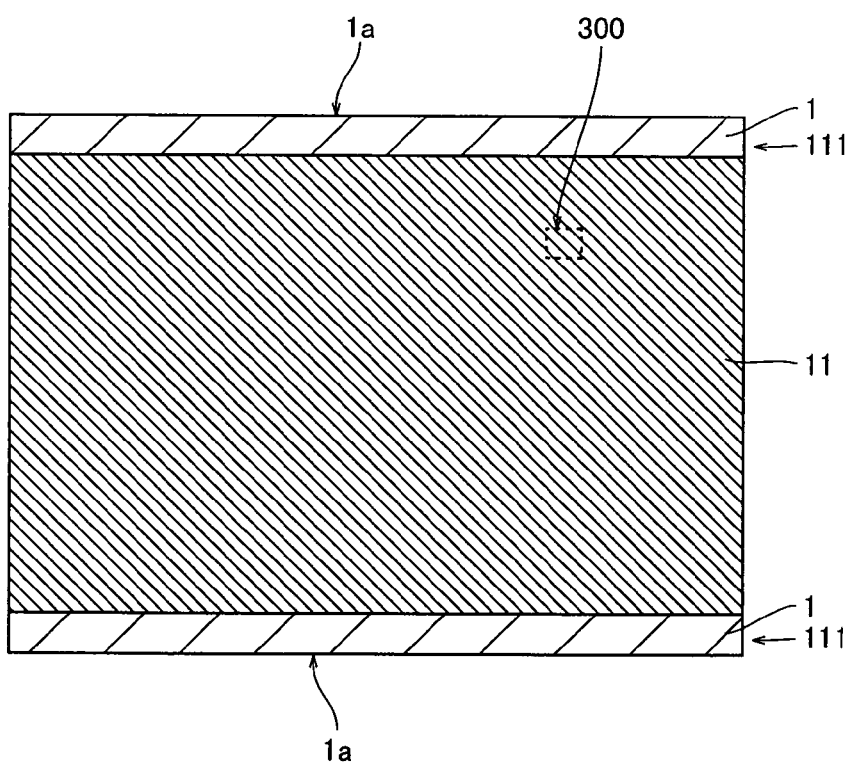
FIG. 12 is a plan view for illustrating the fabrication process for the integrated semiconductor laser device according to the first embodiment shown in FIGS. 1 and 2.

As shown in FIG. 11, the p-side electrode 10 is formed on the current blocking layer 9 by electron beam evaporation, to be in contact with the upper surface of the ridge portion 8 (p-type contact layer 7). At this time, the Pd layer (not shown) having the thickness of about 100 nm and the Au layer (not shown) having the thickness of about 1 μm are successively formed. Thus, the registrational projecting portion constituted of the ridge portion 8 has the height H1 of about 153 nm between the upper surfaces of the portions of the p-side electrode 10 located on the upper surfaces of the flat portions of the p-type cladding layer 6 and the upper surface of the portion of the p-side electrode 10 located on the upper surface of the ridge portion 8. As shown in FIG. 10, ends of the p-side electrode 10 located on the sides closer to end surfaces 1a of the n-type GaN substrate 1 parallel to the light emission planes 12 (see FIG. 1) are arranged on regions separated from the end surfaces 1a of the n-type GaN substrate 1 at a prescribed interval.

Figure 13:
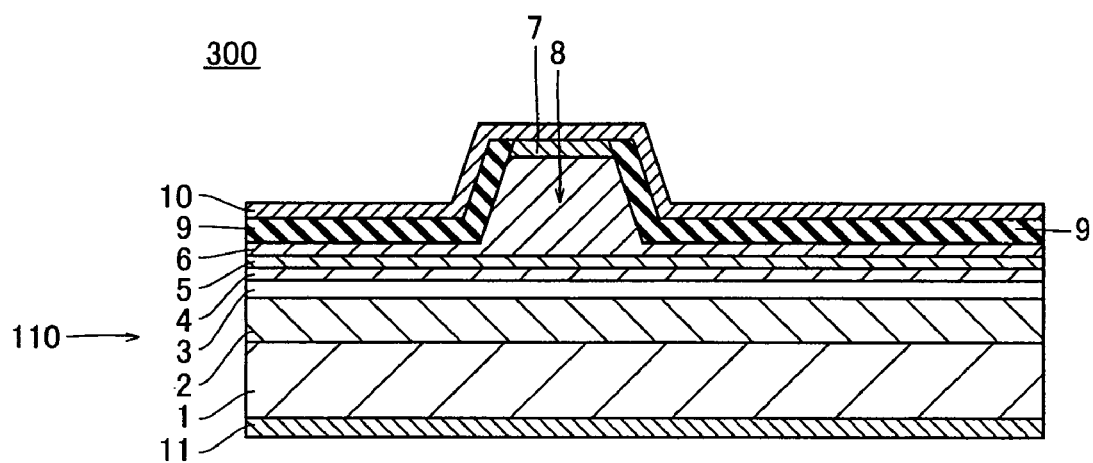
FIG. 13 is a sectional view of a region 300 enclosed with a broken line in FIG. 12.

As shown in FIG. 13, the back surface of the n-type GaN substrate 1 is polished so that the thickness between the upper surface of the ridge portion 8 and the back surface of the n-type GaN substrate 1 is about 150 μm. Thereafter the n-side electrode 11 is formed on the back surface of the n-type GaN substrate 1 by electron beam evaporation. At this time, the Al layer (not shown) having the thickness of about 6 nm, the Pd layer (not shown) having the thickness of about 10 nm and the Au layer (not shown) having the thickness of about 300 nm are successively formed. Further, ends of the n-side electrode 11 located on the sides closer to the end surfaces 1a of the n-type GaN substrate 1 parallel to the light emission planes 12 (see FIG. 1) are arranged on regions separated from the end surfaces 1a of the n-type GaN substrate 1 at a prescribed interval. Thus, regions not provided with the p- and n-side electrodes 10 and 11 form transparent regions 111 allowing visual recognition of the ridge portion 8 of the blue-violet laser element 110 from above or below the same. The blue-violet laser element 110 according to the first embodiment is formed in this manner.

Figure 14:
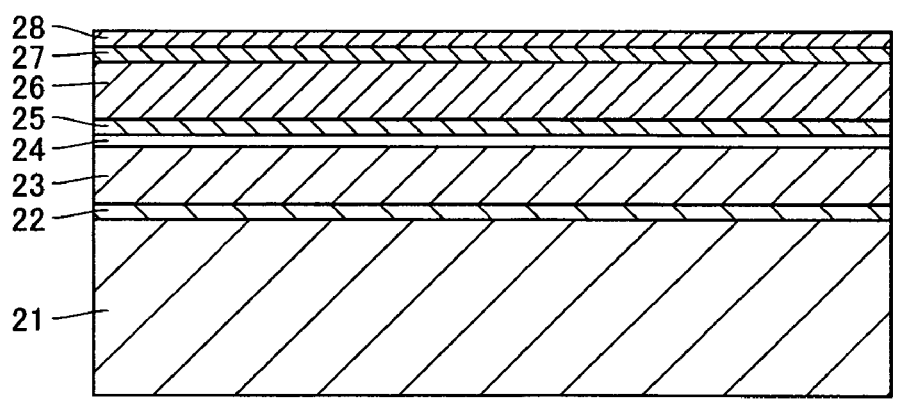
FIGS. 14 to 28 are sectional views for illustrating the fabrication process for the integrated semiconductor laser device according to the first embodiment shown in FIGS. 1 and 2.

In order to form the red laser element 120, the semiconductor layers constituting the red laser element 120 are grown on the n-type GaAs substrate 21, as shown in FIG. 14. More specifically, the n-type buffer layer 22 of n-type GaInP having the thickness of about 300 nm is grown on the n-type GaAs substrate 21 by MOCVD, and the n-type cladding layer 23 of n-type AlGaInP having the thickness of about 2 μm is thereafter grown on the n-type buffer layer 22. Thereafter the active layer 24 having the thickness of about 60 nm is grown on the n-type cladding layer 23. The active layer 24 is grown by alternately growing the plurality of well layers (not shown) of undoped GaInP and the plurality of barrier layers (not shown) of undoped AlGaInP. Thus, the active layer 24 having the MQW structure obtained by alternately stacking the plurality of well layers and the plurality of barrier layers with each other is formed on the n-type cladding layer 23.

Then, the p-type first cladding layer 2 of p-type AlGaInP having the thickness of about 300 nm and the p-type second cladding layer 26 of p-type AlGaInP having the thickness of about 1.2 μm are successively grown on the active layer 24. Then, the p-type intermediate layer 27 of p-type GaInP having the thickness of about 100 nm is grown on the p-type second cladding layer 26, and the p-type contact layer 28 of p-type GaAs having the thickness of about 300 nm is thereafter grown on the p-type intermediate layer 27.

Figure 15:
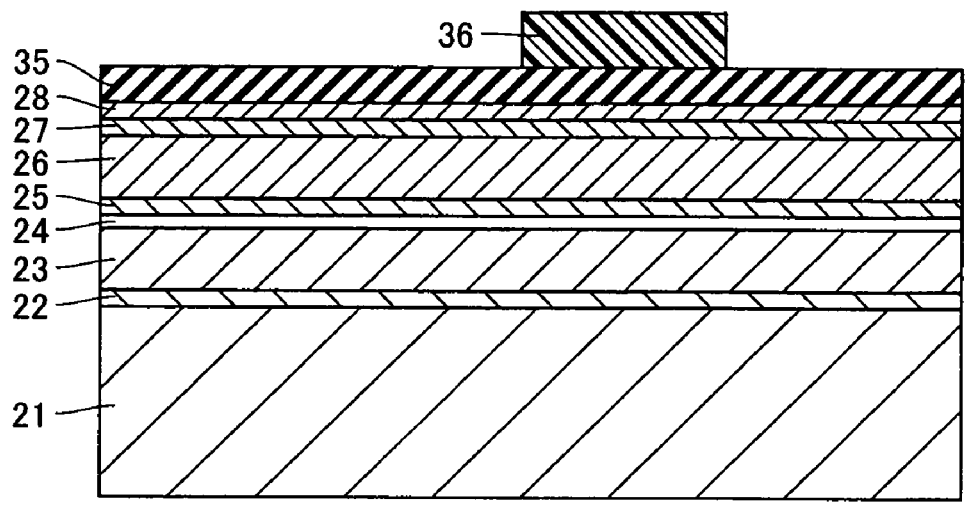

As shown in FIG. 15, an $SiO_2$ film 35 having a thickness of about 240 nm is formed on the p-type contact layer 28 by sputtering, vacuum evaporation or electron beam evaporation. Thereafter a striped (slender) resist film 36 having a thickness of about 2.7 μm is formed on a region of the $SiO_2$ film 35 corresponding to the ridge portion 29 (see FIG. 2).

Figure 16:
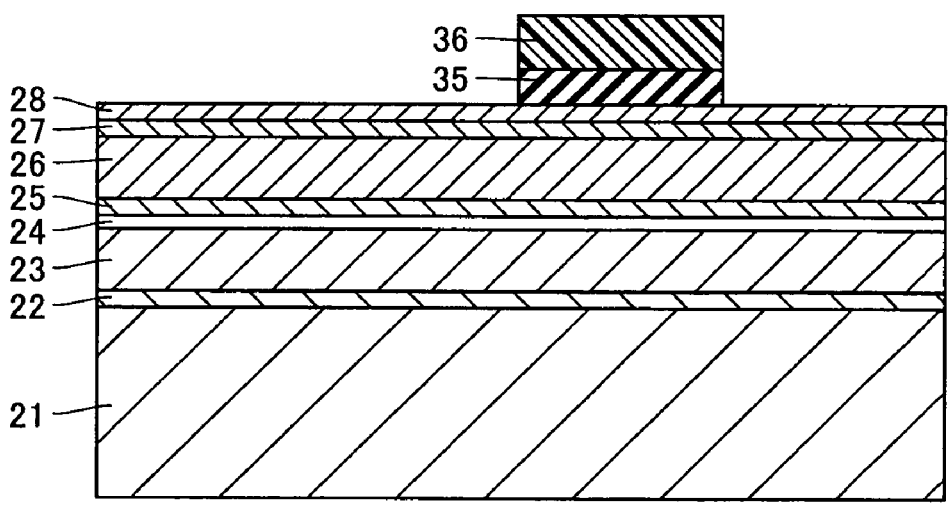

As shown in FIG. 16, the $SiO_2$ film 35 is etched through a mask of the resist film 36 by wet etching with buffered hydrofluoric acid. Thereafter the resist film 36 is removed.

Figure 1:
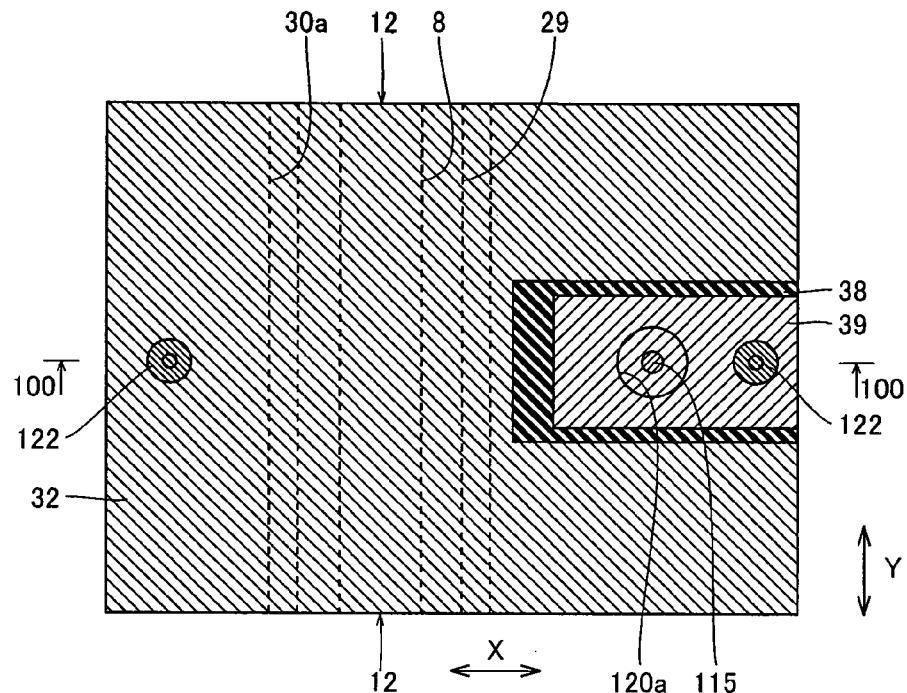
FIG. 1 is a plan view showing the structure of an integrated semiconductor laser device according to a first embodiment of the present invention.
Figure 17:
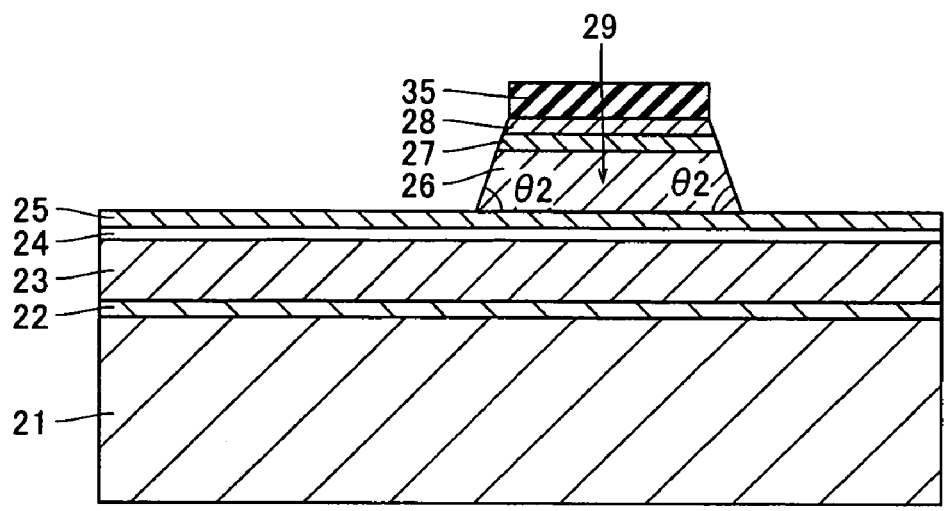

As shown in FIG. 17, a portion between the upper surfaces of the p-type contact layer 28 and the p-type first cladding layer 25 is etched through a mask of the $SiO_2$ film 35 by wet etching with a tartaric acid etching solution or a phosphoric acid etching solution. Thus, the ridge portion having the tapered side surfaces is constituted of the p-type contact layer 28, the p-type intermediate layer 27 and the p-type second cladding layer 26. The side surfaces of the ridge portion 29 and the upper surface of the active layer 24 (p-type first cladding layer 25) form the angle θ2 of about 60°, and the tapered end of the ridge portion 29 has the width of about 2.7 μm. Further, the ridge portion 29 is in the form of a (slender)

stripe extending in the direction Y perpendicular to the light emission planes 12, as shown in FIG. 1.

Figure 18:
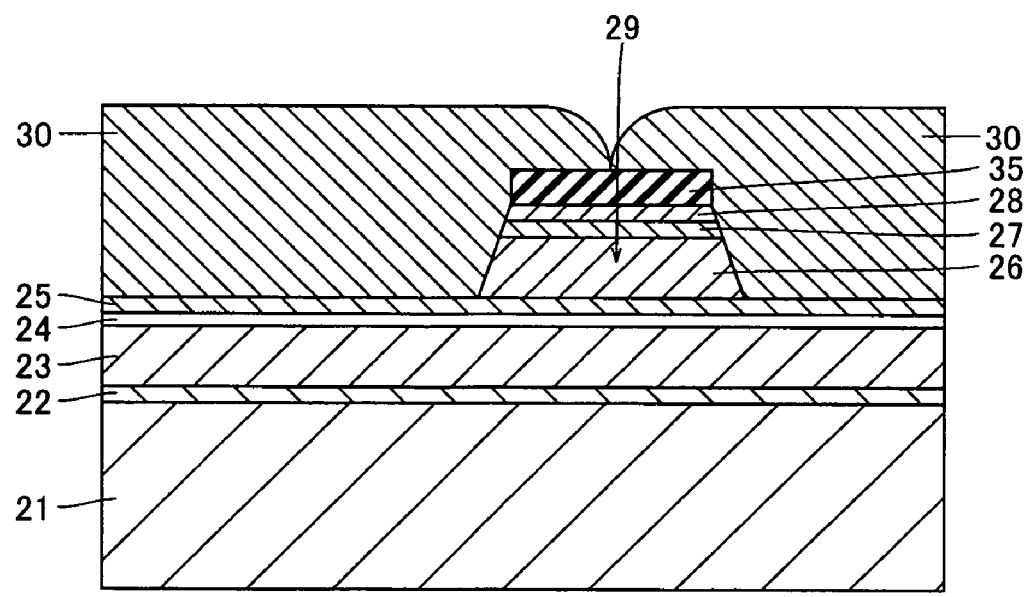

As shown in FIG. 18, the n-type current blocking layer 30 having the thickness of about 2 μm is formed on the overall surface by MOCVD through the SiO$_2$ film 35 serving as a selective growth mask. At this time, the n-type AlInP layer (not shown) and the n-type GaAs layer (not shown) are successively formed. The n-type current blocking layer 30 is selectively grown on the upper surface of the p-type first cladding layer 25, and thereafter laterally grown to cover the SiO$_2$ film 35.

Figure 19:
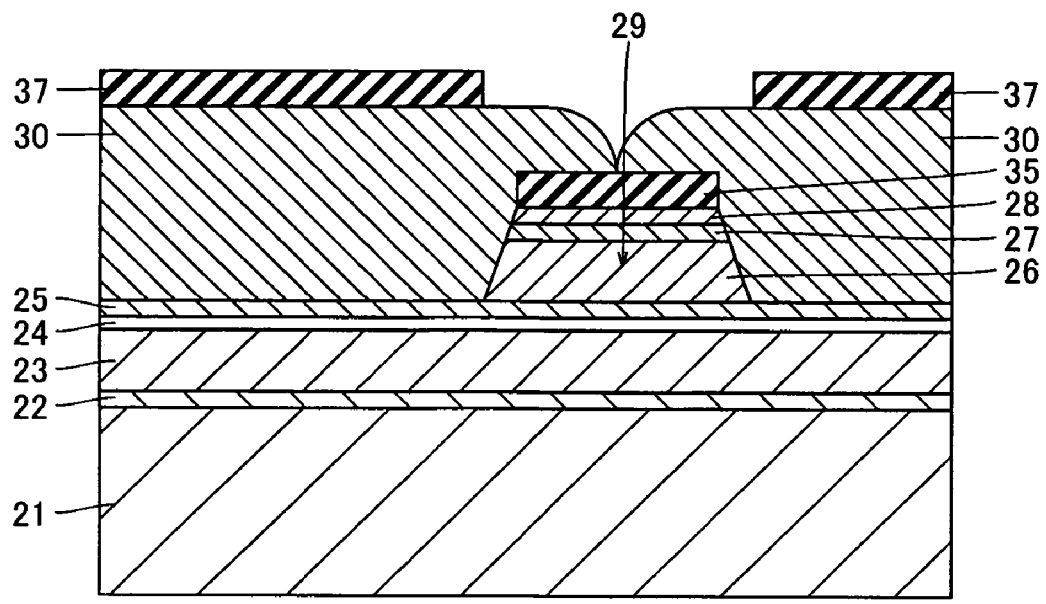
Figure 20:
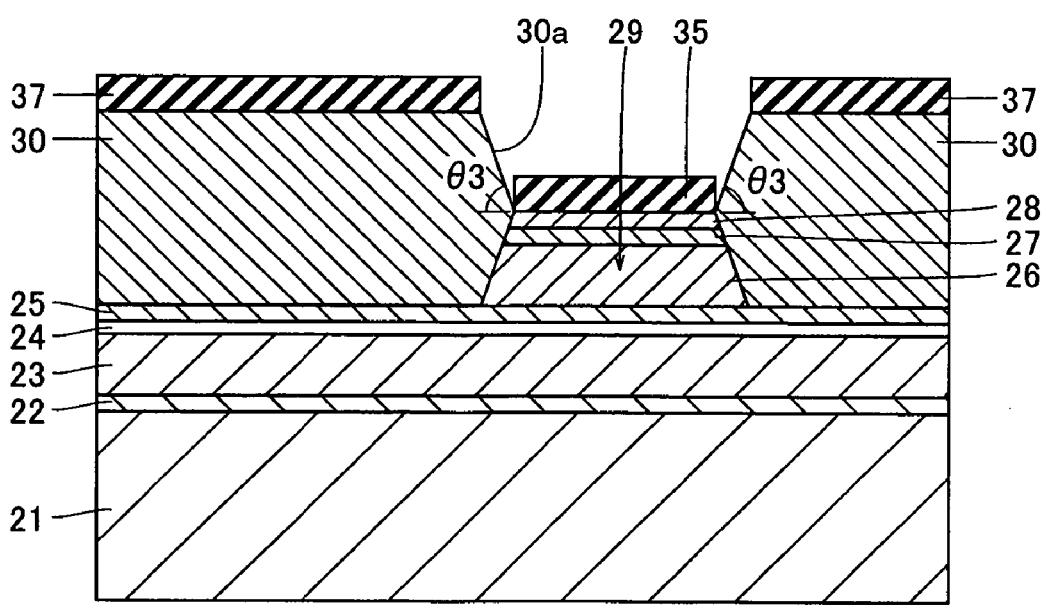

As shown in FIG. 19, another striped (slender) SiO$_2$ film 37 having a thickness of about 240 nm is formed on a region of the n-type current blocking layer 30 other than that corresponding to the opening 30a (see FIG. 2) by plasma CVD. Then, a portion of the n-type current blocking layer 30 located upward beyond the upper surface of the ridge portion 29 is etched through a mask of the SiO$_2$ film 37 by wet etching with a phosphoric acid etching solution. Thus, the n-type current blocking layer 30 is formed with the opening 30a exposing the upper surface of the ridge portion 29 (SiO$_2$ film 35), as shown in FIG. 20. At this time, the opening 30a of the n-type current blocking layer 30 is formed to have the tapered inner side surfaces so that the width of the bottom is smaller than that of the open end. The inner side surfaces of the opening 30a of the n-type current blocking layer 30 and the upper surface of the active layer 24 (p-type contact layer 28) form the angle θ3 of about 70°. The widths of the open end and the bottom of the opening 30a of the n-type current blocking layer 30 are about 3 μm and about 2.7 μm respectively. Further, the opening 30a of the n-type current blocking layer 30 is in the form of a (slender) stripe extending along the ridge portion 29, as shown in FIG. 1. This opening 30a of the n-type current blocking layer 30 forms the registrational recess portion. Thereafter the SiO$_2$ films 35 and 37 are removed.

Figure 21:
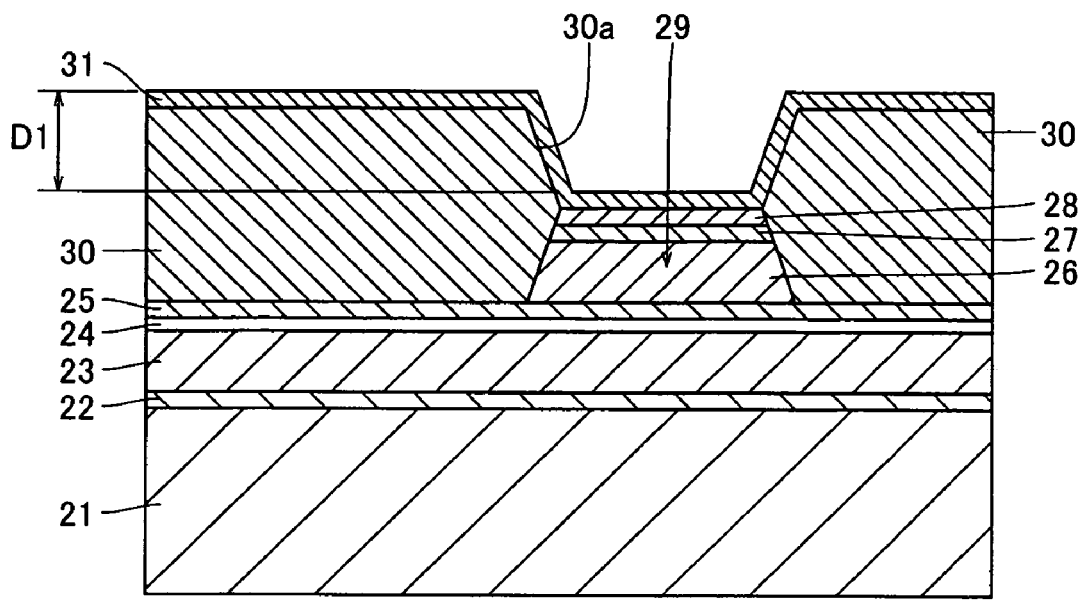

As shown in FIG. 21, the p-side electrode 31 having the thickness of about 0.3 μm is formed on the n-type current blocking layer 30 by electron beam evaporation, to be in contact with the upper surface of the ridge portion 29 (p-type contact layer 28). At this time, the AuZn layer (not shown) and the Pt layer (not shown) are successively formed. Thus, the registrational recess portion constituted of the opening 30a of the n-type current blocking layer 30 has the depth D1 of about 400 nm between the upper surfaces of the portions of the p-side electrode 31 located on the upper surfaces of the current blocking layer 30 and the ridge portion 29 respectively. In other words, the depth D1 (about 400 nm) of the registrational recess portion constituted of the opening 30a of the n-type current blocking layer 30 is larger than the projection height H1 (about 153 nm) (see FIG. 2) of the registrational projecting portion constituted of the ridge portion 8.

Figure 22:
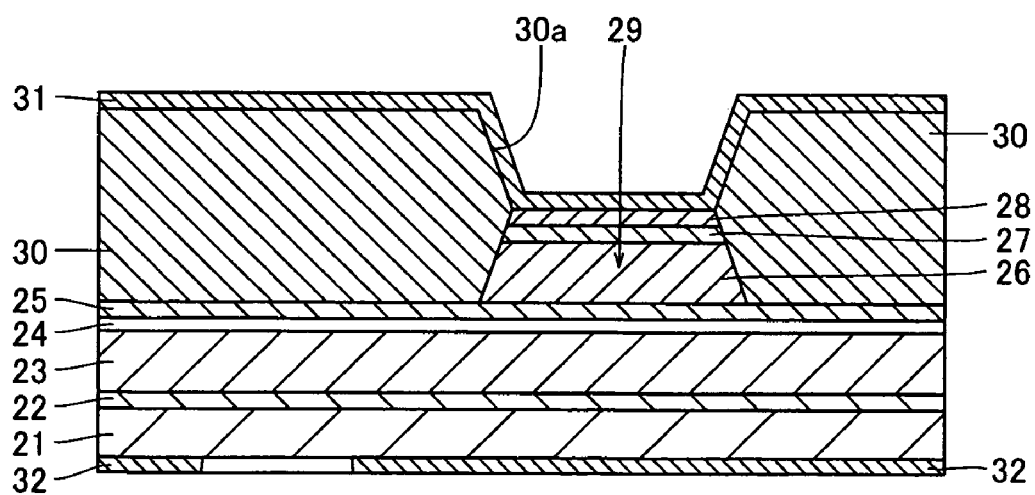

As shown in FIG. 22, the back surface of the n-type GaAs substrate 21 is polished so that the thickness between the upper surface of the ridge portion 29 and the back surface of the n-type GaAs substrate 21 is about 100 μm. Thereafter the n-side electrode 32, also serving as an etching mask, having the thickness of about 1 μm is formed on a region of the back surface of the n-type GaAs substrate 21 other than that formed with the contact hole 120a (see FIG. 2). At this time, the AuGe layer (not shown), the Ni layer (not shown) and the Au layer (not shown) are successively formed.

Figure 23:
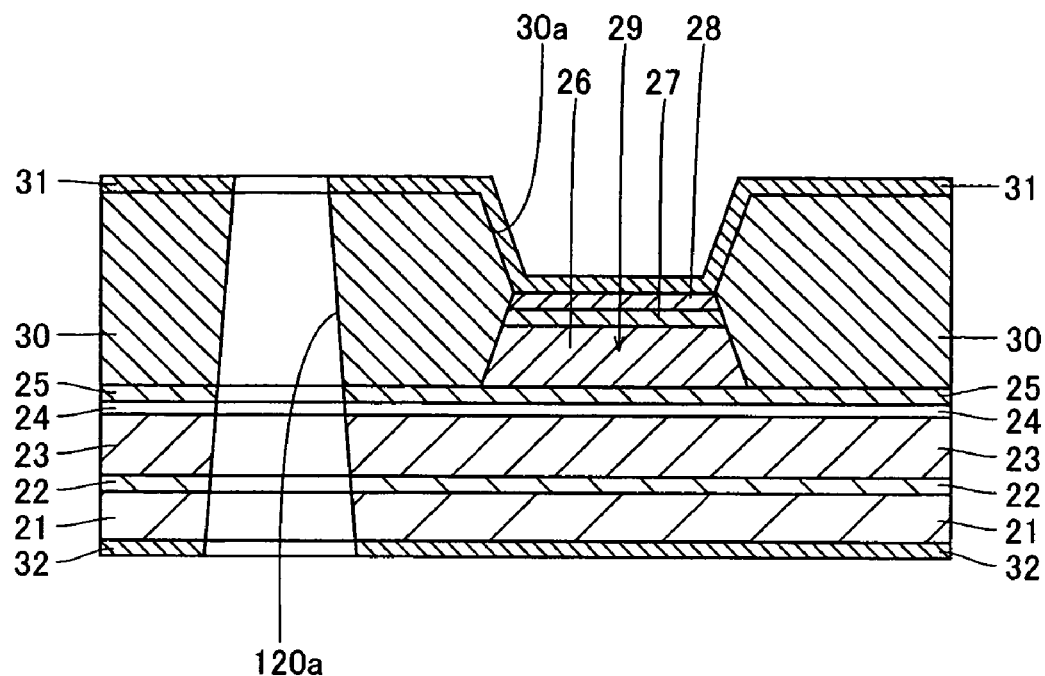

As shown in FIG. 23, the circular contact hole 120a passing through the n-type GaAs substrate 21, the semiconductor layers 22 to 25 and 30 and the p-side electrode 31 from the back surface of the n-type GaAs substrate 21 is formed through the mask of the n-side electrode 32 by RIE with chlorine gas. This contact hole 120a is formed to have the tapered inner side surface so that the diameter of the portion closer to the p-side electrode 31 is smaller than the diameter of several 10 μm of the portion closer to the n-side electrode 32.

Figure 24:
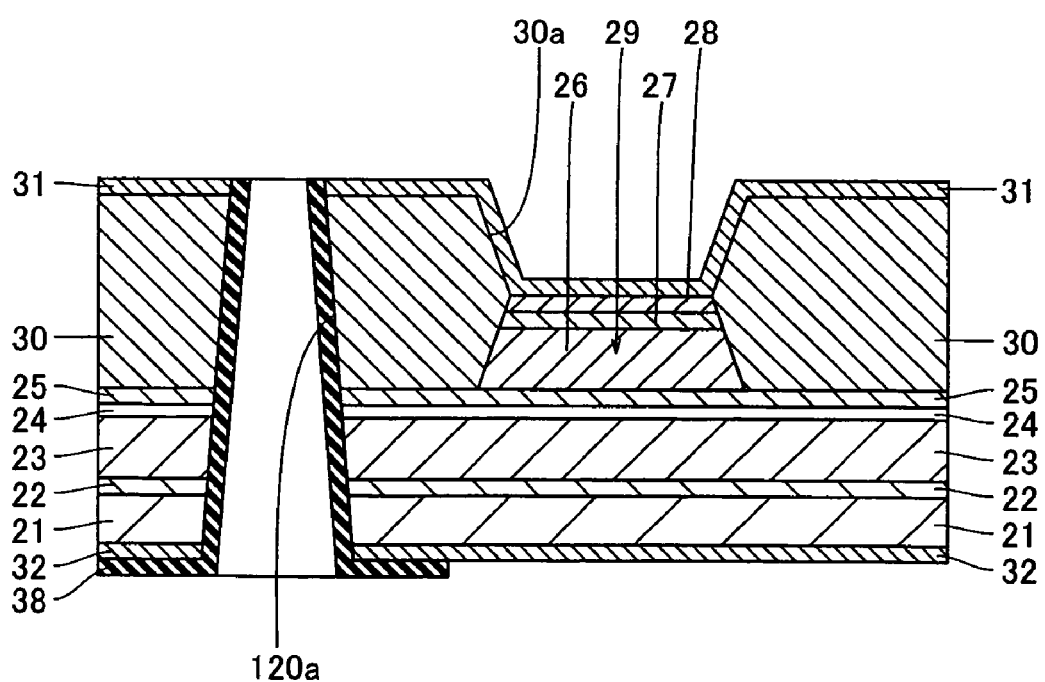

As shown in FIG. 24, the insulating film 38 of SiO$_2$ having the thickness of about 200 nm is formed on the inner side surface of the contact hole 120a and the surface, opposite to the blue-violet laser element 110, of the portion of the n-side electrode 32 located on the region close to the contact hole 120a.

Figure 25:
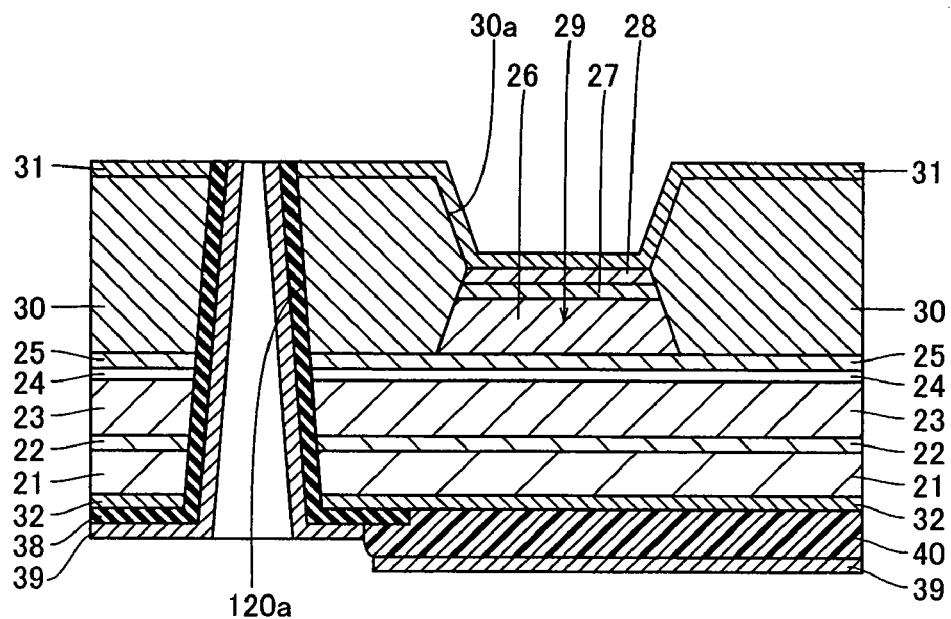
Figure 26:
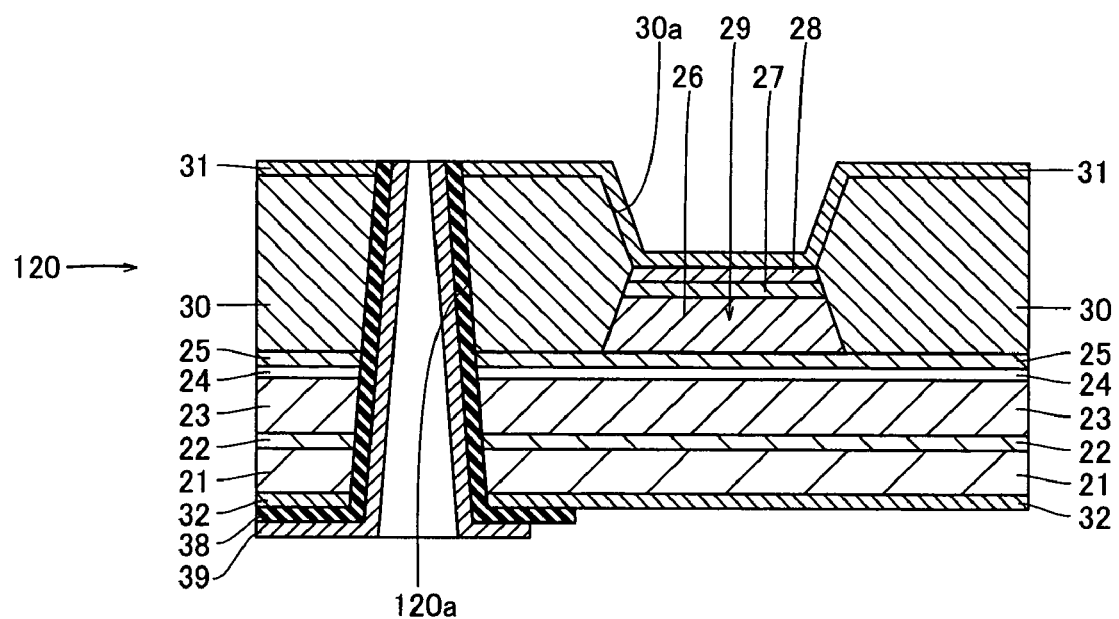

As shown in FIG. 25, a resist film 40 is formed on a prescribed region other than that corresponding to the contact hole 120a. Thereafter the electrode 39 having the thickness of about 0.3 μm is formed on the surface of the resist film 40 opposite to the n-type GaAs substrate 21 as well as the surface of the insulating film 38 opposite to the n-type GaAs substrate 21 and the inner side surfaces thereof by electron beam evaporation. At this time, the Ti layer (not shown), the Pt layer (not shown) and the Au layer (not shown) are successively formed. Thereafter the resist film 40 is removed by lift-off. Thus, a portion unnecessary for the extraction electrode 39 is removed, as shown in FIG. 26. The red laser element 120 according to the first embodiment is formed in this manner.

Figure 27:
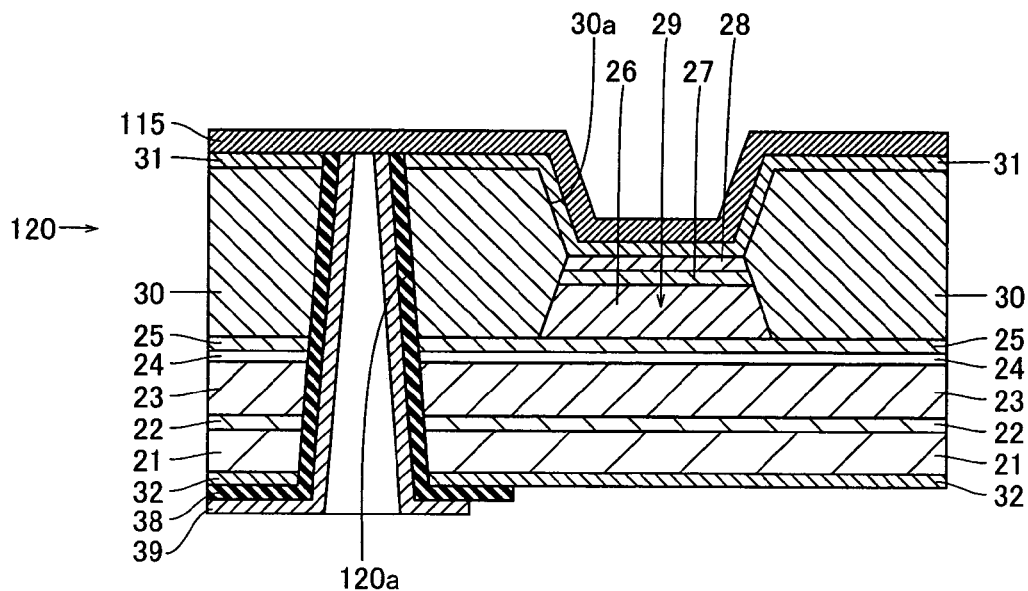

A method of bonding the blue-violet laser element 110 and the red laser element 120 to each other is now described with reference to FIGS. 27 and 28. First, the solder layer 115 of Au—Sn is formed on the p-side electrode 31 of the red laser element 120, as shown in FIG. 27.

Figure 28:
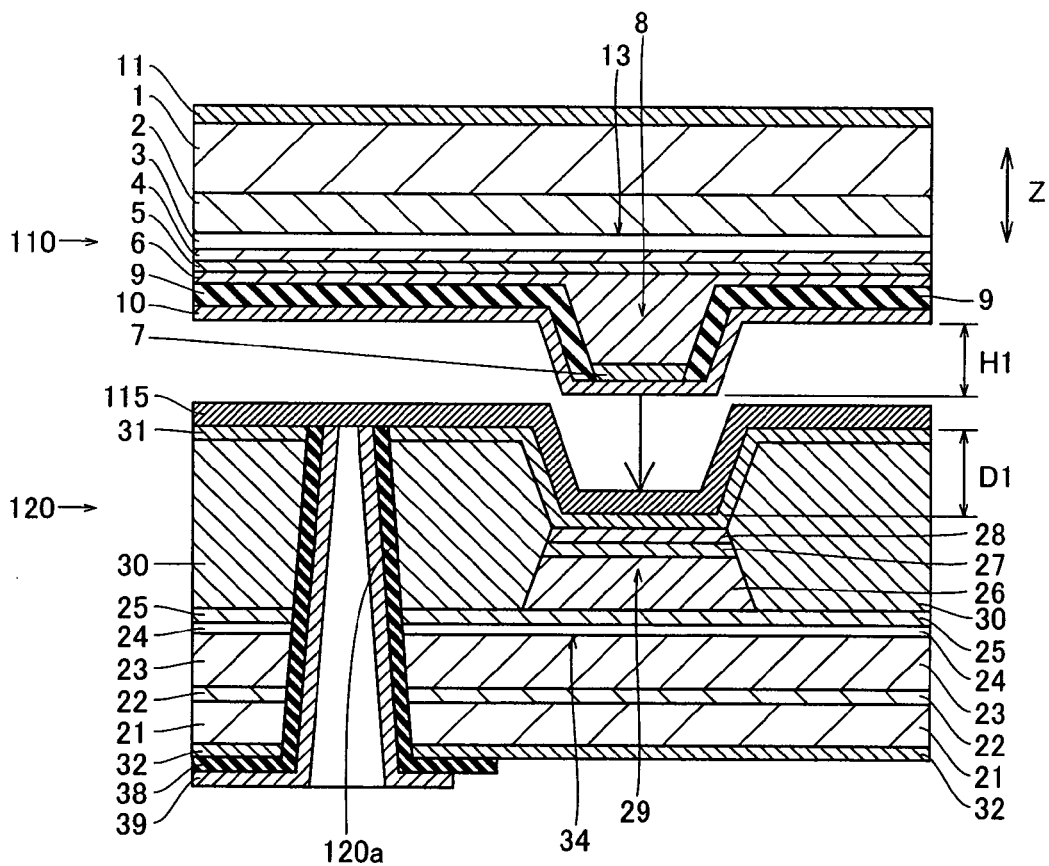

As shown in FIG. 28, the registrational projecting portion constituted of the ridge portion 8 of the blue-violet laser element 110 is directed downward and fitted into the registrational recess portion constituted of the opening 30a of the n-type current blocking layer 30 of the red laser element 120, to be registered therewith. At this time, the registrational projecting portion constituted of the ridge portion 8 and the registrational recess portion constituted of the opening 30a of the n-type current blocking layer 30 are visually recognized through the transparent regions 111 of the blue-violet laser element 110 shown in FIGS. 10 and 12, to be fitted to each other in the direction Z shown in FIG. 28. When the registrational projecting portion constituted of the ridge portion 8 is fitted into the registrational recess portion constituted of the opening 30a of the n-type current blocking layer 30, the solder layer 115 of Au—Sn is melted by heat treatment under a temperature condition of about 280° C. Thereafter the solder layer 115 is solidified by a step of cooling the same to the room temperature, thereby bonding the blue-violet laser element 110 and the red laser element 120 to each other.

At this time, the blue-violet laser element 110 and the red laser element 120 can be inhibited from horizontal misregistration in the direction X shown in FIGS. 1 and 2 due to the fitting between the registrational projecting portion constituted of the ridge portion 8 and the registrational recess portion constituted of the opening 30a of the n-type current blocking layer 30. Thus, cleavage directions of the blue-violet laser element 110 and the red laser element 120 can be inhibited from deviating from each other.

Thereafter the light emission planes 12 (see FIG. 1) are formed by simultaneously cleaving the blue-violet laser element 110 and the red laser element 120 bonded to each other, followed by separation into each integrated semiconductor laser device. Finally, the wires 122 are bonded onto the surfaces of the n-side electrode 32 and the extraction electrode 39 of the red laser element 120 respectively as shown in FIGS. 1 and 2, thereby forming the integrated semiconductor laser device according to the first embodiment.

Second Embodiment

Figure 29:
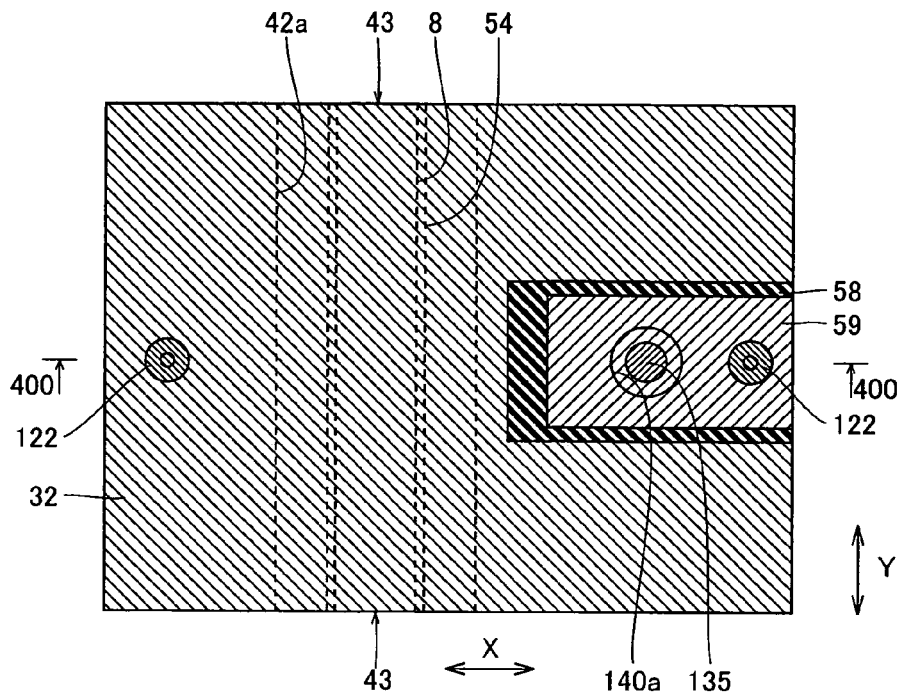
FIG. 29 is a plan view showing the structure of an integrated semiconductor laser device according to a second embodiment of the present invention.
Figure 30:
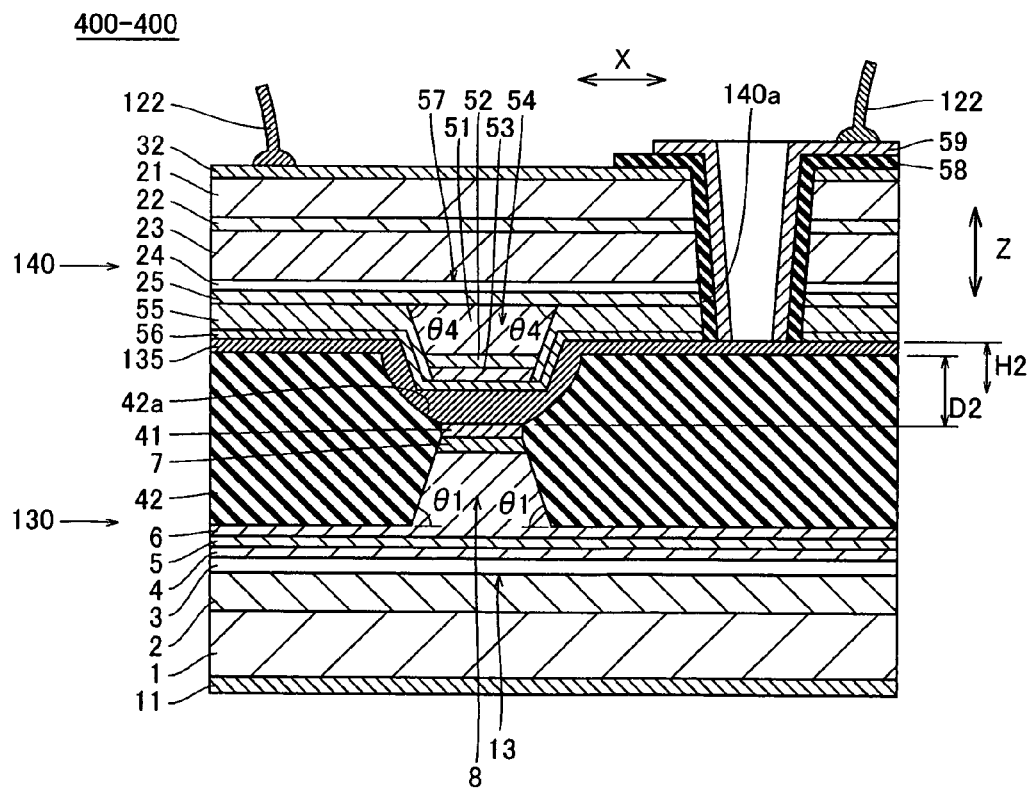
FIG. 30 is a sectional view taken along the line 400-400 in FIG. 29.

Referring to FIGS. 29 and 30, a blue-violet laser element 130 is provided with a registrational recess portion while a red laser element 140 is provided with a registrational projecting portion in an integrated semiconductor laser device according to a second embodiment of the present invention, dissimilarly to the aforementioned first embodiment.

According to the second embodiment, the blue-violet laser element 130 having the registrational recess portion and the red laser element 140 having the registrational projecting portion are stacked (integrated) with each other in a direction Z, as shown in FIG. 30. The blue-violet laser element 130 and the red laser element 140 are examples of the "first semiconductor laser element" and the "second semiconductor laser element" in the present invention respectively.

The structure of the blue-violet laser element 130 according to the second embodiment is now described. In the blue-violet laser element 130 according to the second embodiment, an n-type cladding layer 2, an active layer 3, a light guide layer 4, a cap layer 5, a p-type cladding layer 6 and a p-type contact layer 7 are successively formed on an n-type GaN substrate 1, as shown in FIG. 30. The p-type cladding layer 6 has a projecting portion and remaining flat portions, and the p-type contact layer 7 is formed on the projecting portion of the p-type cladding layer 6. The p-type contact layer 7 and the projecting portion of the p-type cladding layer 6 constitute a ridge portion 8. The semiconductor layers 2 to 7 are similar in composition and thickness to the semiconductor layers 2 to 7 according to the aforementioned first embodiment. The ridge portion 8 is similar in shape to the ridge portion 8 according to the aforementioned first embodiment. A portion of the active layer 3 located under the ridge portion 8 and a peripheral portion of this portion of the active layer 3 form an emission region 13 of the blue-violet laser element 130. The ridge portion 8 is an example of the "second ridge portion" in the present invention.

According to the second embodiment, a p-side electrode 41 having a thickness of about 10 nm is formed only on the ridge portion 8 (p-type contact layer 7). This p-side electrode 41 is formed by a Pt layer (not shown) and a Pd layer (not shown) successively from the side closer to the n-type GaN substrate 1. The p-side electrode 41 is an example of the "first electrode" in the present invention.

According to the second embodiment, a current blocking layer 42 of SiO$_2$, easy to etch for forming a recess portion, having a thickness (about 1.5 μm) larger than the height (about 363 nm) between the upper surfaces of the flat portions of the p-type cladding layer 6 and the upper surface of the p-side electrode 41 is formed on the flat portions of the p-type cladding layer 6 to cover the side surfaces of the ridge portion 8 and the p-side electrode 41. This current blocking layer 42 has an opening 42a exposing the upper surface of the p-side electrode 41. The opening 42a of the current blocking layer 42 has recessed tapered inner side surfaces so that the width of the bottom (width (about 1.5 μm) of the tapered end of the ridge portion 8) is smaller than the width of the open end. The opening 42a of the current blocking layer 42 is in the form of a (slender) stripe extending in a direction Y along the ridge portion 8, as shown in FIG. 29. The opening 42a of the current blocking layer 42 forms the U-shaped registrational recess portion. As shown in FIG. 30, the registrational recess portion constituted of the opening 42a of the n-type current blocking layer 42 has a depth D2 of about 1.14 μm between the upper surfaces of the current blocking layer 42 and the p-side electrode 41. The opening 42a is an example of the "recess portion" in the present invention.

An n-side electrode 11 similar in composition and thickness to the n-side electrode 11 according to the aforementioned first embodiment is formed on the back surface of the n-type GaN substrate 1.

The structure of the red laser element 140 according to the second embodiment is now described. The red laser element 140 shown in FIG. 30 has a downwardly directed ridge portion 54. In this red laser element 140, an n-type buffer layer 22, an n-type cladding layer 23, an active layer 24 and a p-type first cladding layer 25 are successively formed on the surface of an n-type GaAs substrate 21 closer to the blue-violet laser element 130, as shown in FIG. 30. The semiconductor layers 22 to 25 are similar in composition and thickness to the semiconductor layers 22 to 25 according to the aforementioned first embodiment.

According to the second embodiment, a projecting p-type second cladding layer 51 similar in composition and thickness to the p-type second cladding layer 26 according to the aforementioned first embodiment with the tapered end having a width smaller than that (about 2.7 μm) of the p-type second cladding layer 26 according to the aforementioned first embodiment is formed on a prescribed region of the surface of the p-type first cladding layer 25 closer to the blue-violet laser element 130. A p-type intermediate layer 52 and a p-type contact layer 53 are successively formed on the surface of the p-type second cladding layer 51 closer to the blue-violet laser element 130. The p-type intermediate layer 52 and the p-type contact layer 53 are similar in composition and thickness to the p-type intermediate layer 27 and the p-type contact layer 28 according to the aforementioned first embodiment respectively. The p-type second cladding layer 51, the p-type intermediate layer 52 and the p-type contact layer 53 constitute the ridge portion 54.

According to the second embodiment, the ridge portion 54 has tapered side surfaces so that the width of the base is smaller than that of the tapered end. The side surfaces of the ridge portion 54 and the surface of the active layer 24 form an angle θ4 of about 60°. As shown in FIG. 29, the ridge portion 54 is in the form of a (slender) stripe extending in a direction Y perpendicular to light emission planes (cleavage planes) 43. The ridge portion 54 forms a registrational projecting portion. A portion of the active layer 24 corresponding to the position formed with the ridge portion 54 and a peripheral portion of this portion of the active layer 24 form an emission region 57 of the red laser element 140, as shown in FIG. 30. The ridge portion 54 is an example of the "projecting portion" or the "first ridge portion" in the present invention. The emission region 57 is an example of the "second emission region" in the present invention.

An n-type current blocking layer 55 is formed on the surface of the p-type first cladding layer 25 closer to the blue-violet laser element 130 to cover the side surfaces of the ridge portion 54, so that a portion of this n-type current blocking layer 55 located on a region other than the side surfaces of the ridge portion 54 has a thickness of about 800 nm. This n-type current blocking layer 55 is formed by an n-type AlInP layer (not shown) and an n-type GaAs layer (not shown) successively from the side closer to the n-type GaAs substrate 21. A p-side electrode 56 having a thickness of about 0.3 μm is formed to cover the surfaces of the ridge portion 54 and the n-type current blocking layer 55 closer to the blue-violet laser element 130 while partially covering the side surfaces of the ridge portion 54. This p-side electrode 56 is formed by an AuZn layer (not shown), a Pt layer (not shown) and an Au layer (not shown) successively from the side closer to the n-type GaAs substrate 21. The p-side electrode 56 is an example of the "second electrode" in the present invention.

Thus, the registrational projecting portion constituted of the ridge portion 54 has a projection height H2 of about 800 nm between the surface of the portion of the p-side electrode 56 located on the region other than that corresponding to the ridge portion 54 and the surface of the portion of the p-side electrode 56 located on the region corresponding to the ridge portion 54 closer to the blue-violet laser element 130. In other words, the depth D2 (about 1.14 μm) of the registrational recess portion constituted of the opening 42*a* of the current blocking layer 42 is larger than the projection height H2 (about 800 nm) of the registrational projecting portion constituted of the ridge portion 54. An n-side electrode 32 similar in composition and thickness to the n-side electrode 32 according to the aforementioned first embodiment is formed on the surface of the n-type GaAs substrate 21 opposite to the blue-violet laser element 130.

A circular contact hole 140*a* is formed to pass through the n-side electrode 32, the n-type GaAs substrate 21, the semiconductor layers 22 to 25 and 55 and the p-side electrode 56 from the surface of the n-side electrode 32 opposite to the blue-violet laser element 130. This contact hole 140*a* has a tapered inner side surface so that the diameter of a portion closer to the p-side electrode 56 is smaller than the diameter of several 10 μm of a portion closer to the n-side electrode 32. An insulating film 58 of SiO$_2$ having a thickness of about 200 nm is formed on the inner side surface of the contact hole 140*a* and the surface, opposite to the blue-violet laser element 130, of a portion of the n-side electrode 32 located on a region close to the contact hole 140*a*. An extraction electrode 59 having a thickness of about 0.3 μm is formed on a prescribed region of the insulating film 58 to be electrically connected to a solder layer 135 described later through the contact hole 140*a*. This extraction electrode 59 is formed by a Ti layer (not shown), a Pt layer (not shown) and an Au layer (not shown) successively from the side closer to the n-type GaAs substrate 21. Wires (gold wires) 122 are bonded to the surfaces of the n-side electrode 32 and the extraction electrode 59 opposite to the blue-violet laser element 130 respectively.

According to the second embodiment, the red laser element 140 and the blue-violet laser element 130 are integrated (stacked) with each other in the direction Z while the registrational projecting portion constituted of the ridge portion 54 is fitted into the registrational recess portion constituted of the opening 42*a* of the n-type current blocking layer 42, as shown in FIG. 30. Further, the emission regions 13 and 57 of the blue-violet laser element 130 and the red laser element 140 are aligned with each other in the direction (direction Z shown in FIG. 30) of stacking of the semiconductor layers. The depth D2 (about 1.14 μm) of the registrational recess portion of the blue-violet laser element 130 is larger than the projection height H2 (about 800 nm) of the registrational projecting portion of the red laser element 140 as described above, whereby the interval between the bottom surface of the registrational recess portion of the blue-violet laser element 130 and the upper surface of the registrational projecting portion of the red laser element 140 is larger than that between the remaining regions of the blue-violet laser element 130 and the red laser element 140 other than the registrational recess portion and the registrational projecting portion. The registrational recess portion of the blue-violet laser element 130 and the registrational projecting portion of the red laser element 140 are bonded to each other through the solder layer 135 of Au—Sn. The solder layer 135 is an example of the "bonding layer" in the present invention. The p-side electrodes 41 and 56 of the blue-violet laser element 130 and the red laser element 140 are electrically connected to the extraction electrode 59 through the solder layer 135.

According to the second embodiment, as hereinabove described, the registrational recess portion constituted of the opening 42*a* of the current blocking layer 42 of the blue-violet laser element 130 receives the registrational projecting portion constituted of the ridge portion 54 of the red laser element 140, whereby the blue-violet laser element 130 and the red laser element 140 bonded to each other can be inhibited from horizontal misregistration (in the direction X shown in FIG. 30) due to the fitting between the registrational projecting portion and the registrational recess portion. Thus, the optical axes of beams emitted from the blue-violet laser element 130 and the red laser element 140 respectively can be inhibited from horizontal deviation (in the direction X shown in FIG. 30), whereby the optical axis of a beam emitted from the integrated semiconductor laser device can be easily adjusted when the beam is introduced into an optical system formed by a lens and a mirror. Thus, the cost for optical axis adjustment can be reduced. Further, the blue-violet laser element 130 and the red laser element 140 bonded to each other can be so inhibited from horizontal misregistration (in the direction X shown in FIG. 30) that cleavage directions of the blue-violet laser element 130 and the red laser element 140 can be inhibited from deviating from each other. Thus, cleavability for simultaneously cleaving the blue-violet laser element 130 and the red laser element 140 bonded to each other can be improved. Consequently, the properties of laser beams emitted from the light emission planes (cleavage planes) 43 can be improved.

According to the second embodiment, further, the emission regions 13 and 57 of the blue-violet laser element 130 and the red laser element 140 are aligned with each other in the direction (direction Z shown in FIG. 30) of stacking of the semiconductor layers, so that the interval between the emission regions 13 and 57 of the blue-violet laser element 130 and the red laser element 140 can be reduced as compared with a case where the emission regions 13 and 57 of the blue-violet laser element 130 and the red laser element 140 positionally deviate from each other in two directions, i.e., the direction (direction Z shown in FIG. 30) of stacking of the semiconductor layers and the horizontal direction (direction X shown in FIG. 30). Thus, the beam emitted from either the emission region 57 of the red laser element 140 or the emission region 13 of the blue-violet laser element 130 can be inhibited from being incident on a region remarkably deviating from a prescribed region of the optical system when the beam emitted from the integrated semiconductor laser device is introduced into the optical system, if the optical axis is so adjusted as to introduce the beam emitted from either the emission region 13 of the blue-violet laser element 130 or the emission region 57 of the red laser element 140 into the prescribed region of the optical system. Consequently, the optical axis of the beam emitted from the integrated semiconductor laser device can be more easily adjusted with respect to the optical system, whereby the cost for optical axis adjustment can be further reduced.

The remaining effects of the second embodiment are similar to those of the aforementioned first embodiment.

A fabrication process for the integrated semiconductor laser device according to the second embodiment is now described with reference to FIGS. 29 to 50.

Figure 31:
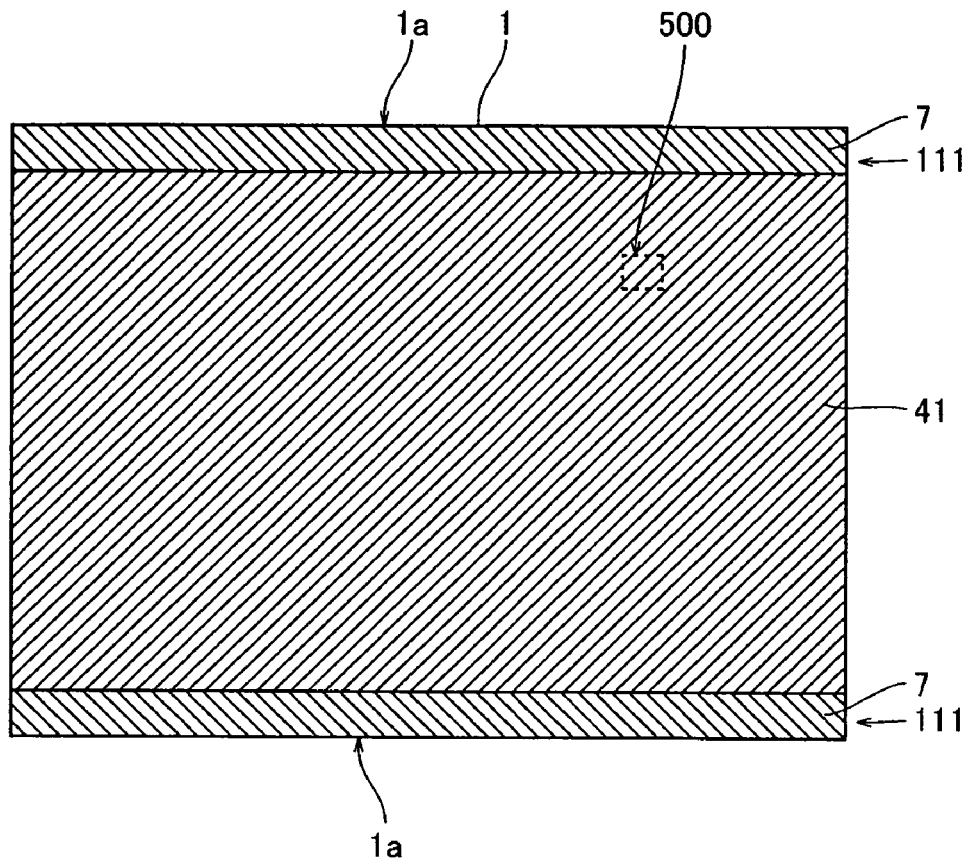
FIG. 31 is a plan view for illustrating a fabrication process for the integrated semiconductor laser device according to the second embodiment shown in FIGS. 29 and 30.
Figure 32:
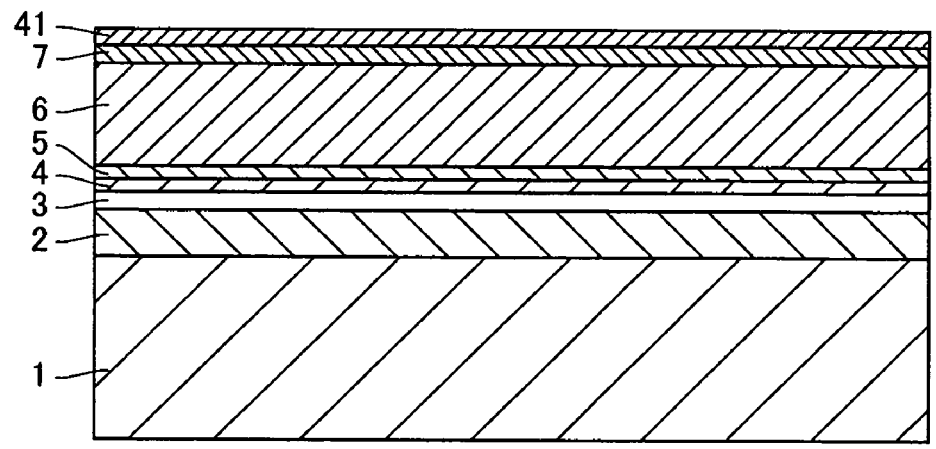
FIG. 32 is a sectional view of a region 500 enclosed with a broken line in FIG. 31.

According to the second embodiment, the blue-violet laser element 130 is formed through steps shown in FIGS. 31 to 39, while the red laser element 140 is formed through steps shown in FIGS. 40 to 48. In order to form the blue-violet laser element 130, the layers up to the p-type contact layer 7 are formed as shown in FIG. 32 through a step similar to that according to the first embodiment shown in FIG. 3. Thereafter the p-side electrode 41 having the thickness of about 10 nm is formed on the p-type contact layer 7 by electron beam evaporation. At this time, the Pt layer (not shown) and the Pd layer (not shown) are successively formed. As shown in FIG. 31, ends of the p-side electrode 41 located on the sides closer to end surfaces 1a of the n-type GaN substrate 1 parallel to the light emission planes 43 (see FIG. 29) are arranged on regions separated from the end surfaces 1a of the n-type GaN substrate 1 at a prescribed interval.

Figure 33:
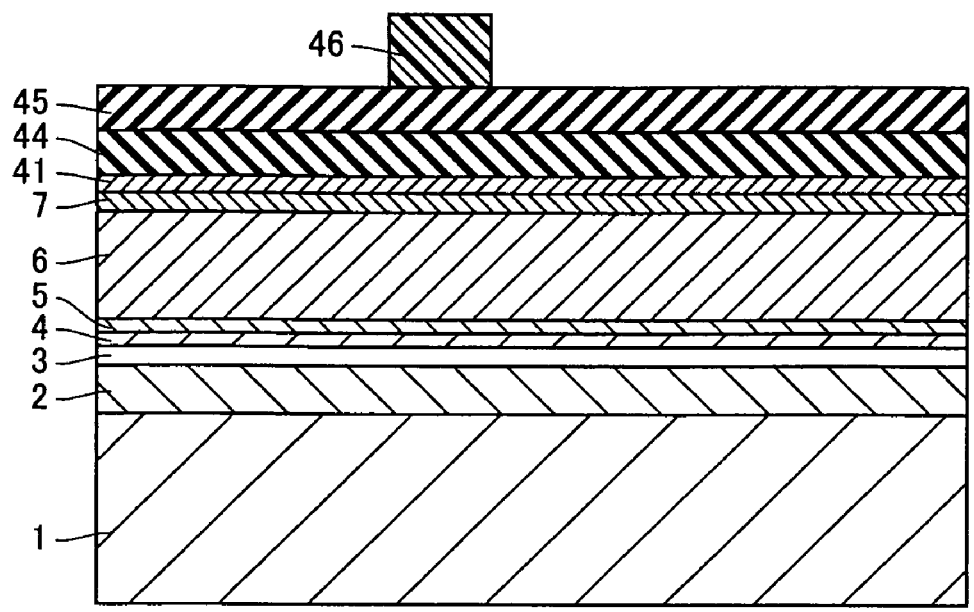
FIGS. 33 to 50 are sectional views for illustrating the fabrication process for the integrated semiconductor laser device according to the second embodiment shown in FIGS. 29 and 30.

Then, an $Al_2O_3$ film 44 having a thickness of about 320 nm and an $SiO_2$ film 45 having a thickness of about 480 nm are successively formed on the p-side electrode 41 by plasma CVD, as shown in FIG. 33. At this time, a striped (slender) resist film 46 having a thickness of about 1.5 μm is formed on a region of the $SiO_2$ film 45 corresponding to the ridge portion 8 (see FIG. 30).

Figure 34:
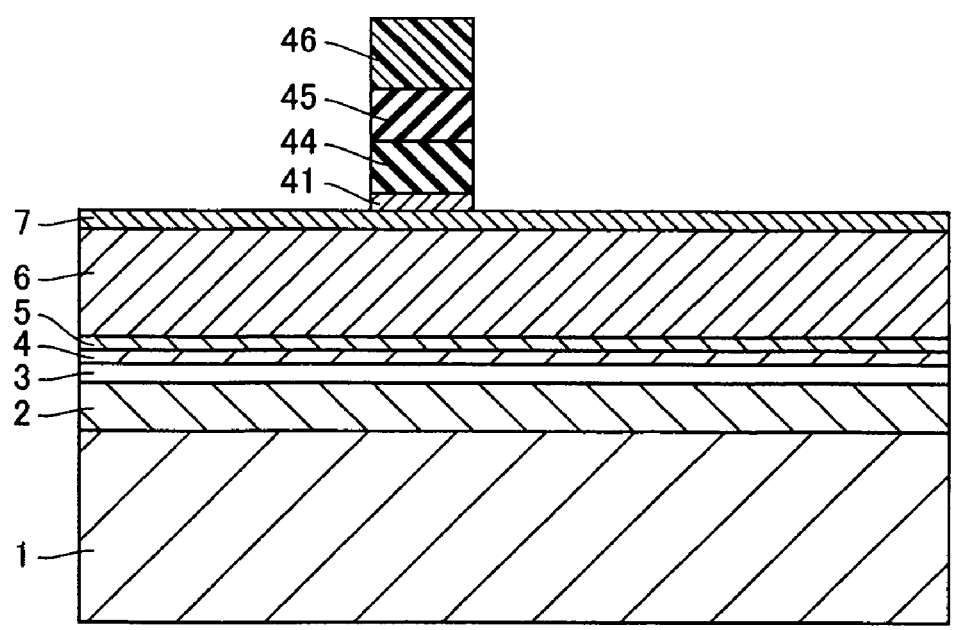

As shown in FIG. 34, the $SiO_2$ film 45, the $Al_2O_3$ film 44 and the p-side electrode 41 are etched through a mask of the resist film 46 by RIE with $CF_4$ gas. Thereafter the resist film 46 is removed.

Figure 35:
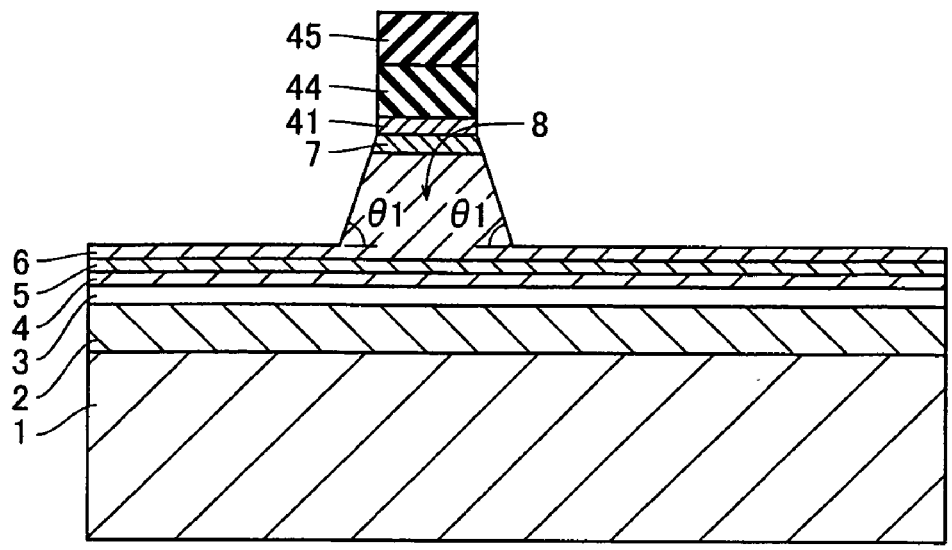

As shown in FIG. 35, a portion between the upper surface of the p-type contact layer 7 and a portion of the p-type cladding layer 6 at an intermediate depth from the upper surface thereof is etched through a mask of the $SiO_2$ film 45 by RIE with chlorine gas. Thus, the ridge portion 8 is constituted of the projecting portion of the p-type cladding layer 6 and the p-type contact layer 7 in the shape similar to that of the ridge portion 8 according to the aforementioned first embodiment.

Figure 36:
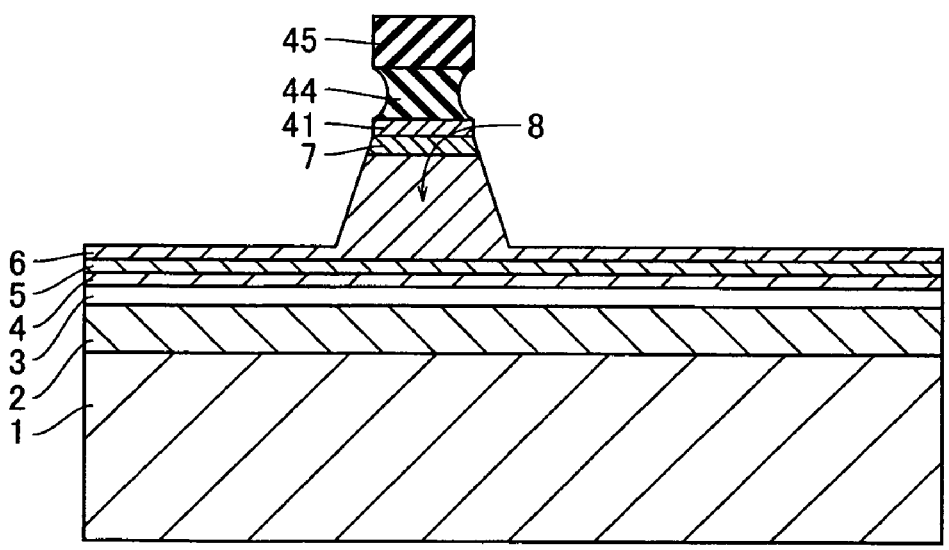

As shown in FIG. 36, the $Al_2O_3$ film 44 is laterally etched up to a prescribed depth from the side surfaces thereof.

Figure 37:
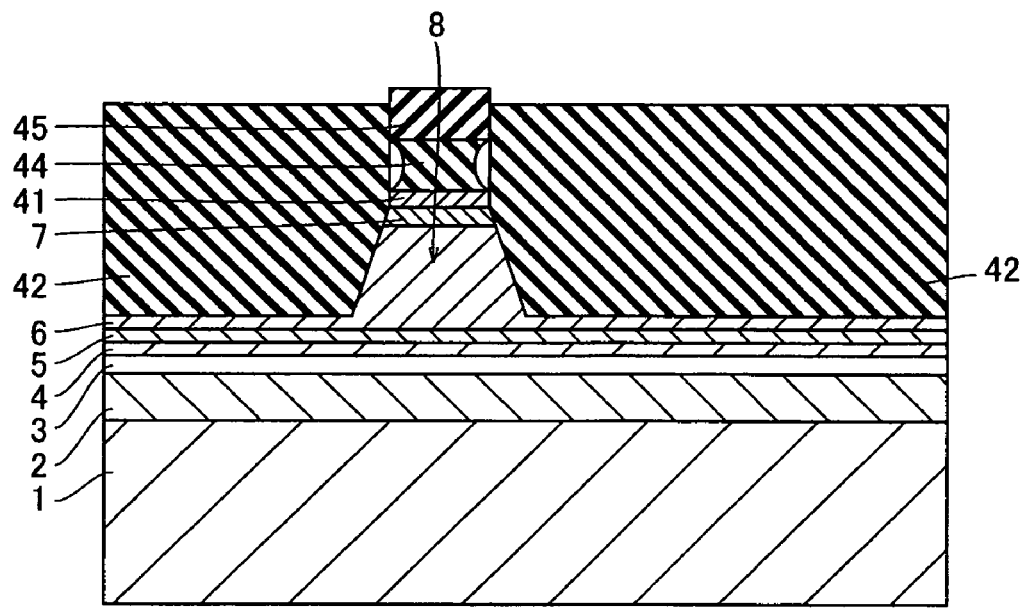
Figure 38:
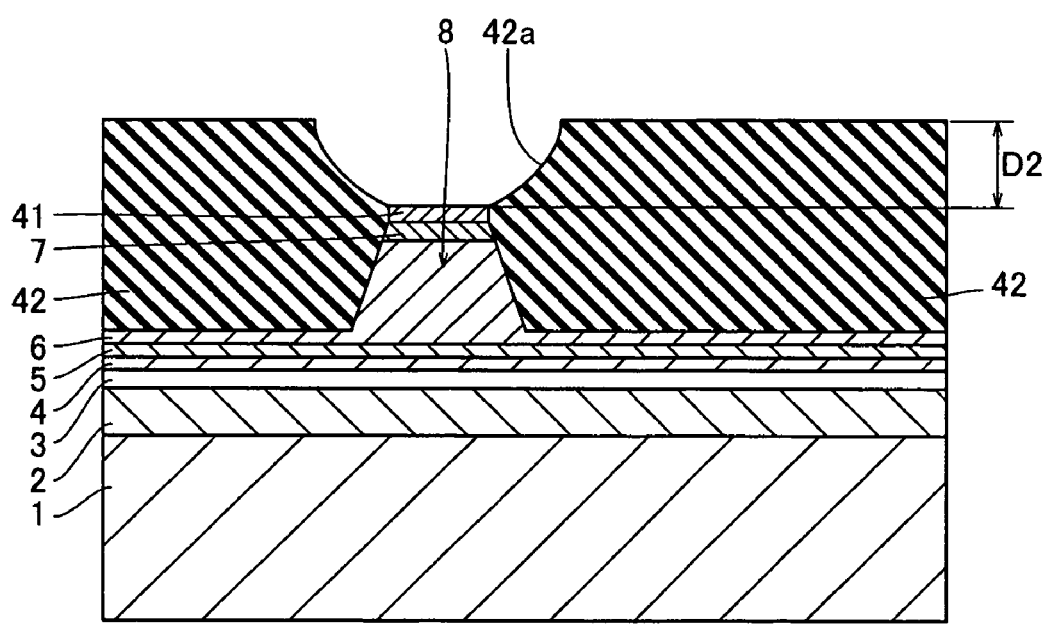

As shown in FIG. 37, the current blocking layer 42 of $SiO_2$ having the thickness of about 1.5 μm is formed on the flat portions of the p-type cladding layer 6 by plasma CVD or electron beam evaporation, to cover the side surfaces of the ridge portion 8 and the p-side electrode 41. Thereafter the $Al_2O_3$ film 44 is removed by wet etching with a phosphoric acid etching solution. At this time, the $SiO_2$ film 45 located on the $Al_2O_3$ film 44 and part of the current blocking layer 42 of $SiO_2$ located in the vicinity of the $SiO_2$ film 45 are also removed. Thus, the current blocking layer 42 is formed with the opening 42a exposing the upper surface of the p-side electrode 41, as shown in FIG. 38. At this time, the opening 42a of the current blocking layer 42 is formed to have the recessed tapered inner side surfaces so that the width of the bottom is smaller than that of the open end. The bottom of the opening 42a of the current blocking layer 42 has the width of about 1.5 μm. Further, the opening 42a of the current blocking layer 42 is in the form of a (slender) stripe extending along the ridge portion 8, as shown in FIG. 29. This opening 42a of the current blocking layer 42 forms the U-shaped registrational recess portion. The registrational recess portion constituted of the opening 42a of the n-type current blocking layer 42 has the depth D2 of about 1.14 μm between the upper surfaces of the current blocking layer 42 and the p-side electrode 41.

Figure 39:
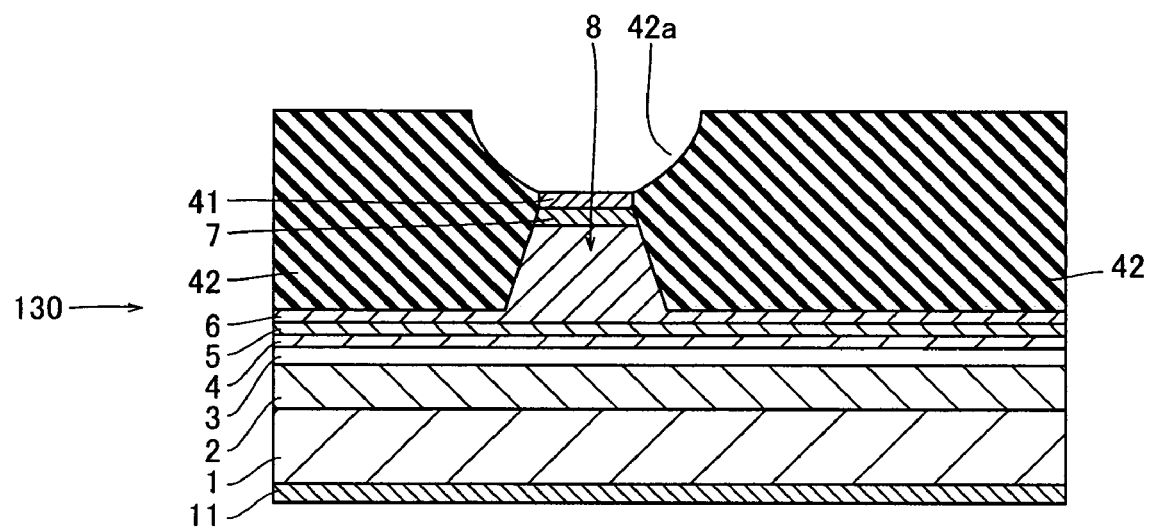

As shown in FIG. 39, the back surface of the n-type GaN substrate 1 is polished so that the thickness between the upper surface of the ridge portion 8 and the back surface of the n-type GaN substrate 1 is about 150 μm. Thereafter the n-side electrode 11 having the composition and the thickness similar to those of the n-side electrode 11 according to the aforementioned first embodiment is formed on the back surface of the n-type GaN substrate 1 by electron beam evaporation. At this time, the ends of the n-side electrode 11 located on the sides closer to the end surfaces 1a (see FIG. 31) of the n-type GaN substrate 1 parallel to the light emission planes 43 are arranged on the regions separated from the end surfaces 1a of the n-type GaN substrate 1 at the prescribed interval. Thus, regions not provided with the p-side electrode 41 form transparent regions 111 allowing visual recognition of the ridge portion 8 of the blue-violet laser element 130 from above or below the same when the blue-violet laser element 130 and the red laser element 140 are bonded to each other. The blue-violet laser element 130 according to the second embodiment is formed in this manner.

Figure 40:
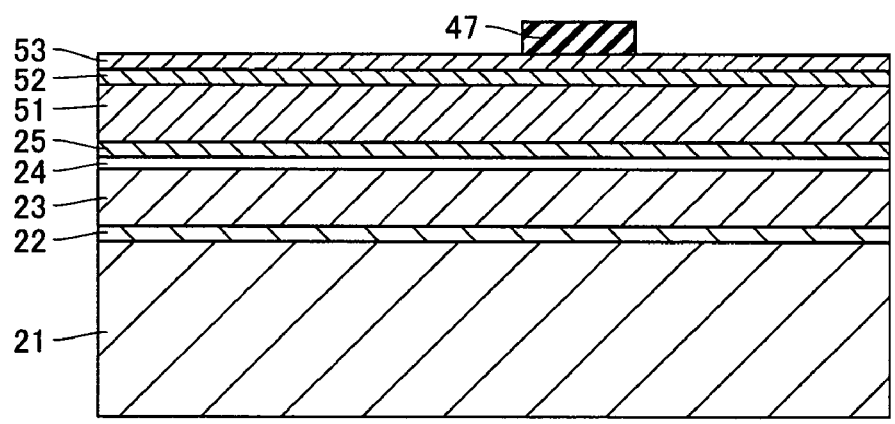

In order to form the red laser element 140, the layers up to the p-type first cladding layer 25 are formed as shown in FIG. 40 through a step similar to that according to the first embodiment shown in FIG. 14. Then, the p-type second cladding layer 51, the p-type intermediate layer 52 and the p-type contact layer 53 are successively grown on the p-type first cladding layer 25 by MOCVD. At this time, the p-type second cladding layer 51, the p-type intermediate layer 52 and the p-type contact layer 53 are grown under growth conditions similar to those for the p-type second cladding layer 26, the p-type intermediate layer 27 and the p-type contact layer 28 according to the aforementioned first embodiment. Thereafter a striped (slender) $SiO_2$ film 47 having a thickness of about 240 nm is formed on a region of the p-type contact layer 53 corresponding to the ridge portion 54 (see FIG. 30).

Figure 41:
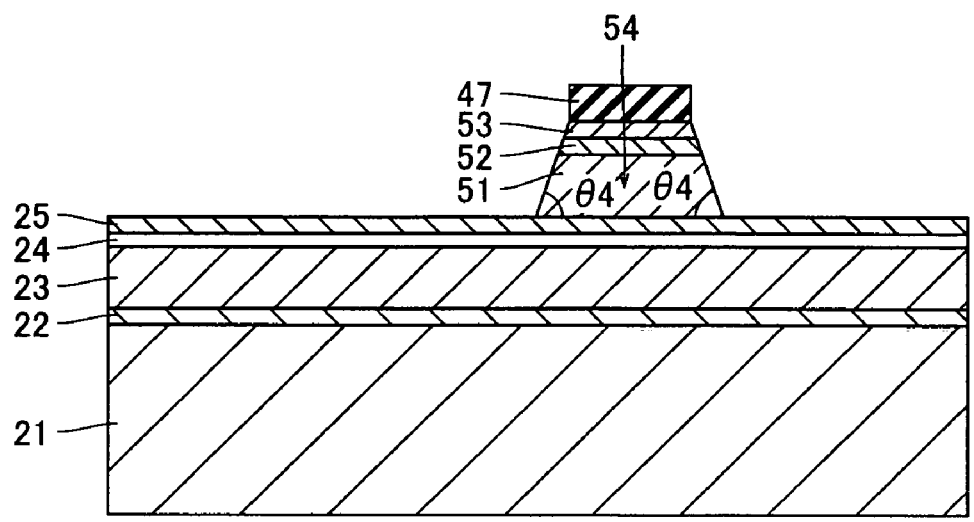

As shown in FIG. 41, a portion between the upper surfaces of the p-type contact layer 53 and the p-type first cladding layer 25 is etched by wet etching with a tartaric acid etching solution or a phosphoric acid etching solution. Thus, the ridge portion 54 is constituted of the p-type contact layer 53, the p-type intermediate layer 52 and the p-type second cladding layer 51. At this time, the ridge portion 54 is formed to have the tapered side surfaces so that the width of the tapered end is smaller than that of the base. The side surfaces of the ridge portion 54 and the upper surface of the active layer 24 (p-type first cladding layer 25) form the angle θ4 of about 60°. Further, the ridge portion 54 is in the form of a (slender) stripe extending in the direction perpendicular to the light emission planes 43, as shown in FIG. 29. This ridge portion 54 forms the registrational projecting portion.

Figure 42:
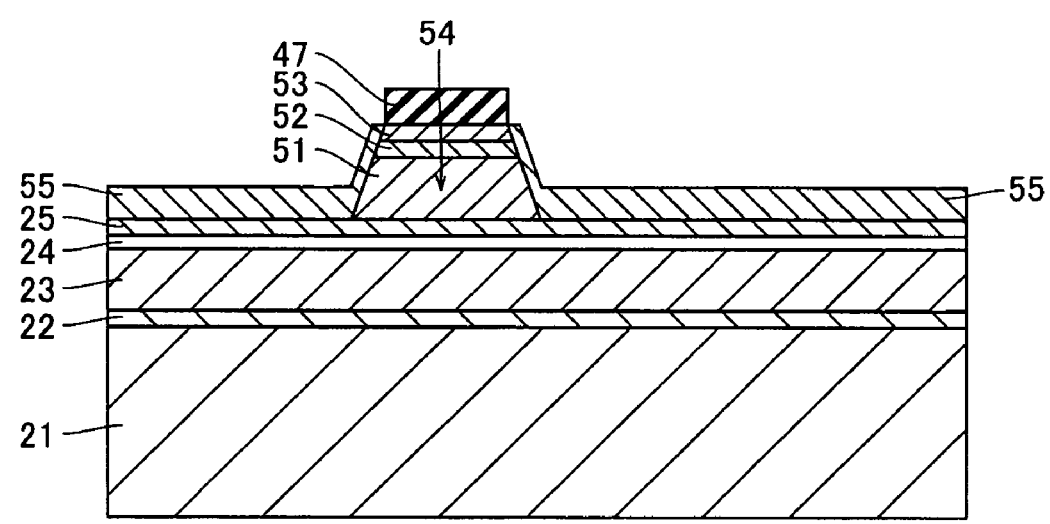

As shown in FIG. 42, the n-type current blocking layer 55 is formed on the upper surface of the p-type first cladding layer 25 through the $SiO_2$ film 47 serving as a selective growth mask by MOCVD to cover the side surfaces of the ridge portion 54, so that the portion located on the region other than the side surfaces of the ridge portion 54 has the thickness of about 800 nm. At this time, the n-type AlInP layer (not shown) and the n-type GaAs layer (not shown) are successively formed. Thereafter the $SiO_2$ film 47 is removed.

Figure 43:
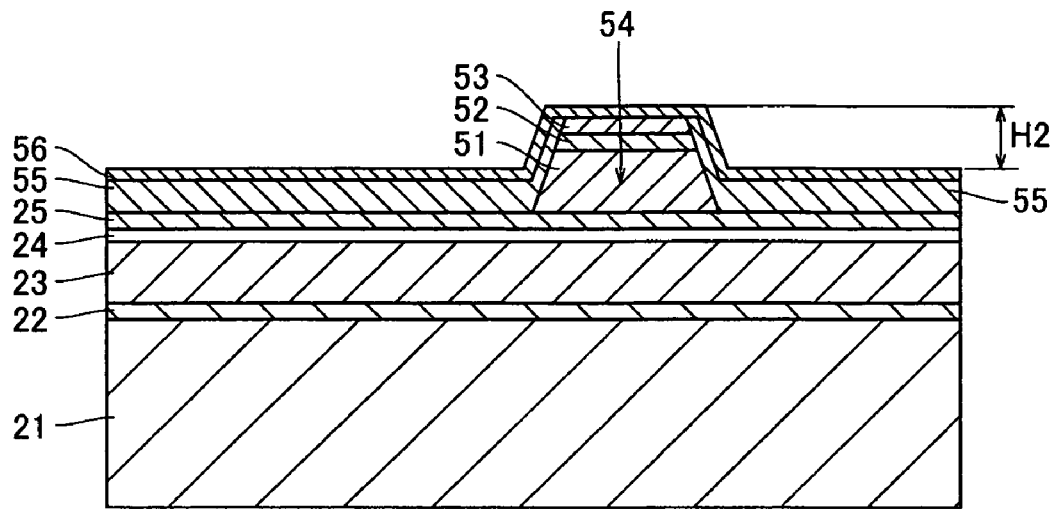

As shown in FIG. 43, the p-side electrode 56 having the thickness of about 0.3 μm is formed by electron beam evaporation, to cover the upper surfaces of the ridge portion 54 and the n-type current blocking layer 55 while partially covering the side surfaces of the ridge portion 54. At this time, the AuZn layer (not shown), the Pt layer (not shown) and the Au layer (not shown) are successively formed. Thus, the registrational projecting portion constituted of the ridge portion 54 has the projection height H2 of about 800 nm between the upper surface of the portion of the p-side electrode 56 located on the upper surface of the current blocking layer 55 and the upper surface of the portion of the p-side electrode 56 located on the upper surface of the ridge portion 54. In other words, the depth D2 (about 1.14 μn) of the registrational recess portion constituted of the opening 42a of the current blocking layer 42 is larger than the projection height H2 (about 800 nm) of the registrational projecting portion constituted of the ridge portion 54.

Figure 44:
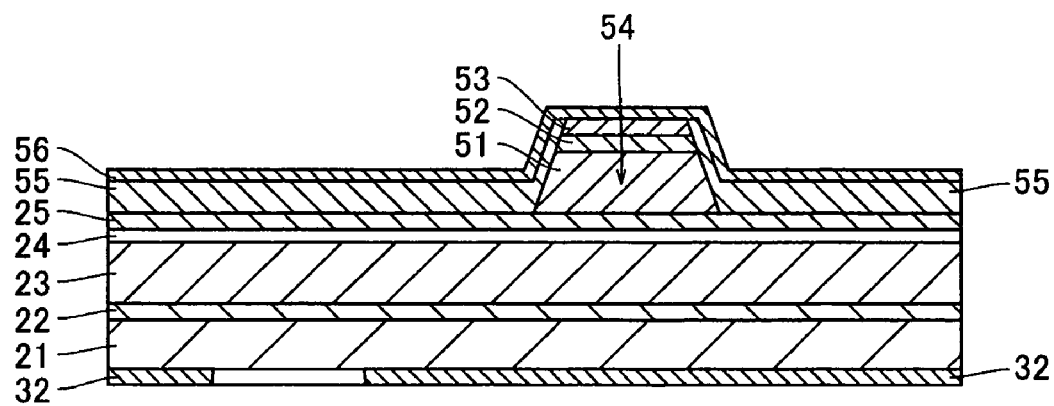

As shown in FIG. 44, the back surface of the n-type GaAs substrate 21 is polished so that the thickness between the upper surface of the ridge portion 54 and the back surface of the n-type GaAs substrate 21 is about 100 μm. Thereafter the n-side electrode 32, also serving as an etching mask, similar in composition and thickness to the START n-side electrode 32 according to the aforementioned first embodiment is formed on the region of the back surface of the n-type GaAs substrate 21 other than that for forming the contact hole 140a (see FIG. 30) by electron beam evaporation.

Figure 45:
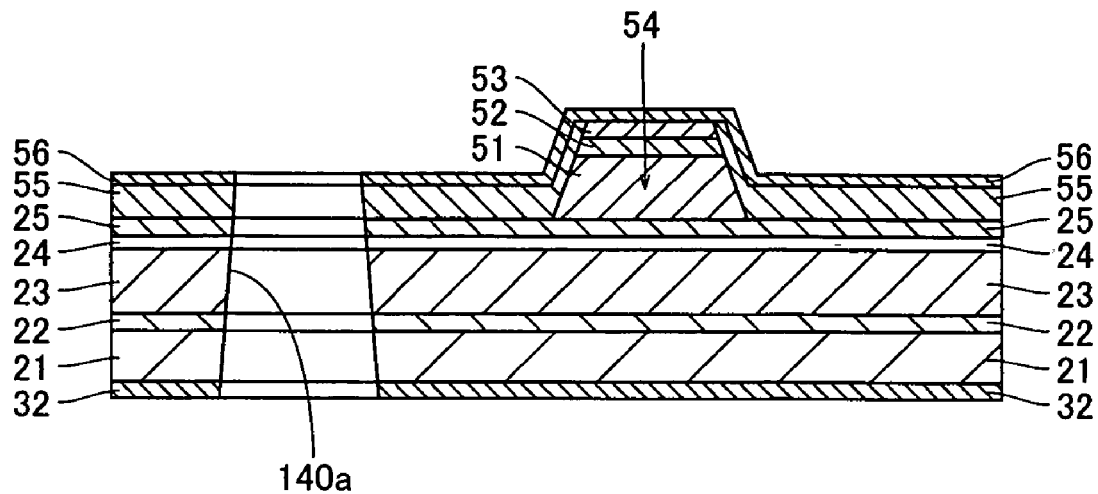

As shown in FIG. 45, the circular contact hole 140a is formed through the mask of the n-side electrode 32 by RIE with chlorine gas, to pass through the n-type GaAs substrate 21, the semiconductor layers 22 to 25 and 55 and the p-side electrode 56 from the back surface of the n-type GaAs substrate 21. This contact hole 140a is formed to have the tapered inner side surface so that the diameter of the portion closer to the p-side electrode 56 is smaller than the diameter of several 10 μm of the portion closer to the n-side electrode 32.

Figure 46:
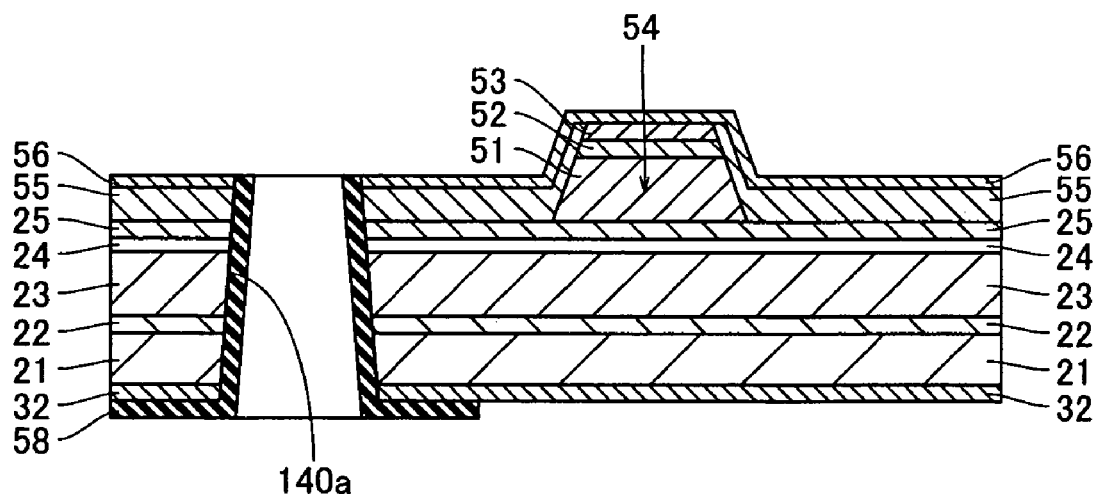

As shown in FIG. 46, the insulating film 58 of $SiO_2$ having the thickness of about 200 nm is formed on the inner side surface of the contact hole 140a and the surface, opposite to the n-type GaAs substrate 21, of the portion of the n-side electrode 32 located on the region close to the contact hole 140a.

Figure 47:
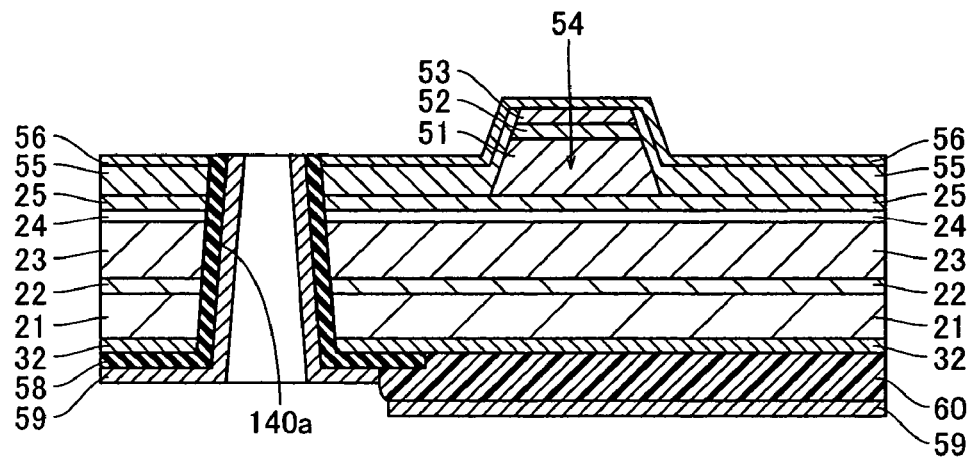
Figure 48:
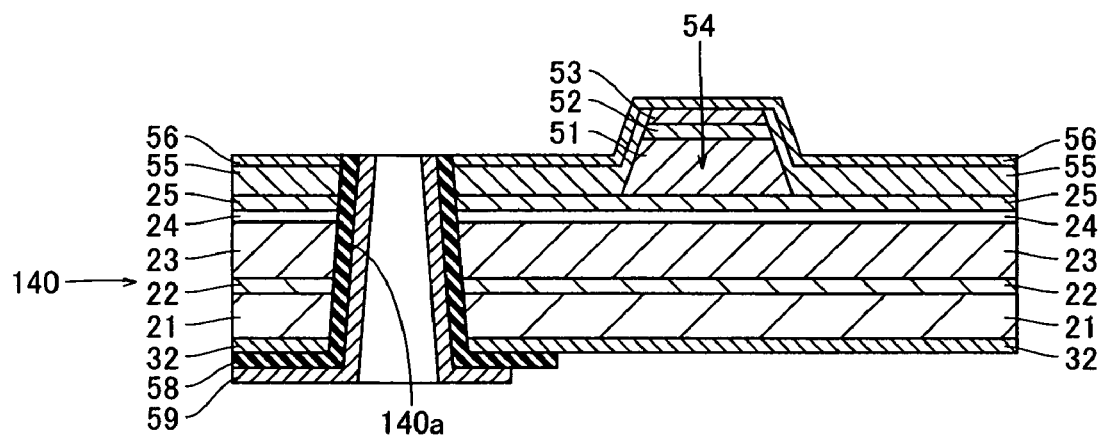

As shown in FIG. 47, a resist film 60 is formed on a prescribed region other than that corresponding to the contact hole 140a. Thereafter the extraction electrode 59 having the thickness of about 0.3 μm is formed on the surface of the resist film 60 opposite to the n-type GaAs substrate 21 as well as the surface of the insulating film 58 opposite to the n-type GaAs substrate 21 and the inner side surfaces thereof. At this time, the Ti layer (not shown), the Pt layer (not shown) and the Au layer (not shown) are successively formed. Thereafter the resist film 60 is removed by lift-off. Thus, a portion unnecessary for the extraction electrode 59 is removed as shown in FIG. 48. The red laser element 140 according to the second embodiment is formed in this manner.

Figure 49:
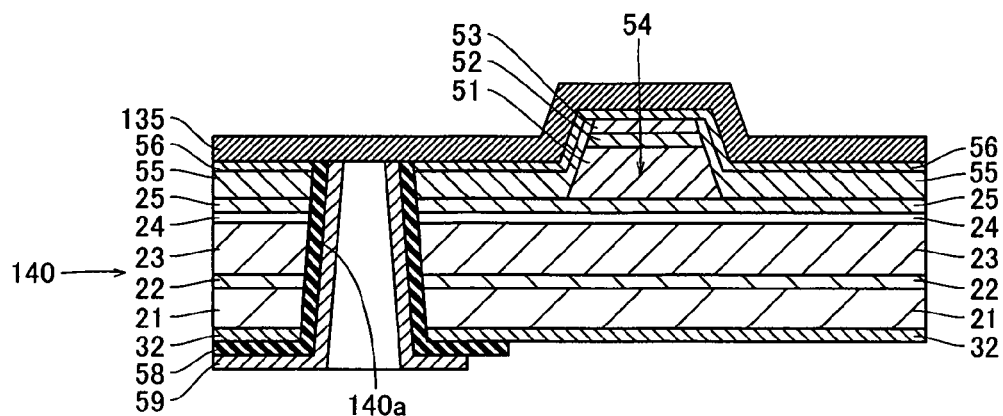

A method of bonding the blue-violet laser element 130 and the red laser element 140 to each other is now described with reference to FIGS. 49 and 50. First, the solder layer 135 of Au—Sn is formed on the p-side electrode 56 of the red laser element 140, as shown in FIG. 49.

Figure 50:
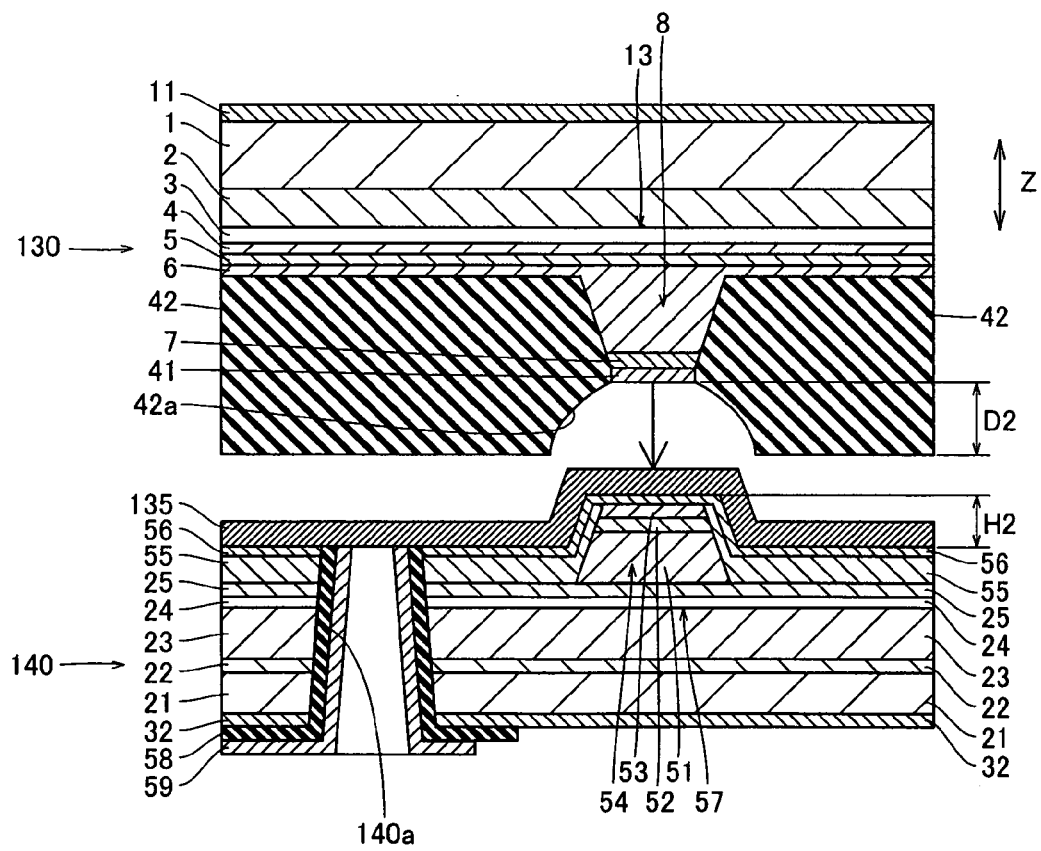

As shown in FIG. 50, the registrational recess portion constituted of the opening 42a of the current blocking layer 42 of the blue-violet laser element 130 is directed downward and receives the registrational projecting portion constituted of the ridge portion 54 of the red laser element 140, to be registered therewith. At this time, the registrational recess portion constituted of the opening 42a of the current blocking layer 42 and the registrational projecting portion constituted of the ridge portion 54 are visually recognized through the transparent regions 111 of the blue-violet laser element 130 shown in FIG. 31, to be fitted to each other in the direction Z. When the registrational projecting portion constituted of the ridge portion 54 is fitted into the registrational recess portion constituted of the opening 42a of the n-type current blocking layer 42, the solder layer 135 of Au—Sn is melted by heat treatment under a temperature condition of about 280° C. Thereafter the solder layer 135 is solidified by a step of cooling the same to the room temperature, thereby bonding the blue-violet laser element 130 and the red laser element 140 to each other through the solder layer 135.

At this time, the blue-violet laser element 130 and the red laser element 140 can be inhibited from horizontal misregistration in the direction X shown in FIGS. 29 and 30 due to the fitting between the registrational recess portion constituted of the opening 42a of the n-type current blocking layer 42 and the registrational projecting portion constituted of the ridge portion 54. Thus, cleavage directions of the blue-violet laser element 130 and the red laser element 140 can be inhibited from deviating from each other.

Thereafter the light emission planes 43 (see FIG. 29) are formed by simultaneously cleaving the blue-violet laser element 130 and the red laser element 140 bonded to each other, followed by separation into each integrated semiconductor laser device. Finally, the wires 122 are bonded onto the surfaces of the n-side electrode 32 and the extraction electrode 59 of the red laser element 140 respectively as shown in FIGS. 29 and 30, thereby forming the integrated semiconductor laser device according to the second embodiment.

Third Embodiment

Figure 51:
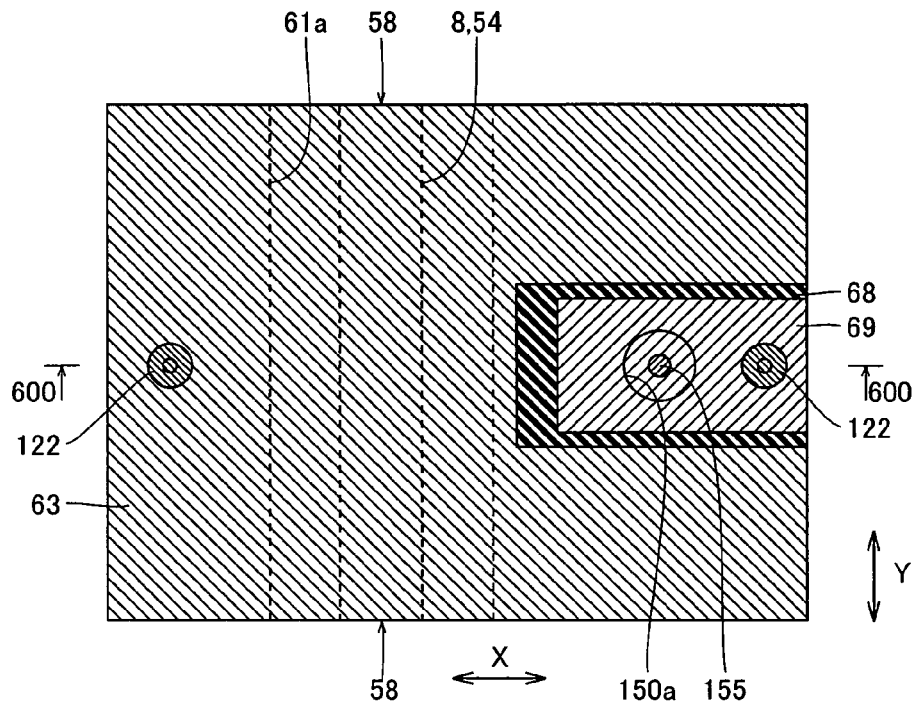
FIG. 51 is a plan view showing the structure of an integrated semiconductor laser device according to a third embodiment of the present invention.
Figure 52:
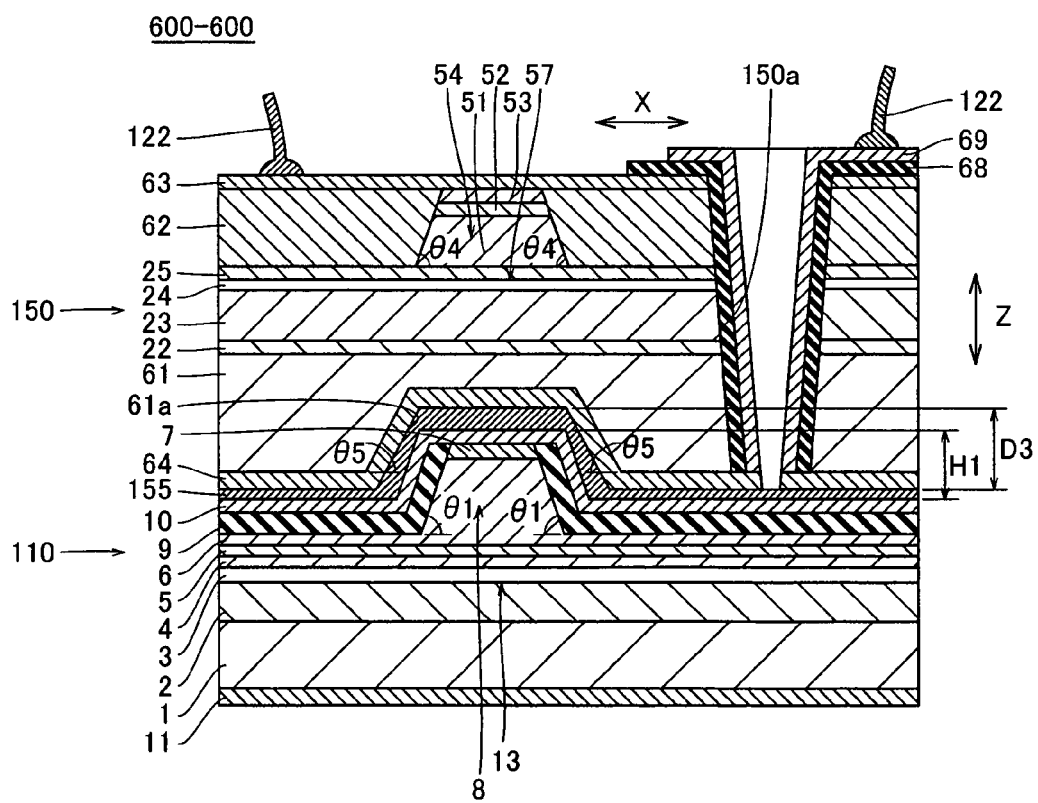
FIG. 52 is a sectional view taken along the line 600-600 in FIG. 51.

Referring to FIGS. 51 and 52, a blue-violet laser element 110 is provided with a registrational projecting portion while a substrate of a red laser element 150 is provided with a registrational recess portion in an integrated semiconductor laser device according to a third embodiment of the present invention, dissimilarly to the aforementioned first and second embodiments.

According to the third embodiment, the blue-violet laser element 110 having the registrational projecting portion and the red laser element 150 having the registrational recess portion are stacked (integrated) with each other in a direction Z, as shown in FIG. 52. The blue-violet laser element 110 is similar in structure to the blue-violet laser element 110 according to the aforementioned first embodiment. The red laser element 150 is an example of the "second semiconductor laser element" in the present invention.

The structure of the red laser element 150 according to the third embodiment is now described. In the red laser element 150 according to the third embodiment, an n-type buffer layer 22, an n-type cladding layer 23, an active layer 24, a p-type first cladding layer 25, a p-type second cladding layer 51, a p-type intermediate layer 52 and a p-type contact layer 53 are successively formed on an n-type GaAs substrate 61, as shown in FIG. 52. The p-type second cladding layer 51 has a projecting portion and remaining flat portions, while the p-type intermediate layer 52 and the p-type contact layer 53 are successively formed on the projecting portion of the p-type second cladding layer 51. The p-type contact layer 53, the p-type intermediate layer 52 and the p-type second cladding layer 51 constitute a ridge portion 54. The semiconductor layers 22 to 25 and 51 to 53 are similar in composition and thickness to the semiconductor layers 22 to 25 and 51 to 53 according to the aforementioned second embodiment. The ridge portion 54 has a shape similar to that of the ridge portion 54 according to the aforementioned second embodiment. A portion of the active layer 24 located under the ridge portion 54 and a peripheral portion of this portion of the active layer 24 form an emission region 57 of the red laser element 150.

According to the third embodiment, an n-type current blocking layer 62 having a thickness of about 1.6 μm is formed on the p-type first cladding layer 25 to cover the side surfaces of the ridge portion 54. This n-type current blocking layer 62 is formed by an n-type AlInP layer (not shown) and an n-type GaAs layer (not shown) successively from the side closer to the n-type GaAs substrate 61. A p-side electrode 63 similar in composition and thickness to the p-side electrode 56 according to the aforementioned second embodiment is formed on the upper surfaces of the n-type current blocking layer 62 and the ridge portion 54 (p-type contact layer 53).

A circular contact hole 150a is formed to pass through the p-side electrode 63, the semiconductor layers 62 and 25 to 22 and the n-type GaAs substrate 61 from the upper surface of the p-side electrode 63. This contact hole 150a has a tapered inner side surface so that the diameter of a portion closer to the n-type GaAs substrate 61 is smaller than the diameter of several 10 μm of a portion closer to the p-side electrode 63. An insulating film 68 of $SiO_2$ having a thickness of about 200 nm is formed on the inner side surface of the contact hole 150a and the surface of a portion of the p-side electrode 63 located on a region close to the contact hole 150a. An extraction electrode 69 having a thickness of about 0.3 μm is formed on a prescribed region of the insulating film 68 to be electrically connected to an n-side electrode 64 described later through the contact hole 150a. This extraction electrode 69 is formed by a Ti layer (not shown), a Pt layer (not shown) and an Au layer (not shown) successively from the side closer to the n-type GaAs substrate 61. Wires (gold wires) 122 are bonded to the surfaces of the p-side electrode 63 and the extraction electrode 69 respectively.

According to the third embodiment, a recess portion 61a having a depth of about 1 μm is formed on a region of the back surface of the n-type GaAs substrate 61 corresponding to the ridge portion 54. The recess portion 61a of the n-type GaAs substrate 61 has tapered inner side surfaces so that the width of the bottom is smaller than the width (about 3 μm) of the open end. The inner side surfaces of the recess portion 61a of the n-type GaAs substrate 61 and the surface of the active layer 24 form an angle θ5 of about 60°. As shown in FIG. 51, the recess portion 61a of the n-type GaAs substrate 61 is in the form of a (slender) stripe extending in the direction Y along the ridge portion 54. The recess portion 61a of the n-type GaAs substrate 61 forms the registrational recess portion. The n-type GaAs substrate 61 is an example of the "substrate" in the present invention.

The n-side electrode 64 having a thickness of about 0.3 μm is formed on the back surface of the n-type GaN substrate 61 including the recess portion 61a to be electrically connected with the extraction electrode 69. This n-side electrode 64 is formed by an AuGe layer (not shown), an Ni layer (not shown) and an Au layer (not shown) successively from the side closer to the n-type GaN substrate 61. The n-side electrode 64 is an example of the "second electrode" in the present invention. Thus, the registrational recess portion constituted of the recess portion 61a of the n-type GaAs substrate 61 has a depth D3 of about 1 μm between a portion of the surface of the n-side electrode 64 closer to the blue-violet laser element 110 located on a region other than that corresponding to the recess portion 61a and another portion of the surface of the n-side electrode 64 closer to the blue-violet laser element 110 located on the region corresponding to the recess portion 61a. In other words, the depth D3 (about 1 μm) of the registrational recess portion constituted of the recess portion 61a of the n-type GaAs substrate 61 is larger than the projection height H1 (about 153 nm) of the registrational projecting portion constituted of the ridge portion 8.

According to the third embodiment, the blue-violet laser element 110 and the red laser element 150 are integrated (stacked) with each other in the direction Z while the registrational projecting portion constituted of the ridge portion 8 is fitted into the registrational recess portion constituted of the recess portion 61a of the n-type GaAs substrate 61, as shown in FIG. 52. Further, the emission regions 13 and 57 of the blue-violet laser element 110 and the red laser element 150 are aligned with each other in the direction (direction Z shown in FIG. 52) of stacking of the semiconductor layers. The depth D3 (about 1 μm) of the registrational recess portion of the red laser element 150 is larger than the projection height H1 (about 153 nm) of the registrational projecting portion of the blue-violet laser element 110 as described above, whereby the interval between the upper surface of the registrational projecting portion of the blue-violet laser element 110 and the bottom surface of the registrational recess portion of the red laser element 150 is larger than that between the remaining regions of the blue-violet laser element 110 and the red laser element 150 other than the registrational projecting portion and the registrational recess portion. The registrational projecting portion of the blue-violet laser element 110 and the registrational recess portion of the red laser element 150 are bonded to each other through the solder layer 155 of Au—Sn. The solder layer 155 is an example of the "bonding layer" in the present invention. The p-side electrode 10 of the blue-violet laser element 110 is electrically connected to the extraction electrode 69 through the n-side electrode 64 of the red laser element 150 and the solder layer 155.

According to the third embodiment, as hereinabove described, the registrational projecting portion constituted of the ridge portion 8 of the blue-violet laser element 110 is fitted into the registrational recess portion constituted of the recess portion 61a of the n-type GaAs substrate 61 of the red laser element 150, whereby the blue-violet laser element 110 and the red laser element 150 bonded to each other can be inhibited from horizontal misregistration (in the direction X shown in FIG. 52) due to the fitting between the registrational projecting portion and the registrational recess portion. Thus, the optical axes of beams emitted from the blue-violet laser element 110 and the red laser element 150 respectively can be inhibited from horizontal deviation (in the direction X shown in FIG. 52), whereby the optical axis of a beam emitted from the integrated semiconductor laser device can be easily adjusted when the beam is introduced into an optical system formed by a lens and a mirror. Thus, the cost for optical axis adjustment can be reduced. Further, the blue-violet laser element 110 and the red laser element 150 bonded to each other can be so inhibited from horizontal misregistration (in the direction X shown in FIG. 52) that cleavage directions of the blue-violet laser element 110 and the red laser element 150 can be inhibited from deviating from each other. Thus, cleavability for simultaneously cleaving the blue-violet laser element 110 and the red laser element 150 bonded to each other can be improved. Consequently, the properties of laser beams emitted from light emission planes (cleavage planes) 58 can be improved.

According to the third embodiment, further, the emission regions 13 and 57 of the blue-violet laser element 110 and the red laser element 150 are aligned with each other in the direction (direction Z shown in FIG. 52) of stacking of the semiconductor layers, so that the interval between the emission regions 13 and 57 of the blue-violet laser element 110 and the red laser element 150 can be reduced as compared with a case where the emission regions 13 and 57 of the blue-violet laser element 110 and the red laser element 150 positionally deviate from each other in two directions, i.e., the direction (direction Z shown in FIG. 52) of stacking of the semiconductor layers and the horizontal direction (direction X shown in FIG. 52). Thus, the beam emitted from either the emission region 57 of the red laser element 150 or the emission region 13 of the blue-violet laser element 110 can be inhibited from being incident on a region remarkably deviating from a prescribed region of the optical system when the beam emitted from the integrated semiconductor laser device is introduced into the optical system, if the optical axis is so adjusted as to introduce the beam emitted from either the emission region 13 of the blue-violet laser element 110 or the emission region 57 of the red laser element 150 into the prescribed region of the optical system. Consequently, the optical axis of the beam emitted from the integrated semiconductor laser device can be more easily adjusted with respect to the optical system, whereby the cost for optical axis adjustment can be further reduced.

According to the third embodiment, the registrational recess portion can be easily formed on the red laser element 150 by forming the recess portion 61a on the n-type GaAs substrate 61 of the red laser element 150.

The remaining effects of the third embodiment are similar to those of the aforementioned first embodiment.

A fabrication process for the integrated semiconductor laser device according to the third embodiment is now described with reference to FIGS. 51 to 63. Steps of fabricating the blue-violet laser element 110 according to the third embodiment are similar to those of the first embodiment shown in FIGS. 3 to 13.

Figure 53:
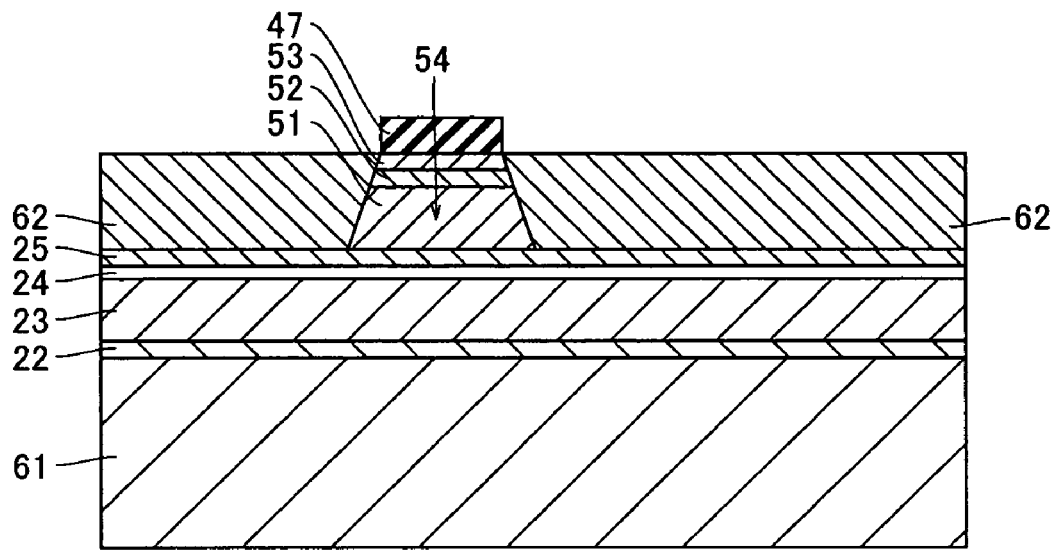
FIGS. 53 to 63 are sectional views for illustrating a fabrication process for the integrated semiconductor laser device according to the third embodiment shown in FIGS. 51 and 52.

In order to form the red laser element 150, the elements up to the ridge portion 54 are formed as shown in FIG. 53, through steps similar to those of the second embodiment shown in FIGS. 40 and 41. Thereafter the n-type current blocking layer 62 having the thickness of about 1.6 μm is formed on the p-type first cladding layer 25 through a selective growth mask of the $SiO_2$ film 47, to cover the side surfaces of the ridge portion 54. At this time, the n-type AlInP layer (not shown) and the n-type GaAs layer (not shown) are successively formed. Thereafter the $SiO_2$ film 47 is removed.

Figure 54:
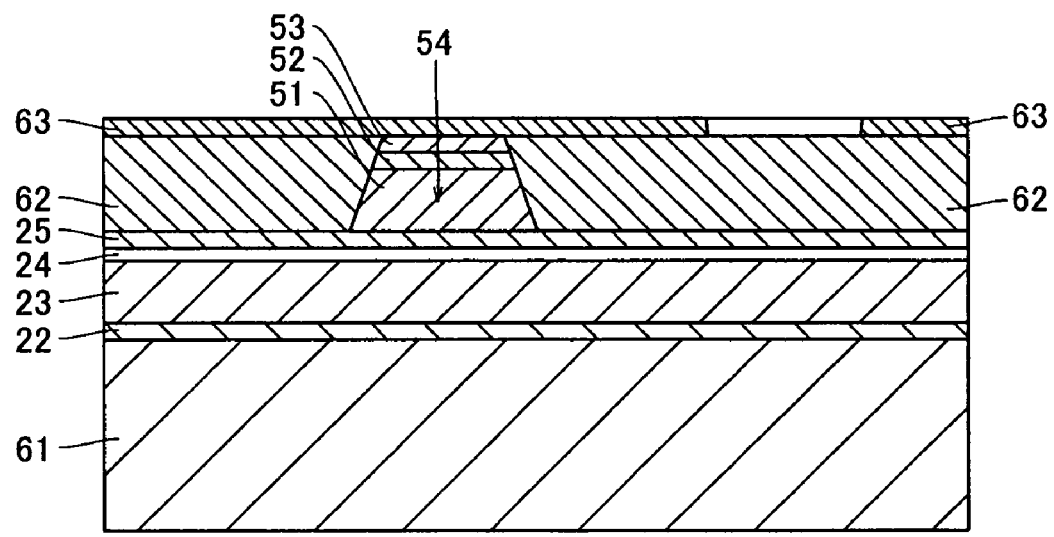

As shown in FIG. 54, the p-side electrode 63 similar in composition and thickness to the p-side electrode 56 according to the aforementioned second embodiment, also serving as an etching mask, is formed on the ridge portion 54 (p-type contact layer 53) and a region of the n-type current blocking layer 62 other than that for forming the contact hole 150a (see FIG. 52) by electron beam evaporation.

Figure 55:
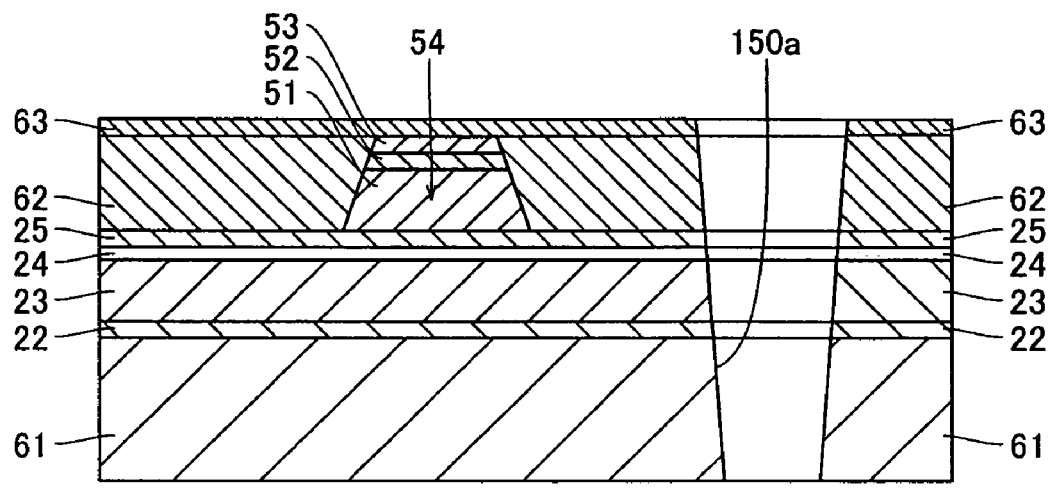

As shown in FIG. 55, the circular contact hole 150a is formed by RIE with chlorine gas, to pass through the semiconductor layers 62 and 25 to 22 and the n-type GaAs substrate 61 from the upper surface of the p-side electrode 63. This contact hole 150a is formed to have the tapered inner side surface so that the diameter of the portion closer to the n-type GaAs substrate 61 is smaller than the diameter of several 10 μm of the portion closer to the p-side electrode 63.

Figure 56:
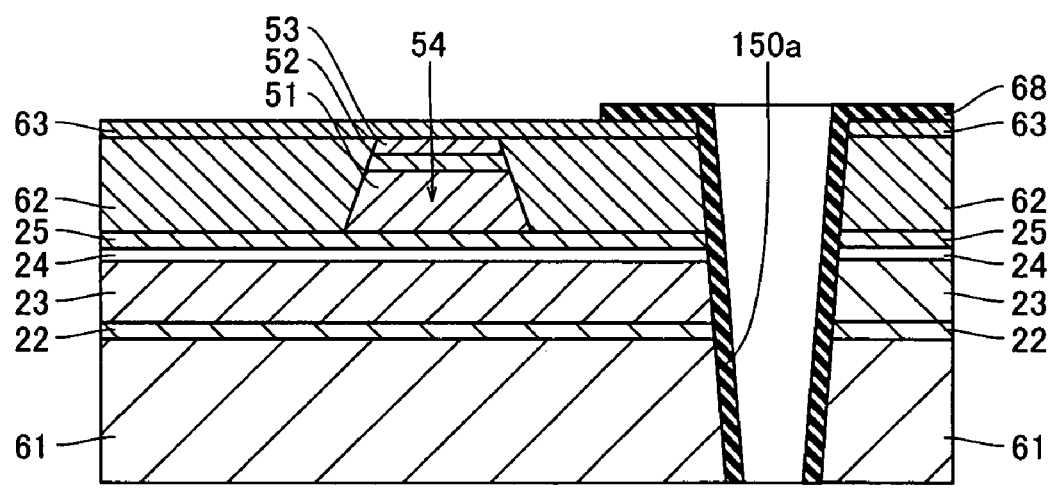

As shown in FIG. 56, the insulating film 68 of $SiO_2$ having the thickness of about 200 nm is formed on the inner side surface of the contact hole 150a and the surface of the portion of the p-side electrode 63 located on the region close to the contact hole 150a.

Figure 57:
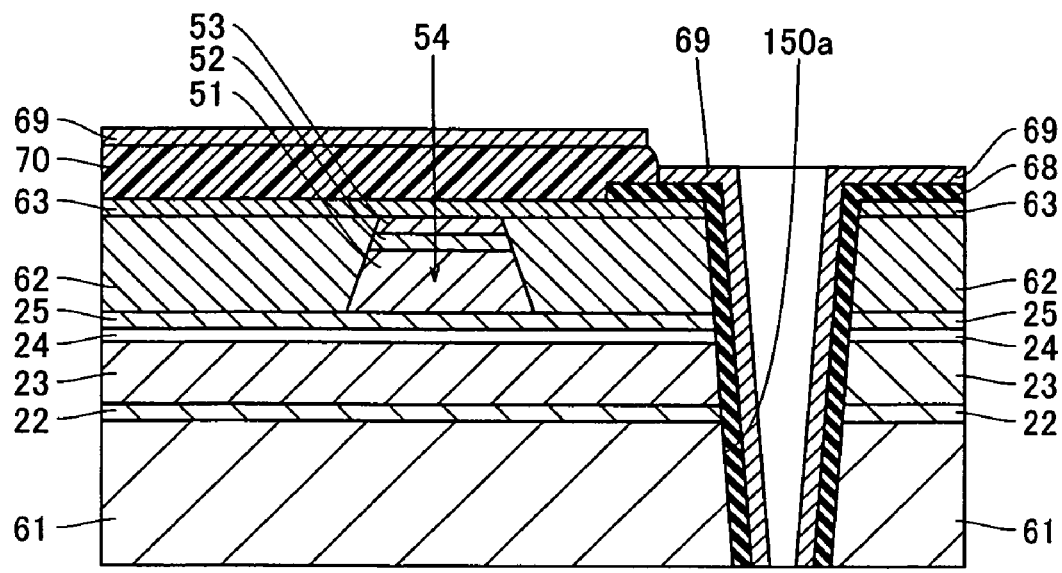
Figure 58:
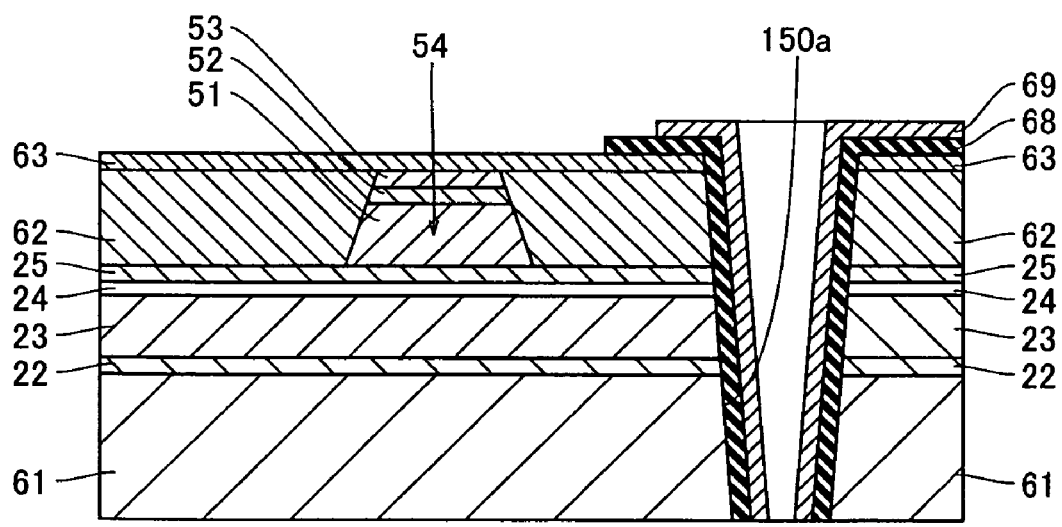

As shown in FIG. 57, a resist film 70 is formed on a prescribed region other than that corresponding to the contact hole 150a. Thereafter the extraction electrode 69 having the thickness of about 0.3 μm is formed on the upper surface of the resist film 70 and the upper surface and the inner side surfaces of the insulating film 68 by electron beam evaporation. At this time, the Ti layer (not shown), the Pt layer (not shown) and the Au layer (not shown) are successively formed. Thereafter the resist film 70 is removed by lift-off. Thus, a portion unnecessary for the extraction electrode 69 is removed as shown in FIG. 58.

Figure 59:
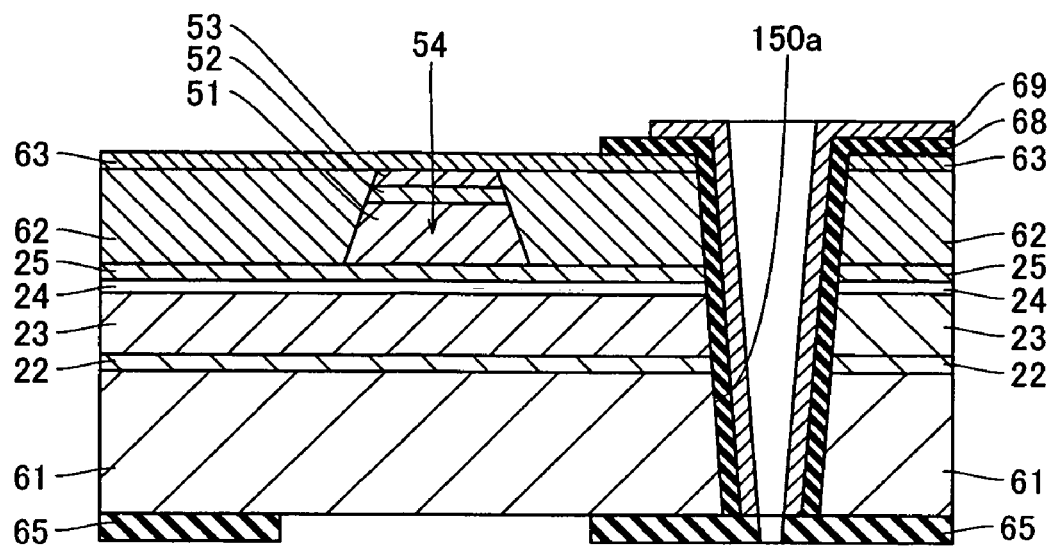

As shown in FIG. 59, the back surface of the n-type GaAs substrate 61 is polished so that the thickness between the upper surface of the ridge portion 54 and the back surface of the n-type GaAs substrate 61 is about 100 μm, and an $SiO_2$ film 65 having a thickness of about 240 nm is thereafter formed on a region of the back surface of the n-type GaAs substrate 61 other than that corresponding to the recess portion 61a (see FIG. 52).

Figure 60:
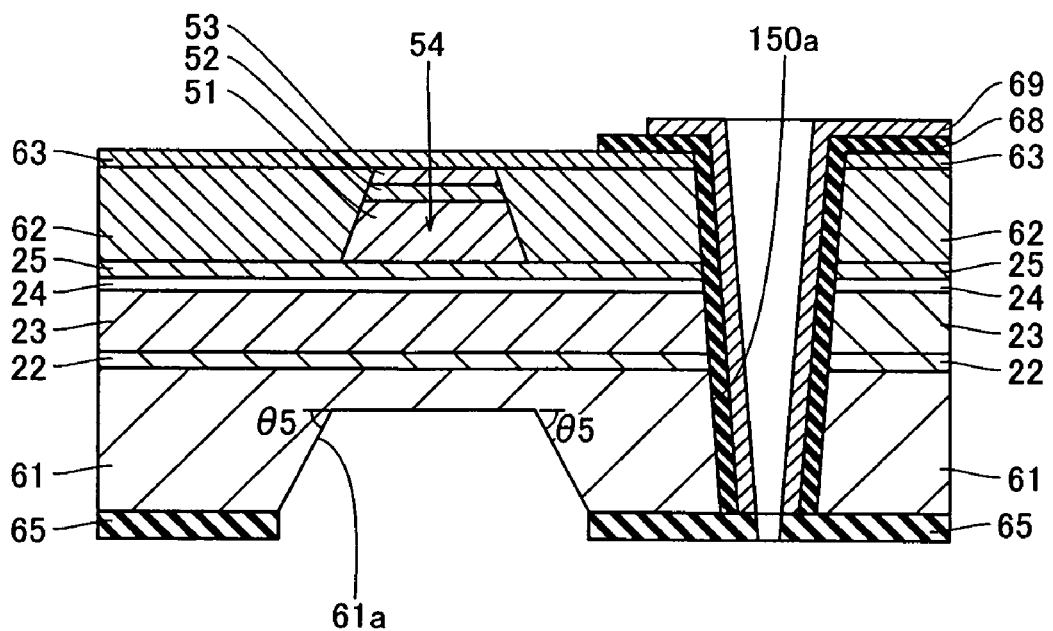

As shown in FIG. 60, the back surface of the n-type GaAs substrate 61 is etched up to a depth of about 1 μm by RIE with chlorine gas through a mask of the $SiO_2$ film 65. Thus, the recess portion 61a having the depth of about 1 μm is formed on the back surface of the n-type GaAs substrate 61. At this time, the recess portion 61a of the n-type GaAs substrate 61 is formed to have the tapered inner side surfaces so that the width of the bottom is smaller than the width of the open end. The open end of the recess portion 61a of the n-type GaAs substrate 61 has the width of about 3 μm. The inner side surfaces of the recess portion 61a of the n-type GaAs substrate 61 and the surface of the active layer 24 (n-type GaAs substrate 61) form the angle θ5 of about 60°. As shown in FIG. 51, the recess portion 61a of the n-type GaAs substrate 61 is in the form of a (slender) stripe extending along the ridge portion 54. The recess portion 61a of the n-type GaAs substrate 61 forms the registrational recess portion. Thereafter the $SiO_2$ film 65 is removed.

Figure 61:
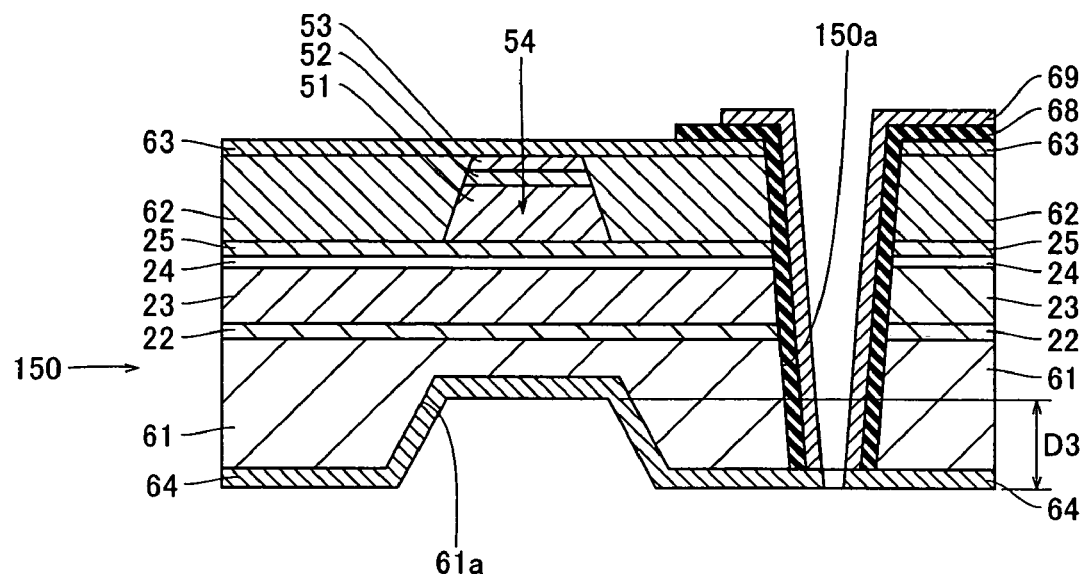

As shown in FIG. 61, the n-side electrode 64 having the thickness of about 0.3 μm is formed on the back surface of the n-type GaN substrate 61 including the recess portion 61a by electron beam evaporation, to be electrically connected with the extraction electrode 69. At this time, the AuGe layer (not shown), the Ni layer (not shown) and the Au layer (not shown) are successively formed. Thus, the registrational recess portion constituted of the recess portion 61a of the n-type GaAs substrate 61 has the depth D3 of about 1 μm between the portion of the upper surface of the n-side electrode 64 located on the region other than the recess portion 61a and another portion of the upper surface of the n-side electrode 64 located on the bottom of the recess portion 61a. In other words, the depth D3 (about 1 μm) of the registrational recess portion constituted of the recess portion 61a of the n-type GaAs substrate 61 is larger than the projection height H1 (about 153 nm) (see FIG. 52) of the registrational projecting portion constituted of the ridge portion 8. The red laser element 150 according to the third embodiment is formed in this manner.

Figure 62:
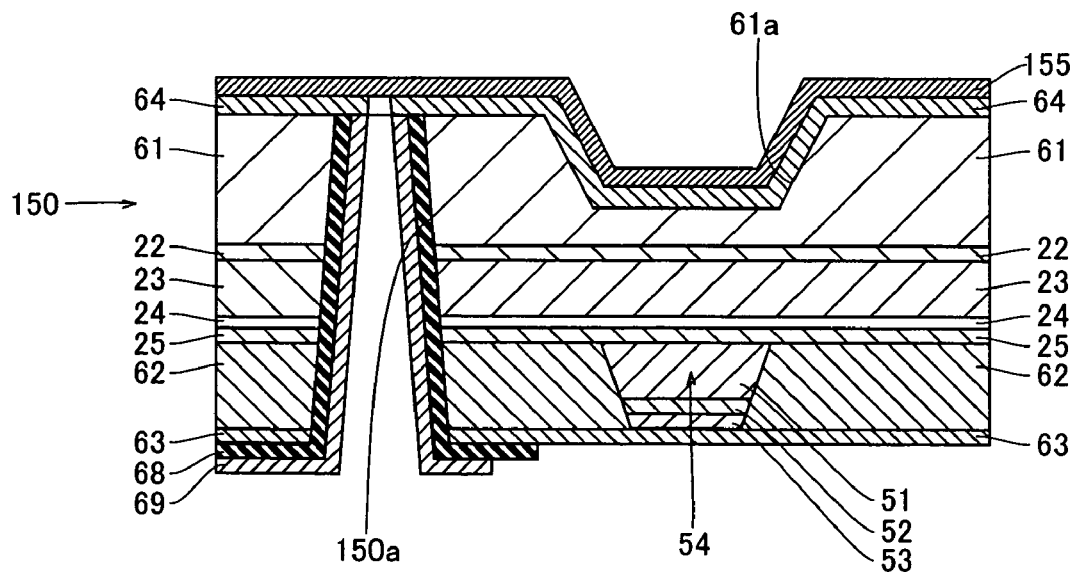

A method of bonding the blue-violet laser element 110 and the red laser element 150 to each other is now described with reference to FIGS. 62 and 63. First, the solder layer 155 of Au—Sn is formed on the n-side electrode 64 of the red laser element 150, as shown in FIG. 62.

Figure 63:
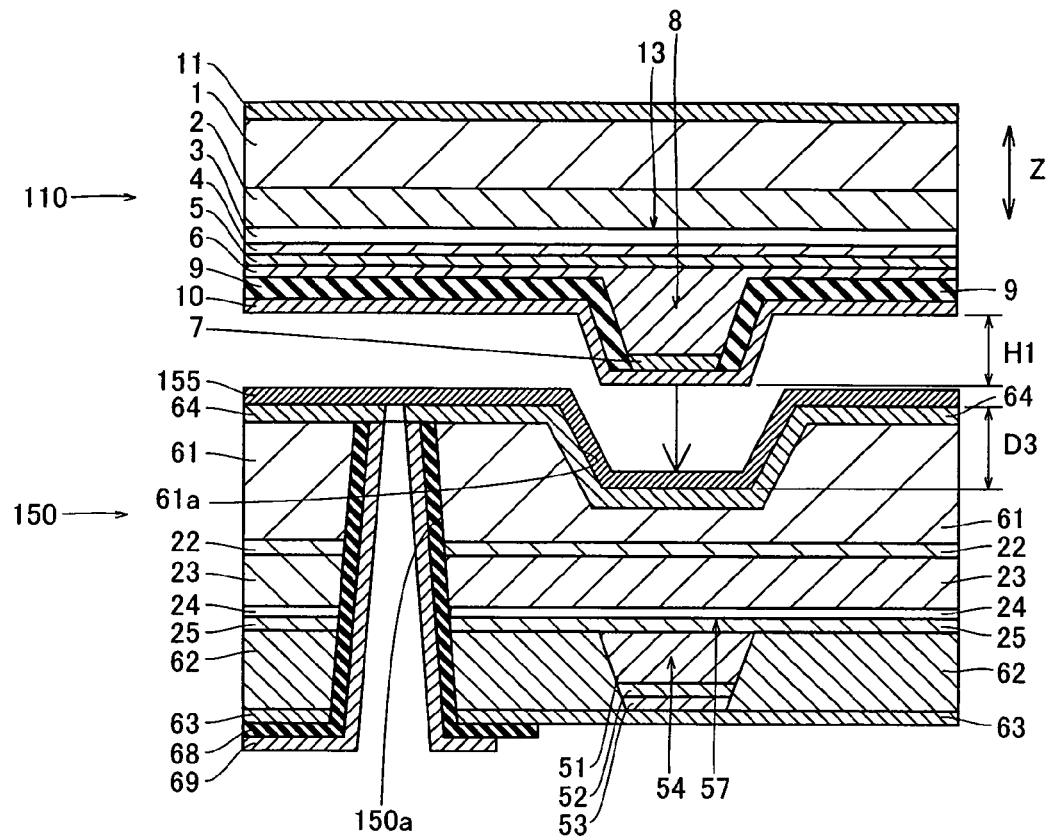

As shown in FIG. 63, the registrational projecting portion constituted of the ridge portion 8 of the blue-violet laser element 110 is directed downward and fitted into the registrational recess portion constituted of the recess portion 61a of the n-type GaAs substrate 61 of the red laser element 150, to be registered therewith. At this time, the registrational projecting portion constituted of the ridge portion 8 and the registrational recess portion constituted of the recess portion 61a of the n-type GaAs substrate 61 are visually recognized through transparent regions 111 of the blue-violet laser element 110 similar to those shown in FIGS. 10 and 12, to be fitted to each other in the direction Z. When the registrational projecting portion constituted of the ridge portion 8 is fitted into the registrational recess portion constituted of the recess portion 61a of the n-type GaAs substrate 61, the solder layer 155 of Au—Sn is melted by heat treatment under a temperature condition of about 280° C. Thereafter the solder layer 155 is solidified by a step of cooling the same to the room temperature, thereby bonding the blue-violet laser element 110 and the red laser element 150 to each other.

At this time, the blue-violet laser element 110 and the red laser element 150 can be inhibited from horizontal misregistration in the direction X shown in FIGS. 51 and 52 due to the fitting between the registrational projecting portion constituted of the ridge portion 8 and the registrational recess portion constituted of the recess portion 61a of the n-type GaAs substrate 61 according to the third embodiment. Thus, cleavage directions of the blue-violet laser element 110 and the red laser element 150 can be inhibited from deviating from each other.

Thereafter the light emission planes 58 (see FIG. 51) are formed by simultaneously cleaving the blue-violet laser element 110 and the red laser element 150 bonded to each other, followed by separation into each integrated semiconductor laser device. Finally, the wires 122 are bonded onto the surfaces of the p-side electrode 63 and the extraction electrode 69 of the red laser element 150 respectively as shown in FIGS. 51 and 52, thereby forming the integrated semiconductor laser device according to the third embodiment.

Fourth Embodiment

Figure 64:
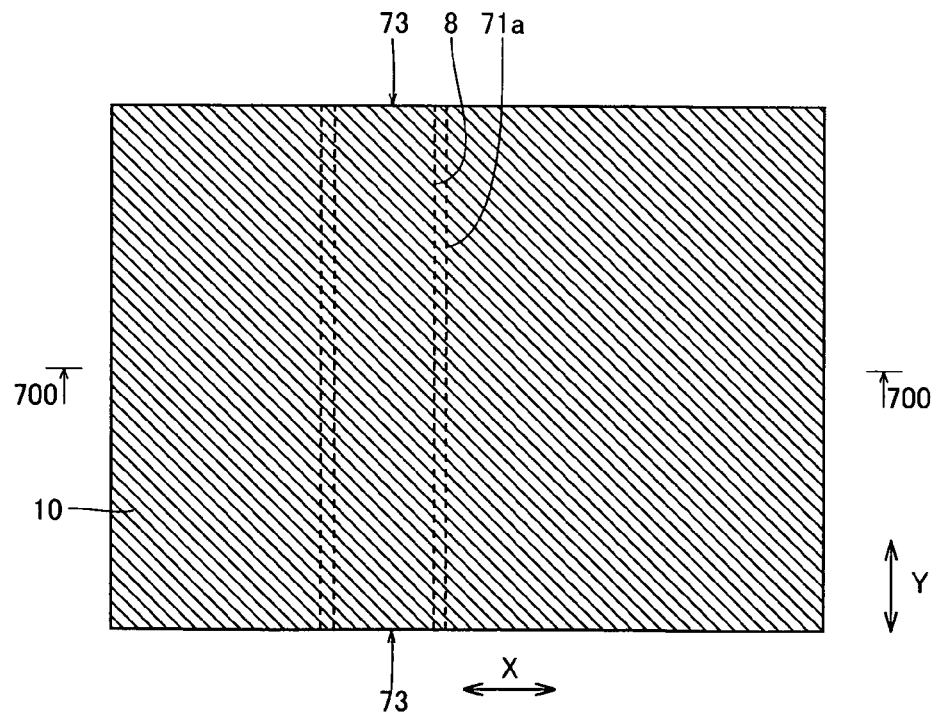
FIG. 64 is a plan view showing the structure of an integrated semiconductor laser device according to a fourth embodiment of the present invention.
Figure 65:
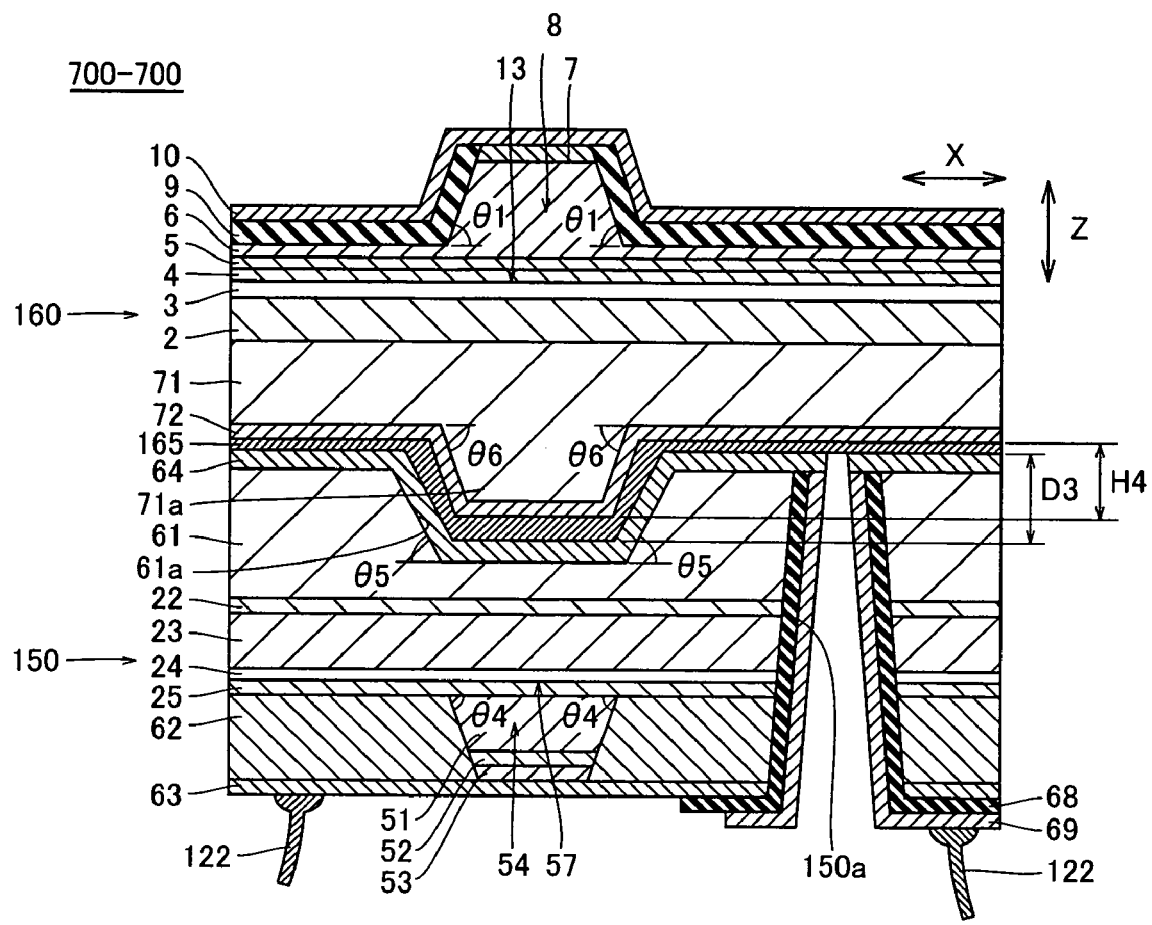
FIG. 65 is a sectional view taken along the line 700-700 in FIG. 64.

Referring to FIGS. 64 and 65, a registrational projecting portion is formed on a substrate of a blue-violet laser element 160 while a registrational recess portion is formed on a substrate of a red laser element 150 in an integrated semiconductor laser device according to a fourth embodiment of the present invention, dissimilarly to the aforementioned first to third embodiments.

According to the fourth embodiment, the blue-violet laser element 160 having the registrational projecting portion and the red laser element 150 having the registrational recess portion are stacked (integrated) with each other in a direction Z, as shown in FIG. 65. The red laser element 150 is similar in structure to the red laser element 150 according to the aforementioned third embodiment. The blue-violet laser element 160 is an example of the "first semiconductor laser element" in the present invention.

The structure of the blue-violet laser element 160 according to the fourth embodiment is now described. In the blue-violet laser element 160 according to the fourth embodiment, an n-type cladding layer 2, an active layer 3, a light guide layer 4, a cap layer 5, a p-type cladding layer 6 and a p-type contact layer 7 are successively formed on an n-type GaN substrate 71, as shown in FIG. 65. The p-type cladding layer 6 has a projecting portion and remaining flat portions, and the p-type contact layer 7 is formed on the projecting portion of the p-type cladding layer 6. The p-type contact layer 7 and the projecting portion of the p-type cladding layer 6 constitute a ridge portion 8. The semiconductor layers 2 to 7 are similar in composition and thickness to the semiconductor layers 2 to 7 according to the aforementioned first embodiment. The ridge portion 8 has a shape similar to that of the ridge portion 8 according to the aforementioned first embodiment. A portion of the active layer 3 located under the ridge portion 8 and a peripheral portion of this portion of the active layer 3 form an emission region 13 of the blue-violet laser element 160.

A current blocking layer 9 similar in composition and thickness to the current blocking layer 9 according to the aforementioned first embodiment is formed to cover the side surfaces of the ridge portion 8 and the upper surfaces of the flat portions of the p-type cladding layer 6. A p-side electrode 10 similar in composition and thickness to the p-side electrode 10 according to the aforementioned first embodiment is formed on the current blocking layer 9, to be in contact with the upper surface of the ridge portion 8 (p-type contact layer 7).

According to the fourth embodiment, a projecting portion 71a having a projection height H4 of about 400 nm is formed on a region of the back surface of the n-type GaN substrate 71 corresponding to the ridge portion 8. The projecting portion 71a of the n-type GaN substrate 71 has tapered side surfaces so that the width of the tapered end is smaller than that of the base. The side surfaces of the projecting portion 71a of the n-type GaN substrate 71 and the upper surface of the active layer 3 form an angle θ6 of about 80°. The tapered end of the projecting portion 71a of the n-type GaN substrate 71 has a width of about 2 μm. As shown in FIG. 64, the projecting portion 71a of the n-type GaN substrate 71 is formed in a striped (slender) manner in a direction Y along the ridge portion 8. The projecting portion 71a of the n-type GaAs substrate 71 forms the registrational projecting portion. The n-type GaAs substrate 71 is an example of the "substrate" in the present invention.

An n-side electrode 72 is formed on the back surface of the n-type GaN substrate 71 including the projecting portion 71a. This n-side electrode 72 is formed by an Al layer (not shown) having a thickness of about 6 nm, a Pd layer (not shown) having a thickness of about 10 nm and an Au layer (not shown) having a thickness of about 300 nm successively from the side closer to the n-type GaN substrate 71. The n-side electrode 72 is an example of the "first electrode" in the present invention. Thus, the registrational projecting portion constituted of the projecting portion 71a of the n-type GaN substrate 71 has the projection height H4 of about 400 nm between the upper surface of the portion of the n-side electrode 72 located on the region other than the projecting portion 71a and the upper surface of the portion of the n-side electrode 72 located on the upper surface of the projecting portion 71a. In other words, the depth D3 (about 1 μm) of the registrational recess portion constituted of the recess portion 61a of the n-type GaAs substrate 61 is larger than the projection height H4 (about 400 nm) of the registrational projecting portion constituted of the projecting portion 71a of the n-type GaN substrate 71.

According to the fourth embodiment, the blue-violet laser element 160 and the red laser element 150 are integrated (stacked) with each other in the direction Z while the registrational projecting portion constituted of the projecting portion 71a of the n-type GaN substrate 71 is fitted into the registrational recess portion constituted of the recess portion 61a of the n-type GaAs substrate 61, as shown in FIG. 65. Further, the emission regions 13 and 57 of the blue-violet laser element 160 and the red laser element 150 are aligned with each other in the direction (direction Z shown in FIG. 65) of stacking of the semiconductor layers. The depth D3 (about 1 μm) of the registrational recess portion of the red laser element 150 is larger than the projection height H4 (about 400 nm) of the registrational projecting portion of the blue-violet laser element 160 as described above, whereby the interval between the upper surface of the registrational projecting portion of the blue-violet laser element 160 and the bottom surface of the registrational recess portion of the red laser element 150 is larger than that between the remaining regions of the blue-violet laser element 160 and the red laser element 150 other than the registrational projecting portion and the registrational recess portion. The registrational projecting portion of the blue-violet laser element 160 and the registrational recess portion of the red laser element 150 are bonded to each other through a solder layer 165 of Au—Sn. The solder layer 165 is an example of the "bonding layer" in the present invention. The n-side electrode 72 of the blue-violet laser element 160 is electrically connected to the extraction electrode 69 through the n-side electrode 64 of the red laser element 150 and the solder layer 165.

According to the fourth embodiment, as hereinabove described, the registrational projecting portion constituted of the projecting portion 71a of the n-type GaN substrate 71 of the blue-violet laser element 160 is fitted into the registrational recess portion constituted of the recess portion 61a of the n-type GaAs substrate 61 of the red laser element 150, whereby the blue-violet laser element 160 and the red laser element 150 bonded to each other can be inhibited from horizontal misregistration (in the direction X shown in FIG. 65) due to the fitting between the registrational projecting portion and the registrational recess portion. Thus, the optical axes of beams emitted from the blue-violet laser element 160 and the red laser element 150 respectively can be inhibited from horizontal deviation (in the direction X shown in FIG. 65), whereby the optical axis of a beam emitted from the integrated semiconductor laser device can be easily adjusted when the beam is introduced into an optical system formed by a lens and a mirror. Thus, the cost for optical axis adjustment can be reduced. Further, the blue-violet laser element 160 and the red laser element 150 bonded to each other can be so inhibited from horizontal misregistration (in the direction X shown in FIG. 65) that cleavage directions of the blue-violet laser element 160 and the red laser element 150 can be inhibited from deviating from each other. Thus, cleavability for simultaneously cleaving the blue-violet laser element 160 and the red laser element 150 bonded to each other can be improved. Consequently, the properties of laser beams emitted from light emission planes (cleavage planes) 73 can be improved.

According to the fourth embodiment, further, the emission regions 13 and 57 of the blue-violet laser element 160 and the red laser element 150 are aligned with each other in the direction (direction Z shown in FIG. 65) of stacking of the semiconductor layers, so that the interval between the emission regions 13 and 57 of the blue-violet laser element 160 and the red laser element 150 can be reduced as compared with a case where the emission regions 13 and 57 of the blue-violet laser element 160 and the red laser element 150 positionally deviate from each other in two directions, i.e., the direction (direction Z shown in FIG. 65) of stacking of the semiconductor layers and the horizontal direction (direction X shown in FIG. 65). Thus, the beam emitted from either the emission region 57 of the red laser element 150 or the emission region 13 of the blue-violet laser element 160 can be inhibited from being incident on a region remarkably deviating from a prescribed region of the optical system when the beam emitted from the integrated semiconductor laser device is introduced into the optical system, if the optical axis is so adjusted as to introduce the beam emitted from either the emission region 13 of the blue-violet laser element 160 or the emission region 57 of the red laser element 150 into the prescribed region of the optical system. Consequently, the optical axis of the beam emitted from the integrated semiconductor laser device can be more easily adjusted with respect to the optical system, whereby the cost for optical axis adjustment can be further reduced.

According to the fourth embodiment, further, the projecting portion 71a is formed on the n-type GaN substrate 71 of the blue-violet laser element 160, so that the registrational projecting portion can be easily formed on the blue-violet laser element 160.

The remaining effects of the fourth embodiment are similar to those of the aforementioned fist embodiment.

A fabrication process for the integrated semiconductor laser device according to the fourth embodiment is now described with reference to FIGS. 64 to 71. The red laser element 150 according to the fourth embodiment is fabricated through steps similar to those according to the third embodiment shown in FIGS. 53 to 61.

Figure 66:
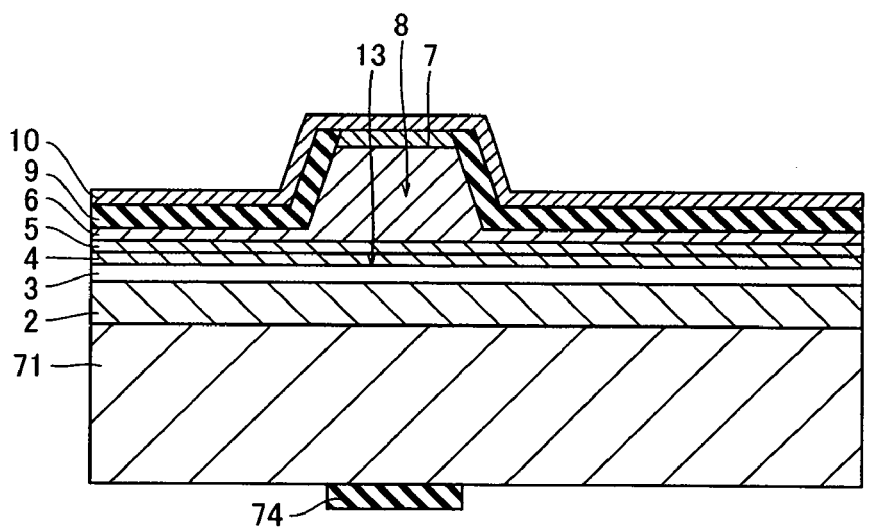
FIGS. 66 and 67 are sectional views for illustrating a fabrication process for the integrated semiconductor laser device according to the fourth embodiment shown in FIGS. 64 and 65.

In order to form the blue-violet laser element 160, the elements up to the p-side electrode 10 are formed as shown in FIG. 66, through steps similar to those of the first embodiment shown in FIGS. 3 to 11. Thereafter the back surface of the n-type GaN substrate 71 is polished so that the thickness between the upper surface of the ridge portion 8 and the back surface of the n-type GaN substrate 71 is about 150 μm. Thereafter an $SiO_2$ film 74 having a thickness of about 240 nm is formed on a region of the back surface of the n-type GaN substrate 71 corresponding to the projecting portion 71a (see FIG. 65) by plasma CVD.

Figure 67:
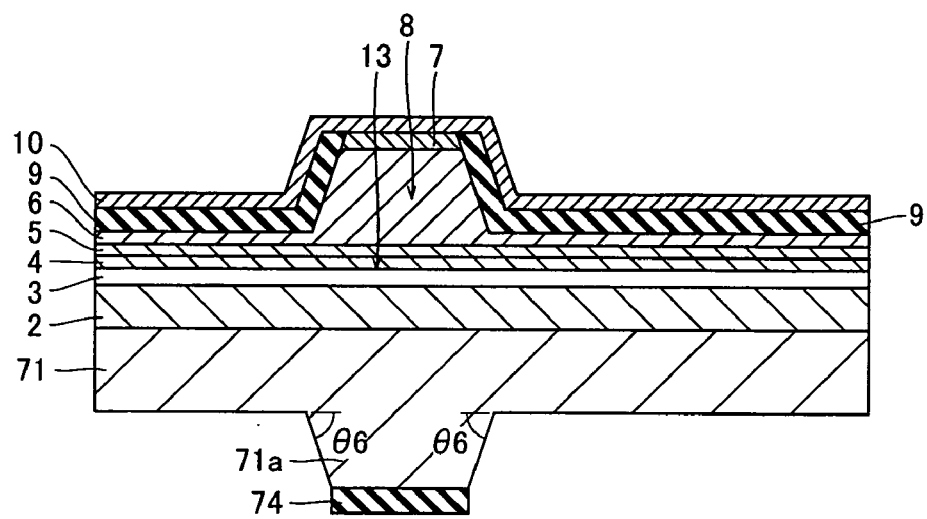

As shown in FIG. 67, the back surface of the n-type GaN substrate 71 is etched up to a depth of about 400 nm through a mask of the $SiO_2$ film 74 by RIE with chlorine gas. Thus, the projecting portion 71a having the projection height H4 of about 400 nm is formed on the back surface of the n-type GaN substrate 71. At this time, the projecting portion 71a of the n-type GaN substrate 71 is formed to have the tapered side surfaces so that the width of the tapered end is smaller than that of the base. The side surfaces of the projecting portion 71a of the n-type GaN substrate 71 and the surface of the active layer 3 (n-type GaN substrate 71) form the angle θ6 of about 80°, and the tapered end of the projecting portion 71a of the n-type GaN substrate 71 has the width of about 2 μm. The projecting portion 71a of the n-type GaN substrate 71 is in the form of a (slender) stripe extending along the ridge portion 8, as shown in FIG. 64. The projecting portion 71a of the n-type GaAs substrate 71 forms the registrational projecting portion. Thereafter the $SiO_2$ film 74 is removed.

Figure 68:
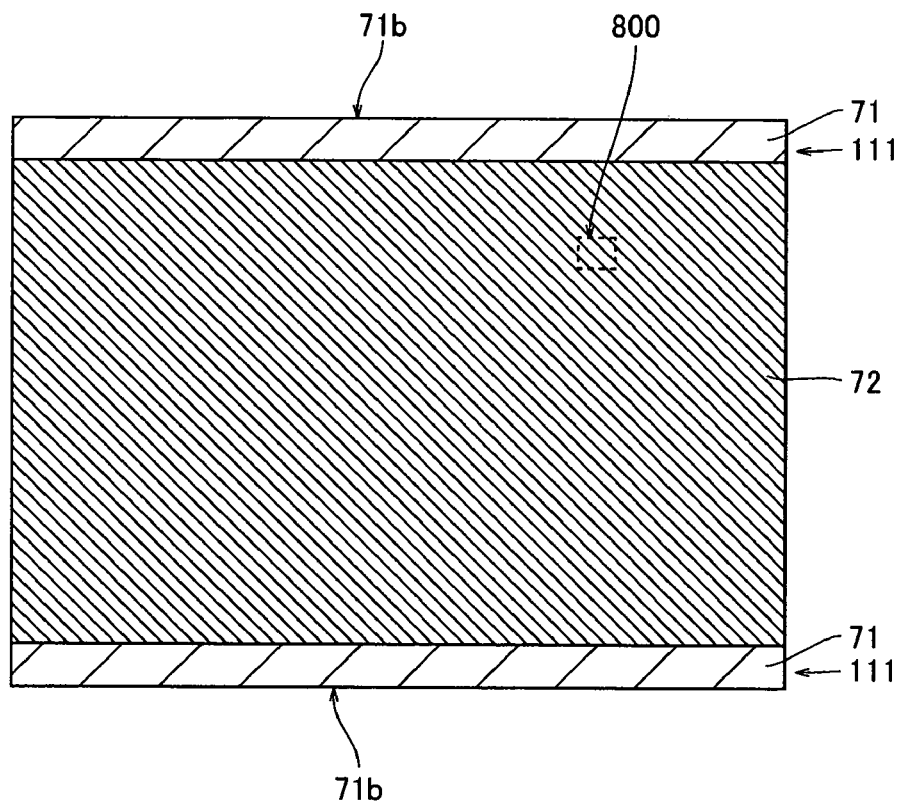
FIG. 68 is a plan view for illustrating the fabrication process for the integrated semiconductor laser device according to the fourth embodiment shown in FIGS. 64 and 65.
Figure 69:
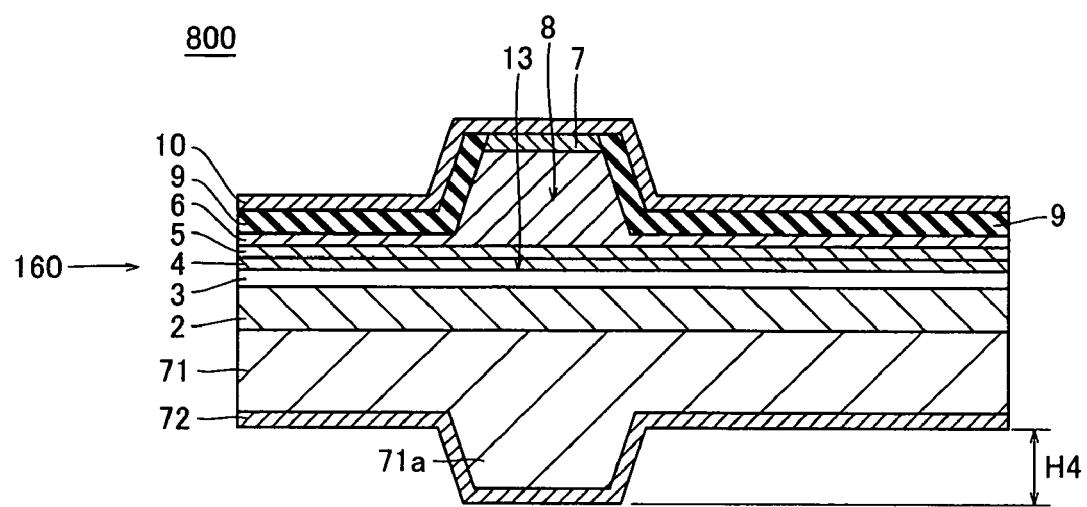
FIG. 69 is a sectional view of a region 800 enclosed with a broken line in FIG. 68.

As shown in FIG. 69, the n-side electrode 72 is formed on the back surface of the n-type GaN substrate 71 including the projecting portion 71a by electron beam evaporation. At this time, the Al layer (not shown) having the thickness of about 6 nm, the Pd layer (not shown) having the thickness of about 10 nm and the Au layer (not shown) having the thickness of about 300 nm are successively formed. Thus, the registrational projecting portion constituted of the projecting portion 71a of the n-type GaN substrate 71 has the projection height H4 of about 400 nm between the upper surface of a portion of the n-side electrode 72 located on a region other than the projecting portion 71a and the upper surface of another portion of the n-side electrode 72 located on the upper surface of the projecting portion 71a. In other words, the depth D3 (about 1 μm) (see FIG. 65) of the registrational recess portion constituted of the recess portion 61a of the n-type GaAs substrate 61 is larger than the projection height H4 (about 400 nm) of the registrational projecting portion constituted of the projecting portion 71a of the n-type GaN substrate 71. As shown in FIG. 68, ends of the n-side electrode 72 located on the sides of end surfaces 71b of the n-type GaN substrate 71 parallel to the light emission planes 73 (see FIG. 64) are arranged on regions of the n-type GaN substrate 71 separated from the end surfaces 71b at a prescribed interval. Thus, regions not provided with the n-side electrode 72 form transparent regions 111 allowing visual recognition of the projecting portion 71a of the n-type GaN substrate 71 of the blue-violet laser element 160 from above or below the same when the blue-violet laser element 160 and the red laser element 150 are bonded to each other. The blue-violet laser element 160 according to the fourth embodiment is formed in this manner.

Figure 70:
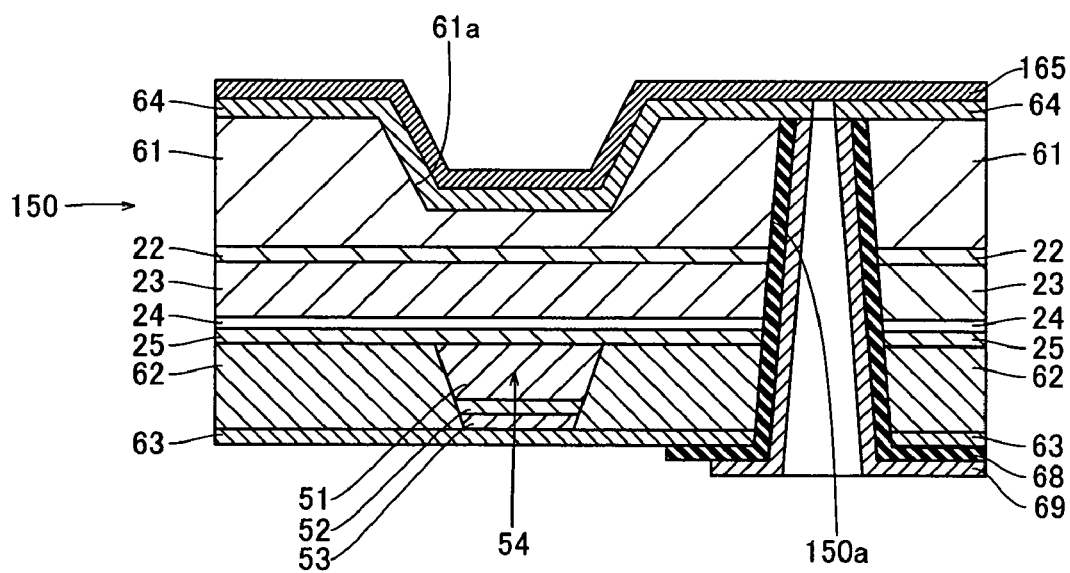
FIGS. 70 and 71 are sectional views for illustrating the fabrication process for the integrated semiconductor laser device according to the fourth embodiment shown in FIGS. 64 and 65.

A method of bonding the blue-violet laser element 160 and the red laser element 150 to each other is now described with reference to FIGS. 70 and 71. First, the solder layer 165 of Au—Sn is formed on the n-side electrode 64 of the red laser element 150, as shown in FIG. 70.

Figure 71:
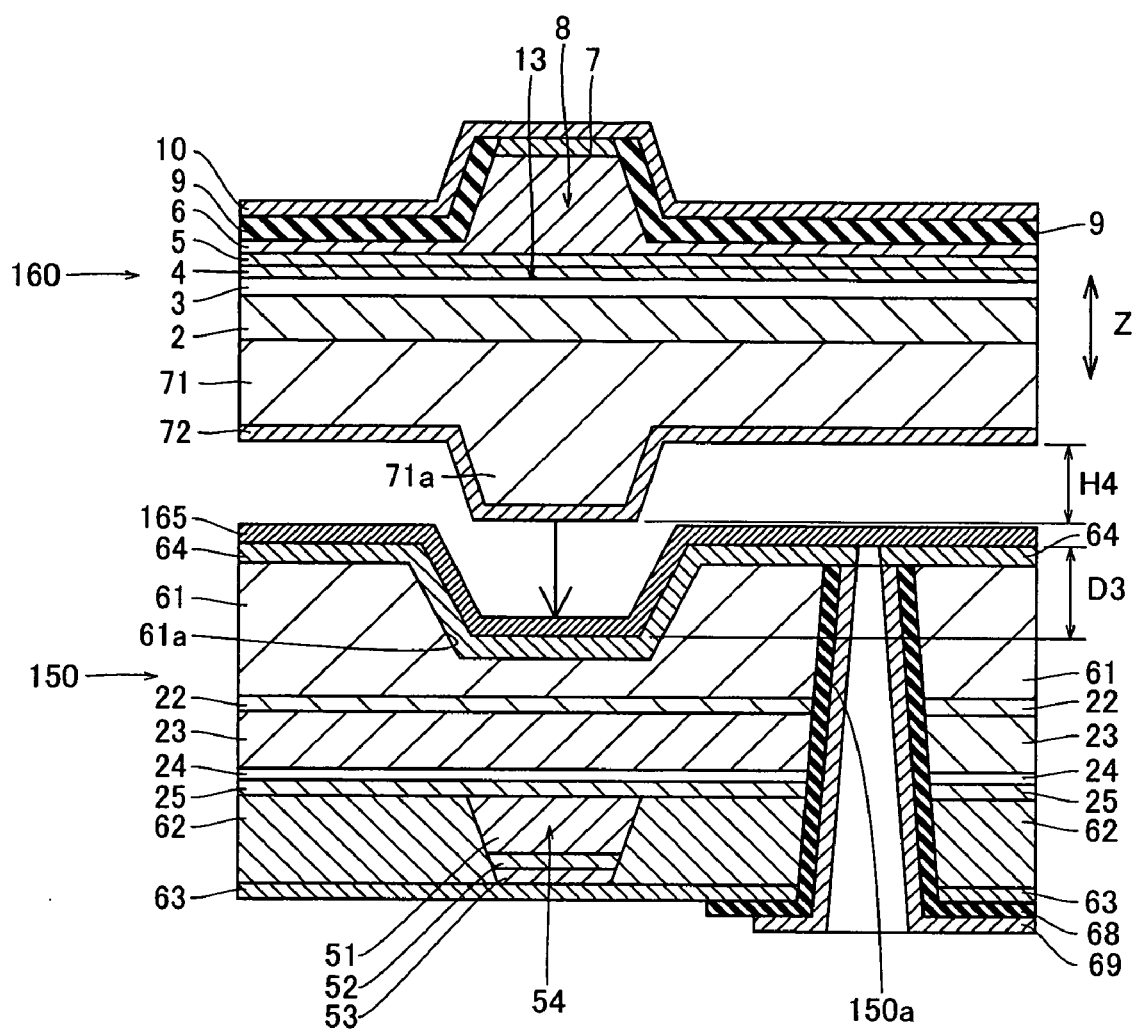

As shown in FIG. 71, the registrational projecting portion constituted of the projecting portion 71a of the n-type GaN substrate 71 of the blue-violet laser element 160 is directed downward and fitted into the registrational recess portion constituted of the recess portion 61a of the n-type GaAs substrate 61 of the red laser element 150, to be registered therewith. At this time, the registrational projecting portion constituted of the projecting portion 71a of the n-type GaN substrate 71 and the registrational recess portion constituted of the recess portion 61a of the n-type GaAs substrate 61 are visually recognized through the transparent regions 111 of the blue-violet laser element 160 shown in FIG. 68 in the direction Z. When the registrational projecting portion constituted of the projecting portion 71a of the n-type GaN substrate 71 is fitted into the registrational recess portion constituted of the recess portion 61a of the n-type GaAs substrate 61, the solder layer 165 of Au—Sn is melted by heat treatment under a temperature condition of about 280° C. Thereafter the solder layer 165 is solidified by a step of cooling the same to the room temperature, thereby bonding the blue-violet laser element 160 and the red laser element 150 to each other.

At this time, the blue-violet laser element 160 and the red laser element 150 can be inhibited from horizontal misregistration in the direction X shown in FIGS. 64 and 65 due to the fitting between the registrational projecting portion constituted of the projecting portion 71a of the n-type GaN substrate 71 and the registrational recess portion constituted of the recess portion 61a of the n-type GaAs substrate 61. Thus, cleavage directions of the blue-violet laser element 160 and the red laser element 150 can be inhibited from deviating from each other.

Thereafter the light emission planes 73 (see FIG. 64) are formed by simultaneously cleaving the blue-violet laser element 160 and the red laser element 150 bonded to each other, followed by separation into each integrated semiconductor laser device. Finally, wires 122 are bonded onto the surfaces of the p-side electrode 63 and the extraction electrode 69 of the red laser element 150 respectively as shown in FIG. 65, thereby forming the integrated semiconductor laser device according to the fourth embodiment.

Fifth Embodiment

Figure 72:
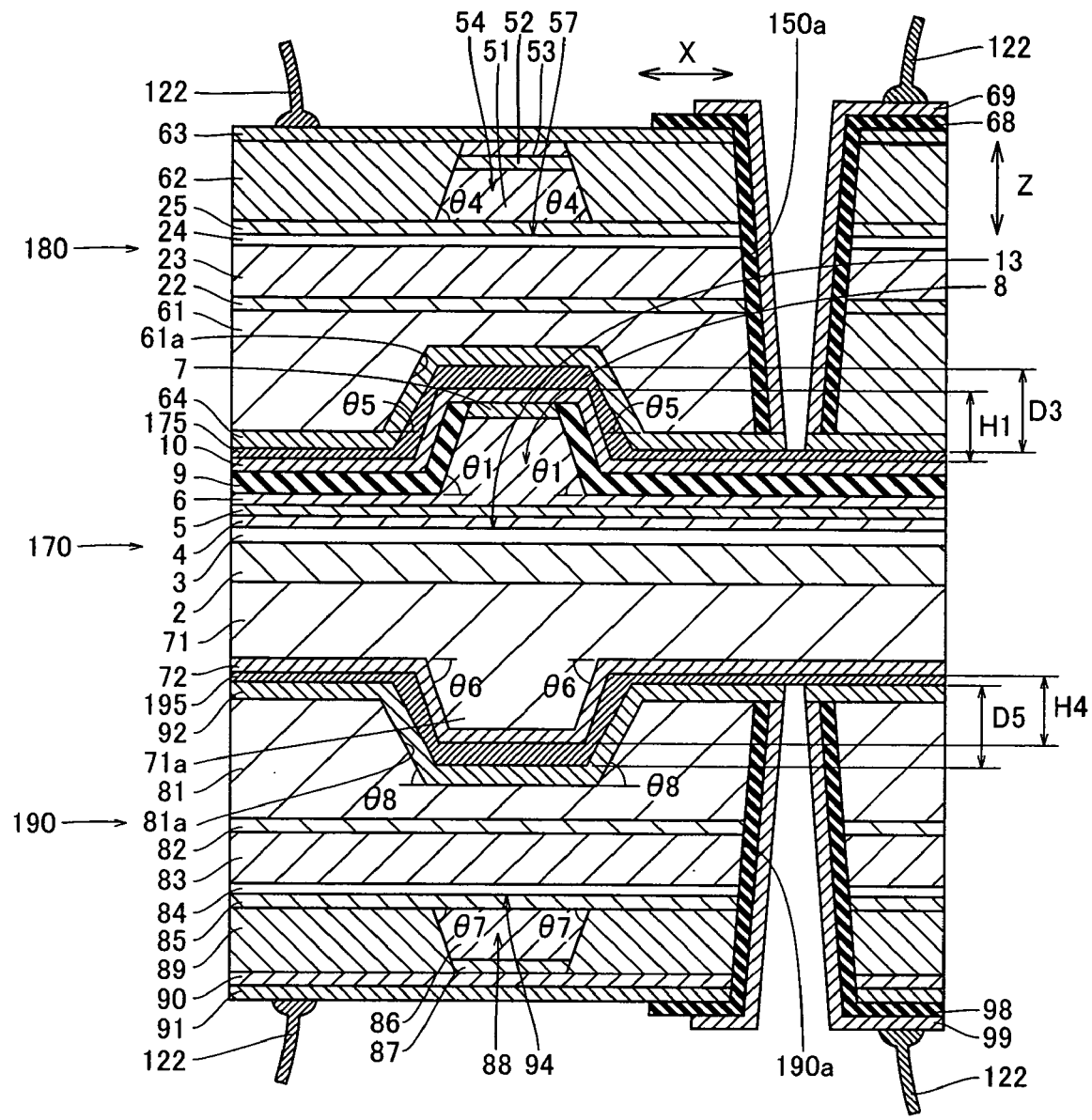
FIG. 72 is a sectional view showing the structure of an integrated semiconductor laser device according to a fifth embodiment of the present invention.
Figure 73:
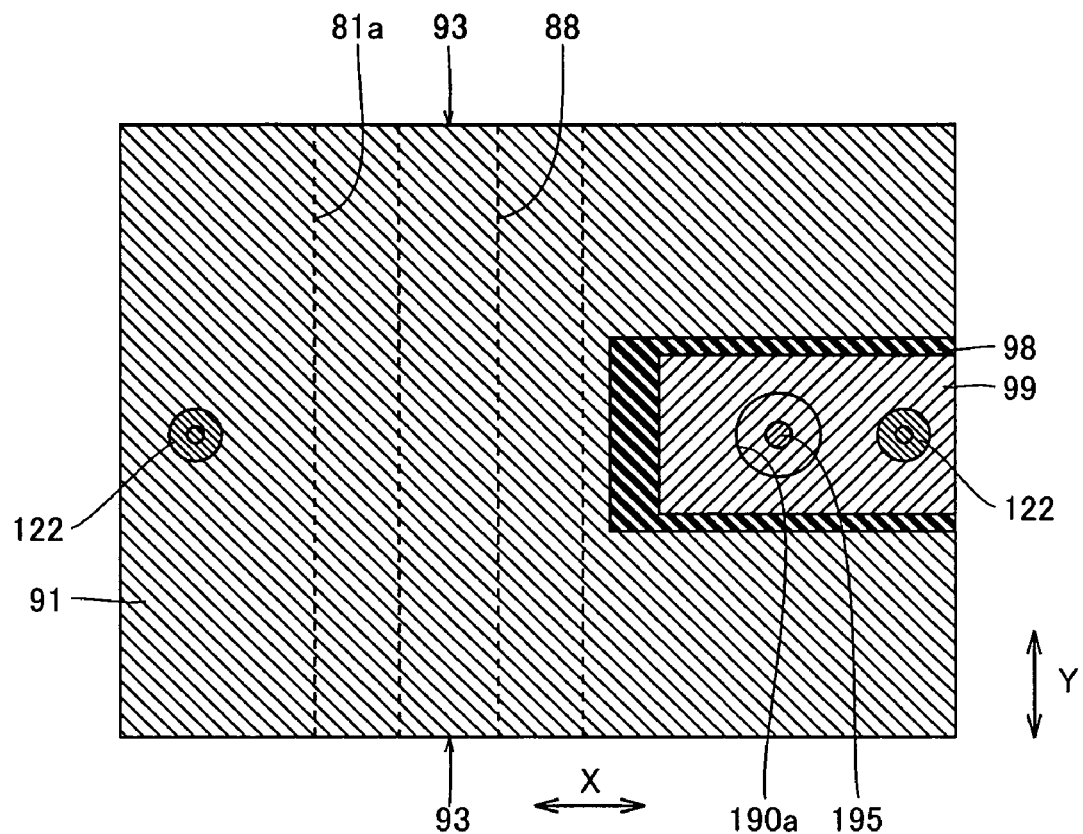
FIG. 73 is a plan view showing a substrate of an infrared laser element of the integrated semiconductor laser device according to the fifth embodiment shown in FIG. 72 as viewed from a p-side.

Referring to FIGS. 72 and 73, an integrated semiconductor laser device according to a fifth embodiment of the present invention includes a blue-violet laser element 170, a red laser element 180 and an infrared laser element 190, dissimilarly to the aforementioned first to fourth embodiments.

According to the fifth embodiment, the blue-violet laser element 170 having two registrational projecting portions, the red laser element 180 having a registrational recess portion and the infrared laser element 190 having another registrational recess portion are stacked (integrated) with each other along a direction Z, as shown in FIG. 72. The blue-violet laser element 170 is an example of the "first semiconductor laser element" in the present invention. The red laser element 180 and the infrared laser element 190 are examples of the "second semiconductor laser element" in the present invention.

The blue-violet laser element 170 according to the fifth embodiment is similar in structure to the blue-violet laser element 160 according to the aforementioned fourth embodiment, as shown in FIG. 72. On the other hand, the red laser element 180 according to the fifth embodiment is similar in structure to the red laser element 150 according to the aforementioned third embodiment, as shown in FIG. 72.

The structure of the infrared laser element 190 according to the fifth embodiment is now described. The infrared laser element 190 shown in FIG. 72 has a downwardly directed ridge portion 88. In the infrared laser element 190 according to the fifth embodiment, an n-type buffer layer 82 of n-type GaAs having a thickness of about 500 nm is formed on the surface of an n-type GaAs substrate 81 opposite to the blue-violet laser element 170, as shown in FIG. 72. An n-type cladding layer 83 of n-type AlGaAs having a thickness of about 1.5 µm is formed on the surface of the n-type buffer layer 82 opposite to the blue-violet laser element 170. An active layer 84 having a thickness of about 80 nm is formed on the surface of the n-type cladding layer 83 opposite to the blue-violet laser element 170. This active layer 84 has an MQW structure obtained by alternately stacking a plurality of well layers (not shown) of undoped AlGaAs and a plurality of barrier layers (not shown) of undoped AlGaAs with each other.

A p-type first cladding layer 85 of p-type AlGaAs having a thickness of about 150 nm is formed on the surface of the active layer 84 opposite to the blue-violet laser element 170. A projecting p-type second cladding layer 86 of p-type AlGaAs having a thickness of about 800 nm is formed on a prescribed region of the surface of the p-type first cladding layer 85 opposite to the blue-violet laser element 170. A p-type cap layer 87 of p-type GaAs having a thickness of about 600 nm is formed on the surface of the p-type second cladding layer 86 opposite to the blue-violet laser element 170. This p-type cap layer 87 and the p-type second cladding layer 86 constitute the ridge portion 88 having tapered side surfaces so that the width thereof is reduced from the base toward the tapered end. The side surfaces of the ridge portion 88 and the surface of the active layer 84 form an angle θ7 of about 60°. The tapered end of the ridge portion 88 has a width of about 2 µm to about 3 µm. The ridge portion 88 is in the form of a (slender) stripe extending in a direction Y perpendicular to light emission planes (cleavage planes) 93. A portion of the active layer 84 corresponding to the position formed with the ridge portion 88 and a peripheral portion of this portion of the active layer 84 form an emission region 94 of the infrared laser element 190, as shown in FIG. 72. The emission region 94 is an example of the "second emission region" in the present invention.

An n-type current blocking layer 89 of n-type GaAs having a thickness of about 1.4 µm is formed on the surface of the p-type first cladding layer 85 opposite to the blue-violet laser element 170, to cover the side surfaces of the ridge portion 88. A p-type contact layer 90 of p-type GaAs having a thickness of about 1 µm is formed on the surfaces of the n-type current blocking layer 89 and the ridge portion 88 (p-type cap layer 87) opposite to the blue-violet laser element 170. A p-side electrode 91 having a thickness of about 1 µm is formed on the surface of the p-type contact layer 90 opposite to the blue-violet laser element 170. This p-side electrode 91 is formed by an AuZn layer (not shown), a Pt layer (not shown) and an Au layer (not shown) successively from the side closer to the n-type GaAs substrate 81.

A circular contact hole 190a is formed to pass through the p-side electrode 91, the semiconductor layers 90, 89 and 85 to 82 and the n-type GaAs substrate 81 from the surface of the p-side electrode 91 opposite to the blue-violet laser element 170. This contact hole 190a has a tapered inner side surface so that the diameter of a portion closer to the n-type GaAs substrate 81 is smaller than the diameter of several 10 µm of a portion closer to the p-side electrode 91. An insulating film 98 of $SiO_2$ having a thickness of about 200 nm is formed on the inner side surface of the contact hole 190a and the surface, opposite to the blue-violet laser element 170, of a portion of the p-side electrode 91 located on a region close to the contact hole 190a. An extraction electrode 99 having a thickness of about 0.3 µm is formed on a prescribed region of the insulating film 98, to be electrically connected to an n-side electrode 92 described later through the contact hole 190a. This extraction electrode 99 is formed by a Ti layer (not shown), a Pt layer (not shown) and an Au layer (not shown) successively from the side closer to the n-type GaAs substrate 81. Wires (gold wires) 122 are bonded to the surfaces of the p-side electrode 91 and the extraction electrode 99 opposite to the blue-violet laser element 170 respectively.

According to the fifth embodiment, a recess portion 81a having a depth of about 1 μm is formed on a region of the surface of the n-type GaAs substrate 81 closer to the blue-violet laser element 170 corresponding to the ridge portion 88. The recess portion 81a of the n-type GaAs substrate 81 has tapered inner side surfaces so that the width of the bottom is smaller than the width (about 3 μm) of the open end. The inner side surfaces of the recess portion 81a of the n-type GaAs substrate 81 and the surface of the active layer 84 form an angle θ8 of about 60°. The recess portion 81a of the n-type GaAs substrate 81 is in the form of a (slender) stripe extending in a direction Y along the ridge portion 88, as shown in FIG. 73. The recess portion 81a of the n-type GaAs substrate 81 forms the registrational recess portion. The n-type GaAs substrate 81 is an example of the "substrate" in the present invention.

As shown in FIG. 72, the n-side electrode 92 having a thickness of about 0.3 μm is formed on the surface of the n-type GaAs substrate 81, including the recess portion 81a, closer to the blue-violet laser element 170, to be electrically connected to the extraction electrode 99. This n-side electrode 92 is formed by an AuGe layer (not shown), an Ni layer (not shown) and an Au layer (not shown) successively from the side closer to the n-type GaAs substrate 81. The n-side electrode 92 is an example of the "second electrode" in the present invention. Thus, the registrational recess portion constituted of the recess portion 81a of the n-type GaAs substrate 81 has a depth D5 of about 1 μm between a portion of the surface of the n-side electrode 92 closer to the blue-violet laser element 170 located on a region other than that corresponding to the recess portion 81a and another portion of the surface of the n-side electrode 92 closer to the blue-violet laser element 170 located on the region corresponding to the recess portion 81a. In other words, the depth D5 (about 1 μm) of the registrational recess portion constituted of the recess portion 81a of the n-type GaAs substrate 81 is larger than the projection height H4 (about 400 nm) of the registrational projecting portion constituted of the projecting portion 71a of the n-type GaN substrate 71.

According to the fifth embodiment, the blue-violet laser element 170 and the red laser element 180 are integrated (stacked) with each other in a direction Z while the registrational projecting portion constituted of a ridge portion 8 is fitted in the registrational recess portion constituted of a recess portion 61a of an n-type GaAs substrate 61, as shown in FIG. 72. Further, the blue-violet laser element 170 and the red laser element 190 are integrated (stacked) with each other in the direction Z while the registrational projecting portion constituted of the projecting portion 71a of the n-type GaN substrate 71 is fitted in the registrational recess portion constituted of the recess portion 81a of the n-type GaAs substrate 81. In addition, emission regions 13, 57 and 94 of the blue-violet laser element 170, the red laser element 180 and the infrared laser element 190 are aligned with each other in the direction of stacking of the semiconductor layers (direction Z shown in FIG. 72).

The depth D3 (about 1 μm) of the registrational recess portion of the red laser element 180 is larger than the projection height H1 (about 153 nm) of the registrational projecting portion of the blue-violet laser element 170, whereby the interval between the upper surface of the registrational projecting portion of the blue-violet laser element 170 and the bottom surface of the registrational recess portion of the red laser element 180 is larger than that between the remaining regions of the blue-violet laser element 170 and the red laser element 180 other than the registrational projecting portion and the registrational recess portion.

The registrational projecting portion of the blue-violet laser element 170 and the registrational recess portion of the red laser element 180 are bonded to each other through a solder layer 175 of Au—Sn. Further, the registrational projecting portion of the blue-violet laser element 170 and the registrational recess portion of the infrared laser element 190 are bonded to each other through another solder layer 195 of Au—Sn. The solder layers 175 and 195 are examples of the "bonding layer" in the present invention. A p-side electrode 10 of the blue-violet laser element 170 is electrically connected to an extraction electrode 69 through an n-side electrode 64 of the red laser element 180 and the solder layer 175. An n-side electrode 72 of the blue-violet laser element 170 is electrically connected to the extraction electrode 99 through the n-side electrode 92 of the infrared laser element 190 and the solder layer 195.

According to the fifth embodiment, as hereinabove described, the registrational projecting portion constituted of the ridge portion 8 of the blue-violet laser element 170 is fitted into the registrational recess portion constituted of the recess portion 61a of the n-type GaAs substrate 61 of the red laser element 180 while the registrational projecting portion constituted of the projecting portion 71a of the n-type GaN substrate 71 of the blue-violet laser element 170 is fitted into the registrational recess portion constituted of the recess portion 81a of the n-type GaAs substrate 81 of the infrared laser element 190, whereby the blue-violet laser element 170, the red laser element 180 and the infrared laser element 190 bonded to each other can be inhibited from horizontal misregistration (in the direction X shown in FIG. 72) due to the fitting between the registrational projecting portions and the registrational recess portions. Thus, the optical axes of beams emitted from the blue-violet laser element 170, the red laser element 180 and the infrared laser element 190 respectively can be inhibited from horizontal deviation (in the direction X shown in FIG. 72), whereby the optical axis of a beam emitted from the integrated semiconductor laser device can be easily adjusted when the beam is introduced into an optical system formed by a lens and a mirror. Thus, the cost for optical axis adjustment can be reduced. Further, the blue-violet laser element 170, the red laser element 180 and the infrared laser element 190 bonded to each other can be so inhibited from horizontal misregistration (in the direction X shown in FIG. 72) that cleavability for simultaneously cleaving the blue-violet laser element 170, the red laser element 180 and the infrared laser element 190 bonded to each other can be improved. Consequently, the properties of laser beams emitted from the light emission planes (cleavage planes) 93 can be improved.

According to the fifth embodiment, further, the emission regions 13, 57 and 94 of the blue-violet laser element 170, the red laser element 180 and the infrared laser element 190 are aligned with each other in the direction (direction Z shown in FIG. 72) of stacking of the semiconductor layers, so that the intervals between the emission regions 13, 57 and 94 of the blue-violet laser element 170, the red laser element 180 and the infrared laser element 190 can be reduced as compared with a case where the emission regions 13, 57 and 94 of the blue-violet laser element 170, the red laser element 180 and the infrared laser element 190 positionally deviate from each other in two directions, i.e., the direction (direction Z shown in FIG. 72) of stacking of the semiconductor layers and the horizontal direction (direction X shown in FIG. 72). Thus, beams emitted from two of the emission regions 13, 57 and 94 of the blue-violet laser element 170, the red laser element 180 and the infrared laser element 190 can be inhibited from being incident on a region remarkably deviating from a prescribed region of the optical system when the beam emitted from the integrated semiconductor laser device is introduced into the optical system, if the optical axis is so adjusted as to introduce the beam emitted from one of the emission regions 13, 57 and 94 of the blue-violet laser element 170, the red laser element 180 and the infrared laser element 190 into the prescribed region of the optical system. Consequently, the optical axis of the beam emitted from the integrated semiconductor laser device can be more easily adjusted with respect to the optical system, whereby the cost for optical axis adjustment can be further reduced.

The remaining effects of the fifth embodiment are similar to those of the aforementioned first embodiment.

A fabrication process for the integrated semiconductor laser device according to the fifth embodiment is now described with reference to FIGS. 72 to 89.

The blue-violet laser element 170 is fabricated through steps similar to those according to the fourth embodiment shown in FIGS. 66 to 69.

The red laser element 180 is also fabricated through steps similar to those according to the third embodiment shown in FIGS. 53 to 61. According to the fifth embodiment, however, a substrate of the red laser element 180 has a length in the cavity direction smaller than that of a substrate of the blue-violet laser element 170 before element isolation.

Figure 74:
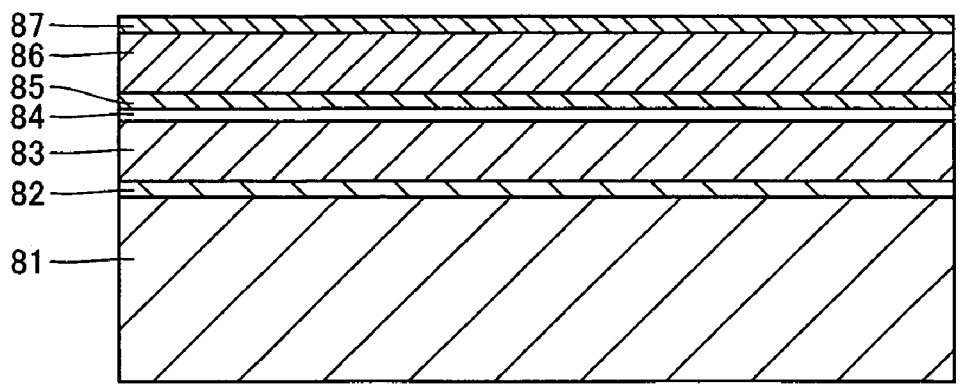
FIGS. 74 to 89 are sectional views for illustrating a fabrication process for the integrated semiconductor laser device according to the fifth embodiment shown in FIG. 72.

In order to form the infrared laser element 190 according to the fifth embodiment, the n-type buffer layer 82 of n-type GaAs having the thickness of about 500 nm is grown on the n-type GaAs substrate 81 by MOCVD, and the n-type cladding layer 83 of n-type AlGaAs having the thickness of about 1.5 μm is thereafter grown on the n-type buffer layer 82, as shown in FIG. 74. Thereafter the active layer 84 having the thickness of about 80 nm is grown on the n-type cladding layer 83. The active layer 84 is grown by alternately growing the plurality of well layers (not shown) of undoped AlGaAs and the plurality of barrier layers (not shown) of undoped AlGaAs. Thus, the active layer 84 having the MQW structure obtained by alternately stacking the plurality of well layers and the plurality of barrier layers with each other is formed on the n-type cladding layer 83.

Then, the p-type first cladding layer 85 of p-type AlGaAs having the thickness of about 150 nm and the p-type second cladding layer 86 of p-type AlGaAs having the thickness of about 800 nm are successively grown on the active layer 84. Then, the p-type cap layer 87 of p-type GaAs having the thickness of about 600 nm is grown on the p-type second cladding layer 86.

Figure 75:
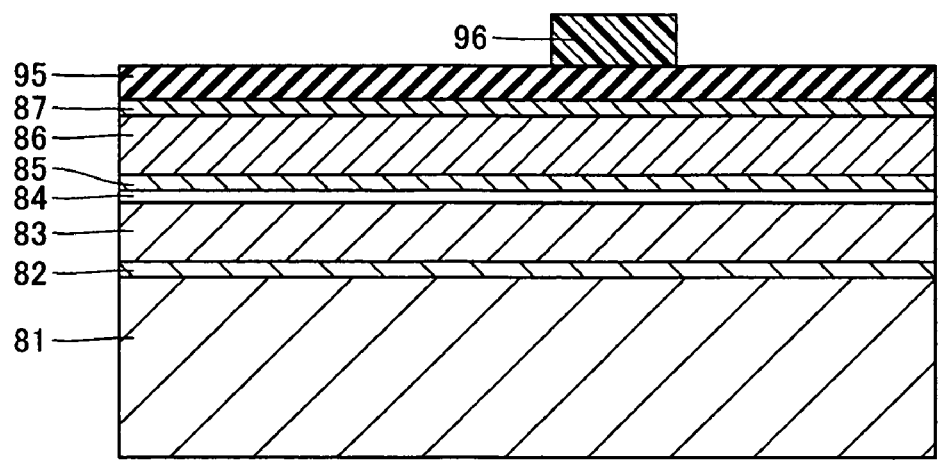

As shown in FIG. 75, an $SiO_2$ film 95 having a thickness of about 240 nm is formed on the p-type cap layer 87 by sputtering, vacuum evaporation or electron beam evaporation. Thereafter a striped (slender) resist film 96 having a width of about 2 μm to about 3 μm is formed on a region of the $SiO_2$ film 95 corresponding to the ridge portion 88 (see FIG. 72).

Figure 76:
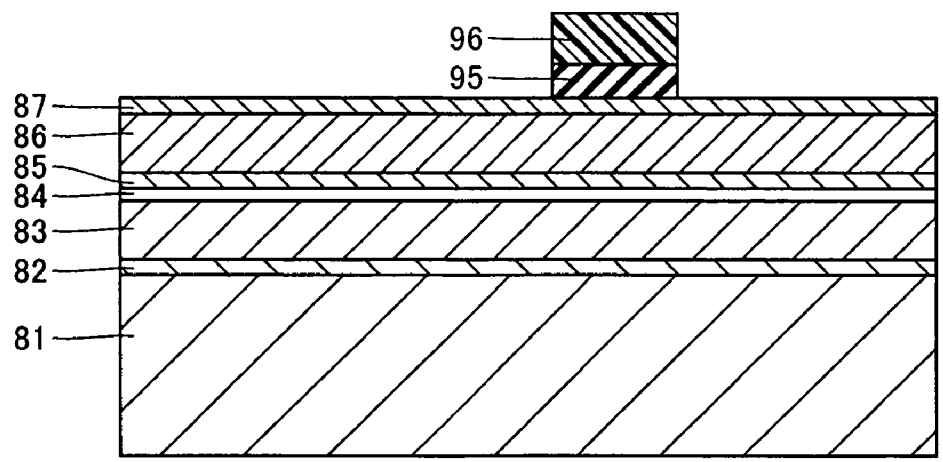

As shown in FIG. 76, the $SiO_2$ film 95 is etched through a mask of the resist film 96 by wet etching with buffered hydrofluoric acid. Thereafter the resist film 96 is removed.

Figure 77:
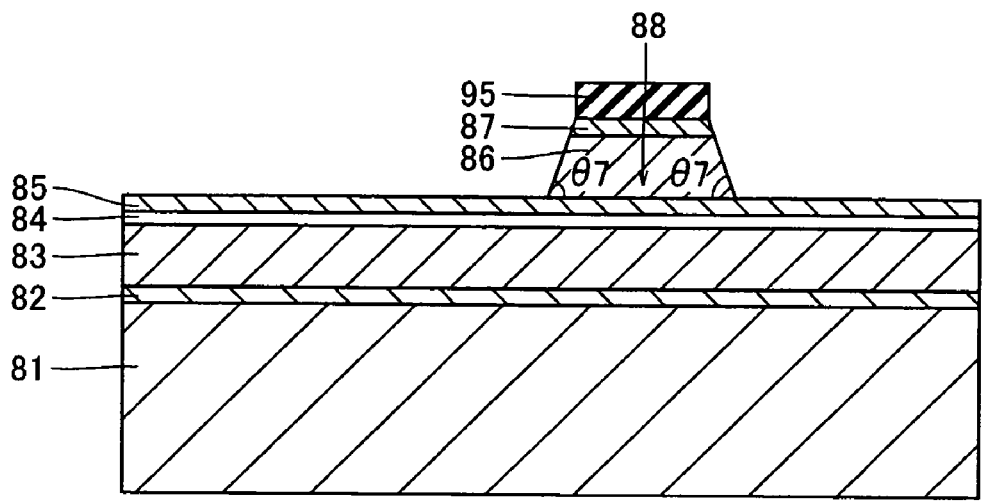

As shown in FIG. 77, a portion between the upper surfaces of the p-type cap layer 87 and the p-type first cladding layer 85 is etched through a mask of the $SiO_2$ film 95 by wet etching with a tartaric acid etching solution or a phosphoric acid etching solution. Thus, the ridge portion 88 is constituted of the p-type cap layer 87 and the p-type second cladding layer 86 with the tapered side surfaces. The side surfaces of the ridge portion 88 and the upper surface of the active layer 84 (p-type first cladding layer 85) form the angle θ7 of about 60°, and the tapered end of the ridge portion 88 has the width of about 2 μm to about 3 μm. The ridge portion 88 is in the form of a (slender) stripe extending in the direction Y perpendicular to the light emission planes 93, as shown in FIG. 73.

Figure 78:
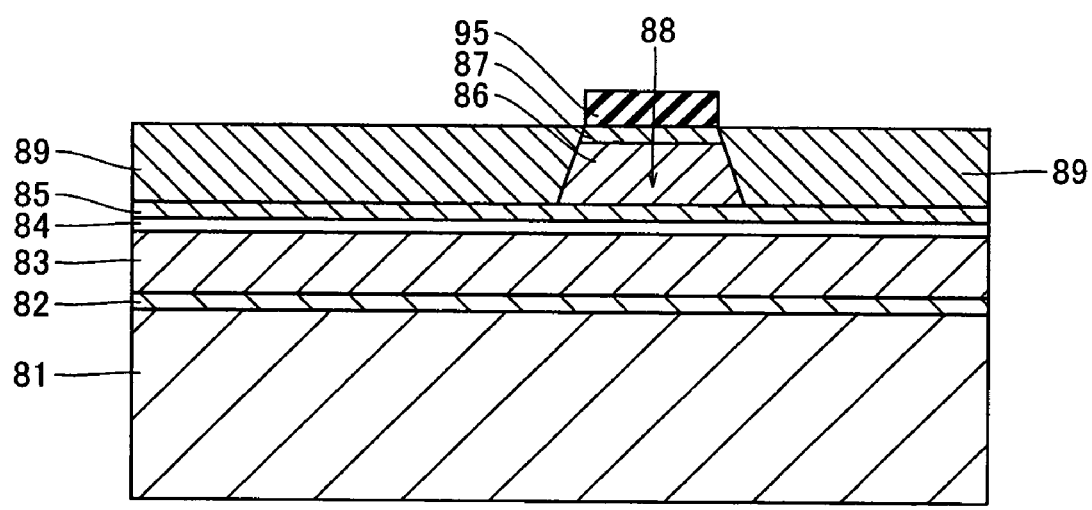

As shown in FIG. 78, the n-type current blocking layer 89 of n-type GaAs having the thickness of about 1.4 μm is formed on the p-type first cladding layer 85 by MOCVD through a selective growth mask of the $SiO_2$ film 95, to cover the side surfaces of the ridge portion 88. Thereafter the $SiO_2$ film 95 is removed.

Figure 79:
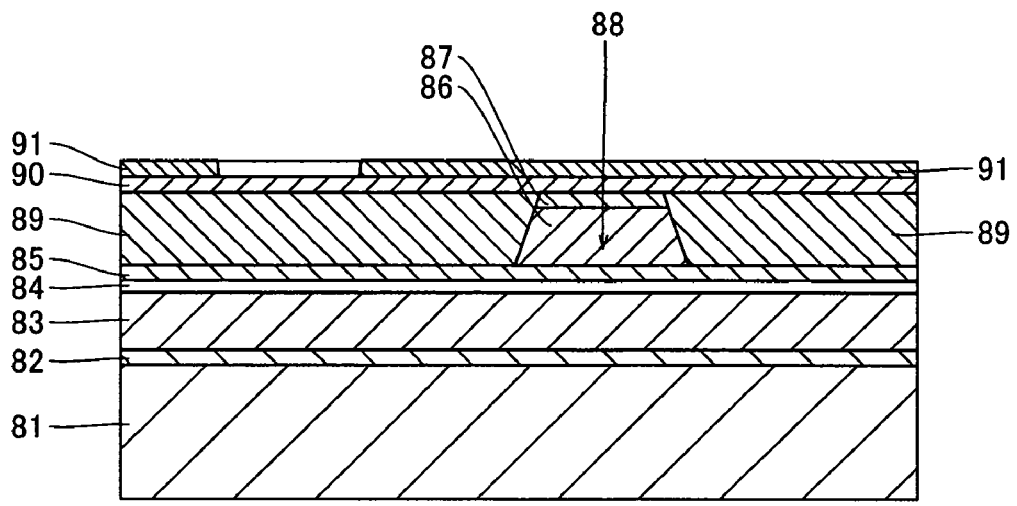

As shown in FIG. 79, the p-type contact layer 90 of p-type GaAs having the thickness of about 1 μm is grown on the upper surfaces of the n-type current blocking layer 89 and the ridge portion 88 (p-type cap layer 87) by MOCVD. Thereafter the p-side electrode 91, also serving as an etching mask, having the thickness of about 1 μm is grown on a region of the p-type contact layer 90 other than that for forming the contact hole 190a (see FIG. 72) by electron beam evaporation. At this time, the AuZn layer (not shown), the Pt layer (not shown) and the Au layer (not shown) are successively formed.

Figure 80:
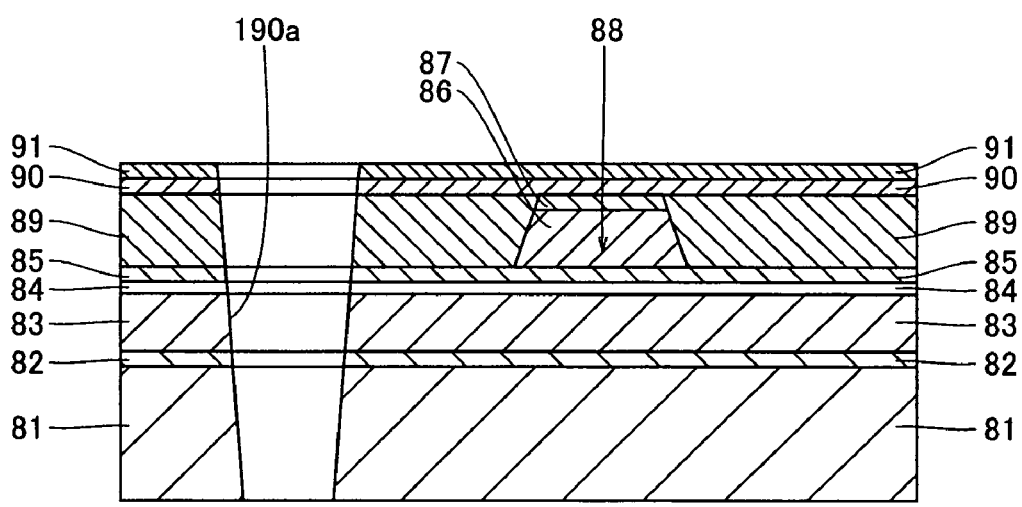

As shown in FIG. 80, the circular contact hole 190a is formed by RIE with chlorine gas through the mask of the p-side electrode 91, to pass through the semiconductor layers 90, 89 and 85 to 82 and the n-type GaAs substrate 81 from the upper surface of the p-side contact layer 90. This contact hole 190a is formed to have the tapered inner side surface so that the diameter of the portion closer to the n-type GaAs substrate 81 is smaller than the diameter of several 10 μm of the portion closer to the p-side electrode 91.

Figure 81:
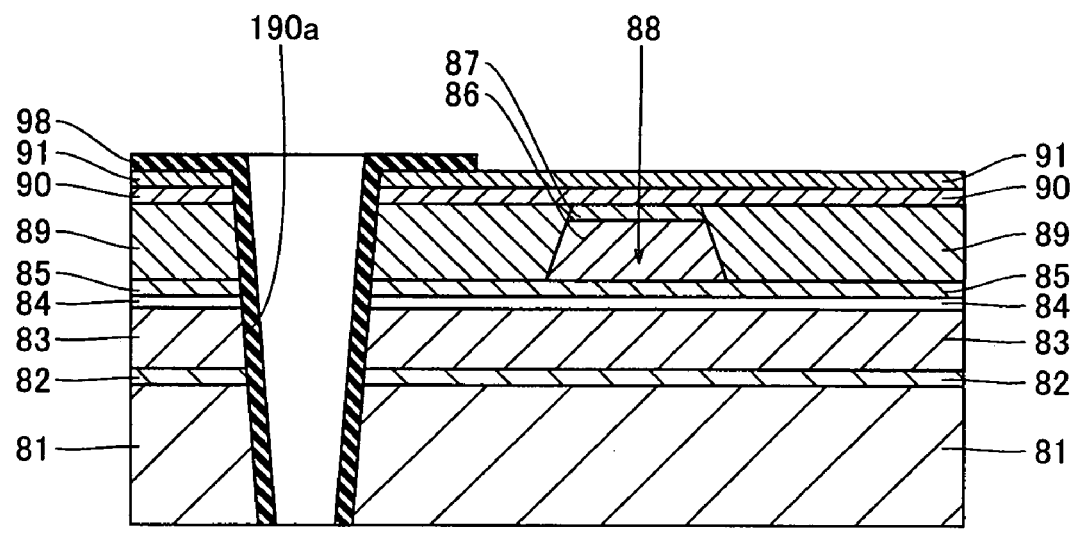

As shown in FIG. 81, the insulating film 98 of $SiO_2$ having the thickness of about 200 nm is formed on the inner side surface of the contact hole 190a and the upper surface of a portion of the p-side electrode 91 located on a region close to the contact hole 190a by plasma CVD.

Figure 82:
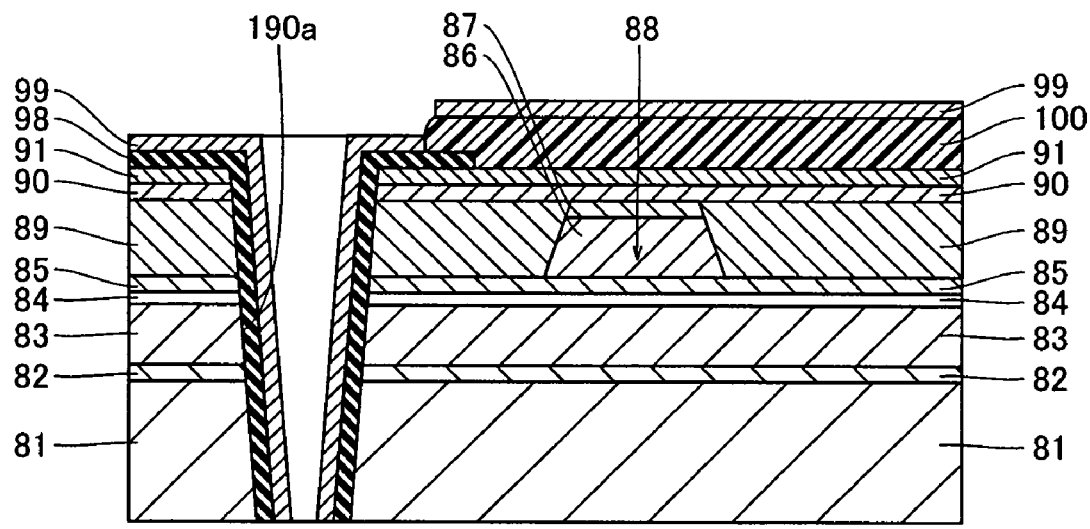
Figure 83:
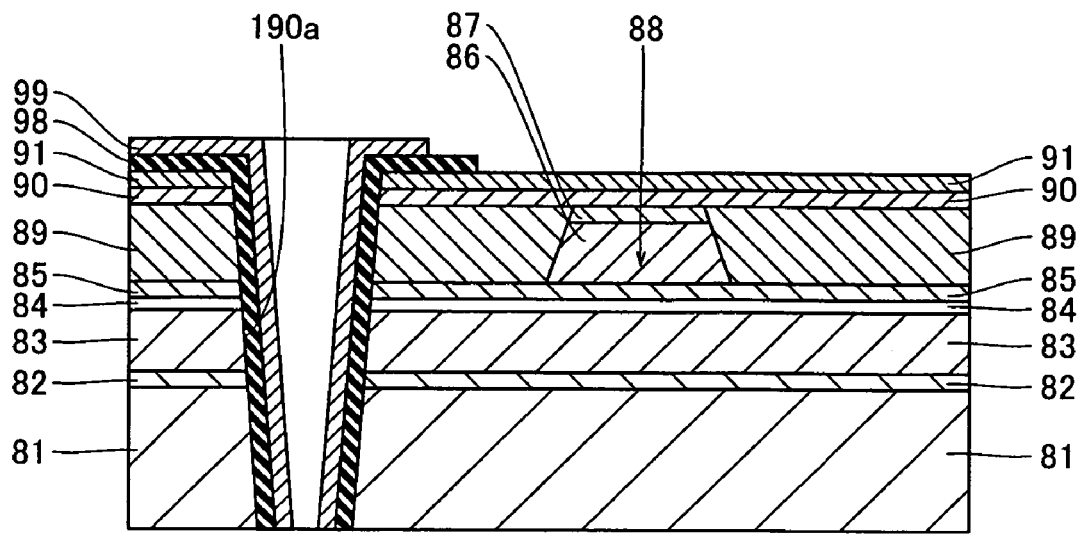

As shown in FIG. 82, a resist film 100 is formed on a prescribed region other than that corresponding to the contact hole 190a. Thereafter the extraction electrode 99 having the thickness of about 0.3 μm is formed on the upper surface of the resist film 100 and the upper surface and the inner side surfaces of the insulating film 98 by electron beam evaporation. At this time, the Ti layer (not shown), the Pt layer (not shown) and the Au layer (not shown) are successively formed. Thereafter the resist film 100 is removed by lift-off. Thus, a portion unnecessary for the extraction electrode 99 is removed, as shown in FIG. 83.

Figure 84:
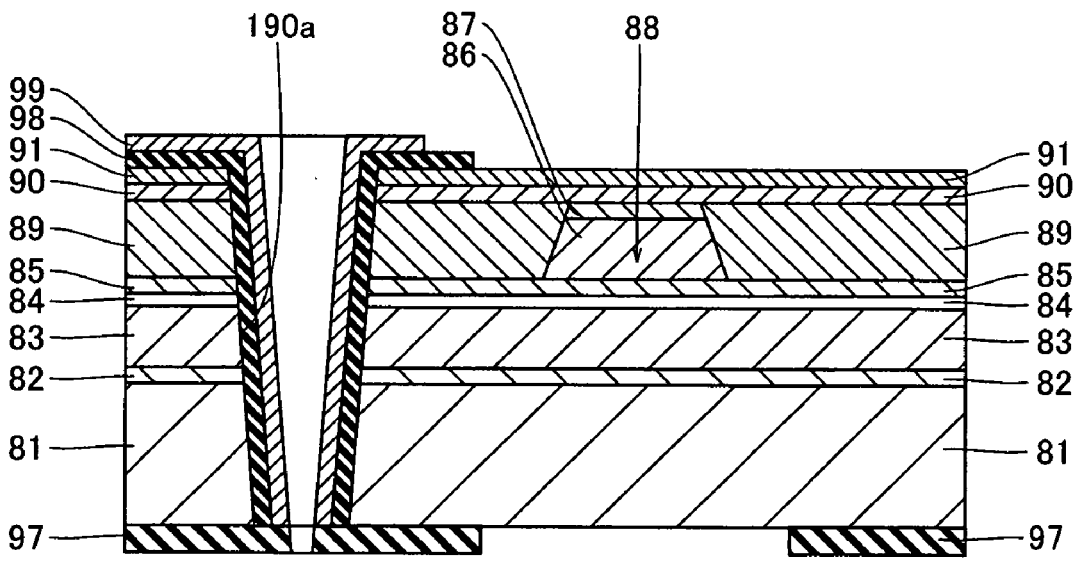

As shown in FIG. 84, the back surface of the n-type GaAs substrate 81 is polished so that the thickness between the upper surface of the ridge portion 88 and the back surface of the n-type GaAs substrate 81 is about 100 μm. Thereafter an $SiO_2$ film 97 having a thickness of about 240 nm is formed on a region of the back surface of the n-type GaAs substrate 81 other than that corresponding to the recess portion 81a (see FIG. 72) by plasma CVD.

Figure 85:
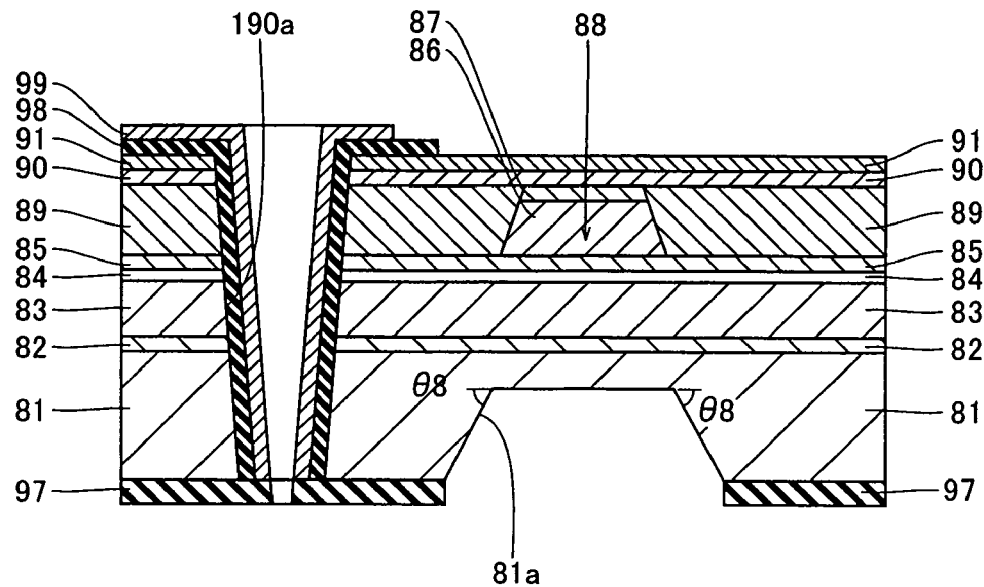
Figure 86:
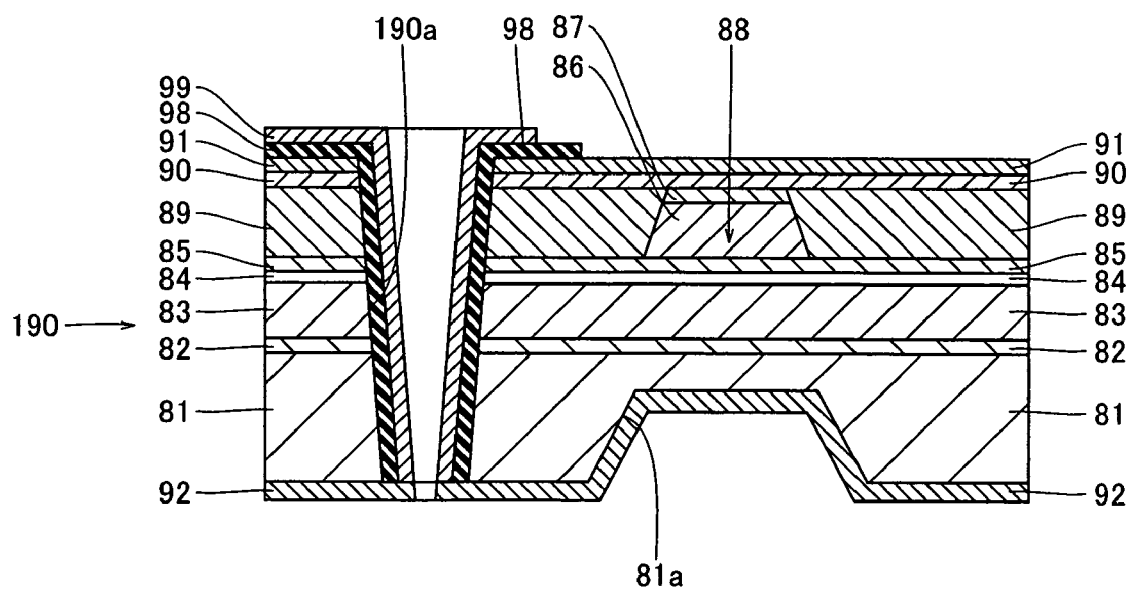

As shown in FIG. 85, the back surface of the n-type GaAs substrate 81 is etched up to a depth of about 1 μm through a mask of the $SiO_2$ film 97 by RIE with chlorine gas. Thus, the recess portion 81a having the depth of about 1 μm is formed on the back surface of the n-type GaAs substrate 81. At this time, the recess portion 81a of the n-type GaAs substrate 81 is formed to have the tapered inner side surfaces so that the width of the bottom is smaller than that of the open end. The open end of the recess portion 81a of the n-type GaAs substrate 81 has the width of about 3 μm. The inner side surfaces of the recess portion 81a of the n-type GaAs substrate 81 and the surface of the active layer 84 (n-type GaAs substrate 81)

form the angle θ8 of about 60°. The recess portion 81a of the n-type GaAs substrate 81 is in the form of a (slender) stripe extending along the ridge portion 88, as shown in FIG. 73. The recess portion 81a of the n-type GaAs substrate 81 forms the registrational recess portion. Thereafter the SiO₂ film 97 is removed.

As shown in FIG. 71, the n-side electrode 92 having the thickness of about 0.3 μm is formed on the back surface of the n-type GaAs substrate 81 including the recess portion 81a by electron beam evaporation, to be electrically connected to the extraction electrode 99. At this time, the AuGe layer (not shown), the Ni layer (not shown) and the Au layer (not shown) are successively formed. Thus, the registrational recess portion constituted of the recess portion 81a of the n-type GaAs substrate 81 has the depth D5 of about 1 μm between the portion of the upper surface of the n-side electrode 92 located on the region other than the recess portion 81a and another portion of the upper surface of the n-side electrode 92 located on the upper surface of the bottom of the recess portion 81a. In other words, the depth D5 (about 1 μm) of the registrational recess portion constituted of the recess portion 81a of the n-type GaAs substrate 81 is larger than the projection height H4 (about 400 nm) (see FIG. 72) of the registrational projecting portion constituted of the projecting portion 71a of the n-type GaN substrate 71.

Figure 87:
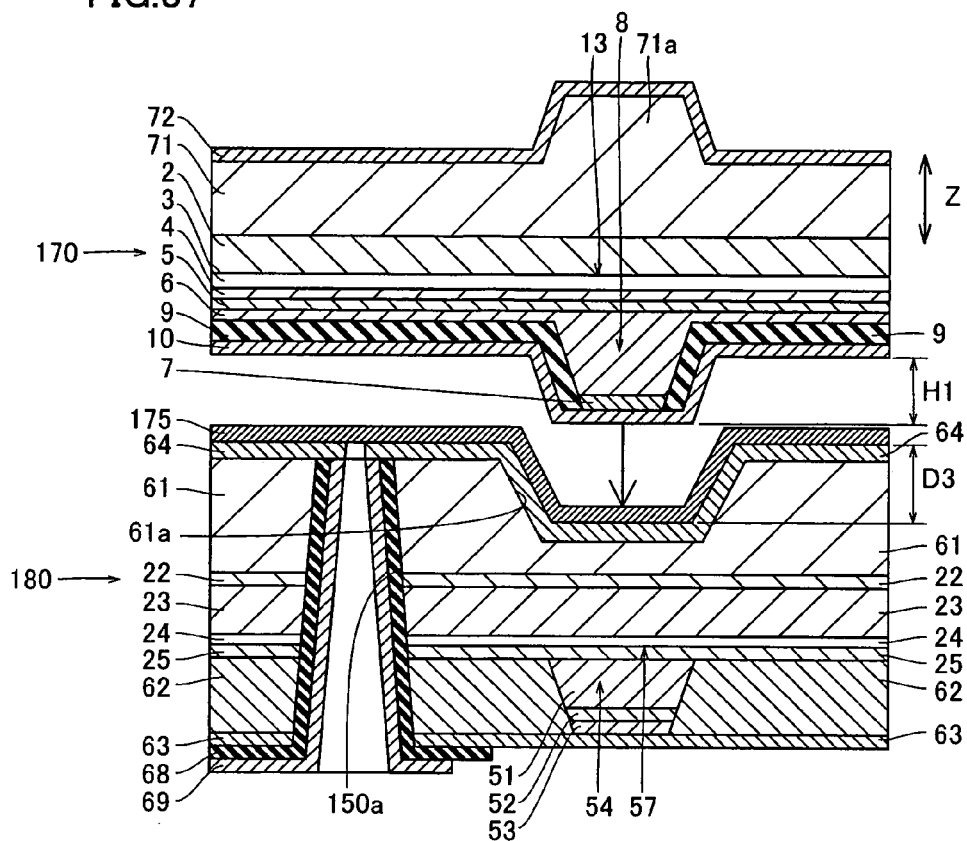
Figure 88:
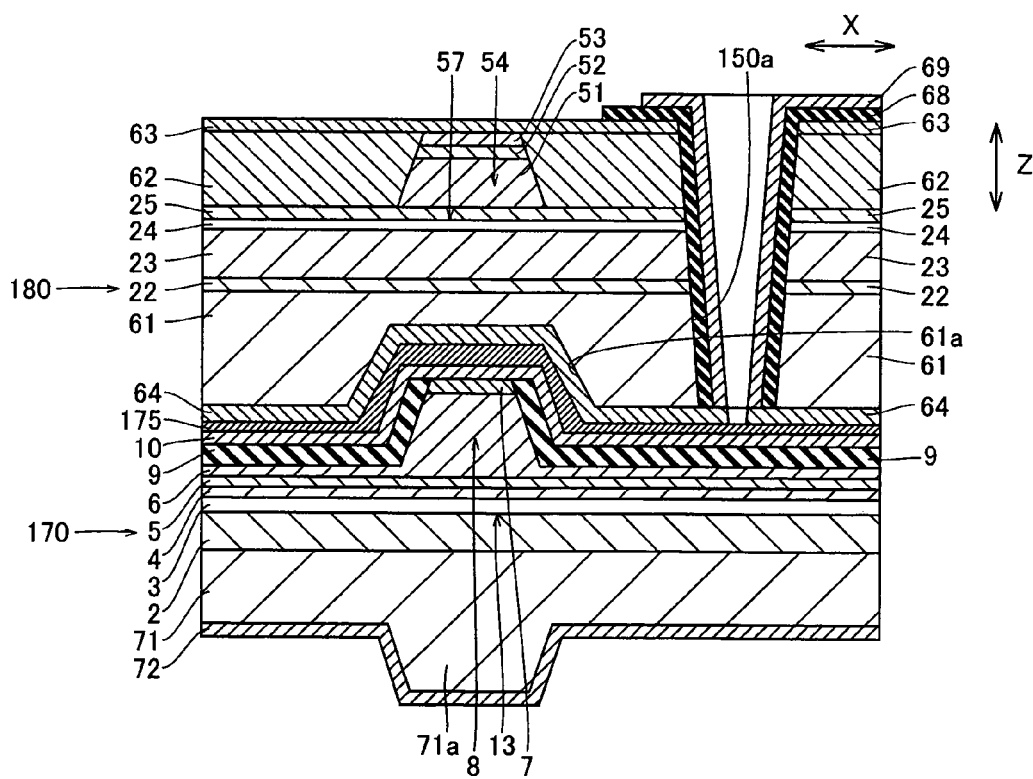

A method of bonding the blue-violet laser element 170, the red laser element 180 and the infrared laser element 190 to each other is now described with reference to FIGS. 87 to 89. First, the solder layer 175 of Au—Sn is formed on the n-side electrode 64 of the red laser element 180, as shown in FIG. 87. Thereafter the registrational projecting portion constituted of the ridge portion 8 of the blue-violet laser element 170 is directed downward and fitted into the registrational recess portion constituted of the recess portion 61a of the n-type GaAs substrate 61 of the red laser element 180, to be registered therewith. At this time, the registrational projecting portion constituted of the ridge portion 8 and the registrational recess portion constituted of the recess portion 61a of the n-type GaAs substrate 61 are visually recognized through transparent regions 111 of the blue-violet laser element 170 similar to those shown in FIGS. 10 and 12, to be fitted to each other in the direction Z. When the registrational projecting portion constituted of the ridge portion 8 is fitted into the registrational recess portion constituted of the recess portion 61a of the n-type GaAs substrate 61, the solder layer 175 of Au—Sn is melted by heat treatment under a temperature condition of about 280° C. Thereafter the solder layer 175 is solidified by a step of cooling the same to the room temperature, thereby bonding the blue-violet laser element 170 and the red laser element 180 to each other.

At this time, the blue-violet laser element 170 and the red laser element 180 can be inhibited from horizontal misregistration in the direction X shown in FIG. 72 due to the fitting between the registrational projecting portion constituted of the ridge portion 8 and the registrational recess portion constituted of the recess portion 61a of the n-type GaAs substrate 61 according to the fifth embodiment. Thus, cleavage directions of the blue-violet laser element 170 and the red laser element 180 can be inhibited from deviating from each other.

Figure 89:
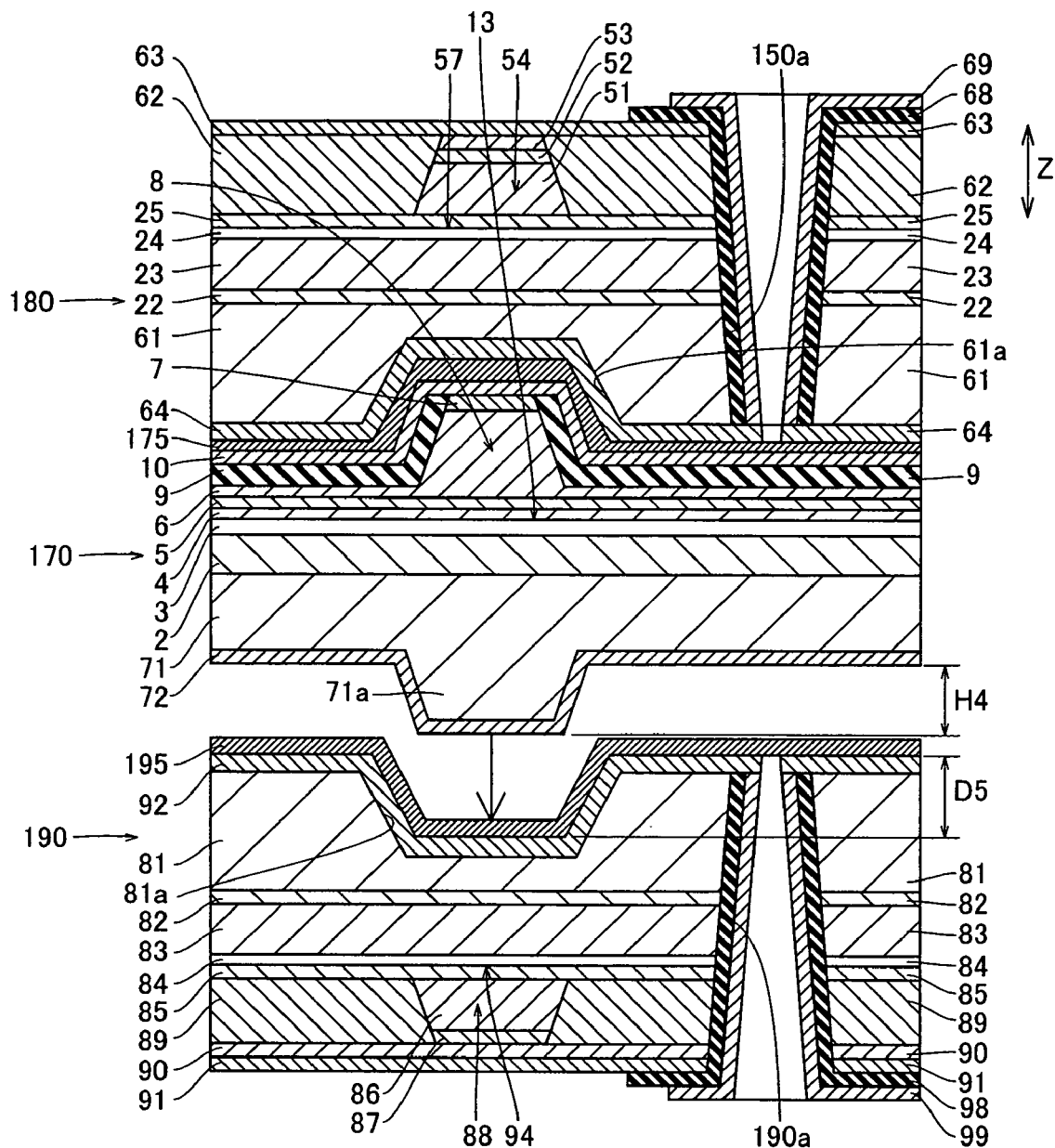

Then, the solder layer 195 of Au—Sn is formed on the n-side electrode 92 of the infrared laser element 190, as shown in FIG. 89. Thereafter the registrational projecting portion constituted of the projecting portion 71a of the n-type GaN substrate 71 of the blue-violet laser element 170 is directed downward and fitted into the registrational recess portion constituted of the recess portion 81a of the n-type GaAs substrate 81 of the infrared laser element 190, to be registered therewith. At this time, the registrational projecting portion constituted of the projecting portion 71a of the n-type GaN substrate 71 and the registrational recess portion constituted of the recess portion 81a of the n-type GaAs substrate 81 are visually recognized through the transparent regions 111 of the blue-violet laser element 170 similar to those shown in FIGS. 10 and 12, to be fitted to each other in the direction Z. When the registrational projecting portion constituted of the projecting portion 71a of the n-type GaN substrate 71 is fitted into the registrational recess portion constituted of the recess portion 81a of the n-type GaAs substrate 81, the solder layer 195 of Au—Sn is melted by heat treatment under a temperature condition of about 280° C. Thereafter the solder layer 195 is solidified by a step of cooling the same to the room temperature, thereby bonding the blue-violet laser element 170 and the infrared laser element 190 to each other.

At this time, the blue-violet laser element 170 and the infrared laser element 190 can be inhibited from horizontal misregistration in the direction X shown in FIG. 72 due to the fitting between the registrational projecting portion constituted of the projecting portion 71a of the n-type GaN substrate 71 and the registrational recess portion constituted of the recess portion 81a of the n-type GaAs substrate 81 according to the fifth embodiment. Thus, cleavage directions of the blue-violet laser element 170 and the infrared laser element 190 can be inhibited from deviating from each other.

Thereafter the light emission planes 93 (see FIG. 73) are formed by simultaneously cleaving the blue-violet laser element 170, the red laser element 180 and the infrared laser element 190 bonded to each other, followed by separation into each integrated semiconductor laser device. Finally, the wires 122 are bonded onto the surfaces of the p-side electrode 63 and the extraction electrode 69 of the red laser element 180 and the surfaces of the p-side electrode 91 and the extraction electrode 99 of the infrared laser element 190 respectively as shown in FIG. 72, thereby forming the integrated semiconductor laser device according to the fifth embodiment.

Sixth Embodiment

Figure 90:
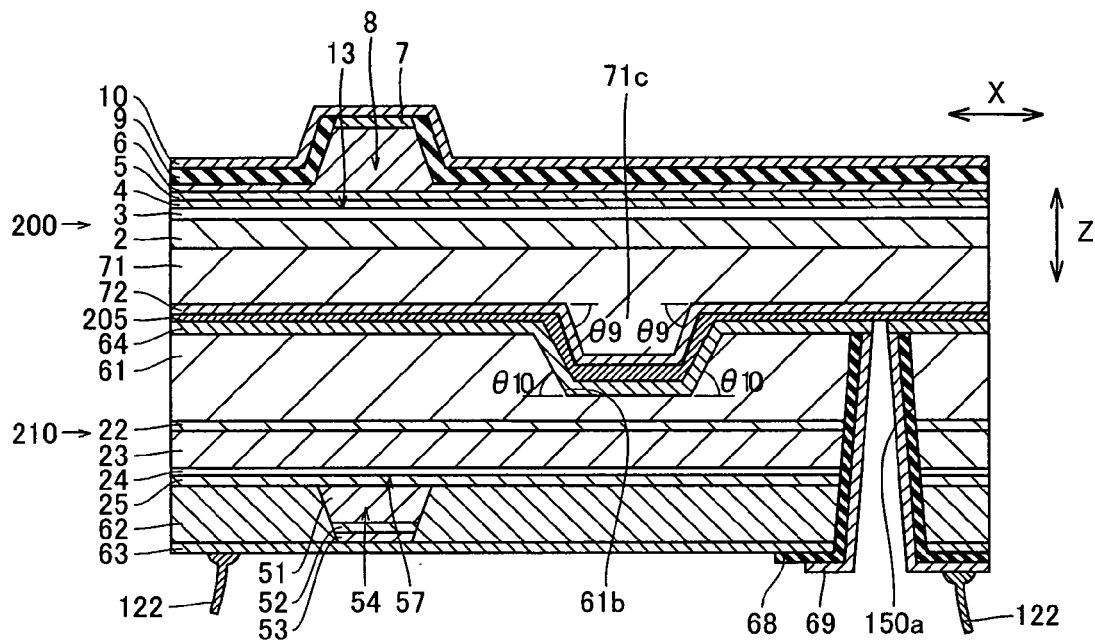
FIG. 90 is a sectional view showing the structure of an integrated semiconductor laser device according to a sixth embodiment of the present invention.

Referring to FIG. 90, registrational projecting and recess portions and emission regions 13 and 57 are not aligned with each other in the direction Z of stacking of semiconductor layers but arranged at prescribed intervals in the horizontal direction X in an integrated semiconductor laser device according to a sixth embodiment of the present invention, dissimilarly to the aforementioned first to fifth embodiments.

According to the sixth embodiment, a blue-violet laser element 200 having the registrational projecting portion and a red laser element 210 having the registrational recess portion are stacked (integrated) with each other in the direction Z, as shown in FIG. 90. The blue-violet laser element 200 and the red laser element 210 are examples of the "first semiconductor laser element" and the "second semiconductor laser element" in the present invention respectively.

The structure of the blue-violet laser element 200 according to the sixth embodiment is now described. In the blue-violet laser element 200 according to the sixth embodiment, a projecting portion 71c having a projection height of about 400 nm is formed on a region of the back surface of an n-type GaN substrate 71 other than that corresponding to a ridge portion 8. The projecting portion 71c of the n-type GaN substrate 71 has tapered side surfaces so that the width of the tapered end is smaller than that of the base. The side surfaces of the projecting portion 71c of the n-type GaN substrate 71 and the upper surface of an active layer 3 form an angle θ9 of about 80°. The tapered end of the projecting portion 71c of the n-type GaN substrate 71 has a width of about 2 µm. The projecting portion 71c of the n-type GaN substrate 71 is in the form of a (slender) stripe extending along the ridge portion 8. The projecting portion 71c of the n-type GaN substrate 71 forms the registrational projecting portion.

The structure of the red laser element 210 according to the sixth embodiment is now described. In the red laser element 210 according to the sixth embodiment, a recess portion 61b having a depth of about 1 µm is formed on a region of the surface of an n-type GaAs substrate 61 closer to the blue-violet laser element 200 other than that corresponding to a ridge portion 54, as shown in FIG. 90. This recess portion 61b of the n-type GaAs substrate 61 has tapered inner side surfaces so that the width of the bottom is smaller than the width (about 3 µm) of the open end. The inner side surfaces of the recess portion 61b of the n-type GaAs substrate 61 and the surface of an active layer 24 form an angle θ10 of about 60°. The recess portion 61b of the n-type GaAs substrate 61 is in the form of a (slender) stripe extending along the ridge portion 54. The recess portion 61b of the n-type GaAs substrate 61 forms the registrational recess portion.

According to the sixth embodiment, the blue-violet laser element 200 and the red laser element 210 are integrated (stacked) with each other in the direction Z while the registrational projecting portion constituted of the projecting portion 71c of the n-type GaN substrate 71 is fitted into the registrational recess portion constituted of the recess portion 61b of the n-type GaAs substrate 61, as shown in FIG. 90. Further, the emission regions 13 and 57 of the blue-violet laser element 200 and the red laser element 210 are aligned with each other in the direction (direction Z shown in FIG. 90) of stacking of the semiconductor layers. In addition, the registrational projecting portion of the blue-violet laser element 200 and the registrational recess portion of the red laser element 210 are bonded to each other through a solder layer 205 of Au—Sn. The solder layer 205 is an example of the "bonding layer" in the present invention.

The remaining structure of the integrated semiconductor laser device according to the sixth embodiment is similar to that of the integrated semiconductor laser device according to the aforementioned fourth embodiment.

According to the sixth embodiment, as hereinabove described, the registrational projecting portion constituted of the projecting portion 71a of the n-type GaN substrate 71 of the blue-violet laser element 200 is fitted into the registrational recess portion constituted of the recess portion 61a of the n-type GaAs substrate 61 of the red laser element 210, whereby the blue-violet laser element 200 and the red laser element 210 bonded to each other can be inhibited from horizontal misregistration (in the direction X shown in FIG. 90) due to the fitting between the registrational projecting portion and the registrational recess portion. Thus, the optical axes of beams emitted from the blue-violet laser element 200 and the red laser element 210 respectively can be inhibited from horizontal deviation (in the direction X shown in FIG. 90), whereby the optical axis of a beam emitted from the integrated semiconductor laser device can be easily adjusted when the beam is introduced into an optical system formed by a lens and a mirror. Thus, the cost for optical axis adjustment can be reduced. Further, the blue-violet laser element 200 and the red laser element 210 bonded to each other can be so inhibited from horizontal misregistration (in the direction X shown in FIG. 90) that cleavage directions of the blue-violet laser element 200 and the red laser element 210 can be inhibited from deviating from each other. Thus, cleavability for simultaneously cleaving the blue-violet laser element 200 and the red laser element 210 bonded to each other can be improved. Consequently, the properties of laser beams emitted from light emission planes (cleavage planes) can be improved.

The remaining effects of the sixth embodiment are similar to those of the aforementioned first embodiment.

A fabrication process for the integrated semiconductor laser device according to the sixth embodiment is similar to that for the integrated semiconductor laser device according to the aforementioned fourth embodiment. According to the sixth embodiment, however, the projecting portion 71b is formed on the back surface of the n-type GaN substrate 71 so that the same is not aligned with the emission region 13 in the direction of stacking of the semiconductor layers. Further, the recess portion 61b is formed on the back surface of the n-type GaAs substrate 61 so that the same is not aligned with the emission region 57 in the direction of stacking of the semiconductor layers.

Seventh Embodiment

Figure 91:
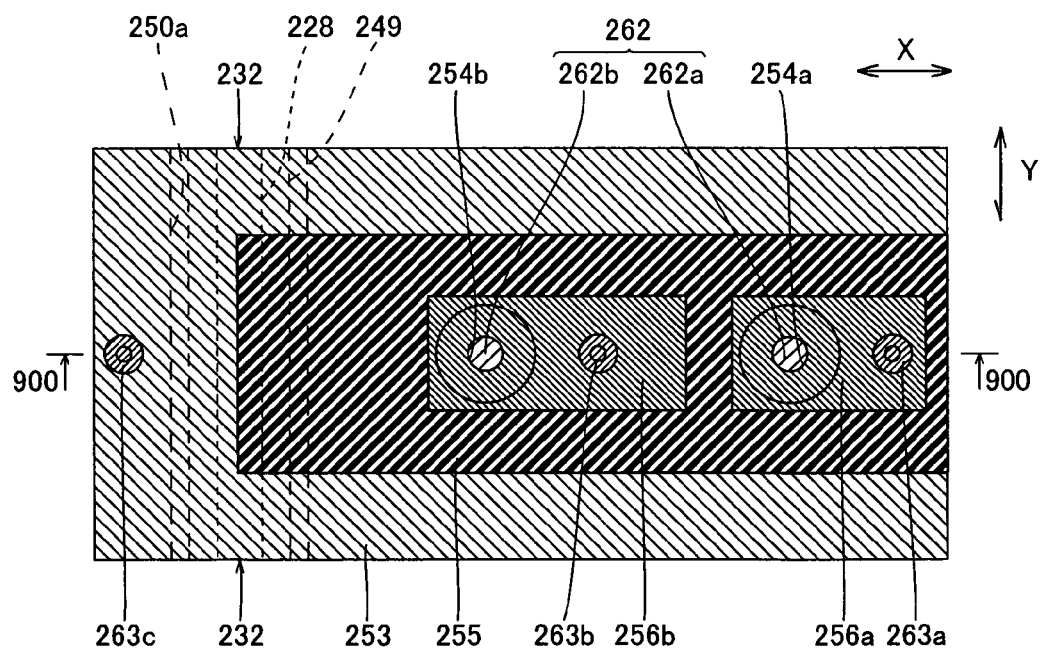
FIG. 91 is a plan view showing the structure of an integrated semiconductor laser device according to a seventh embodiment of the present invention.
Figure 92:
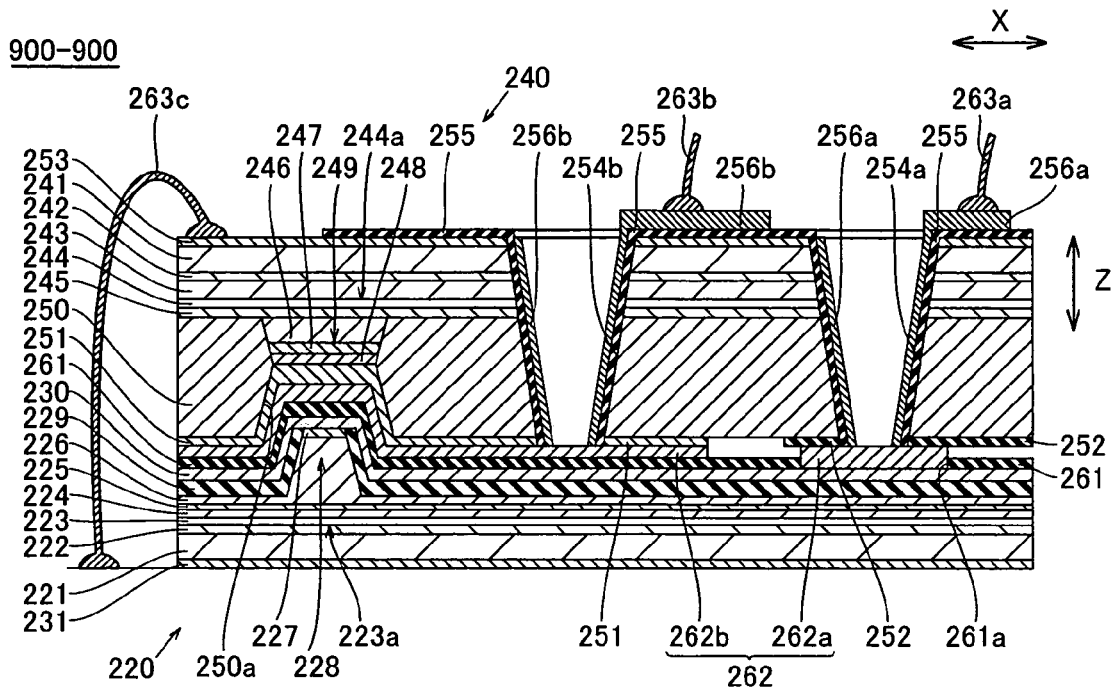
FIG. 92 is a sectional view taken along the line 900-900 in FIG. 91.

Referring to FIGS. 91 and 92, an insulating film is arranged between two semiconductor laser elements constituting an integrated semiconductor laser device according to a seventh embodiment of the present invention, dissimilarly to the aforementioned first to sixth embodiments.

In the integrated semiconductor laser device according to the seventh embodiment, a blue-violet laser element 220 having a registrational projecting portion and a red laser element 240 having a registrational recess portion are stacked (integrated) with each other in a direction Z, as shown in FIG. 92. The blue-violet laser element 220 and the red laser element 240 are examples of the "first semiconductor laser element" and the "second semiconductor laser element" in the present invention respectively.

The structure of the blue-violet laser element 220 according to the seventh embodiment is now described. In the blue-violet laser element 220 according to the seventh embodiment, an n-type cladding layer 222 of n-type AlGaN having a thickness of about 2.5 µm is formed on an n-type GaN substrate 221, as shown in FIG. 92. An active layer 223 having a thickness of about 70 nm is formed on the n-type cladding layer 222. This active layer 223 has an MQW structure obtained by alternately stacking a plurality of well layers (not shown) of undoped InGaN and a plurality of barrier layers (not shown) of undoped InGaN with each other. A light guide layer 224 of undoped InGaN having a thickness of about 80 nm is formed on the active layer 223. A cap layer 225 of undoped AlGaN having a thickness of about 20 nm is formed on the light guide layer 224.

A p-type cladding layer 226 having a projecting portion and remaining flat portions is formed on the cap layer 225. The flat portions of the p-type cladding layer 226 have a thickness of about 50 nm, and the projecting portion has a height of about 350 nm from the upper surfaces of the flat portions. A p-type contact layer 227 of p-type InGaN having a thickness of about 3 nm is formed on the projecting portion of the p-type cladding layer 226. The p-type contact layer 227 and the projecting portion of the p-type cladding layer 226 constitute a ridge portion 228.

According to the seventh embodiment, the ridge portion 228 is similar in shape to the ridge portion 8 according to the aforementioned first embodiment. In other words, the ridge portion 228 has tapered side surfaces so that the width of the tapered end is smaller than that of the base. The side surfaces of the ridge portion 228 and the upper surface of the active layer 223 form an angle identical to the angle θ1 (about 70°) formed by the side surfaces of the ridge portion 8 and the upper surface of the active layer 3 according to the aforementioned first embodiment. The tapered end of the ridge portion 228 has a width of about 1.5 μm. As shown in FIG. 91, the ridge portion 228 is in the form of a (slender) stripe extending in a direction Y perpendicular to light emission planes (cleavage planes) 232. This ridge portion 228 forms the registrational projecting portion. As shown in FIG. 92, a portion of the active layer 223 located under the ridge portion 228 and a peripheral portion of this portion of the active layer 223 form an emission region 223a of the blue-violet laser element 220. The ridge portion 228 is an example of the "projecting portion" or the "first ridge portion" in the present invention. The emission region 223a is an example of the "first emission region" in the present invention.

A current blocking layer 229 of SiO$_2$ having a thickness of about 200 nm is formed to cover the side surfaces of the ridge portion 228 and the upper surfaces of the flat portions of the p-type cladding layer 226. A p-side electrode 230 is formed on the current blocking layer 229, to be in contact with the upper surface of the ridge portion 228 (p-type contact layer 227). This p-side electrode 230 is formed by a Pd layer (not shown) having a thickness of about 100 nm and an Au layer (not shown) having a thickness of about 1 μm successively from the side closer to the n-type GaN substrate 221. The p-side electrode 230 is an example of the "first electrode" in the present invention. Thus, the registrational projecting portion constituted of the ridge portion 228 has a projection height identical to the projection height H1 (about 153 nm) of the registrational projecting portion constituted of the ridge portion 8 according to the aforementioned first embodiment between the upper surfaces of the portions of the p-side electrode 230 located on the upper surfaces of the flat portions of the p-type cladding layer 226 and the upper surface of the portion of the p-side electrode 230 located on the upper surface of the ridge portion 228.

An n-side electrode 231 is formed on the back surface of the n-type GaN substrate 221. This n-side electrode 231 is formed by an Al layer (not shown) having a thickness of about 6 nm, a Pd layer (not shown) having a thickness of about 10 nm and an Au layer (not shown) having a thickness of about 300 nm successively from the side closer to the n-type GaN substrate 221.

The structure of a red laser element 240 according to the seventh embodiment is now described. The red laser element 240 shown in FIG. 92 has a downwardly directed ridge portion 249. In the red laser element 240 according to the seventh embodiment, an n-type buffer layer 242 of n-type GaInP having a thickness of about 300 nm is formed on the surface of an n-type GaAs substrate 241 closer to the blue-violet laser element 220, as shown in FIG. 92. An n-type cladding layer 243 of n-type AlGaInP having a thickness of about 2 μm is formed on the surface of the n-type buffer layer 242 closer to the blue-violet laser element 220. An active layer 244 having a thickness of about 60 nm is formed on the surface of the n-type cladding layer 243 closer to the blue-violet laser element 220. This active layer 224 has an MQW structure obtained by alternately stacking a plurality of well layers (not shown) of undoped GaInP and a plurality of barrier layers (not shown) of undoped AlGaInP with each other.

A p-type first cladding layer 245 of p-type AlGaInP having a thickness of about 300 nm is formed on the surface of the active layer 244 closer to the blue-violet laser element 220. A projecting p-type second cladding layer 246 of p-type AlGaInP having a thickness of about 1.2 μm is formed on a prescribed region of the surface of the p-type first cladding layer 245 closer to the blue-violet laser element 220. A p-type intermediate layer 247 of p-type GaInP having a thickness of about 100 nm is formed on the surface of the p-type second cladding layer 246 closer to the blue-violet laser element 220. A p-type contact layer 248 of p-type GaAs having a thickness of about 300 nm is formed on the surface of the p-type intermediate layer 247 closer to the blue-violet laser element 220. The p-type contact layer 248, the p-type intermediate layer 247 and the p-type second cladding layer 246 constitute a ridge portion 249.

The ridge portion 249 is similar in shape to the ridge portion 29 according to the aforementioned first embodiment. In other words, the ridge portion 249 has tapered side surfaces so that the width thereof is reduced from the base toward the tapered end. The side surfaces of the ridge portion 249 and the surface of the active layer 244 form an angle identical to the angle θ2 (about 60°) formed by the side surfaces of the ridge portion 29 and the surface of the active layer 24 according to the aforementioned first embodiment. The tapered end of the ridge portion 249 has a width of about 2.7 μm. As shown in FIG. 91, the ridge portion 249 is in the form of a (slender) stripe extending in the direction Y perpendicular to the light emission planes (cleavage planes) 232. As shown in FIG. 92, a portion of the active layer 244 located under the ridge portion 249 and a peripheral portion of this portion of the active layer 244 form an emission region 244a of the red laser element 240. The ridge portion 249 is an example of the "second ridge portion" in the present invention. The emission region 244a is an example of the "second emission region" in the present invention.

According to the seventh embodiment, an n-type current blocking layer 250 having a thickness (about 2 μm) larger than the height (about 1.6 μm) of the ridge portion 249 is formed on the surface of the p-type first cladding layer 245 closer to the blue-violet laser element 220, to cover the side surfaces of the ridge portion 249. The n-type current blocking layer 250 has an opening 250a exposing the surface of the ridge portion 249 closer to the blue-violet laser element 220. The opening 250a of the n-type current blocking layer 250 has tapered inner side surfaces so that the width of the bottom (the width (about 2.7 μm) of the tapered end of the ridge portion 249) is smaller than the width (about 3 μm) of the open end. The inner side surfaces of the opening 250a of the n-type current blocking layer 250 and the surface of the active layer 244 form an angle identical to the angle θ3 (about 70°) formed by the inner side surfaces of the opening 30a of the n-type current blocking layer 30 and the surface of the active layer 24 according to the aforementioned first embodiment. As shown in FIG. 91, the opening 250a of the n-type current blocking layer 250 is in the form of a (slender) stripe extending in the direction Y along the ridge portion 249. As shown in FIG. 92, the n-type current blocking layer 250 is formed by a p-type AlInP layer (not shown) and an n-type GaAs layer (not shown) successively from the side closer to the n-type GaAs substrate 241. The opening 250a of the n-type current blocking layer 250 forms a registrational recess portion. The n-type current blocking layer 250 is an example of the "current blocking layer" in the present invention, and the opening 250a is an example of the "recess portion" in the present invention.

A p-side electrode 251 having a thickness of about 0.3 μm is formed on the surface of the ridge portion 249 (p-type contact layer 248) closer to the blue-violet laser element 220, to extend toward a prescribed region of the surface of the n-type current blocking layer 250 closer to the blue-violet laser element 220 through the opening 250a. This p-side electrode 251 is formed by an AuZn layer (not shown), a Pt layer (not shown) and an Au layer (not shown) successively from the side closer to the n-type GaAs substrate 241. The p-side electrode 251 is an example of the "second electrode" in the present invention. Thus, the registrational recess portion constituted of the opening 250a of the n-type current blocking layer 250 has a depth identical to the depth D1 (about 400 nm) of the registrational recess portion constituted of the opening 30a of the n-type current blocking layer 30 according to the aforementioned first embodiment between a portion of the surface of the p-side electrode 251 closer to the blue-violet laser element 220 located on a region other than that corresponding to the ridge portion 249 and another portion of the surface of the p-side electrode 251 closer to the blue-violet laser element 220 located on the region corresponding to the ridge portion 249. In other words, the depth (about 400 nm) of the registrational recess portion constituted of the opening 250a of the n-type current blocking layer 250 is larger than the projection height (about 153 nm) of the registrational projecting portion constituted of the ridge portion 228, similarly to the aforementioned first embodiment.

An insulating film 252 of $SiO_2$ having a thickness of about 200 nm is formed on a prescribed region, not covered with the p-side electrode 251 but exposed, of the surface of the n-type current blocking layer 250 closer to the blue-violet laser element 220. An n-side electrode 253 having a thickness of about 1 μm is formed on the surface of the n-type GaAs substrate 241 opposite to the blue-violet laser element 220. This n-side electrode 253 is formed by an AuGe layer (not shown), an Ni layer (not shown) and an Au layer (not shown) successively from the side closer to the n-type GaAs substrate 241.

According to the seventh embodiment, a circular contact hole 254a is formed to pass through the n-side electrode 253, the n-type GaAs substrate 241, the semiconductor layers 242 to 245 and 250 and the insulating film 252 from the surface of the n-side electrode 253 opposite to the blue-violet laser element 220. Another circular contact hole 254b is formed to pass through the n-side electrode 253, the n-type GaAs substrate 241, the semiconductor layers 242 to 245 and 250 and the p-side electrode 251 from the surface of the n-side electrode 253 opposite to the blue-violet laser element 220 at a prescribed interval from the contact hole 254a. Each of the contact holes 254a and 254b has a tapered inner side surface so that the diameter of a portion closer to the p-side electrode 251 is smaller than the diameter of several 10 μm of a portion closer to the n-side electrode 253. The contact holes 254a and 254b are examples of the "first contact hole" and the "second contact hole" in the present invention respectively. An insulating film 255 of $SiO_2$ having a thickness of about 200 nm is formed on the inner side surfaces of the contact holes 254a and 254b, to extend along the surface of the n-side electrode 253 opposite to the blue-violet laser element 220. An end of this insulating film 255 is arranged to partially expose the surface of the n-side electrode 252, as shown in FIG. 91.

According to the seventh embodiment, an extraction electrode 256a having a thickness of about 0.3 μm is formed on a portion of the insulating film 255 located in the contact hole 254a to extend toward a prescribed region of the surface of the insulating film 255 opposite to the blue-violet laser element 220, as shown in FIG. 92. Another extraction electrode 256b of the same layer as the extraction electrode 256a is formed on another portion of the insulating film 255 located in the contact hole 254b, to extend toward another prescribed region of the surface of the insulating film 255 opposite to the blue-violet laser element 220. Each of the extraction electrodes 256a and 256b is formed by a Ti layer (not shown), a Pt layer (not shown) and an Au layer (not shown) successively from the side closer to the n-type GaAs substrate 241. The extraction electrode 256a and 256b are examples of the "first extraction electrode" and the "second extraction electrode" in the present invention respectively.

A bonded state of the blue-violet laser element 220 and the red laser element 240 according to the seventh embodiment is now described. According to the seventh embodiment, an insulating film 261 of $SiO_2$ having a thickness of about 200 nm is formed on the p-side electrode 230 of the blue-violet laser element 220. This insulating film 261 has an opening 261a, which is arranged on a region facing the contact hole 254a of the red laser element 240. In other words, the region of the p-side electrode 230 of the blue-violet laser element 220 facing the contact hole 254a is not covered with the insulating film 261 but exposed.

According to the seventh embodiment, the blue-violet laser element 220 and the red laser element 240 are integrated (stacked) with each other in the direction Z while the insulating film 261 is formed on the surface of the blue-violet laser element 220 and the registrational projecting portion constituted of the ridge portion 228 is fitted into the registrational recess portion constituted of the opening 250a of the n-type current blocking layer 250. Further, the emission regions 223a and 244a of the blue-violet laser element 220 and the red laser element 240 are aligned with each other in the direction Z of stacking of the semiconductor layers. The depth (about 400 nm) of the registrational recess portion of the red laser element 240 is larger than the projection height (about 153 nm) of the registrational projecting portion of the blue-violet laser element 220 as hereinabove described, whereby the interval between the upper surface of the registrational projecting portion of the blue-violet laser element 220 and the bottom of the registrational recess portion of the red laser element 240 is larger than the interval between the remaining regions of the blue-violet laser element 220 and the red laser element 240 other than the registrational projecting portion and the registrational recess portion.

The registrational projecting portion of the blue-violet laser element 220 and the registrational recess portion of the red laser element 240 are bonded to each other through a solder layer 262 of Au—Sn. This solder layer 262 is divided into two solder layers 262a and 262b. The solder layer 262a is arranged in the opening 261a, and in contact with the p-side electrode 230 and the extraction electrode 256a of the blue-violet laser element 220. Thus, the p-side electrode 230 and the extraction electrode 256a of the blue-violet laser element 220 are electrically connected with each other through the solder layer 262a. The other solder layer 262b is arranged at a prescribed interval from the solder layer 262a, and in contact with the p-side electrode 251 and the extraction electrode 256b of the red laser element 240. Thus, the p-side electrode 251 and the extraction electrode 256b of the red laser element 240 are electrically connected with each other through the solder layer 262b.

Wires (gold wires) 263a and 263b are bonded to the surfaces of the extraction electrodes 256a and 256b opposite to the blue-violet laser element 220 respectively. A first end of still another wire (gold wire) 263c is bonded to the exposed region of the surface of the n-side electrode 253 opposite to the blue-violet laser element 220. A second end of the wire 263c is bonded to a conductive submount (not shown) bonded to the n-side electrode 231 of the blue-violet laser element 220.

According to the seventh embodiment, as hereinabove described, the registrational projecting portion constituted of the ridge portion 228 of the blue-violet laser element 220 is fitted into the registrational recess portion constituted of the opening 250a of the n-type current blocking layer 250 of the red laser element 240, whereby the blue-violet laser element 220 and the red laser element 240 bonded to each other can be inhibited from horizontal misregistration (in the direction X shown in FIG. 92) due to the fitting between the registrational projecting portion and the registrational recess portion. Thus, the optical axes of beams emitted from the blue-violet laser element 220 and the red laser element 240 respectively can be inhibited from horizontal deviation (in the direction X shown in FIG. 92), whereby the optical axis of a beam emitted from the integrated semiconductor laser device can be easily adjusted when the beam is introduced into an optical system formed by a lens and a mirror. Thus, the cost for optical axis adjustment can be reduced. Further, the blue-violet laser element 220 and the red laser element 240 bonded to each other can be so inhibited from horizontal misregistration (in the direction X shown in FIG. 92) that cleavage directions of the blue-violet laser element 220 and the red laser element 240 can be inhibited from deviating from each other. Thus, cleavability for simultaneously cleaving the blue-violet laser element 220 and the red laser element 240 bonded to each other can be improved. Consequently, the properties of laser beams emitted from the light emission planes (cleavage planes) 232 can be improved.

According to the seventh embodiment, further, the emission regions 223a and 244a of the blue-violet laser element 220 and the red laser element 240 are aligned with each other in the direction (direction Z shown in FIG. 92) of stacking of the semiconductor layers, so that the interval between the emission regions 223a and 244a of the blue-violet laser element 220 and the red laser element 240 can be reduced as compared with a case where the emission regions 223a and 244a of the blue-violet laser element 220 and the red laser element 240 positionally deviate from each other in two directions, i.e., the direction (direction Z shown in FIG. 92) of stacking of the semiconductor layers and the horizontal direction (direction X shown in FIG. 92). Thus, the beam emitted from either the emission region 244a of the red laser element 240 or the emission region 223a of the blue-violet laser element 220 can be inhibited from being incident on a region remarkably deviating from a prescribed region of the optical system when the beam emitted from the integrated semiconductor laser device is introduced into the optical system, if the optical axis is so adjusted as to introduce the beam emitted from either the emission region 223a of the blue-violet laser element 220 or the emission region 244a of the red laser element 240 into the prescribed region of the optical system. Consequently, the optical axis of the beam emitted from the integrated semiconductor laser device can be more easily adjusted with respect to the optical system, whereby the cost for optical axis adjustment can be further reduced.

According to the seventh embodiment, the insulating film 261 is so formed between the p-side electrodes 230 and 251 of the blue-violet laser element 220 and the red laser element 240 that the p-side electrodes 230 and 251 of the blue-violet laser element 220 and the red laser element 240 can be electrically insulated from each other through the insulating film 261 also when the blue-violet laser element 220 and the red laser element 240 are so stacked (integrated) with each other as to oppose the p-side electrodes 230 and 251 of the blue-violet laser element 220 and the red laser element 240 to each other. Thus, the p-side electrodes 230 and 251 of the blue-violet laser element 220 and the red laser element 240 can be connected to a common cathode. Therefore, different voltages can be applied to the p-side electrodes 230 and 251 of the blue-violet laser element 220 and the red laser element 240 respectively, whereby the flexibility can be improved in relation to methods of supplying electric power to the emission regions 223a and 244a of the blue-violet laser element 220 and the red laser element 240 respectively. Further, the p-side electrodes 230 and 251 of the blue-violet laser element 220 and the red laser element 240 can be connected to a common anode by connecting the extraction electrodes 256a and 256b with each other through a wire and individually bonding wires insulated from each other to the n-side electrode 253 of the red laser element 240 and the conductive submount (not shown) respectively. In this case, arbitrary voltages can be applied to the n-side electrodes 231 and 253 of the blue-violet laser element 220 and the red laser element 240 respectively. In addition, the p-side electrode 230 of the blue-violet laser element 220 and the n-side electrode 253 of the red laser element 240 can be electrically connected with each other, while the n-side electrode 231 of the blue-violet laser element 220 and the p-side electrode 251 of the red laser element 240 can also be electrically connected with each other. Consequently, the integrated semiconductor laser device can be used in diverse manners.

According to the seventh embodiment, the contact hole 254a is formed through the red laser element 240 while the opening 261a partially exposing the p-side electrode 230 of the blue-violet laser element 220 is formed on the region of the insulating film 261 facing the contact hole 254a, whereby a voltage can be externally applied to the p-side electrode 230 of the blue-violet laser element 220 through the contact hole 254a and the opening 261a of the insulating film 261 despite the insulating film 261 formed between the p-side electrodes 230 and 251 of the blue-violet laser element 220 and the red laser element 240.

According to the seventh embodiment, the contact hole 254b is formed through the red laser element 240 at the prescribed interval from the contact hole 254a, whereby different voltages can be easily applied to the p-side electrodes 230 and 251 of the blue-violet laser element 220 and the red laser element 240 through the contact holes 254a and 254b respectively.

According to the seventh embodiment, the extraction electrodes 256a an 256b are formed on the inner side surfaces of the contact holes 254a and 254b respectively, whereby voltages can be externally applied to the p-side electrodes 230 and 251 of the blue-violet laser element 220 and the red laser element 240 through the extraction electrodes 256a and 256b respectively.

According to the seventh embodiment, the registrational projecting portion of the blue-violet laser element 220 and the registrational recess portion of the red laser element 240 can be easily bonded to each other through the solder layer 262.

The remaining effects of the seventh embodiment are similar to those of the aforementioned first embodiment.

A fabrication process for the integrated semiconductor laser device according to the seventh embodiment is now described with reference to FIGS. 91 to 105.

Figure 93:
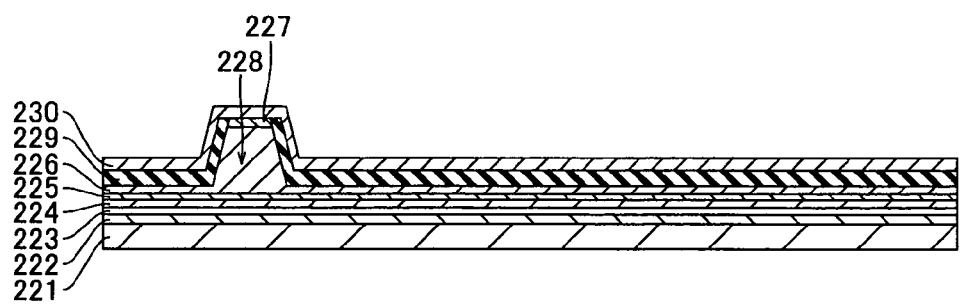
FIGS. 93 to 105 are sectional views for illustrating a fabrication process for the integrated semiconductor laser device according to the seventh embodiment shown in FIGS. 91 and 92.

In order to form the blue-violet laser element 220, the elements up to the p-side electrode 230 are formed through steps similar to those of the first embodiment shown in FIGS. 3 to 11, and the back surface of the n-type GaN substrate 221 is thereafter polished so that the thickness between the upper surface of the ridge portion 228 and the back surface of the n-type GaN substrate 221 is about 150 μm, as shown in FIG. 93.

Figure 94:
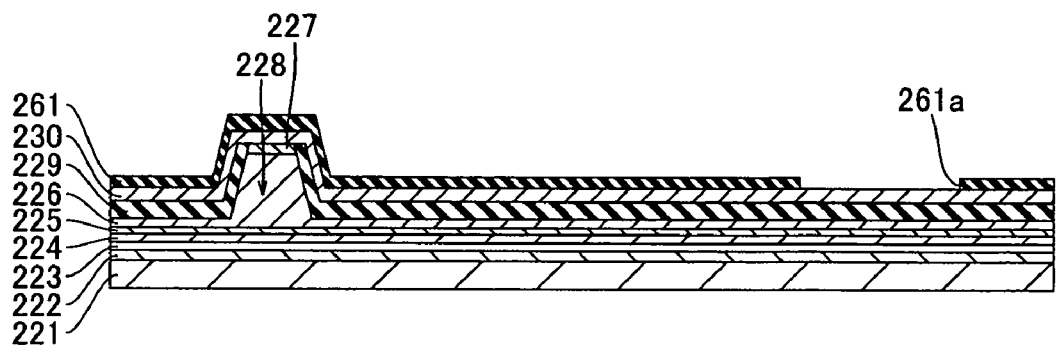

As shown in FIG. 94, the insulating film 261 of $SiO_2$ including the opening 261a and having the thickness of about 200 nm is formed on the p-side electrode 230 by plasma CVD. In order to form the insulating film 261, the opening 261a is arranged on the prescribed region other than that corresponding to the ridge portion 228.

Figure 95:
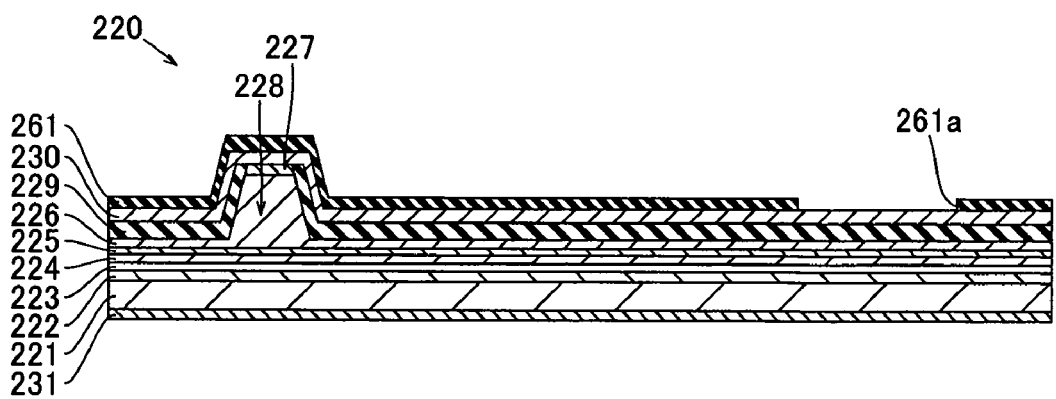

As shown in FIG. 95, the n-side electrode 231 is formed on the back surface of the n-type GaN substrate 221 by electron beam evaporation. In order to form the n-side electrode 231, the Al layer (not shown) having the thickness of about 6 nm, the Pd layer (not shown) having the thickness of about 10 nm and the Au layer (not shown) having the thickness of about 300 nm are successively formed. Thus, the blue-violet laser element 220 is formed with the p-side electrode 230 whose surface is covered with the insulating film 261 having the opening 261a.

Figure 96:
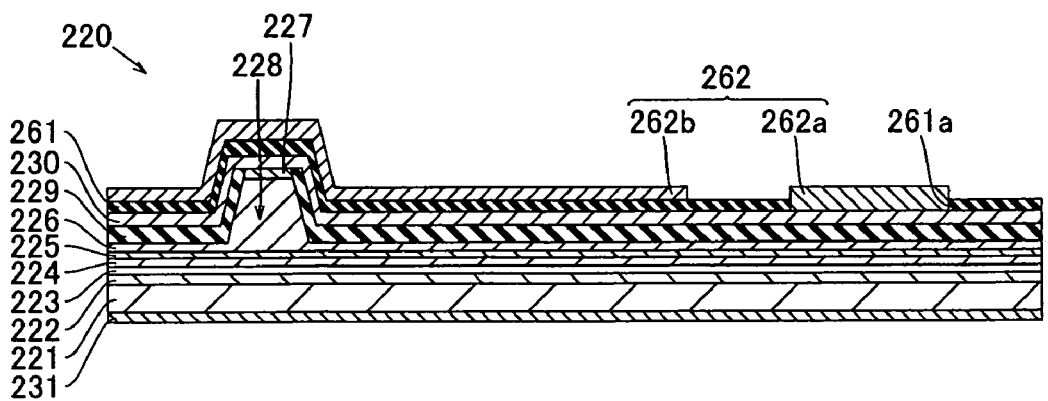

Thereafter the solder layer 262 of Au—Sn including the divided solder layers 262a and 262b is formed as shown in FIG. 96. More specifically, the solder layer 262a is formed on the upper surface of the portion of the p-side electrode 230 located in the opening 261a. Further, the other solder layer 262b is formed at the prescribed interval from the solder layer 262a, to at least cover the region of the insulating film 261 on the ridge portion 228.

Figure 97:
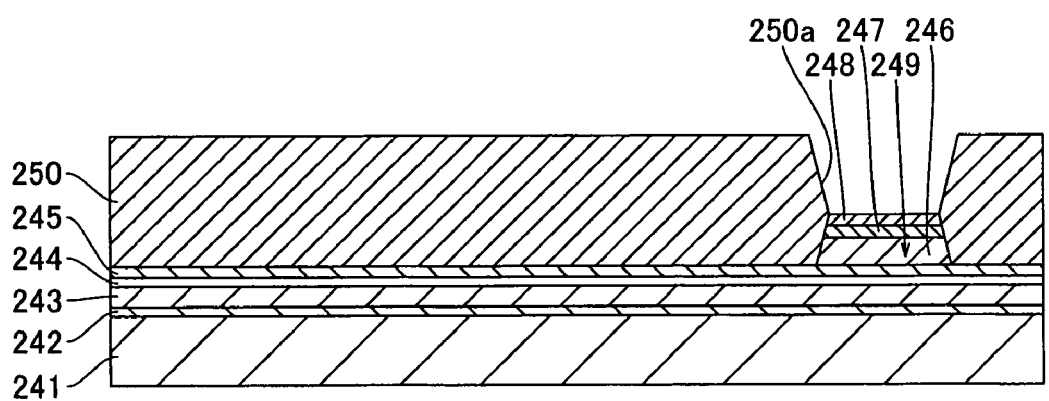

In order to form the red laser element 240, the layers up to the n-type current blocking layer 250 having the opening 250a are formed as shown in FIG. 97 through steps similar to those of the first embodiment shown in FIGS. 14 to 20.

Figure 98:
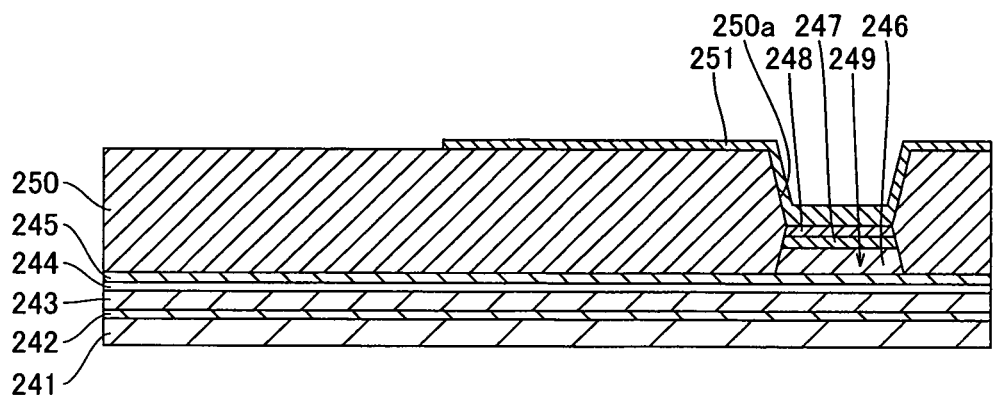

As shown in FIG. 98, the p-side electrode 251 having the thickness of about 0.3 µm is formed on the ridge portion 249 (p-type contact layer 248) by electron beam evaporation, to extend toward the prescribed region of the upper surface of the n-type current blocking layer 250 through the opening 250a. In order to form the p-side electrode 251, the AuZn layer (not shown) and the Pt layer (not shown) are successively formed. Thereafter the back surface of the n-type GaAs substrate 241 is polished so that the thickness between the upper surface of the ridge portion 249 and the back surface of the n-type GaAs substrate 241 is about 100 µm.

Figure 99:
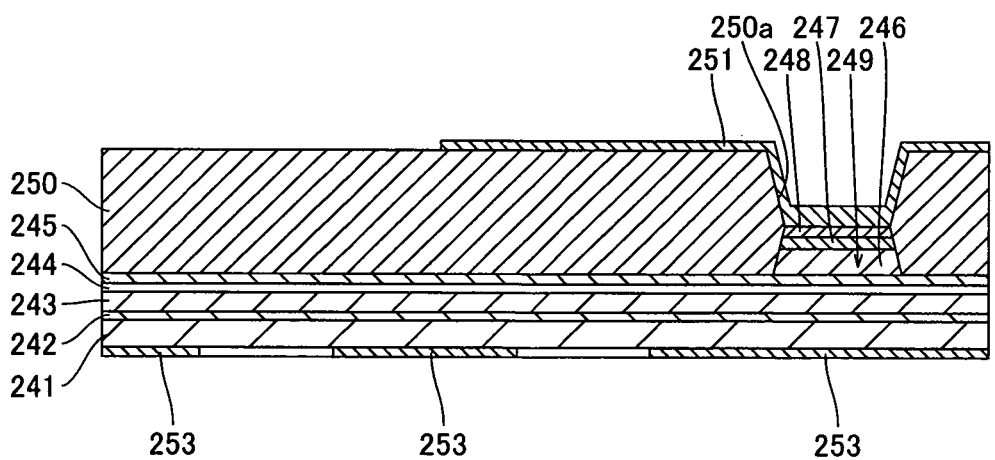

As shown in FIG. 99, the n-side electrode 253, also serving as an etching mask, having the thickness of about 1 µm is formed on the region of the back surface of the n-type GaAs substrate 241 other than those for forming the contact holes 254a and 254b (see FIG. 92) by electron beam evaporation. In order to form the n-side electrode 253, the AuGe layer (not shown), the Ni layer (not shown) and the Au layer (not shown) are successively formed.

Figure 100:
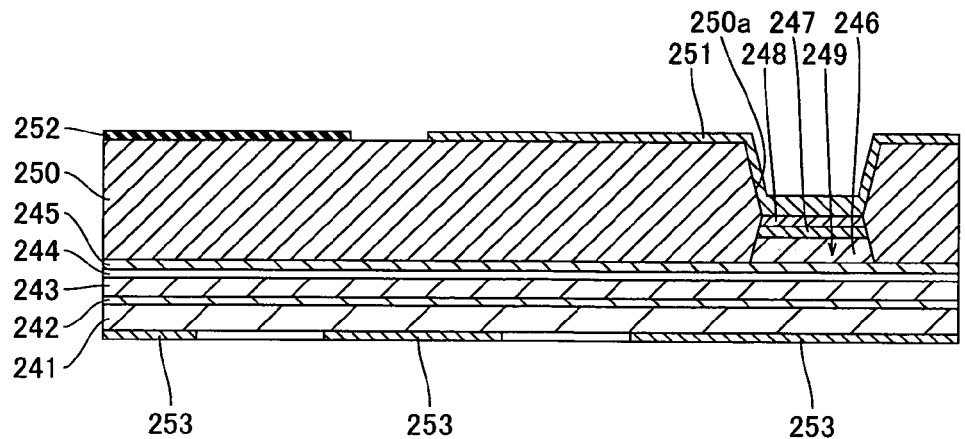

As shown in FIG. 100, the insulating film 252 of SiO$_2$ having the thickness of about 200 nm is formed on the prescribed region, not covered with the p-side electrode 251 but exposed, of the surface of the n-type current blocking layer 250 by plasma CVD at the prescribed interval from the p-side electrode 251.

Figure 101:
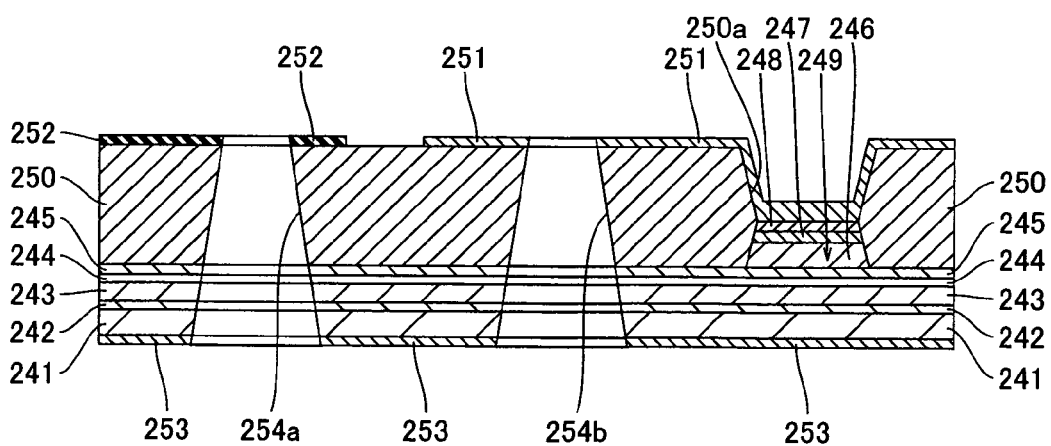

As shown in FIG. 101, the circular contact hole 254a is formed by partially removing the n-type GaAs substrate 241, the semiconductor layers 242 to 245 and 250 and the insulating film 252 from the back surface of the n-type GaAs substrate 241 through the mask of the n-side electrode 253 by RIE with chlorine gas. At the same time, the other circular contact hole 254b is also formed by partially removing the n-type GaAs substrate 241, the semiconductor layers 242 to 245 and 250 and the p-side electrode 251 on the region separated from the contact hole 254a at the prescribed interval.

Figure 102:
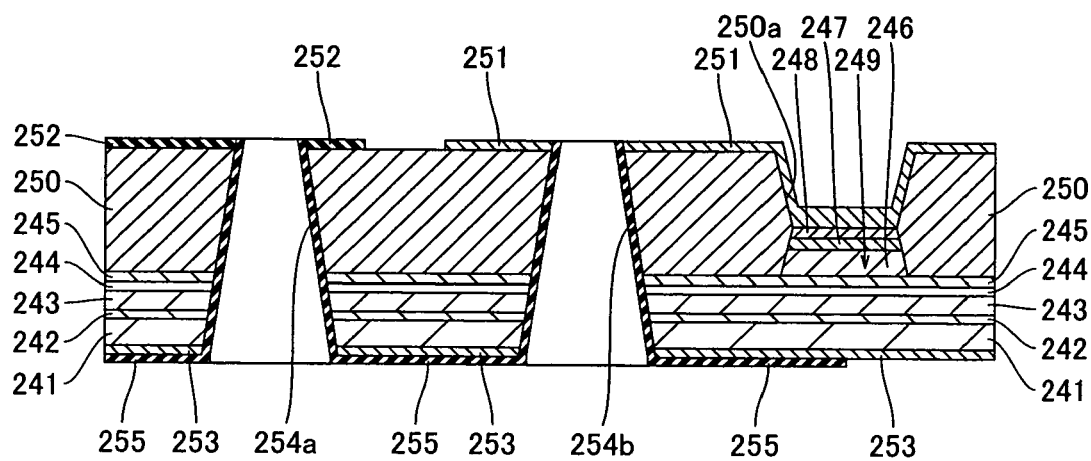

As shown in FIG. 102, the insulating film 255 of SiO$_2$ having the thickness of about 200 nm is formed on the inner side surfaces of the contact holes 254a and 254b, to extend along the surface of the n-side electrode 253 opposite to the n-type GaAs substrate 241. The end of this insulating film 255 is arranged to partially expose the surface of the n-side electrode 253, as shown in FIG. 91.

Figure 103:
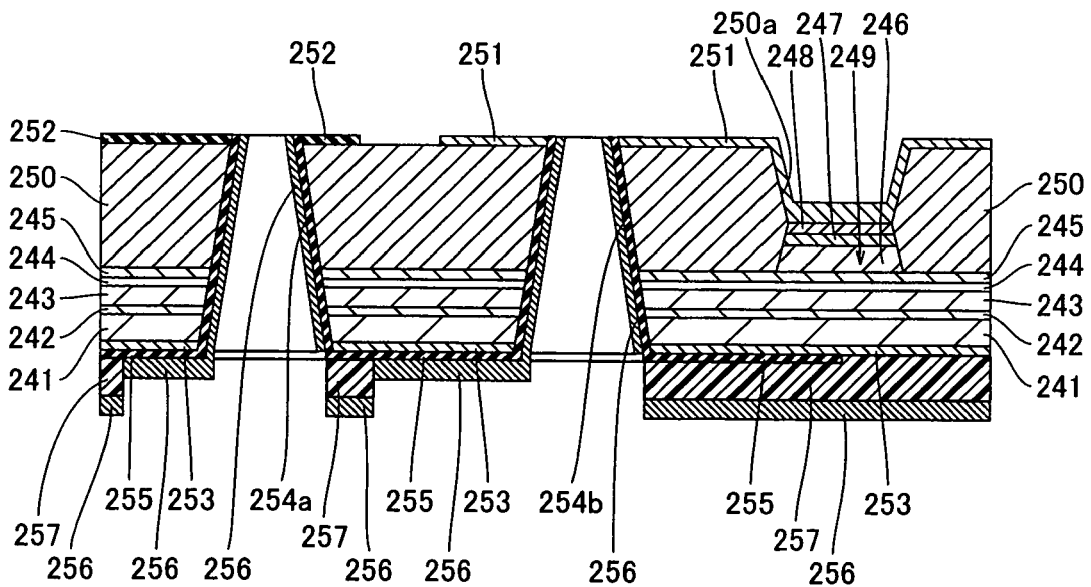
Figure 104:
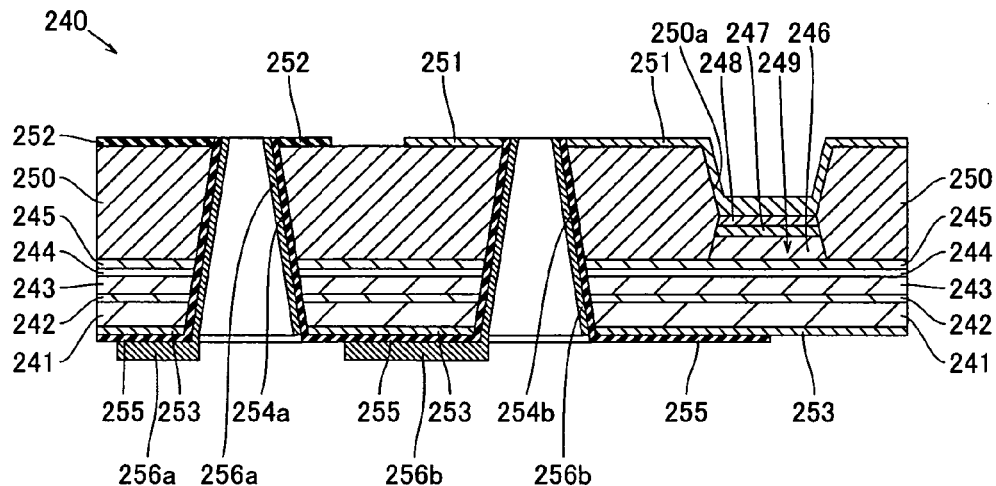

As shown in FIG. 103, a resist film 257 is formed on regions of the surface of the n-side electrode 253, opposite to the n-type GaAs substrate 241, other than the regions for forming the extraction electrodes 256a and 256b (see FIG. 92). A metallic layer 256 having a thickness of about 0.3 µm is formed by electron beam evaporation, to cover the inner side surfaces of the contact holes 254a and 254b and the surfaces of the resist film 257 and the insulating film 255 opposite to the n-type GaAs substrate 241. In order to form the metallic layer 256, a Ti layer (not shown), a Pt layer (not shown) and an Au layer (not shown) are successively formed. Thereafter the resist film 257 is removed. At this time, the portion of the metallic layer 256 formed on the surface of the resist film 257 opposite to the n-type GaAs substrate 241 is also removed. Thus, the extraction electrode 256a is formed on the portion of the insulating film 255 located in the contact hole 254a to extend toward the prescribed region of the surface of the insulating film 255 opposite to the n-type GaAs substrate 241, as shown in FIG. 104. Further, the extraction electrode 256b of the same layer as the extraction electrode 256a is formed on the portion of the insulating film 255 located in the contact hole 254b, to extend toward the prescribed region of the surface of the insulating film 255 opposite to the n-type GaAs substrate 241. The red laser element 240 is formed in this manner.

A method of bonding the blue-violet laser element 220 and the red laser element 240 to each other is now described with reference to FIG. 105.

Figure 105:
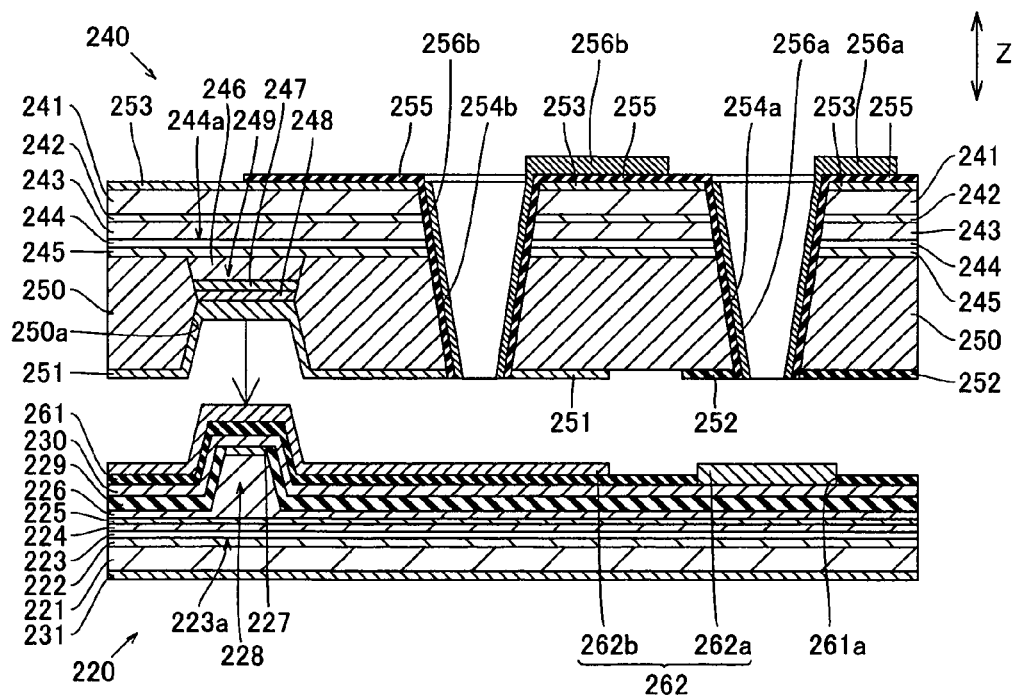

As shown in FIG. 105, the registrational recess portion constituted of the opening 250a of the n-type current blocking layer 250 of the red laser element 240 is directed downward and receives the registrational projecting portion constituted of the ridge portion 228 of the blue-violet laser element 220, to be registered therewith. When the registrational recess portion constituted of the opening 250a of the n-type current blocking layer 250 of the red laser element 240 receives the registrational projecting portion constituted of the ridge portion 228, the solder layer 262 of Au—Sn is melted by heat treatment under a temperature condition of about 280° C. Thereafter the solder layer 262 is solidified by a step of cooling the same to the room temperature, thereby bonding the blue-violet laser element 220 and the red laser element 240 to each other. The solder layer 262a in contact with the p-side electrode 230 of the blue-violet laser element 220 is in contact with the extraction electrode 256a of the red laser element 240. On the other hand, the solder layer 262b is in contact with the p-side electrode 251 and the extraction electrode 256b of the red laser element 240.

At this time, the blue-violet laser element 220 and the red laser element 240 can be inhibited from horizontal misregistration in the direction X shown in FIGS. 91 and 92 due to the fitting between the registrational projecting portion constituted of the ridge portion 228 and the registrational recess portion constituted of the opening 250a of the n-type current blocking layer 250. Thus, cleavage directions of the blue-violet laser element 220 and the red laser element 240 can be inhibited from deviating from each other.

Thereafter the light emission planes 232 (see FIG. 91) are formed by simultaneously cleaving the blue-violet laser element 220 and the red laser element 240 bonded to each other followed by separation into each integrated semiconductor laser device, and the n-side electrode 231 of the blue-violet laser element 220 is bonded to the submount (not shown). Finally, the wires (gold wires) 263a and 263b are bonded to the surfaces of the extraction electrodes 256a and 256b opposite to the blue-violet laser element 220 respectively, as shown in FIGS. 91 and 92. Further, the first and second ends of the wire (gold wire) 263c are bonded to the exposed region of the surface of the n-side electrode 253 opposite to the blue-violet laser element 220, and the conductive submount (not shown). The integrated semiconductor laser device according to the seventh embodiment is formed in this manner.

Eighth Embodiment

Figure 106:
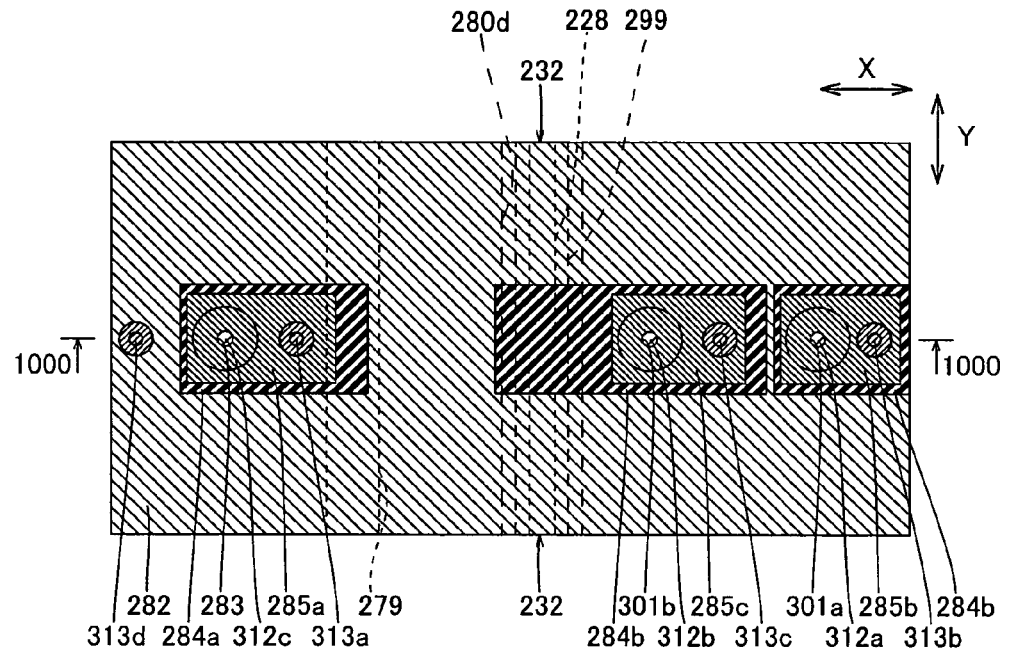
FIG. 106 is a plan view showing the structure of an integrated semiconductor laser device according to an eighth embodiment of the present invention.
Figure 107:
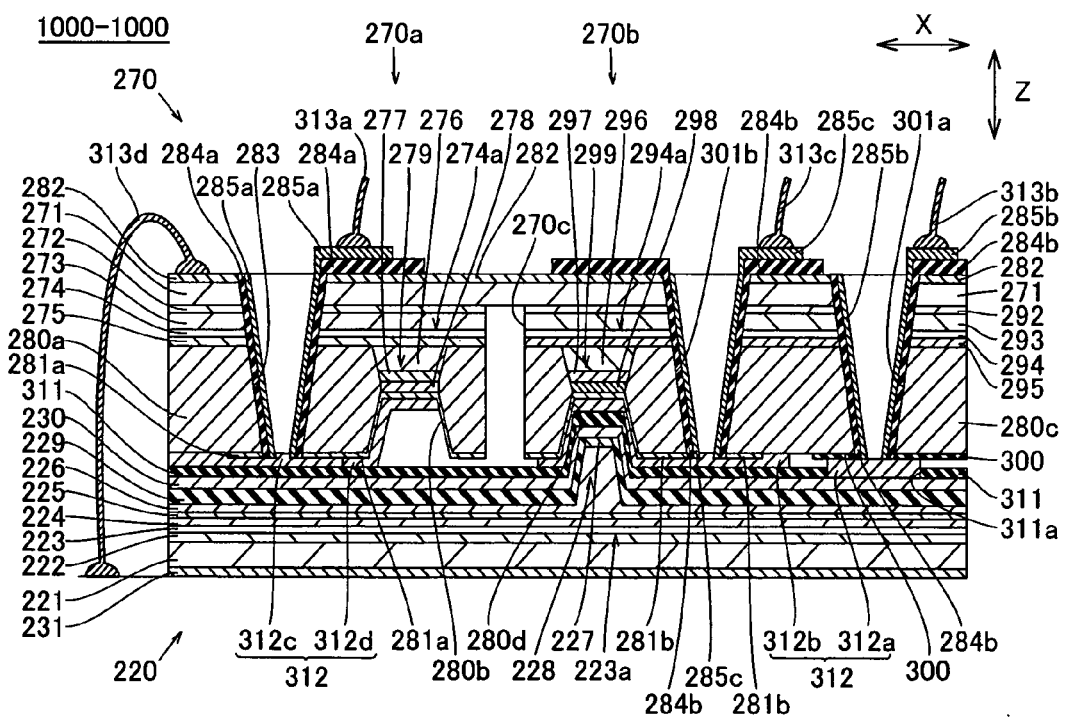
FIG. 107 is a sectional view taken along the line 1000-1000 in FIG. 106.

Referring to FIGS. 106 and 107, an insulating film is arranged between a blue-violet laser element 220 and a monolithic laser element 270 in an integrated semiconductor laser device according to an eighth embodiment of the present invention, dissimilarly to the aforementioned seventh embodiment.

In the integrated semiconductor laser device according to the eighth embodiment, the blue-violet laser element 220 having a registrational projecting portion and the monolithic laser element 270 having a registrational recess portion are stacked (integrated) with each other in a direction Z, as shown in FIG. 107. The blue-violet laser element 220 is similar in structure to the blue-violet laser element 220 according to the aforementioned seventh embodiment. The monolithic laser element 270 is an example of the "second semiconductor laser element" in the present invention.

The monolithic laser element 270 according to the eighth embodiment has a red laser region 270a formed with a red laser element layer and an infrared laser region 270b formed with an infrared laser element layer. The red laser region 270a and the infrared laser region 270b are isolated from each other through an isolation trench 270c. The monolithic laser element 270 shown in FIG. 107 has downwardly directed ridge portions 279 and 299.

More specifically, an n-type buffer layer 272 of n-type GaInP having a thickness of about 300 nm is formed on a prescribed region of the surface of an n-type GaAs substrate 271 closer to the blue-violet laser element 220 in the red laser region 270a. An n-type cladding layer 273 of n-type AlGaInP having a thickness of about 2 µm is formed on the surface of the n-type buffer layer 272 closer to the blue-violet laser element 220. An active layer 274 having a thickness of about 60 nm is formed on the surface of the n-type cladding layer 273 closer to the blue-violet laser element 220. This active layer 274 has an MQW structure obtained by alternately stacking a plurality of well layers (not shown) of undoped GaInP and a plurality of barrier layers (not shown) of undoped AlGaInP with each other.

A p-type first cladding layer 275 of p-type AlGaInP having a thickness of about 300 nm is formed on the surface of the active layer 274 closer to the blue-violet laser element 220. A projecting p-type second cladding layer 276 of p-type AlGaInP having a thickness of about 1.2 µm is formed on a prescribed region of the surface of the p-type first cladding layer 275 closer to the blue-violet laser element 220. A p-type intermediate layer 277 of p-type GaInP having a thickness of about 100 nm is formed on the surface of the p-type second cladding layer 276 closer to the blue-violet laser element 220. A p-type contact layer 278 of p-type GaAs having a thickness of about 300 nm is formed on the surface of the p-type intermediate layer 277 closer to the blue-violet laser element 220. The p-type contact layer 278, the p-type intermediate layer 277 and the p-type second cladding layer 276 constitute the ridge portion 279. This ridge portion 279 is similar in shape to the ridge portion 249 according to the aforementioned seventh embodiment. A portion of the active layer 274 corresponding to the position formed with the ridge portion 279 and a peripheral portion of this portion of the active layer 274 form an emission region 274a emitting a red laser beam. The emission region 274a is an example of the "third emission region" in the present invention.

An n-type current blocking layer 280a having a thickness (about 2 µm) larger than the height (about 1.6 µm) of the ridge portion 279 is formed on the surface of the p-type first cladding layer 275 closer to the blue-violet laser element 220, to cover the side surfaces of the ridge portion 279. This n-type current blocking layer 280a has an opening 280b exposing the surface of the ridge portion 279 closer to the blue-violet laser element 220. The opening 280b of the n-type current blocking layer 280a is similar in shape to the opening 250a of the n-type current blocking layer 250 according to the aforementioned seventh embodiment. The n-type current blocking layer 280a is formed by an n-type AlInP layer (not shown) and an n-type GaAs layer (not shown) successively from the side closer to the n-type GaAs substrate 271.

A p-side electrode 281a having a thickness of about 0.3 µm is formed on the surface of the ridge portion 279 (p-type contact layer 278) closer to the blue-violet laser element 220, to extend toward a prescribed region of the surface of the n-type current blocking layer 280a closer to the blue-violet laser element 220 through the opening 280b. This p-side electrode 281a is formed by an AuZn layer (not shown), a Pt layer (not shown) and an Au layer (not shown) successively from the side closer to the n-type GaAs substrate 271. The p-side electrode 281a is an example of the "third electrode" in the present invention. An n-side electrode 282 common to the red laser region 270a and the infrared laser region 270b is formed on the surface of the n-type GaAs substrate 271 opposite to the blue-violet laser element 220. This n-side electrode 282, having a thickness of about 1 µm, is formed by an AuGe layer (not shown), an Ni layer (not shown) and an Au layer (not shown) successively from the side closer to the n-type GaAs substrate 271.

According to the eighth embodiment, a circular contact hole 283 is formed through the red laser region 270a to pass through the n-side electrode 282, the n-type GaAs substrate 271, the semiconductor layers 272 to 275 and 280a and the p-side electrode 281a from the surface of the n-side electrode 282 opposite to the blue-violet laser element 220. This contact hole 283 has a tapered inner side surface so that the diameter of a portion closer to the p-side electrode 281a is smaller than the diameter of several 10 µm of a portion closer to the n-side electrode 282. The contact hole 283 is an example of the "first contact hole" in the present invention. An insulating film 284a of $SiO_2$ having a thickness of about 200 nm is formed on the inner side surface of the contact hole 283, to extend along the surface of the n-side electrode 282 opposite to the blue-violet laser element 220. An end of this insulating film 284a is arranged to partially expose the surface of the n-side electrode 282, as shown in FIG. 106.

According to the eighth embodiment, an extraction electrode 285a having a thickness of about 0.3 µm is formed on a portion of the insulating film 284a located in the contact hole 283 to extend toward a prescribed region of the surface of the insulating film 284a opposite to the blue-violet laser element 220, as shown in FIG. 107. This extraction electrode 285a is formed by a Ti layer (not shown), a Pt layer (not shown) and an Au layer (not shown) successively from the side closer to the n-type GaAs substrate 271. The extraction electrode 285a is an example of the "third extraction electrode" in the present invention.

On the infrared laser region 270b, an n-type buffer layer 292 of n-type GaAs having a thickness of about 300 nm is formed on a prescribed region of the surface of the n-type GaAs substrate 271 closer to the blue-violet laser element 220. An n-type cladding layer 293 of n-type AlGaAs having a thickness of about 2 µm is formed on the surface of the n-type buffer layer 292 closer to the blue-violet laser element 220.

An active layer 294 having a thickness of about 70 nm is formed on the surface of the n-type cladding layer 293 closer to the blue-violet laser element 220. This active layer 294 has an MQW structure obtained by alternately stacking a plurality of well layers (not shown) of undoped AlGaAs and a plurality of barrier layers (not shown) of undoped AlGaAs with each other.

A p-type first cladding layer 295 of p-type AlGaAs having a thickness of about 300 nm is formed on the surface of the active layer 294 closer to the blue-violet laser element 220. A projecting p-type second cladding layer 296 of p-type AlGaAs having a thickness of about 1.2 μm is formed on a prescribed region of the surface of the p-type first cladding layer 295 closer to the blue-violet laser element 220. A p-type cap layer 297 of p-type GaAs having a thickness of about 100 nm is formed on the surface of the p-type second cladding layer 296 closer to the blue-violet laser element 220. A p-type contact layer 298 of p-type GaAs having a thickness of about 300 nm is formed on the surface of the p-type cap layer 297 closer to the blue-violet laser element 220. The p-type contact layer 298, the p-type cap layer 297 and the p-type second cladding layer 296 constitute the ridge portion 299.

The ridge portion 299 has tapered side surfaces so that the width thereof is reduced from the base toward the tapered end. The side surfaces of the ridge portion 299 and the surface of the active layer 294 form an angle of about 60°. The tapered end of the ridge portion 299 has a width of about 2.7 μm. As shown in FIG. 106, the ridge portion 299 is in the form of a (slender) stripe extending in a direction Y perpendicular to the light emission planes (cleavage planes) 232. As shown in FIG. 107, a portion of the active layer 294 corresponding to the position formed with the ridge portion 299 and a peripheral portion of this portion of the active layer 294 form an emission region 294a emitting an infrared laser beam. The ridge portion 299 is an example of the "second ridge portion" in the present invention. The emission region 294a is an example of the "second emission region" in the present invention.

According to the eighth embodiment, an n-type current blocking layer 280c having a thickness (about 2 μm) larger than the height (about 1.6 μm) of the ridge portion 299 is formed on the surface of the p-type first cladding layer 295 closer to the blue-violet laser element 220, to cover the side surfaces of the ridge portion 299. The n-type current blocking layer 280c has an opening 280d exposing the surface of the ridge portion 299 closer to the blue-violet laser element 220. The opening 280d of the n-type current blocking layer 280c has tapered inner side surfaces so that the width of the bottom (the width (about 2.7 μm) of the tapered end of the ridge portion 299) is smaller than the width (about 3 μm) of the open end. The inner side surfaces of the opening 280d of the n-type current blocking layer 280c and the surface of the active layer 294 form an angle of about 70°. As shown in FIG. 106, the opening 280d of the n-type current blocking layer 280c is in the form of a (slender) stripe extending in the direction Y along the ridge portion 299. The n-type current blocking layer 280c is formed by the same layer as the n-type current blocking layer 280a of the red laser region 270a. The opening 280d of the n-type current blocking layer 280c forms a registrational recess portion. The n-type current blocking layer 280c is an example of the "current blocking layer" in the present invention, and the opening 280d is an example of the "recess portion" in the present invention.

A p-side electrode 281b is formed on the surface of the ridge portion 299 (p-type contact layer 298) closer to the blue-violet laser element 220, to extend toward a prescribed region of the surface of the n-type current blocking layer 280c closer to the blue-violet laser element 220 through the opening 280d. This p-side electrode 281b is formed by the same layer as the p-side electrode 281a of the red laser region 270a. The p-side electrode 281b is an example of the "second electrode" in the present invention. Thus, the registrational recess portion constituted of the opening 280d of the n-type current blocking layer 280c has a depth of about 400 nm between a portion of the surface of the p-side electrode 281b closer to the blue-violet laser element 220 located on a region other than that corresponding to the ridge portion 299 and another portion of the surface of the p-side electrode 281b closer to the blue-violet laser element 220 located on the region corresponding to the ridge portion 299. In other words, the depth (about 400 nm) of the registrational recess portion constituted of the opening 280d of the n-type current blocking layer 280c is larger than the projection height (about 153 nm) of the registrational projecting portion constituted of the ridge portion 299.

An insulating film 300 of SiO$_2$ having a thickness of about 200 nm is formed on a prescribed region, not covered with the p-side electrode 281b but exposed, of the surface of the n-type current blocking layer 280c closer to the blue-violet laser element 220.

According to the eighth embodiment, a circular contact hole 301a is formed through the infrared laser region 270b to pass through the n-side electrode 282, the n-type GaAs substrate 271, the semiconductor layers 292 to 295 and 280c and the insulating film 300 from the surface of the n-side electrode 282 opposite to the blue-violet laser element 220. Another circular contact hole 301b is formed to pass through the n-side electrode 282, the n-type GaAs substrate 271, the semiconductor layers 292 to 295 and 280c and the p-side electrode 281b from the surface of the n-side electrode 282 opposite to the blue-violet laser element 220 at a prescribed interval from the contact hole 301a. Each of the contact holes 301a and 301b has a tapered inner side surface so that the diameter of a portion closer to the p-side electrode 281b is smaller than the diameter of several 10 μm of a portion closer to the n-side electrode 282. The contact holes 301a and 301b are examples of the "first contact hole" and the "second contact hole" in the present invention respectively. An insulating film 284b is formed on the inner side surfaces of the contact holes 301a and 301b, to extend along the surface of the n-side electrode 282 opposite to the blue-violet laser element 220. This insulating film 284b is formed by the same layer as the insulating film 284a of the red laser region 270a. An end of the insulating film 284b is arranged to partially expose the surface of the n-side electrode 282, as shown in FIG. 106.

According to the eighth embodiment, an extraction electrode 285b is formed on a portion of the insulating film 284b located in the contact hole 301a to extend toward a prescribed region of the surface of the insulating film 284b opposite to the blue-violet laser element 220, as shown in FIG. 107. Another extraction electrode 285c is formed on another portion of the insulating film 284b located in the contact hole 301b, to extend toward another prescribed region of the surface of the insulating film 284b opposite to the blue-violet laser element 220. The extraction electrodes 285b and 285c are formed by the same layer as the extraction electrode 285a of the red laser region 270a. The extraction electrode 285b and 285c are examples of the "first extraction electrode" and the "second extraction electrode" in the present invention respectively.

A bonded state of the blue-violet laser element 220 and the monolithic laser element 270 according to the eighth embodiment is now described. According to the eighth embodiment, an insulating film 311 of SiO$_2$ having a thickness of about 200 nm is formed on the p-side electrode 230 of the blue-violet laser element 220. This insulating film 311 has an opening 311a, which is arranged on a region facing the contact hole 301a of the monolithic laser element 270 (red laser region 270b). In other words, the region of the p-side electrode 230 of the blue-violet laser element 220 facing the contact hole 301a is not covered with the insulating film 311 but exposed.

According to the eighth embodiment, the blue-violet laser element 220 and the monolithic laser element 270 are integrated (stacked) with each other in the direction Z while the insulating film 311 is formed on the surface of the blue-violet laser element 220 and the registrational projecting portion constituted of the ridge portion 228 is fitted into the registrational recess portion constituted of the opening 280d of the n-type current blocking layer 280c. Further, the emission regions 223a and 294a of the blue-violet laser element 220 and the infrared laser region 270b are aligned with each other in the direction Z of stacking of the semiconductor layers. The depth (about 400 nm) of the registrational recess portion of the monolithic laser element 270 is larger than the projection height (about 153 nm) of the registrational projecting portion of the blue-violet laser element 220 as hereinabove described, whereby the interval between the upper surface of the registrational projecting portion of the blue-violet laser element 220 and the bottom of the registrational recess portion of the monolithic laser element 270 is larger than the interval between the remaining regions of the blue-violet laser element 220 and the monolithic laser element 270 other than the registrational projecting portion and the registrational recess portion.

The blue-violet laser element 220 and the monolithic laser element 270 are bonded to each other through a solder layer 312 of Au—Sn. This solder layer 312 includes solder layers 312a and 312b located on the infrared laser region 270b and solder layers 312c and 312d located on the red laser region 270a. On the infrared laser region 270b, the solder layer 312a is arranged in the opening 311a, and in contact with the p-side electrode 230 and the extraction electrode 285b of the blue-violet laser element 220. Thus, the p-side electrode 230 and the extraction electrode 285b of the blue-violet laser element 220 are electrically connected with each other through the solder layer 312a. On the infrared laser region 270b, further, the solder layer 312b is arranged at a prescribed interval from the solder layer 312a, and in contact with the p-side electrode 281b and the extraction electrode 285c of the infrared laser region 270b. Thus, the p-side electrode 281b and the extraction electrode 285c of the infrared laser region 270b are electrically connected with each other through the solder layer 312b. On the red laser region 270a, on the other hand, the solder layers 312c and 312d are fused to each other, and in contact with the p-side electrode 281a and the extraction electrode 285a of the red laser region 270a. Thus, the p-side electrode 281a and the extraction electrode 285a of the red laser region 270a are electrically connected with each other through the solder layers 312c and 312d.

Wires (gold wires) 313a, 313b and 313c are bonded to the surfaces of the extraction electrodes 285a, 285b and 285c opposite to the blue-violet laser element 220 respectively. A first end of a further wire (gold wire) 313d is bonded to the exposed region of the surface of the n-side electrode 282 opposite to the blue-violet laser element 220. A second end of the wire 313c is bonded to a conductive submount (not shown) bonded to the n-side electrode 231 of the blue-violet laser element 220.

According to the eighth embodiment, as hereinabove described, the registrational projecting portion constituted of the ridge portion 228 of the blue-violet laser element 220 is fitted into the registrational recess portion constituted of the opening 280d of the n-type current blocking layer 280c of the monolithic laser element 270, whereby the blue-violet laser element 220 and the monolithic laser element 270 bonded to each other can be inhibited from horizontal misregistration (in the direction X shown in FIG. 107) due to the fitting between the registrational projecting portion and the registrational recess portion. Thus, the optical axes of beams emitted from the blue-violet laser element 220 and the monolithic laser element 270 respectively can be inhibited from horizontal deviation (in the direction X shown in FIG. 107), whereby the optical axis of a beam emitted from the integrated semiconductor laser device can be easily adjusted when the beam is introduced into an optical system formed by a lens and a mirror. Thus, the cost for optical axis adjustment can be reduced. Further, the blue-violet laser element 220 and the monolithic laser element 270 bonded to each other can be so inhibited from horizontal misregistration (in the direction X shown in FIG. 107) that cleavage directions of the blue-violet laser element 220 and the monolithic laser element 270 can be inhibited from deviating from each other. Thus, cleavability for simultaneously cleaving the blue-violet laser element 220 and the monolithic laser element 270 bonded to each other can be improved. Consequently, the properties of laser beams emitted from the light emission planes (cleavage planes) 232 can be improved.

According to the eighth embodiment, further, the emission regions 223a and 294a of the blue-violet laser element 220 and the infrared laser region 270b are aligned with each other in the direction (direction Z shown in FIG. 107) of stacking of the semiconductor layers, so that the interval between the emission regions 223a and 294a of the blue-violet laser element 220 and the infrared laser region 270b can be reduced as compared with a case where the emission regions 223a and 294a of the blue-violet laser element 220 and the infrared laser region 270b positionally deviate from each other in two directions, i.e., the direction (direction Z shown in FIG. 107) of stacking of the semiconductor layers and the horizontal direction (direction X shown in FIG. 107). Thus, the beam emitted from either the emission region 294a of the infrared laser region 270b or the emission region 223a of the blue-violet laser element 220 can be inhibited from being incident on a region remarkably deviating from a prescribed region of the optical system when the beam emitted from the integrated semiconductor laser device is introduced into the optical system, if the optical axis is so adjusted as to introduce the beam emitted from either the emission region 223a of the blue-violet laser element 220 or the emission region 294a of the infrared laser region 270b into the prescribed region of the optical system. Consequently, the optical axis of the beam emitted from the integrated semiconductor laser device can be more easily adjusted with respect to the optical system, whereby the cost for optical axis adjustment can be further reduced.

According to the eighth embodiment, the insulating film 311 is formed between the p-side electrode 230 of the blue-violet laser element 220 and the p-side electrodes 281a and 281b of the monolithic laser element 270, so that the p-side electrode 230 of the blue-violet laser element 220 and the p-side electrodes 281a and 281b of the monolithic laser element 270 can be electrically insulated from each other through the insulating film 311 also when the blue-violet laser element 220 and the monolithic laser element 270 are so stacked (integrated) with each other as to oppose the p-side electrode 230 of the blue-violet laser element 220 and the p-side electrodes 281a and 281b of the monolithic laser element 270 to each other. Thus, different voltages can be applied to the p-side electrode 230 of the blue-violet laser element 220 and the p-side electrodes 281*a* and 281*b* of the monolithic laser element 270 respectively, whereby the flexibility can be improved in relation to methods of supplying electric power to the emission region 223*a* of the blue-violet laser element 220 and the emission regions 274*a* and 294*a* of the monolithic laser element 270 respectively. Consequently, the integrated semiconductor laser device can be used in diverse manners.

According to the eighth embodiment, the contact holes 301*a*, 283 and 301*b* corresponding to the p-side electrodes 230, 281*a* and 281*b* of the blue-violet laser element 220 and the red and infrared laser regions 270*a* and 270*b* of the monolithic laser element 270 respectively are formed in the monolithic laser element 270, so that different voltages can be easily applied to the p-side electrodes 230, 281*a* and 281*b* of the blue-violet laser element 220 and the red and infrared laser regions 270*a* and 270*b* of the monolithic laser element 270 through the corresponding contact holes 301*a*, 283 and 301*b* respectively.

The remaining effects of the eighth embodiment are similar to those of the aforementioned seventh embodiment.

A fabrication process for the integrated semiconductor laser device according to the eighth embodiment is now described with reference to FIGS. 106 to 132.

Figure 108:
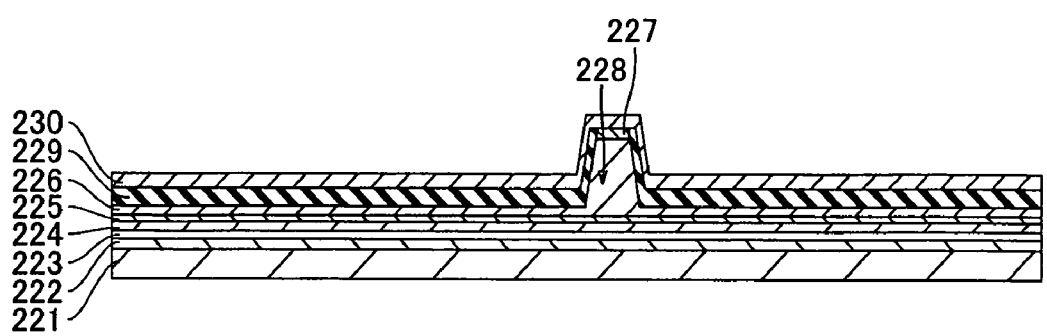
FIGS. 108 to 132 are sectional views for illustrating a fabrication process for the integrated semiconductor laser device according to the eighth embodiment shown in FIGS. 106 and 107.

First, the elements up to the p-side electrode 230 are formed through steps similar to those of the first embodiment shown in FIGS. 3 to 11, and the back surface of the n-type GaN substrate 221 is thereafter polished so that the thickness between the upper surface of the ridge portion 228 and the back surface of the n-type GaN substrate 221 is about 150 μm, as shown in FIG. 108.

Figure 109:
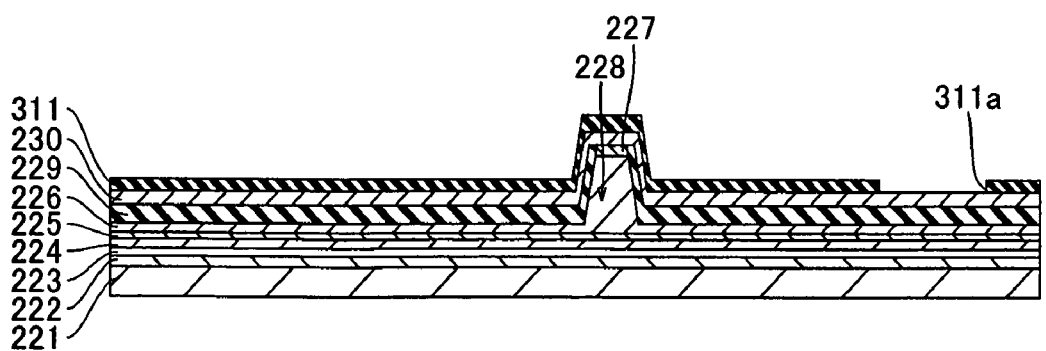

As shown in FIG. 109, the insulating film 311 of $SiO_2$ including the opening 311*a* and having the thickness of about 200 nm is formed on the p-side electrode 230 by plasma CVD. In order to form this insulating film 311, the opening 311*a* is arranged on a prescribed region other than that corresponding to the ridge portion 228.

Figure 110:
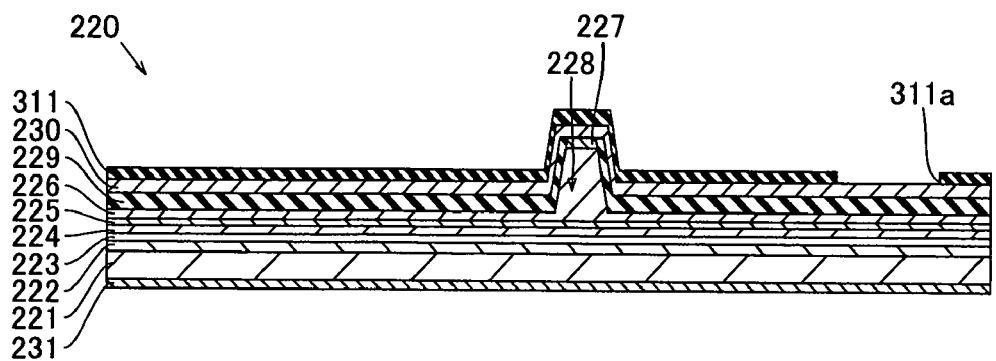

As shown in FIG. 110, the n-side electrode 231 is formed on the back surface of the n-type GaN substrate 221 by electron beam evaporation. Thus, the blue-violet laser element 220 is formed with the p-side electrode 230 whose surface is covered with the insulating film 311 having the opening 311*a*.

Figure 111:
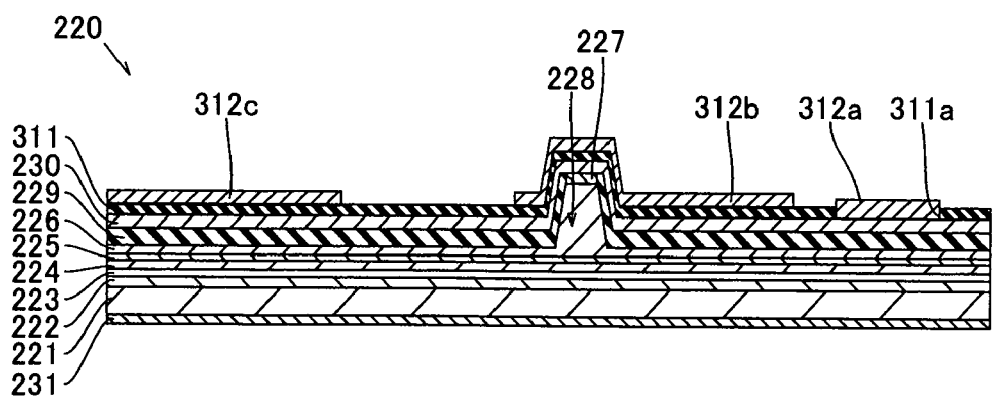

Thereafter the solder layers 312*a* to 312*c* of Au—Sn are formed as shown in FIG. 111. More specifically, the solder layer 312*a* is formed on the upper surface of the portion of the p-side electrode 230 located in the opening 311*a*. The solder layer 312*b* is formed at the prescribed interval from the solder layer 312*a*, to at least cover the region of the insulating film 311 on the ridge portion 228. The solder layer 312*c* is formed on a region opposite to the solder layer 312*a* through the ridge portion 228 at a prescribed interval from the solder layer 312*b*.

Figure 112:
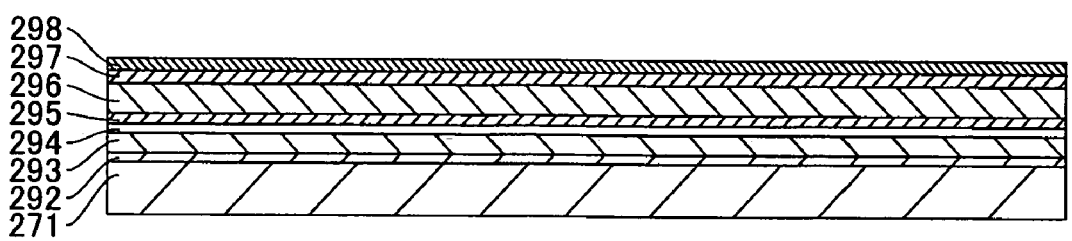

In order to form the monolithic laser element 270, the n-type buffer layer 292 of n-type GaAs having the thickness of about 300 nm and the n-type cladding layer 293 of n-type AlGaAs having the thickness of about 2 μm are successively grown on the n-type GaAs substrate 271 by MOCVD, as shown in FIG. 112. Thereafter the active layer 294 is grown on the n-type cladding layer 293. The active layer 294 is grown by alternately growing the plurality of well layers (not shown) of undoped AlGaAs and the plurality of barrier layers (not shown) of undoped AlGaAs. Thus, the active layer 294 is formed in the MQW structure obtained by alternately stacking the plurality of well layers (not shown) of undoped AlGaAs and the plurality of barrier layers (not shown) of undoped AlGaAs with each other.

Then, the p-type first cladding layer 295 of p-type AlGaAs having the thickness of about 300 nm and the p-type second cladding layer 296 of p-type AlGaAs having the thickness of about 1.2 μm are successively grown on the active layer 294. Thereafter the p-type cap layer 297 of p-type GaAs having the thickness of about 100 nm and the p-type contact layer 298 of p-type GaAs having the thickness of about 300 nm are successively grown on the p-type second cladding layer 296.

Figure 113:
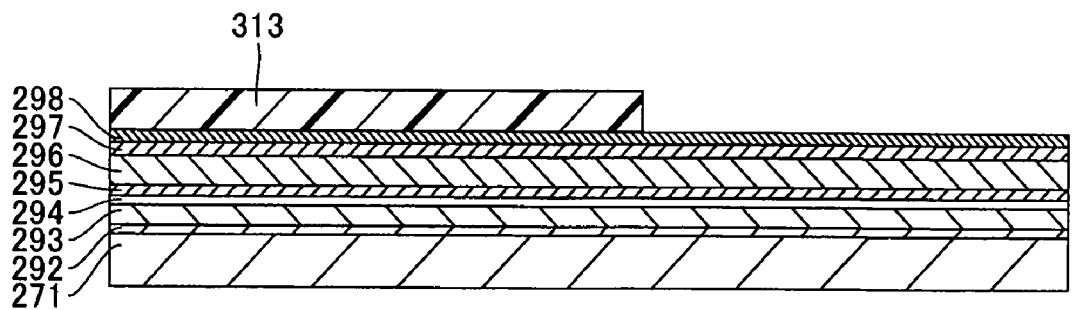

As shown in FIG. 113, a resist film 313 is formed on a prescribed region of the p-type contact layer 298.

Figure 114:
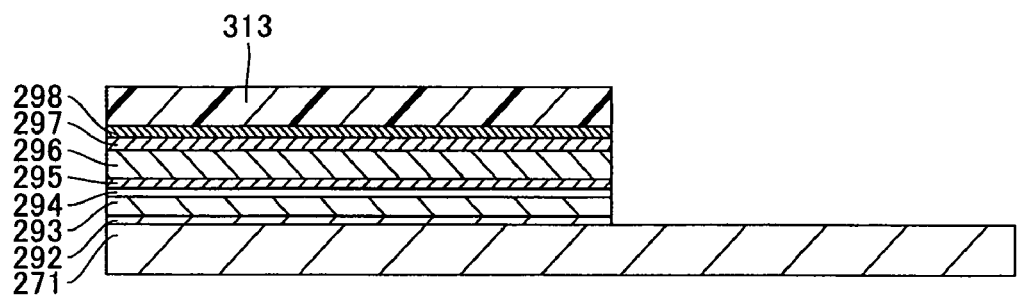

As shown in FIG. 114, the layers from the p-type contact layer 298 to the n-type buffer layer 292 are partially etched through a mask of the resist film 313 by wet etching with phosphoric acid and hydrogen peroxide water. Thereafter the resist film 313 is removed.

Figure 115:
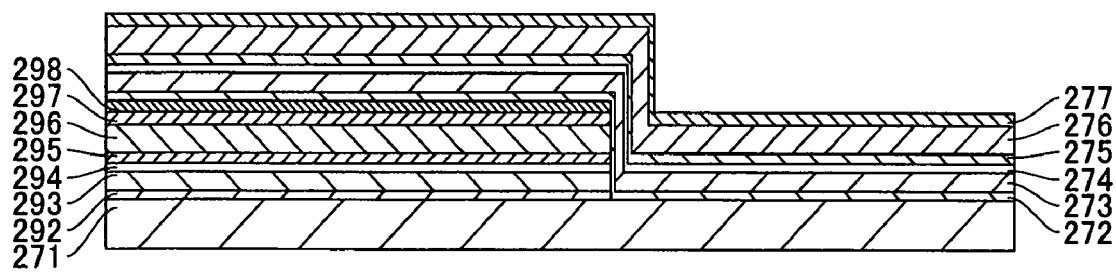

As shown in FIG. 115, the n-type buffer layer 272 of n-type GaInP having the thickness of about 300 nm and the n-type cladding layer 273 of n-type AlGaInP having the thickness of about 2 μm are successively grown on the overall surface by MOCVD. Thereafter the active layer 274 is grown on the n-type cladding layer 273. The active layer 274 is grown by alternately growing the plurality of well layers (not shown) of undoped GaInP and the plurality of barrier layers (not shown) of undoped AlGaInP. Thus, the active layer 274 is formed in the MQW structure obtained by alternately stacking the plurality of well layers (not shown) of undoped GaInP and the plurality of barrier layers (not shown) of undoped AlGaInP with each other.

Then, the p-type first cladding layer 275 of p-type AlGaInP having the thickness of about 300 nm and the p-type second cladding layer 276 of p-type AlGaInP having the thickness of about 1.2 μm are successively grown on the active layer 274. Thereafter the p-type intermediate layer 277 of p-type GaInP having the thickness of about 100 nm is grown on the p-type second cladding layer 276.

Figure 116:
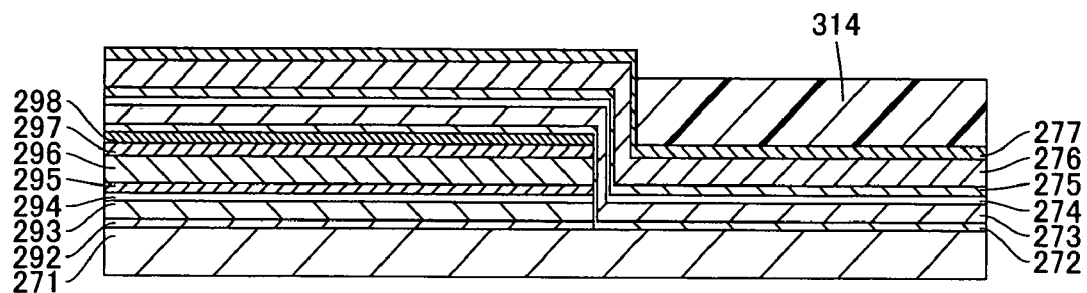

As shown in FIG. 116, a resist film 314 is formed on a prescribed region of the p-type intermediate layer 277 located on a region not provided with the semiconductor layers 292 to 298.

Figure 117:
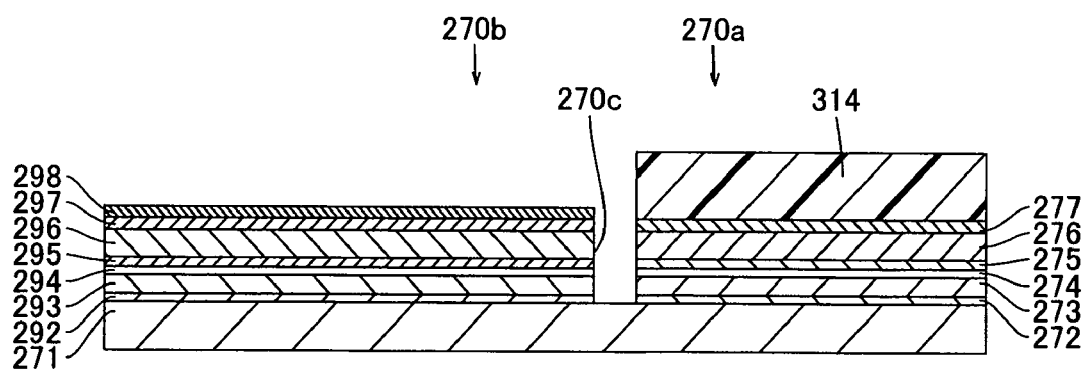

As shown in FIG. 117, the layers from the p-type intermediate layer 277 to the n-type buffer layer 272 are partially etched through a mask of the resist film 314 by wet etching with a mixed solution of hydrobromic acid, hydrochloric acid and water. Thus, the isolation trench 270*c* is formed for isolating the red laser region 270*a* and the infrared laser region 270*b* from each other. Thereafter the resist film 314 is removed.

Figure 118:
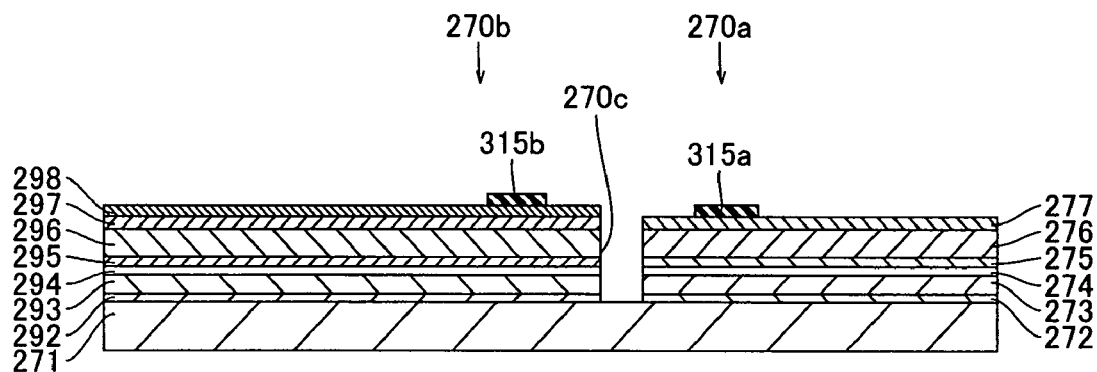

As shown in FIG. 118, an $SiO_2$ film 315*a* having a thickness of about 240 nm is formed on a prescribed region of the p-type intermediate layer 277 located on the red laser region 270*a* by plasma CVD. At the same time, another $SiO_2$ film 315*b* of the same layer as the $SiO_2$ film 315*a* is formed on a prescribed region of the p-type contact layer 298 located on the infrared laser region 270*b*.

Figure 119:
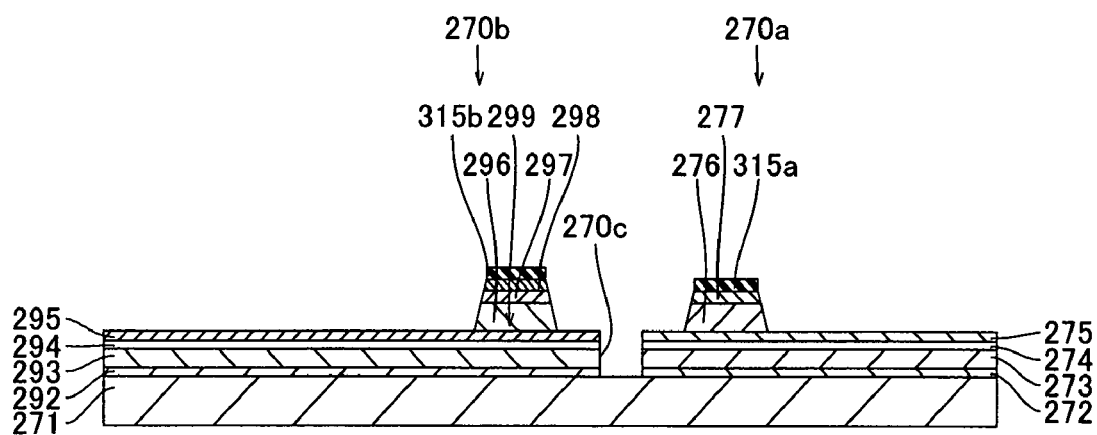

As shown in FIG. 119, the p-type intermediate layer 277 and the p-type second cladding layer 276 are etched on the red laser region 270*a* by wet etching with a mixed solution of hydrobromic acid, hydrochloric acid and water. Further, the p-type contact layer 298, the p-type cap layer 297 and the p-type second cladding layer 296 are etched on the infrared laser region 270*b* by wet etching with phosphoric acid and hydrogen peroxide water. Thus, the p-type contact layer 298, the p-type cap layer 297 and the p-type second cladding layer 296 constitute the ridge portion 299.

Figure 120:
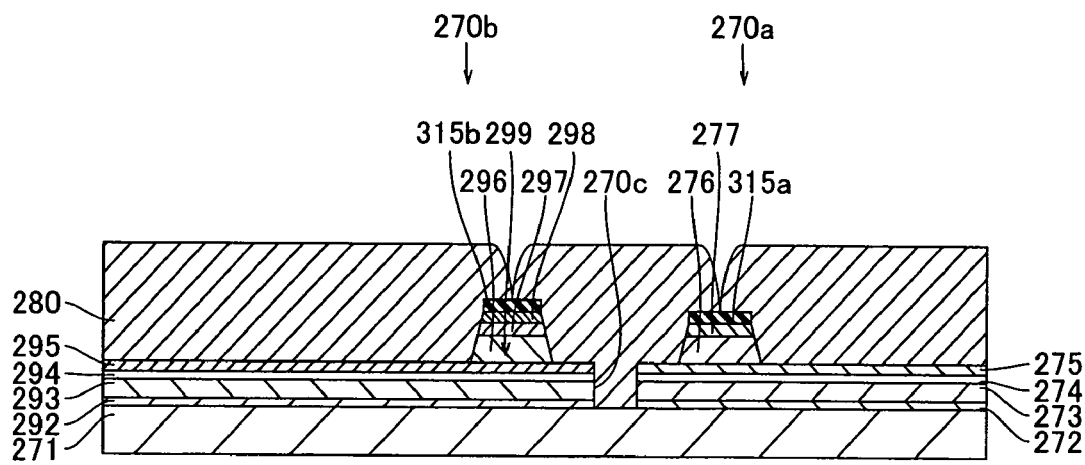

As shown in FIG. 120, a semiconductor layer 280 having a thickness of about 2 μm is grown on the overall surface through selective growth masks of the $SiO_2$ films 315*a* and 315b by MOCVD. Thus, the semiconductor layer 280 is selectively grown on the upper surfaces of the n-type GaAs substrate 271 and the p-type first cladding layers 275 and 295, and thereafter laterally grown to cover the SiO₂ films 315a and 315b. In order to grow this semiconductor layer 280, an n-type AlInP layer (not shown) and an n-type GaAs layer (not shown) are successively grown.

Figure 121:
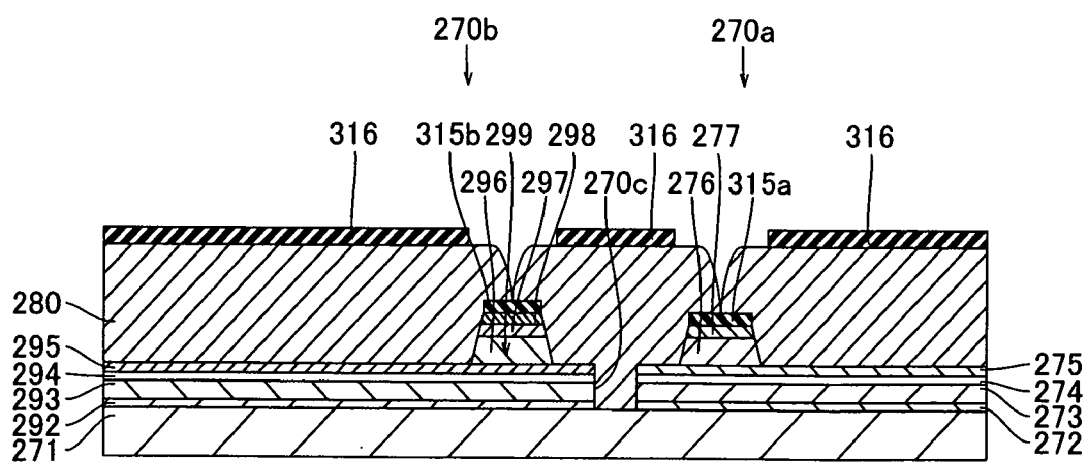

As shown in FIG. 121, still another SiO₂ film 316 having a thickness of about 240 nm is formed on a region of the semiconductor layer 280 other than those for forming the openings 280b and 280d (see FIG. 107) by plasma CVD.

Figure 122:
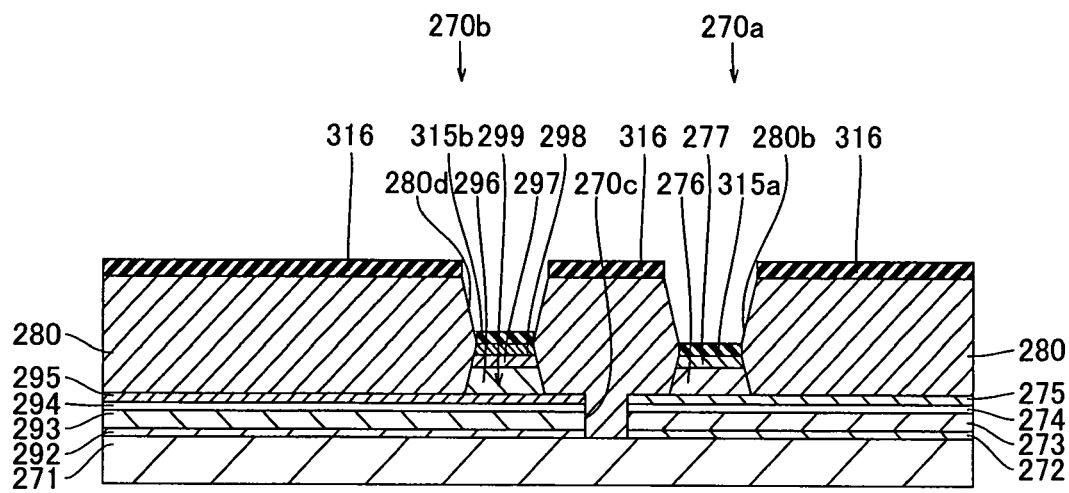

As shown in FIG. 122, portions of the semiconductor layer 280 located upward beyond the upper surfaces of the p-type intermediate layer 277 and the p-type contact layer 298 are etched through a mask of the SiO₂ film 316 by wet etching with a phosphoric acid etching solution. Thus, the openings 280b and 280d are formed on the red laser region 270a and the infrared laser region 270b of the semiconductor layer 280 respectively. Each of the openings 280b and 280d is formed to have the tapered inner side surfaces so that the width of the bottom is smaller than that of the open end. Thereafter the SiO₂ films 315a, 315b and 316 are removed.

Figure 123:
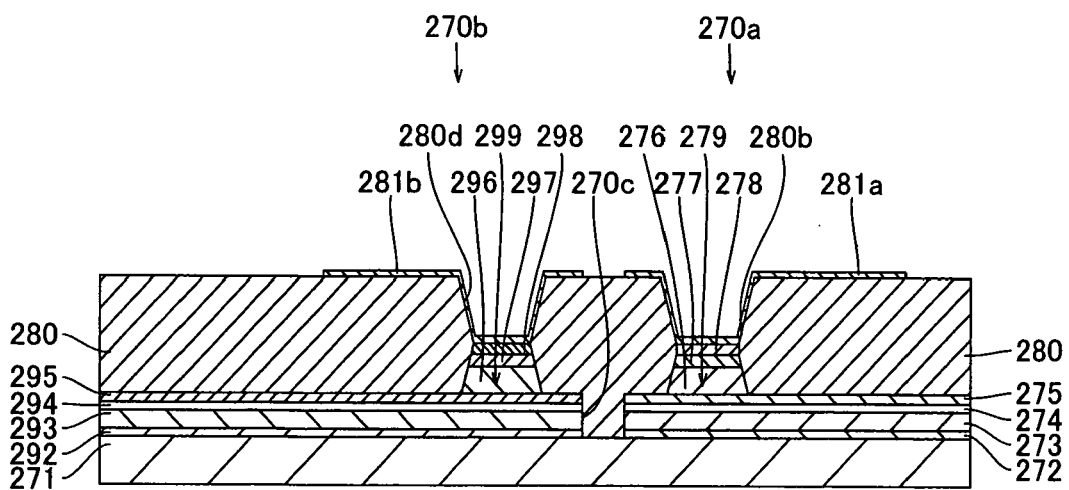

As shown in FIG. 123, the p-type contact layer 278 of p-type GaAs having the thickness of about 300 nm is grown on the p-type intermediate layer 277 by MOCVD on the red laser region 270a. Thus, the ridge portion 279 is constituted of the p-type contact layer 278, the p-type intermediate layer 277 and the p-type second cladding layer 276. Thereafter the p-side electrode 281a having the thickness of about 0.3 μm is formed on the ridge portion 279 (p-type contact layer 278) on the red laser region 270a by electron beam evaporation, to extend toward a prescribed region of the upper surface of the semiconductor layer 280 through the opening 280b. In order to form this p-side electrode 281a, the AuZn layer (not shown), the Pt layer (not shown) and the Au layer (not shown) are successively formed. At the same time, the p-side electrode 281b of the same layer as the p-side electrode 281a is also formed on the upper surface of the ridge portion 299 (p-type contact layer 298) on the infrared laser region 270b by electron beam evaporation, to extend toward another prescribed region of the upper surface of the semiconductor layer 280 through the opening 280d. First ends of the p-side electrodes 281a and 281b closer to the isolation trench 270c are arranged to expose a region of the semiconductor layer 280 corresponding to the isolation trench 270c. A second end of the p-side electrode 281a opposite to the isolation trench 270c is arranged to expose a prescribed region of the semiconductor layer 280 located on the red laser region 270a. Further, a second end of the p-side electrode 281b opposite to the isolation trench 270c is arranged to expose another prescribed region of the semiconductor layer 280 located on the infrared laser region 270b.

Figure 124:
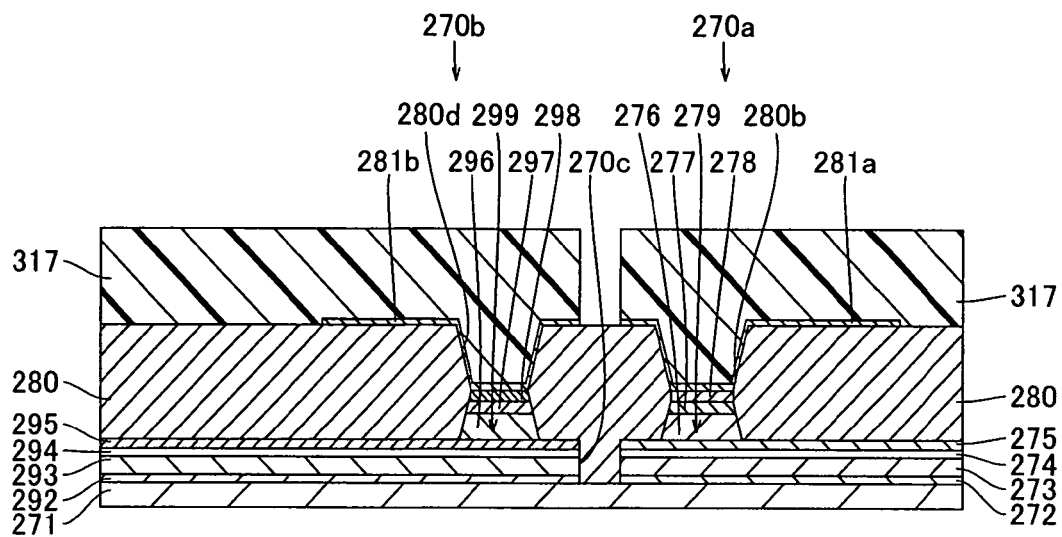
Figure 125:
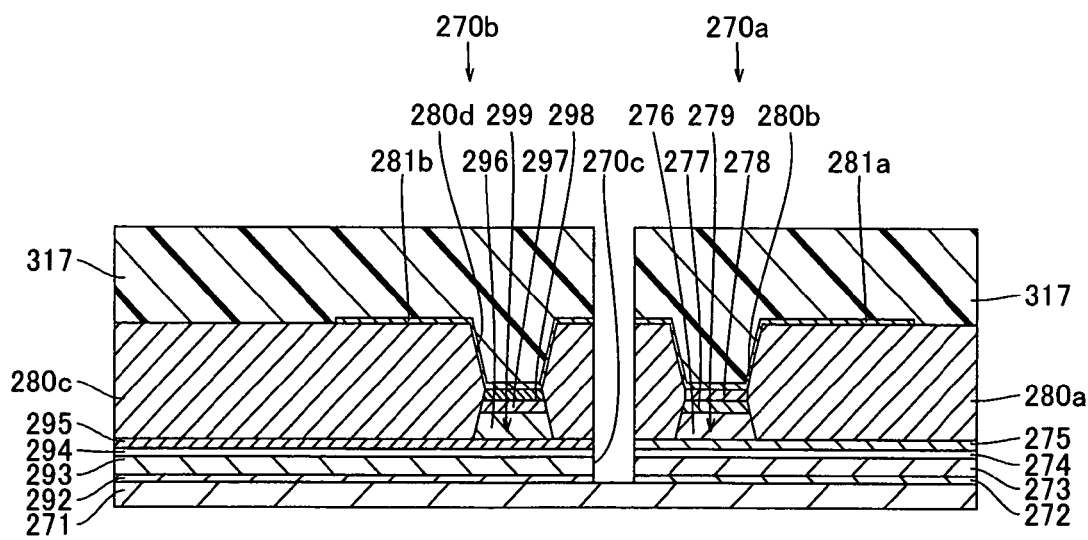

As shown in FIG. 124, the back surface of the n-type GaAs substrate 271 is polished so that the thickness between the upper surface of the ridge portion 299 and the back surface of the n-type GaAs substrate 271 is about 100 μm. Thereafter a resist film 317 is formed to cover the overall surface excluding the region of the semiconductor layer 280 corresponding to the isolation trench 270c. The semiconductor layer 280 is etched through a mask of the resist film 317 by wet etching. Thus, the semiconductor layer 280 (see FIG. 124) is isolated into the n-type current blocking layer 280a for the red laser region 270a and the n-type current blocking layer 280c for the infrared laser region 270b, as shown in FIG. 125. Thereafter the resist film 317 is removed.

Figure 126:
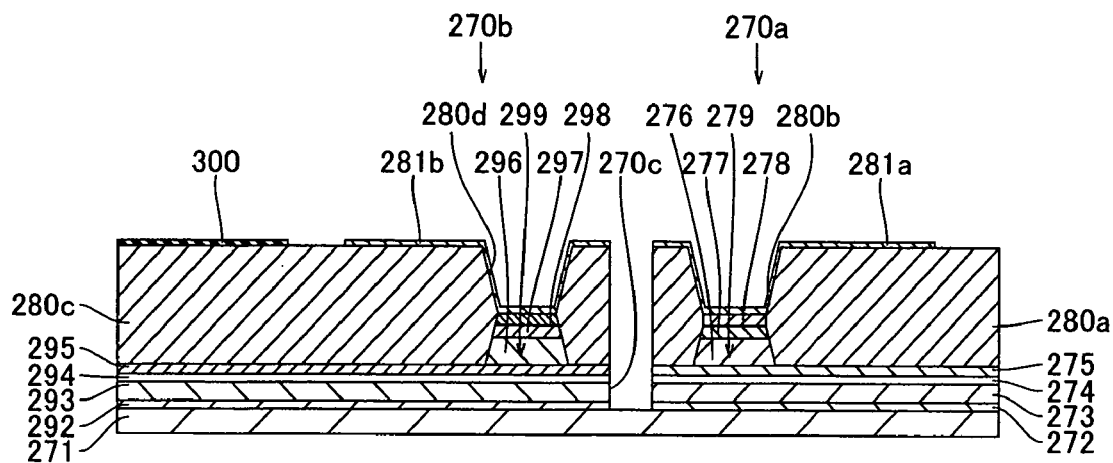

As shown in FIG. 126, the insulating film 300 of SiO₂ having the thickness of about 200 nm is formed on the prescribed region, not covered with the p-side electrode 281b but exposed, of the surface of the n-type current blocking layer 280c on the infrared laser region 270b by plasma CVD.

Figure 127:
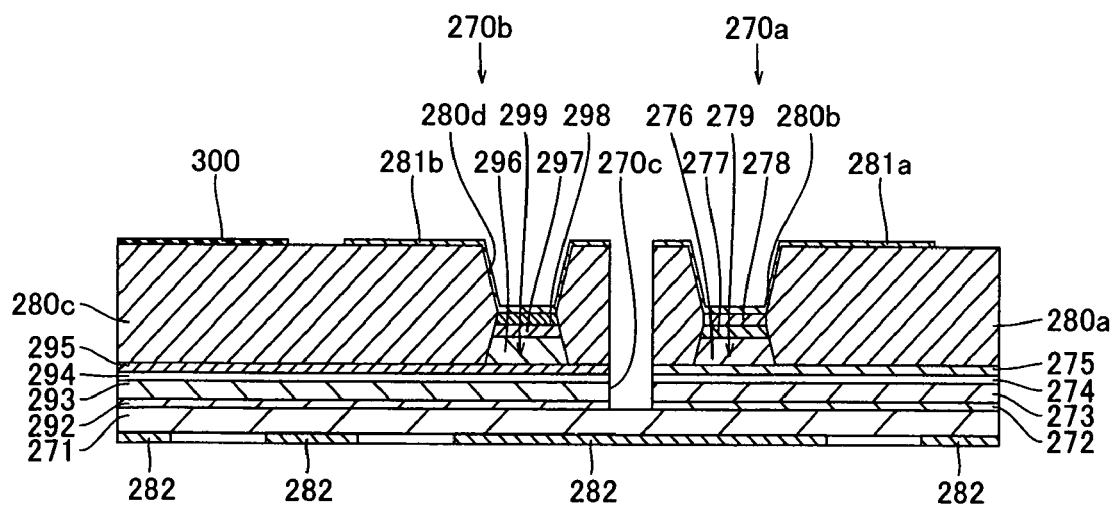

As shown in FIG. 127, the n-side electrode 282, also serving as an etching mask, having the thickness of about 1 μm is formed on the region of the back surface of the n-type GaAs substrate 271 other than those for forming the contact holes 283, 301a and 301b (see FIG. 107) by electron beam evaporation. In order to form this n-side electrode 282, the AuGe layer (not shown), the Ni layer (not shown) and the Au layer (not shown) are successively formed.

Figure 128:
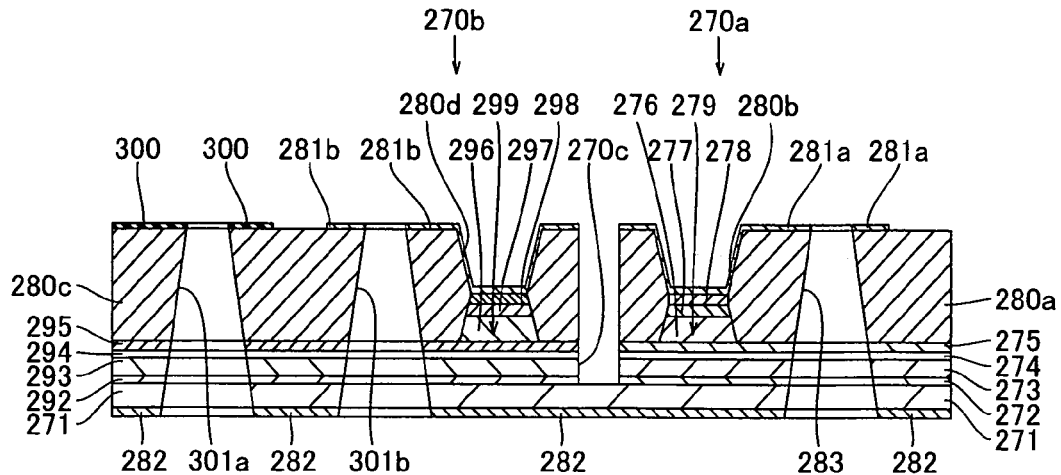

As shown in FIG. 128, the circular contact hole 283 is formed by partially removing the n-type GaAs substrate 271, the semiconductor layers 272 to 275 and 280a and the p-side electrode 281a from the back surface of the n-type GaAs substrate 271 through a mask of the n-side electrode 282 by RIE with chlorine gas through the red laser region 270a. At the same time, the contact holes 301a and 301b are formed through the infrared laser region 270b. In other words, the contact hole 301a is formed by partially removing the n-type GaAs substrate 271, the semiconductor layers 292 to 295 and 280c and the insulating film 300 from the back surface of the n-type GaAs substrate 271 through a mask of the n-side electrode 282 by RIE with chlorine gas. Further, the contact hole 301b is formed through the region separated from the contact hole 301a at the prescribed interval by partially removing the n-type GaAs substrate 271, the semiconductor layers 292 to 295 and 280c and the p-side electrode 281b from the back surface of the n-type GaAs substrate 271.

Figure 129:
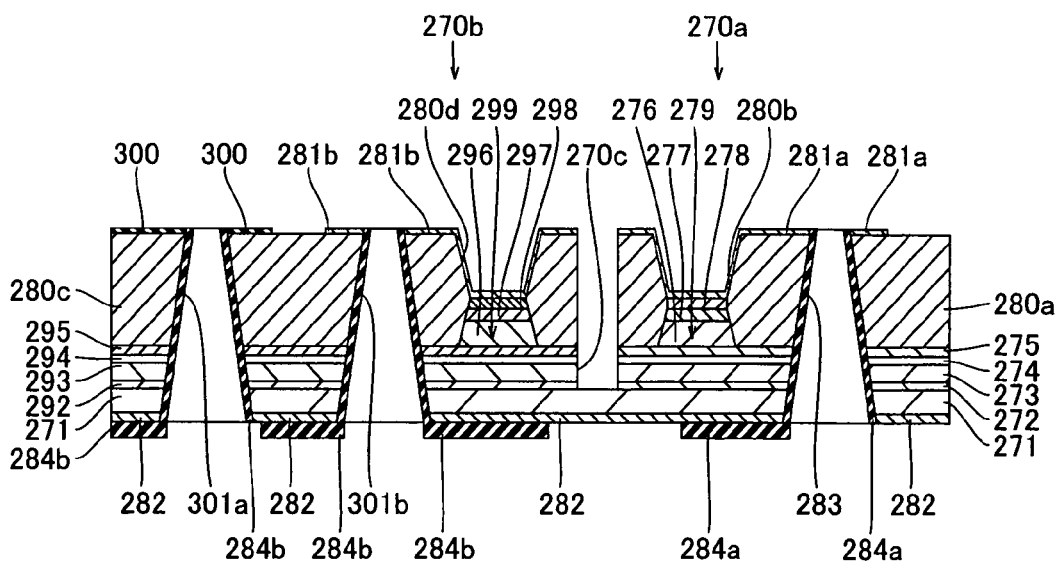

As shown in FIG. 129, the insulating film 284a of SiO₂ having the thickness of about 200 nm is formed on the inner side surface of the contact hole 283 on the red laser region 270a by plasma CVD, to extend along the surface of the n-side electrode 282 opposite to the blue-violet laser element 220. The end of this insulating film 284a is arranged to partially expose the surface of the n-side electrode 282 of the red laser region 270a, as shown in FIG. 106. At the same time, the insulating film 284b of the same layer as the insulating film 284a is formed on the inner side surfaces of the contact holes 301a and 301b on the infrared laser region 270b to extend along the surface of the n-side electrode 282 opposite to the n-type GaAs substrate 271, as shown in FIG. 129. The end of the insulating film 284b is arranged to partially expose the surface of the n-side electrode 282 of the infrared laser region 270b, as shown in FIG. 106

Figure 130:
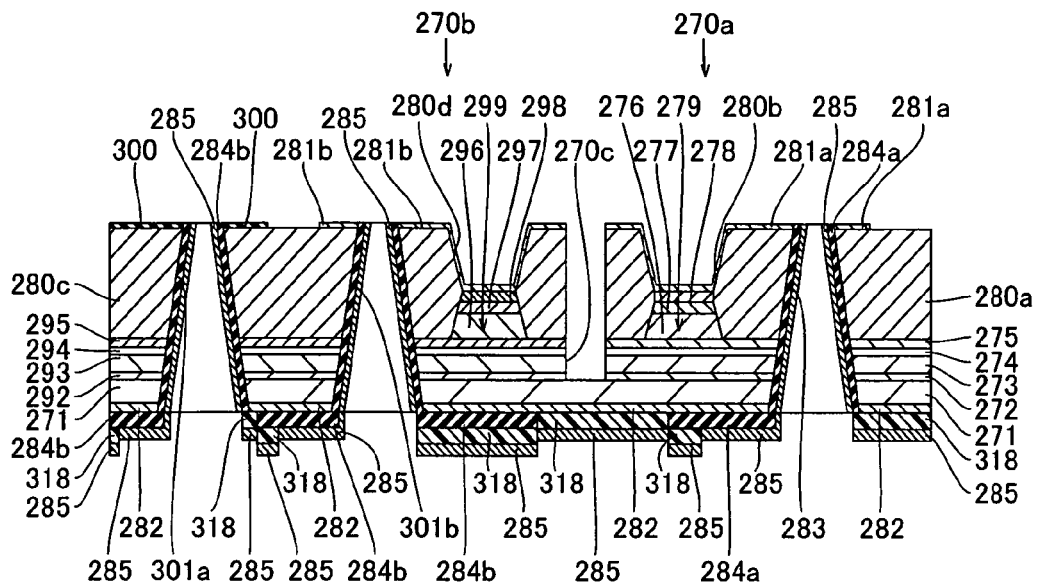

As shown in FIG. 130, a resist film 318 is formed on a region of the surface of the n-side electrode 282 opposite to the n-type GaAs substrate 271 other than those for forming the extraction electrodes 285a, 285b and 285c (see FIG. 107). A metallic layer 285 having a thickness of about 0.3 μm is formed by electron beam evaporation, to cover the inner side surfaces of the contact holes 283, 301a and 301b and the surfaces of the resist film 318 and the insulating films 284a and 284b opposite to the n-type GaAs substrate 271. In order to form this metallic layer 285, a Ti layer (not shown), a Pt layer (not shown) and an Au layer (not shown) are successively formed. Thereafter the resist film 318 is removed. At this time, a portion of the metallic layer 285 formed on the surface of the resist film 318 opposite to the n-type GaAs substrate 271 is also removed.

Figure 131:
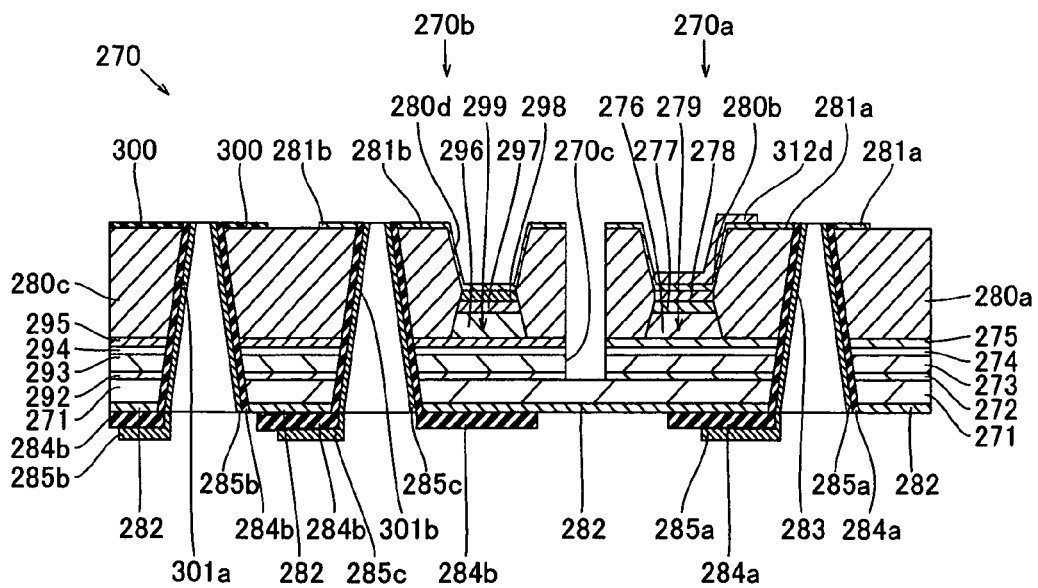

Thus, the extraction electrode 285a is formed on the portion of the insulating film 284a located in the contact hole 283 on the red laser region 270a to extend toward the prescribed region of the surface of the insulating film 284a opposite to the n-type GaAs substrate 271, as shown in FIG. 131. Further, the extraction electrode 285b of the same layer as the extraction electrode 285a is formed on the insulating film 284b located in the contact hole 301a on the infrared laser region 270b, to extend toward the prescribed region of the surface of the insulating film 284b opposite to the n-type GaAs substrate 271. In addition, the extraction electrode 285c of the same layer as the extraction electrode 285a is formed on the portion of the insulating film 284b located in the contact hole 301b, to extend toward the prescribed region of the surface of the insulating film 284b opposite to the n-type GaAs substrate 271. The monolithic laser element 270 is formed in this manner. Thereafter the solder layer 312d of Au—Sn is formed on the p-side electrode 281a located on the upper surface of the ridge portion 279 on the red laser region 270a, to extend toward the prescribed region of the p-side electrode 281 located on the upper surface of the n-type current blocking layer 280a.

A method of bonding the blue-violet laser element 220 and the monolithic laser element 270 to each other is now described with reference to FIG. 132.

Figure 132:
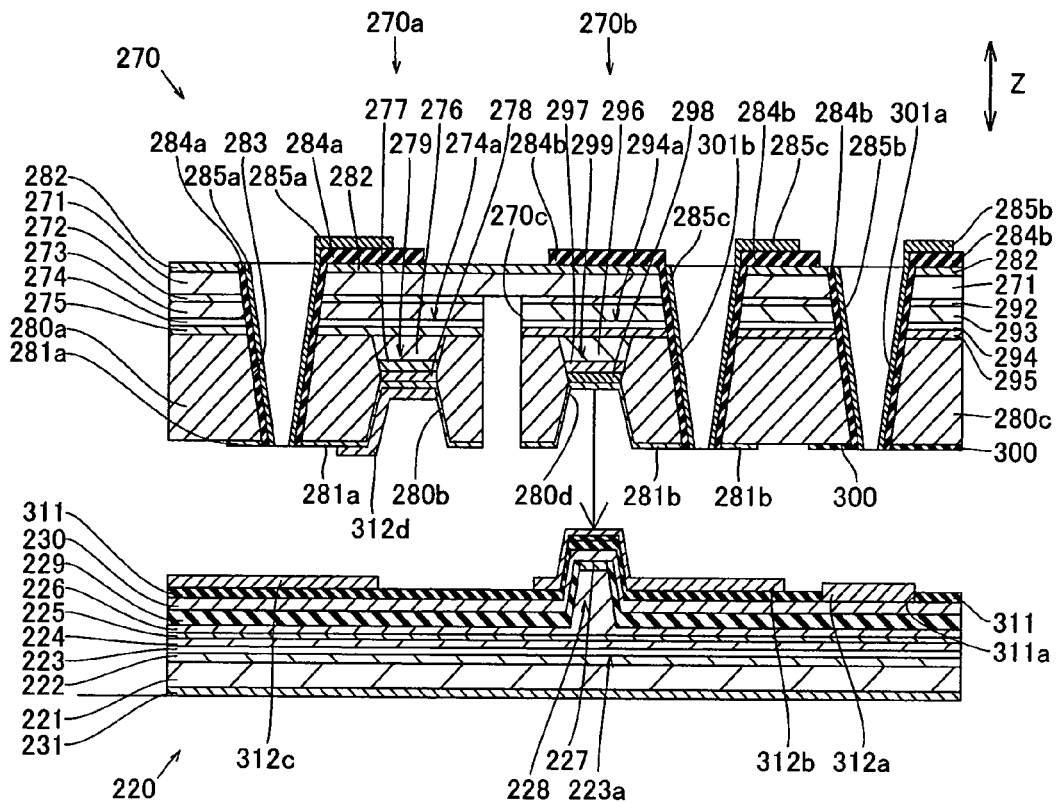
Figure 133:
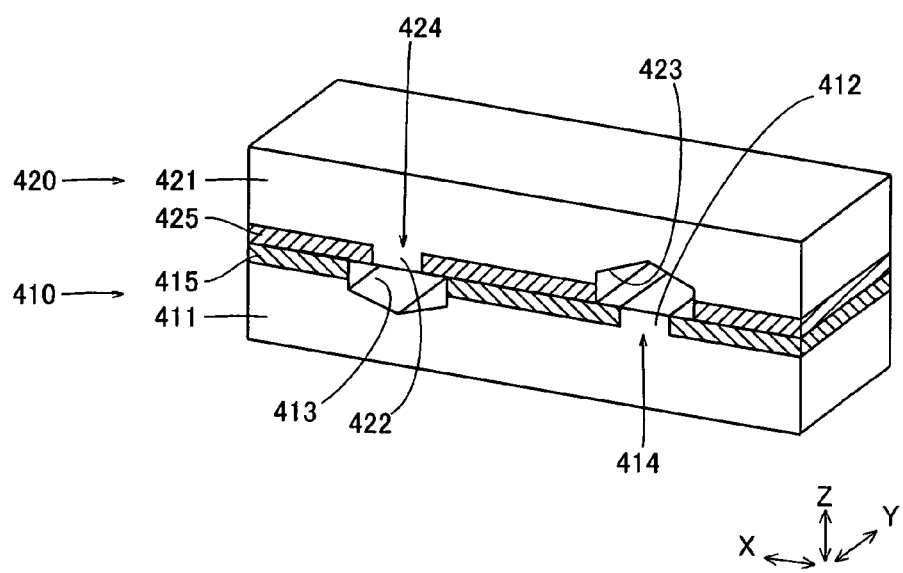
FIG. 133 is a perspective view showing the structure of a conventional integrated semiconductor laser device.

As shown in FIG. 132, the registrational recess portion constituted of the opening 280d of the n-type current blocking layer 280c of the monolithic laser element 270 (infrared laser region 270b) is directed downward and receives the registrational projecting portion constituted of the ridge portion 228 of the blue-violet laser element 220, to be registered therewith. When the registrational recess portion constituted of the opening 280d of the n-type current blocking layer 280c receives the registrational projecting portion constituted of the ridge portion 228, the solder layers 312a to 312d of Au—Sn are melted by heat treatment under a temperature condition of about 280° C. Thereafter the solder layers 312a to 312d are solidified by a step of cooling the same to the room temperature, thereby bonding the blue-violet laser element 220 and the monolithic laser element 270 to each other. The solder layer 312a in contact with the p-side electrode 230 of the blue-violet laser element 220 is in contact with the extraction electrode 285b of the monolithic laser element 270 (infrared laser region 270b). The solder layer 312b located on the infrared laser region 270b is in contact with the extraction electrode 285c of the monolithic laser element 270 (infrared laser region 270b) and the p-side electrode 281b of the infrared laser region 270b. The solder layer 312c located on the red laser region 270a is fused to the solder layer 312d, and the fused solder layers 312c and 312d are in contact with the extraction electrode 285a of the monolithic laser element 270 (red laser region 270a) and the p-side electrode 281a of the red laser region 270a.

At this time, the blue-violet laser element 220 and the monolithic laser element 270 can be inhibited from horizontal misregistration in the direction X shown in FIGS. 106 and 107 due to the fitting between the registrational projecting portion constituted of the ridge portion 228 and the registrational recess portion constituted of the opening 280d of the n-type current blocking layer 280c according to the eighth embodiment. Thus, cleavage directions of the blue-violet laser element 220 and the monolithic laser element 270 can be inhibited from deviating from each other.

Thereafter the light emission planes 232 (see FIG. 106) are formed by simultaneously cleaving the blue-violet laser element 220 and the monolithic laser element 270 bonded to each other followed by separation into each integrated semiconductor laser device, while the n-side electrode 231 of the blue-violet laser element 220 is bonded to the conductive submount (not shown). Finally, the wires (gold wires) 313a, 313b and 313c are bonded to the surfaces of the extraction electrodes 285a, 285b and 285c opposite to the blue-violet laser element 220 respectively. Further, the first and second ends of the wire (gold wire) 313d are bonded to the exposed region of the surface of the n-side electrode 282 opposite to the blue-violet laser element 220 and the conductive submount (not shown) bonded to the n-side electrode 231 of the blue-violet laser element 220 respectively. The integrated semiconductor laser device according to the eighth embodiment is formed in this manner.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to the integrated semiconductor laser device including the blue-violet laser element and the red laser element or the blue-violet laser element, the red laser element and the infrared laser element in each of the aforementioned first to eighth embodiments, the present invention is not restricted to this but is also applicable to an integrated semiconductor laser device including a blue-violet laser element and an infrared laser element or an integrated semiconductor laser device including a red laser element and an infrared laser element. The present invention is further applicable to an integrated semiconductor laser device including at least two semiconductor laser elements other than blue-violet, red and infrared laser elements.

While the side surfaces of the projecting portion and the inner side surfaces of the recess portion are tapered respectively in each of the aforementioned first to eighth embodiments, the present invention is not restricted to this but the side surfaces of the projecting portion and the inner side surfaces of the recess portion may not be tapered.

While the solder layer(s) is employed as the bonding layer(s) in each of the aforementioned first to eighth embodiments, the present invention is not restricted to this but a bonding layer of a material other than solder may alternatively be employed.

While the current blocking layer includes an n-type GaAs layer in the red laser element according to each of the aforementioned first to eighth embodiments, the present invention is not restricted to this but an insulating film of $SiN_x$ or $SiO_2$ may alternatively be employed as the current blocking layer.

While the thickness of the electrode located on the side surfaces of the registrational projecting portion is identical to that of the electrode located on the region other than the side surfaces of the registrational projecting portion in each of the aforementioned first to eighth embodiments, the present invention is not restricted to this but the thickness of the electrode located on the side surfaces of the registrational projecting portion may alternatively be smaller than that of the electrode located on the region other than the side surfaces of the registrational projecting portion.

While the thickness of the electrode located on the inner side surfaces of the registrational recess portion is identical to that of the electrode located on the region other than the inner side surfaces of the registrational recess portion in each of the aforementioned first to eighth embodiments, the present invention is not restricted to this but the thickness of the electrode located on the inner side surfaces of the registrational recess portion may alternatively be smaller than that of the electrode located on the region other than the inner side surfaces of the registrational recess portion.

While the insulating film of $SiO_2$ is formed between the first semiconductor laser element (blue-violet laser element) and the second semiconductor laser element (red or monolithic laser element) in each of the aforementioned seventh and eighth embodiments, the present invention is not restricted to this but an insulating film of a material other than $SiO_2$ may alternatively be formed between the first and second semiconductor laser elements. This insulating film may be made of $SiN_x$, $TiO_2$ or $ZrO_2$, for example, in place of $SiO_2$.

While the first semiconductor laser element is provided with the registrational projecting portion and the second semiconductor laser element is provided with the registrational recess portion while the insulating film is formed between the first and second semiconductor laser elements in each of the aforementioned seventh and eighth embodiments, the present invention is not restricted to this but the first and second semiconductor laser elements may alternatively be provided with the registrational recess portion and the registrational projecting portion respectively while the insulating film is formed between the first and second semiconductor laser elements.

What is claimed is:

1. An integrated semiconductor laser device comprising:
   a first semiconductor laser element including a first emission region and having either a projecting portion or a recess portion; and
   a second semiconductor laser element including a second emission region and having either a recess portion or a projecting portion, wherein
   either said projecting portion or said recess portion of said first semiconductor laser element is fitted to either said recess portion or said projecting portion of said second semiconductor laser element,
   either said first semiconductor laser element or said second semiconductor laser element further includes a first ridge portion constituting said projecting portion,
   either said projecting portion or said recess portion of said first semiconductor laser element is fitted to either said recess portion or said projecting portion of said second semiconductor laser element through a bonding layer,
   said first emission region and said second emission region are aligned substantially along the same line extending in a direction of stacking of semiconductor layers,
   either said second semiconductor laser element or said first semiconductor laser element further includes said recess portion,
   either said second semiconductor laser element or said first semiconductor laser element further includes:
   a second ridge portion; and
   a current blocking layer formed to cover the side surfaces of said second ridge portion with a thickness larger than the height of said second ridge portion and an opening provided on a region corresponding to said second ridge portion,
   said opening of said current blocking layer constitutes said recess portion of either said second semiconductor laser element or said first semiconductor laser element, and
   said first ridge portion constituting said projecting portion is fitted in said opening of said current blocking layer constituting said recess portion.

2. The integrated semiconductor laser device according to claim 1, wherein
   said projecting portion and said recess portion are bonded to each other through a bonding layer to electrically conduct with each other.

3. The integrated semiconductor laser device according to claim 1, wherein
   said first semiconductor laser element further includes a first electrode arranged on the side closer to said second semiconductor laser element for supplying electric power to said first emission region,
   said second semiconductor laser element further includes a second electrode arranged on the side closer to said first semiconductor laser element for supplying electric power to said second emission region, and
   said first electrode and said second electrode are electrically connected with each other.

4. The integrated semiconductor laser device according to claim 3, wherein
   a contact hole extending in said direction of stacking of said semiconductor layers is formed through a prescribed region of said second semiconductor laser element, and
   said first electrode and said second electrode are electrically connected with an external device from the second semiconductor laser element side of the integrated semiconductor laser device through said contact hole.

5. The integrated semiconductor laser device according to claim 4, wherein
   an extraction electrode electrically connected to said first electrode and said second electrode is formed on the inner side surface of said contact hole.

6. An integrated semiconductor laser device comprising:
   a first semiconductor laser element including a first emission region and having either a projecting portion or a recess portion; and
   a second semiconductor laser element including a second emission region and having either a recess portion or a projecting portion, wherein
   either said projecting portion or said recess portion of said first semiconductor laser element is fitted to either said recess portion or said projecting portion of said second semiconductor laser element,
   either said first semiconductor laser element or said second semiconductor laser element further includes a first ridge portion constituting said projecting portion,
   either said projecting portion or said recess portion of said first semiconductor laser element is fitted to either said recess portion or said projecting portion of said second semiconductor laser element through a bonding layer,
   said first emission region and said second emission region are aligned substantially along the same line extending in a direction of stacking of semiconductor layers,
   said first semiconductor laser element further includes a first electrode arranged on the side closer to said second semiconductor laser element for supplying electric power to said first emission region,
   said second semiconductor laser element further includes a second electrode arranged on the side closer to said first semiconductor laser element for supplying electric power to said second emission region,
   an insulating film is arranged at least between said first electrode and said second electrode,
   an opening is formed through a prescribed region of said insulating film while a first contact hole extending in said direction of stacking of said semiconductor layers is formed through a region of said second semiconductor laser element facing said opening of said insulating film, and
   said first electrode is electrically connected with an external device from the second semiconductor laser element side of the integrated semiconductor laser device through said first contact hole and said opening of said insulating film.

7. The integrated semiconductor laser device according to claim 6, wherein
   a first extraction electrode electrically connected to said first electrode is formed on the inner side surface of said first contact hole.

8. The integrated semiconductor laser device according to claim 6, wherein
a second contact hole extending in said direction of stacking of said semiconductor layers is formed through a region of said second semiconductor laser element separated from said first contact hole at a prescribed interval, and
said second electrode is electrically connected with said external device from the second semiconductor laser element side of the integrated semiconductor laser device through said second contact hole.

9. The integrated semiconductor laser device according to claim 8, wherein
a second extraction electrode electrically connected to said second electrode is formed on the inner side surface of said second contact hole.

10. The integrated semiconductor laser device according to claim 8, further comprising a third semiconductor laser element including a third emission region and a third electrode arranged on the side closer to said first semiconductor laser element for supplying electric power to said third emission region, wherein
said insulating film is also arranged between said first electrode and said third electrode in addition to between said first electrode and said second electrode.

11. The integrated semiconductor laser device according to claim 10, wherein
said second semiconductor laser element and said third semiconductor laser element are formed on a common substrate.

12. The integrated semiconductor laser device according to claim 10, wherein
a third contact hole extending in said direction of stacking of said semiconductor layers is formed through said third semiconductor laser element, and
said third electrode is connected to said external device from the third semiconductor laser element side of the integrated semiconductor laser device through said third contact hole.

13. The integrated semiconductor laser device according to claim 12, wherein
a third extraction electrode electrically connected to said third electrode is formed on the inner side surface of said third contact hole.

* * * * *